United States Patent
Henry et al.

(10) Patent No.: US 10,541,460 B2
(45) Date of Patent: Jan. 21, 2020

(54) APPARATUS AND METHOD FOR GUIDED WAVE COMMUNICATIONS USING AN ABSORBER

(71) Applicant: AT&T Intellectual Property I, L.P., Atlanta, GA (US)

(72) Inventors: Paul Shala Henry, Holmdel, NJ (US); Giovanni Vannucci, Middletown, NJ (US); Thomas M. Willis, III, Tinton Falls, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 16/443,909

(22) Filed: Jun. 18, 2019

(65) Prior Publication Data

US 2019/0305399 A1    Oct. 3, 2019

Related U.S. Application Data

(63) Continuation of application No. 15/828,682, filed on Dec. 1, 2017, now Pat. No. 10,374,281.

(51) Int. Cl.
| | |
|---|---|
| *H01P 3/10* | (2006.01) |
| *H01P 5/18* | (2006.01) |
| *H01P 3/12* | (2006.01) |
| *H04B 3/54* | (2006.01) |
| *H04B 3/52* | (2006.01) |
| *H04B 10/2575* | (2013.01) |
| *G01R 1/24* | (2006.01) |

(52) U.S. Cl.
CPC ............. *H01P 5/188* (2013.01); *H01P 3/10* (2013.01); *H01P 3/12* (2013.01); *H04B 3/52* (2013.01); *H04B 3/54* (2013.01); *G01R 1/24* (2013.01); *H04B 10/25752* (2013.01)

(58) Field of Classification Search
CPC . H01P 3/10; H01P 5/024; H01P 5/188; H01Q 13/0241; H04B 3/52; H04B 3/36; H04B 7/0613
USPC ..................... 333/240, 24 R, 21 R
See application file for complete search history.

(56) References Cited

U.S. PATENT DOCUMENTS

| | | |
|---|---|---|
| 2,685,068 A | 7/1954 | Goubau |
| 2,852,753 A | 9/1958 | Walter et al. |
| (Continued) | | |

FOREIGN PATENT DOCUMENTS

| | | |
|---|---|---|
| CA | 2515560 A1 | 2/2007 |
| WO | 8605327 A1 | 9/1986 |
| (Continued) | | |

OTHER PUBLICATIONS

"International Search Report and Written Opinion", PCT/US2018/015634, dated Jun. 25, 2018, 8 pages.

(Continued)

*Primary Examiner* — Stephen E. Jones
(74) *Attorney, Agent, or Firm* — Guntin & Gust, PLC; Mark Wilinski

(57) ABSTRACT

Aspects of the subject disclosure may include, a system having an absorber and a coupling device. The absorber includes absorbent material that absorbs radiation. The coupling device is positioned in and surrounded by the absorber. The coupling device facilitates transmitting or receiving of an electromagnetic wave along a transmission medium, where the electromagnetic wave propagates along the transmission medium without requiring an electrical return path. Other embodiments are disclosed.

20 Claims, 71 Drawing Sheets

(56) References Cited

U.S. PATENT DOCUMENTS

| | | |
|---|---|---|
| 2,867,776 A | 1/1959 | Wilkinson, Jr. |
| 2,912,695 A | 11/1959 | Cutler |
| 2,921,277 A | 1/1960 | Goubau |
| 3,201,724 A | 8/1965 | Hafner |
| 3,566,317 A | 2/1971 | Theodore |
| 4,783,665 A | 11/1988 | Lier et al. |
| 4,825,221 A | 4/1989 | Suzuki et al. |
| 5,889,449 A | 3/1999 | Fiedziuszko |
| 6,239,377 B1 | 5/2001 | Nishikawa et al. |
| 7,009,471 B2 | 3/2006 | Elmore |
| 7,043,271 B1 | 5/2006 | Seto et al. |
| 7,138,958 B2 | 11/2006 | Syed et al. |
| 7,183,922 B2 | 2/2007 | Mendolia et al. |
| 7,253,426 B2 | 8/2007 | Gorrell et al. |
| 7,280,033 B2 | 10/2007 | Berkman et al. |
| 7,345,623 B2 | 3/2008 | McEwan et al. |
| 7,567,154 B2 | 7/2009 | Elmore |
| 7,590,404 B1 | 9/2009 | Johnson et al. |
| 7,835,600 B1 | 11/2010 | Yap et al. |
| 7,915,980 B2 | 3/2011 | Hardacker et al. |
| 7,925,235 B2 | 4/2011 | Konya et al. |
| 8,077,113 B2 | 12/2011 | Renilson et al. |
| 8,159,385 B2 | 4/2012 | Farneth et al. |
| 8,212,635 B2 | 7/2012 | Miller, II et al. |
| 8,237,617 B1 | 8/2012 | Johnson et al. |
| 8,253,516 B2 | 8/2012 | Miller, II et al. |
| 8,269,583 B2 | 9/2012 | Miller, II et al. |
| 8,344,829 B2 | 1/2013 | Miller, II et al. |
| 8,736,502 B1 | 5/2014 | Mehr et al. |
| 8,897,697 B1 | 11/2014 | Bennett et al. |
| 9,019,164 B2 | 4/2015 | Syed et al. |
| 9,113,347 B2 | 8/2015 | Henry |
| 9,209,902 B2 | 12/2015 | Willis, III et al. |
| 9,312,919 B1 | 4/2016 | Barzegar et al. |
| 9,461,706 B1 | 10/2016 | Bennett et al. |
| 9,490,869 B1 | 11/2016 | Henry |
| 9,509,415 B1 | 11/2016 | Henry et al. |
| 9,520,945 B2 | 12/2016 | Gerszberg et al. |
| 9,525,524 B2 | 12/2016 | Barzegar et al. |
| 9,544,006 B2 | 1/2017 | Henry et al. |
| 9,564,947 B2 | 2/2017 | Stuckman et al. |
| 9,577,306 B2 | 2/2017 | Willis, III et al. |
| 9,608,692 B2 | 3/2017 | Willis, III et al. |
| 9,608,740 B2 | 3/2017 | Henry et al. |
| 9,615,269 B2 | 4/2017 | Henry et al. |
| 9,627,768 B2 | 4/2017 | Henry et al. |
| 9,628,116 B2 | 4/2017 | Willis, III et al. |
| 9,640,850 B2 | 5/2017 | Henry et al. |
| 9,653,770 B2 | 5/2017 | Henry et al. |
| 9,680,670 B2 | 6/2017 | Henry et al. |
| 9,692,101 B2 | 6/2017 | Henry et al. |
| 9,705,561 B2 | 7/2017 | Henry et al. |
| 9,705,571 B2 | 7/2017 | Gerszberg et al. |
| 9,722,318 B2 | 8/2017 | Adriazola et al. |
| 9,742,462 B2 | 8/2017 | Bennett et al. |
| 9,748,626 B2 | 8/2017 | Henry et al. |
| 9,749,053 B2 | 8/2017 | Henry et al. |
| 9,768,833 B2 | 9/2017 | Fuchs et al. |
| 9,769,020 B2 | 9/2017 | Henry et al. |
| 9,780,834 B2 | 10/2017 | Henry et al. |
| 9,793,951 B2 | 10/2017 | Henry et al. |
| 9,793,954 B2 | 10/2017 | Bennett et al. |
| 9,847,566 B2 | 12/2017 | Henry et al. |
| 9,853,342 B2 | 12/2017 | Henry et al. |
| 9,860,075 B1 | 1/2018 | Gerszberg et al. |
| 9,865,911 B2 | 1/2018 | Henry et al. |
| 9,866,309 B2 | 1/2018 | Bennett et al. |
| 9,871,282 B2 | 1/2018 | Henry et al. |
| 9,871,283 B2 | 1/2018 | Henry et al. |
| 9,876,264 B2 | 1/2018 | Barnickel et al. |
| 9,876,570 B2 | 1/2018 | Henry et al. |
| 9,876,605 B1 | 1/2018 | Henry et al. |
| 9,882,257 B2 | 1/2018 | Henry et al. |
| 9,893,795 B1 | 2/2018 | Willis et al. |
| 9,912,381 B2 | 3/2018 | Bennett et al. |
| 9,917,341 B2 | 3/2018 | Henry et al. |
| 9,991,580 B2 | 6/2018 | Henry et al. |
| 9,997,819 B2 | 6/2018 | Bennett et al. |
| 9,998,172 B1 | 6/2018 | Barzegar et al. |
| 9,998,870 B1 | 6/2018 | Bennett et al. |
| 9,999,038 B2 | 6/2018 | Barzegar et al. |
| 10,003,364 B1 | 6/2018 | Willis, III et al. |
| 10,009,063 B2 | 6/2018 | Gerszberg et al. |
| 10,009,065 B2 | 6/2018 | Henry et al. |
| 10,009,901 B2 | 6/2018 | Gerszberg |
| 10,027,397 B2 | 7/2018 | Kim |
| 10,027,427 B2 | 7/2018 | Vannucci et al. |
| 10,033,107 B2 | 7/2018 | Henry et al. |
| 10,033,108 B2 | 7/2018 | Henry et al. |
| 10,044,409 B2 | 8/2018 | Barzegar et al. |
| 10,051,483 B2 | 8/2018 | Barzegar et al. |
| 10,051,488 B1 | 8/2018 | Vannucci et al. |
| 10,062,970 B1 | 8/2018 | Vannucci et al. |
| 10,069,535 B2 | 9/2018 | Vannucci et al. |
| 10,079,661 B2 | 9/2018 | Gerszberg et al. |
| 10,090,606 B2 | 10/2018 | Henry et al. |
| 10,096,883 B2 | 10/2018 | Henry et al. |
| 10,103,777 B1 | 10/2018 | Henry et al. |
| 10,103,801 B2 | 10/2018 | Bennett et al. |
| 10,123,217 B1 | 11/2018 | Barzegar et al. |
| 10,129,057 B2 | 11/2018 | Willis, III et al. |
| 10,135,145 B2 | 11/2018 | Henry et al. |
| 10,136,434 B2 | 11/2018 | Gerszberg et al. |
| 10,142,086 B2 | 11/2018 | Bennett et al. |
| 10,148,016 B2 | 12/2018 | Johnson et al. |
| 10,154,493 B2 | 12/2018 | Bennett et al. |
| 10,170,840 B2 | 1/2019 | Henry et al. |
| 10,171,158 B1 | 1/2019 | Barzegar et al. |
| 10,200,106 B1 | 2/2019 | Barzegar et al. |
| 10,205,212 B2 | 2/2019 | Henry et al. |
| 10,205,231 B1 | 2/2019 | Henry et al. |
| 10,205,655 B2 | 2/2019 | Barzegar et al. |
| 10,224,981 B2 | 3/2019 | Henry et al. |
| 10,230,426 B1 | 3/2019 | Henry et al. |
| 10,230,428 B1 | 3/2019 | Barzegar et al. |
| 10,243,270 B2 | 3/2019 | Henry et al. |
| 10,244,408 B1 | 3/2019 | Vannucci et al. |
| 10,264,586 B2 | 4/2019 | Beattie, Jr. et al. |
| 10,276,907 B2 | 4/2019 | Bennett et al. |
| 10,284,261 B1 | 5/2019 | Barzegar et al. |
| 10,291,286 B2 | 5/2019 | Henry et al. |
| 10,305,190 B2 | 5/2019 | Britz et al. |
| 10,305,192 B1 | 5/2019 | Rappaport |
| 10,305,197 B2 | 5/2019 | Henry et al. |
| 10,312,567 B2 | 6/2019 | Bennett et al. |
| 2004/0110469 A1 | 6/2004 | Judd et al. |
| 2004/0113756 A1 | 6/2004 | Mollenkopf et al. |
| 2004/0218688 A1 | 11/2004 | Santhoff et al. |
| 2005/0042989 A1 | 2/2005 | Ho et al. |
| 2005/0111533 A1 | 5/2005 | Berkman et al. |
| 2005/0159187 A1 | 7/2005 | Mendolia et al. |
| 2005/0258920 A1 | 11/2005 | Elmore et al. |
| 2006/0083269 A1 | 4/2006 | Kang et al. |
| 2008/0064331 A1 | 3/2008 | Washiro et al. |
| 2008/0211727 A1 | 9/2008 | Elmore et al. |
| 2008/0252541 A1 | 10/2008 | Diaz et al. |
| 2009/0079660 A1 | 3/2009 | Elmore et al. |
| 2009/0135042 A1 | 5/2009 | Umishita et al. |
| 2009/0258652 A1 | 10/2009 | Lambert et al. |
| 2010/0220024 A1 | 9/2010 | Snow et al. |
| 2010/0225426 A1 | 9/2010 | Unger et al. |
| 2010/0277003 A1 | 11/2010 | Von Novak et al. |
| 2011/0110404 A1 | 5/2011 | Washiro |
| 2011/0132658 A1 | 6/2011 | Miller, II et al. |
| 2011/0136432 A1 | 6/2011 | Miller, II et al. |
| 2011/0140911 A1 | 6/2011 | Pant et al. |
| 2011/0147073 A1 | 6/2011 | Kume et al. |
| 2011/0187578 A1 | 8/2011 | Farneth et al. |
| 2012/0133373 A1 | 5/2012 | Ali et al. |
| 2012/0306587 A1 | 12/2012 | Strid et al. |
| 2013/0064311 A1 | 3/2013 | Turner et al. |
| 2013/0169499 A1 | 7/2013 | Lin et al. |
| 2014/0273873 A1 | 9/2014 | Huynh et al. |
| 2014/0285277 A1 | 9/2014 | Herbsommer et al. |

(56) References Cited

U.S. PATENT DOCUMENTS

| | | |
|---|---|---|
| 2015/0188584 A1 | 7/2015 | Laurent-Michel |
| 2016/0061021 A1 | 3/2016 | Shaposhnikov et al. |
| 2016/0080839 A1 | 3/2016 | Fuchs et al. |
| 2016/0112093 A1 | 4/2016 | Barzegar |
| 2016/0164571 A1 | 6/2016 | Bennett et al. |
| 2016/0182096 A1 | 6/2016 | Panioukov et al. |
| 2016/0351987 A1 | 12/2016 | Henry |
| 2016/0359541 A1 | 12/2016 | Bennett |
| 2016/0359546 A1 | 12/2016 | Bennett |
| 2017/0012667 A1 | 1/2017 | Bennett |
| 2017/0033953 A1 | 2/2017 | Henry et al. |
| 2017/0033954 A1 | 2/2017 | Henry et al. |
| 2017/0079037 A1 | 3/2017 | Gerszberg et al. |
| 2017/0110795 A1 | 4/2017 | Henry |
| 2017/0110804 A1 | 4/2017 | Henry et al. |
| 2017/0229782 A1 | 8/2017 | Adriazola et al. |
| 2018/0048497 A1 | 2/2018 | Henry et al. |
| 2018/0054232 A1 | 2/2018 | Henry et al. |
| 2018/0054233 A1 | 2/2018 | Henry et al. |
| 2018/0054234 A1 | 2/2018 | Stuckman et al. |
| 2018/0062886 A1 | 3/2018 | Paul et al. |
| 2018/0069594 A1 | 3/2018 | Henry et al. |
| 2018/0069731 A1 | 3/2018 | Henry et al. |
| 2018/0074568 A1 | 3/2018 | Priyadarshi et al. |
| 2018/0076982 A1 | 3/2018 | Henry et al. |
| 2018/0077709 A1 | 3/2018 | Gerszberg |
| 2018/0108997 A1 | 4/2018 | Henry et al. |
| 2018/0108998 A1 | 4/2018 | Henry et al. |
| 2018/0108999 A1 | 4/2018 | Henry et al. |
| 2018/0115058 A1 | 4/2018 | Henry et al. |
| 2018/0115075 A1 | 4/2018 | Bennett et al. |
| 2018/0115081 A1 | 4/2018 | Johnson et al. |
| 2018/0123207 A1 | 5/2018 | Henry et al. |
| 2018/0123208 A1 | 5/2018 | Henry et al. |
| 2018/0123643 A1 | 5/2018 | Henry et al. |
| 2018/0123836 A1 | 5/2018 | Henry et al. |
| 2018/0151957 A1 | 5/2018 | Bennett et al. |
| 2018/0159229 A1 | 6/2018 | Britz |
| 2018/0159230 A1 | 6/2018 | Henry et al. |
| 2018/0159235 A1 | 6/2018 | Wolniansky |
| 2018/0159238 A1 | 6/2018 | Wolniansky |
| 2018/0159240 A1 | 6/2018 | Henry et al. |
| 2018/0159243 A1 | 6/2018 | Britz et al. |
| 2018/0166761 A1 | 6/2018 | Henry et al. |
| 2018/0166784 A1 | 6/2018 | Johnson et al. |
| 2018/0166785 A1 | 6/2018 | Henry et al. |
| 2018/0166787 A1 | 6/2018 | Johnson et al. |
| 2018/0167130 A1 | 6/2018 | Vannucci |
| 2018/0302162 A1 | 10/2018 | Gerszberg et al. |
| 2019/0013577 A1 | 1/2019 | Henry et al. |
| 2019/0013837 A1 | 1/2019 | Henry et al. |
| 2019/0074563 A1 | 3/2019 | Henry et al. |
| 2019/0074564 A1 | 3/2019 | Henry et al. |
| 2019/0074565 A1 | 3/2019 | Henry et al. |
| 2019/0074580 A1 | 3/2019 | Henry et al. |
| 2019/0074878 A1 | 3/2019 | Henry et al. |
| 2019/0081747 A1 | 3/2019 | Barzegar et al. |
| 2019/0104012 A1 | 4/2019 | Barzegar et al. |
| 2019/0104419 A1 | 4/2019 | Barzegar et al. |
| 2019/0115642 A1 | 4/2019 | Henry et al. |
| 2019/0123442 A1 | 4/2019 | Vannucci et al. |
| 2019/0123783 A1 | 4/2019 | Henry et al. |
| 2019/0131717 A1 | 5/2019 | Vannucci |
| 2019/0131718 A1 | 5/2019 | Vannucci et al. |
| 2019/0140679 A1 | 5/2019 | Vannucci et al. |
| 2019/0141714 A1 | 5/2019 | Willis, III et al. |
| 2019/0173151 A1 | 6/2019 | Henry et al. |
| 2019/0174506 A1 | 6/2019 | Willis, III et al. |
| 2019/0181683 A1 | 6/2019 | Vannucci et al. |

FOREIGN PATENT DOCUMENTS

| | | |
|---|---|---|
| WO | 2018106455 A1 | 6/2018 |
| WO | 2018106684 A1 | 6/2018 |
| WO | 2018106915 A1 | 6/2018 |
| WO | 2019050752 A1 | 3/2019 |

OTHER PUBLICATIONS

"Theory and Application of RF/Microwave Absorbers", Emerson & Cuming Microwave Products, http://www.eccosorb.com/resource-white-papers.htm, Oct. 2, 2017, 19 pages.

Akalin, Tahsin et al., "Single-Wire Transmission Lines at Terahertz Frequencies", IEEE Transactions on Microwave Theory and Techniques, vol. 54, No. 6, 2006, 2762-2767.

Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.

Barlow, H. M. et al., "Surface Waves", 621.396.11 : 538.566, Paper No. 1482 Radio Section, 1953, pp. 329-341.

Corridor Systems, "A New Approach to Outdoor DAS Network Physical Layer Using E-Line Technology", Mar. 2011, 5 pages.

Elmore, Glenn et al., "A Surface Wave Transmission Line", QEX, May/Jun. 2012, pp. 3-9.

Elmore, Glenn, "Introduction to the Propagating Wave on a Single Conductor", www.corridor.biz, Jul. 27, 2009, 30 pages.

Friedman, M et al., "Low-Loss RF Transport Over Long Distances", IEEE Transactions on Microwave Theory and Techniques, vol. 49, No. 2, Feb. 2001, 8 pages.

Goubau, Georg et al., "Investigation of a Surface-Wave Line for Long Distance Transmission", 1952, 263-267.

Goubau, Georg et al., "Investigations with a Model Surface Wave Transmission Line", IRE Transactions on Antennas and Propagation, 1957, 222-227.

Goubau, Georg, "Open Wire Lines", IRE Transactions on Microwave Theory and Techniques, 1956, 197-200.

Goubau, Georg, "Single-Conductor Surface-Wave Transmission Lines", Proceedings of the I.R.E., 1951, 619-624.

Goubau, Georg, "Surface Waves and Their Application to Transmission Lines", Radio Communication Branch, Coles Signal Laboratory, Mar. 10, 1950, 1119-1128.

Goubau, Georg, "Waves on Interfaces", IRE Transactions on Antennas and Propagation, Dec. 1959, 140-146.

Laird, "Lossy, Flexible, Foam Microwave Absorber", Eccosorb LS; http://www.eccosorb.com/Collateral/Documents/English-US/RFP-DS-LS%20070116.pdf, Oct. 2, 2017, 3 pages.

Moisan, M. et al., "Experimental Investigations of the Propagation of Surface Waves Along a Plasma Column", Plasma Physics. vol. 24, No. 11, pp. 1331 to 1400, 1982, Feb. 1982, 70 pages.

Patent Cooperation Treaty, "International Search Report and Written Opinion dated Mar. 14, 2019", PCT Application No. PCT/US18/63227, dated Mar. 14, 2019, 10 pages.

Ren-Bin, Zhong et al., "Surface plasmon wave propagation along single metal wire", Chin. Phys. B, vol. 21, No. 11, May 2, 2012, 9 pages.

Sommerfeld, A., "On the propagation of electrodynamic waves along a wire", Annals of Physics and Chemistry New Edition, vol. 67, No. 2, 1899, 72 pages.

Villaran, Michael et al., "Condition Monitoring of Cables Task 3 Report: Condition Monitoring Techniques for Electric Cables", Brookhaven National Laboratory, Technical Report, Nov. 30, 2009, 89 pages.

Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.

Wang, Kanglin, "Dispersion of Surface Plasmon Polaritons on Metal Wires in the Terahertz Frequency Range", Physical Review Letters, PRL 96, 157401, 2006, 4 pages.

100

200

300

400

500

550

900

950

1000

1100

1200

1300

INTEGRATED DIELECTRIC ANTENNA
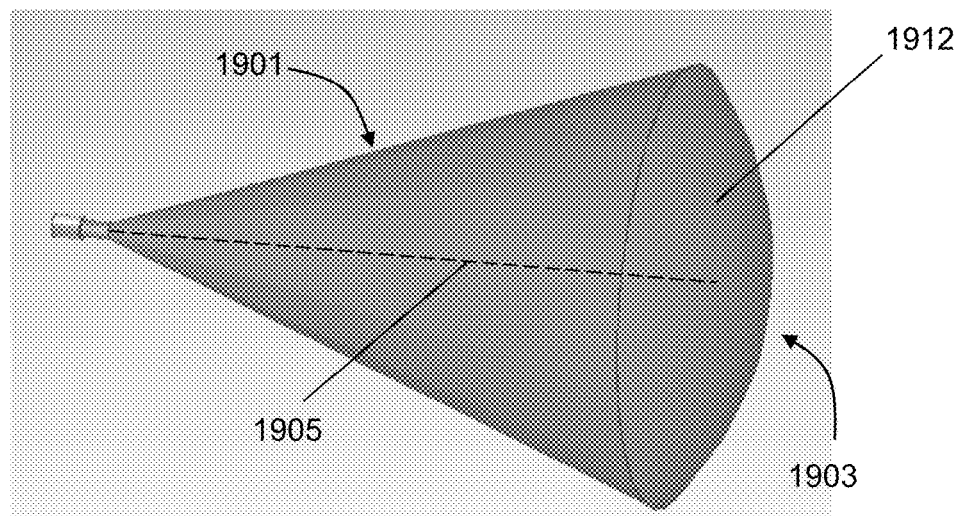
ASSEMBLED DIELECTRIC ANTENNA
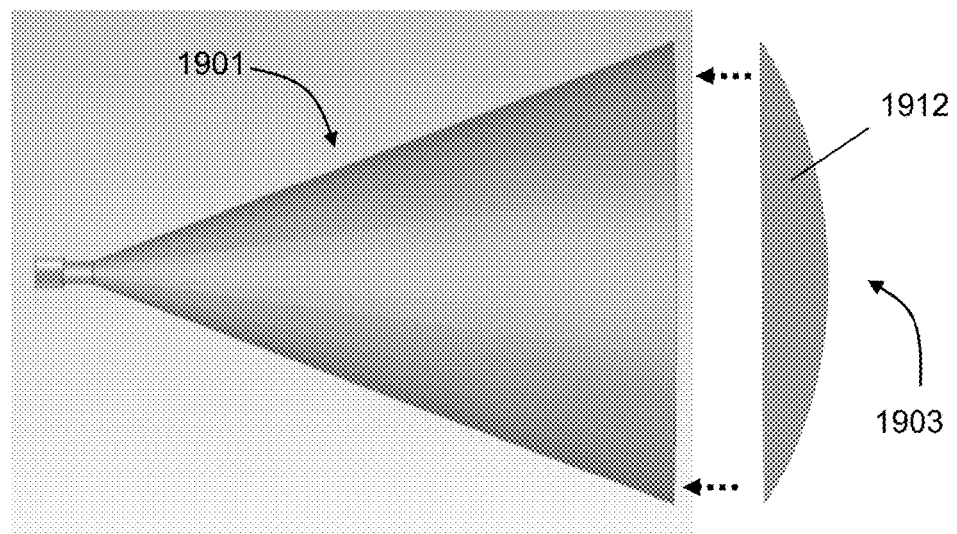
FIG. 19C

Antenna Array Using Pyramidal Horns

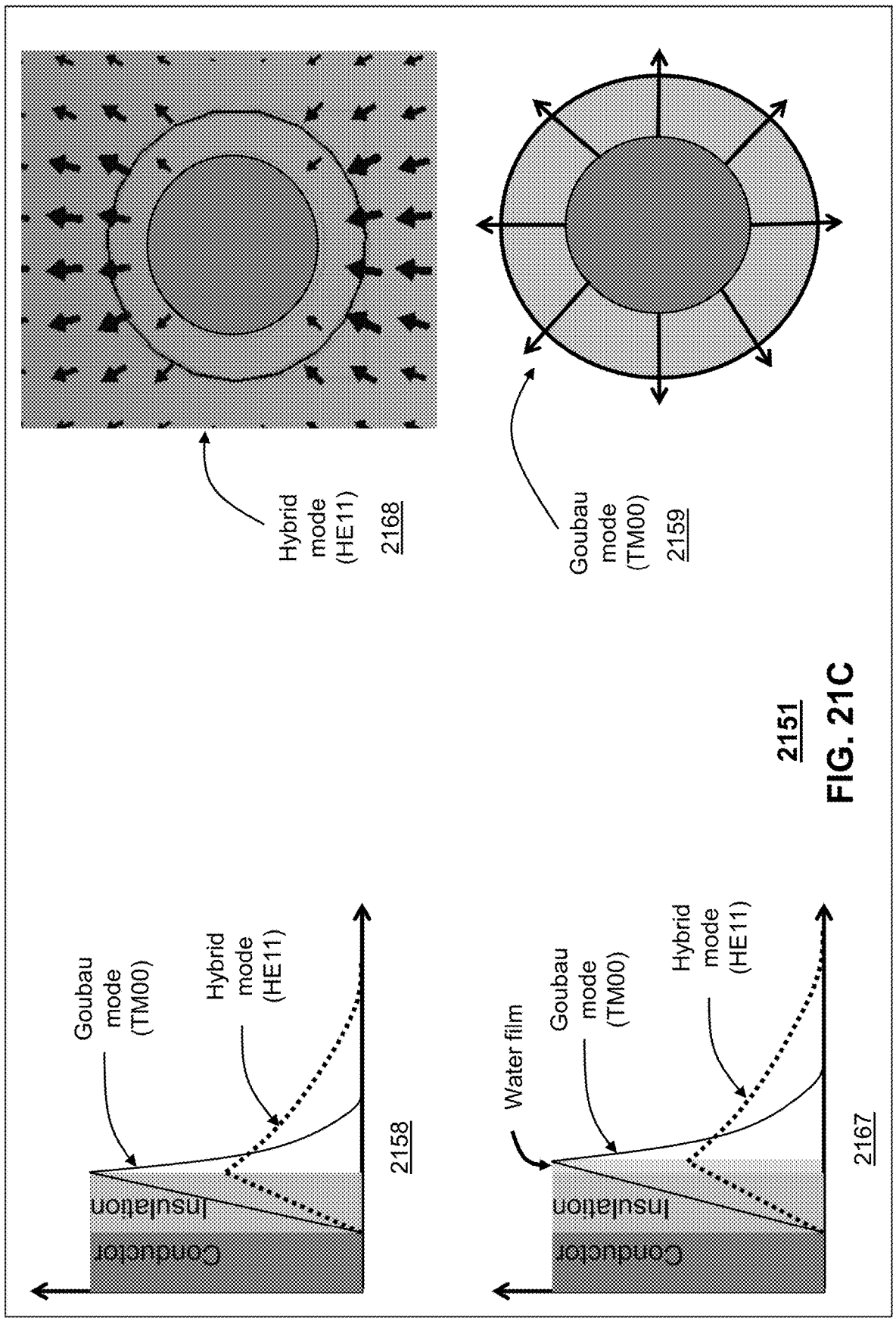

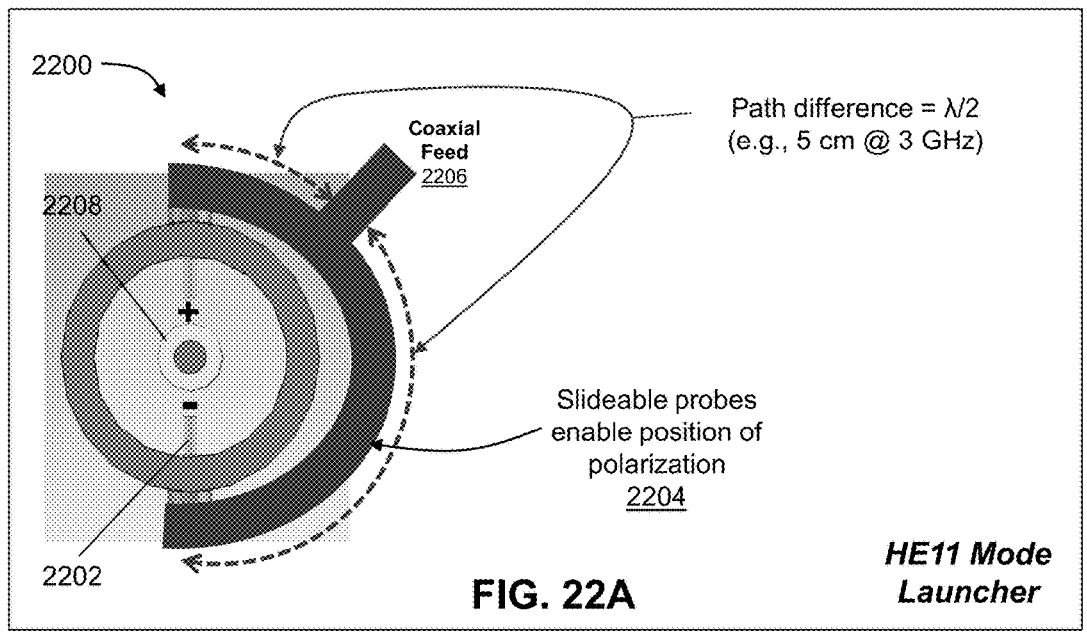
FIG. 22A — HE11 Mode Launcher
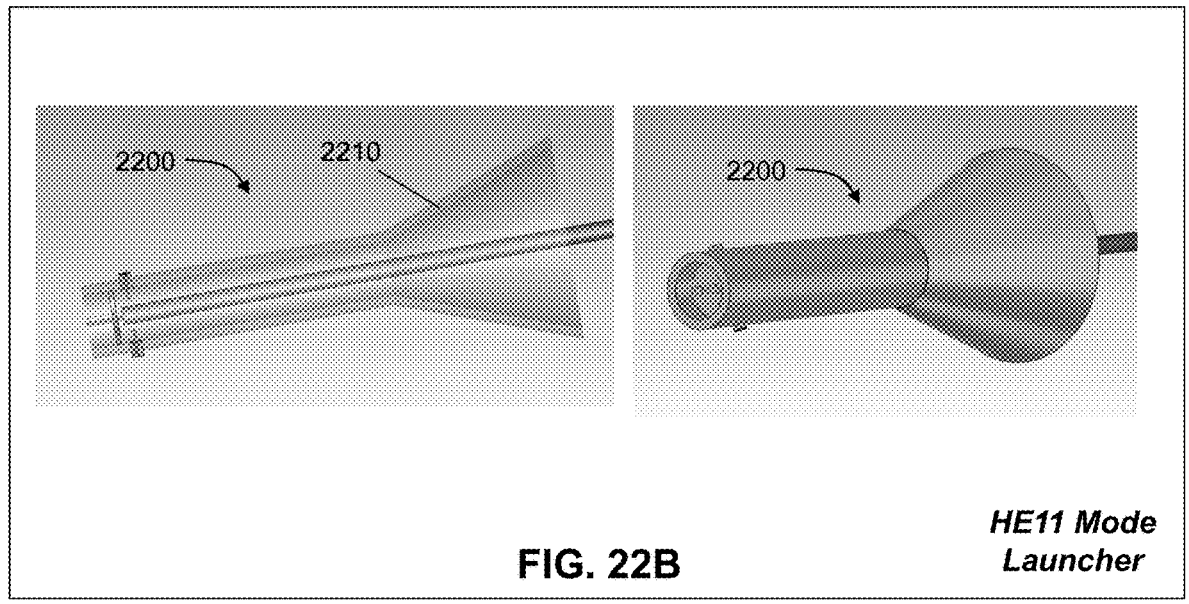
FIG. 22B — HE11 Mode Launcher

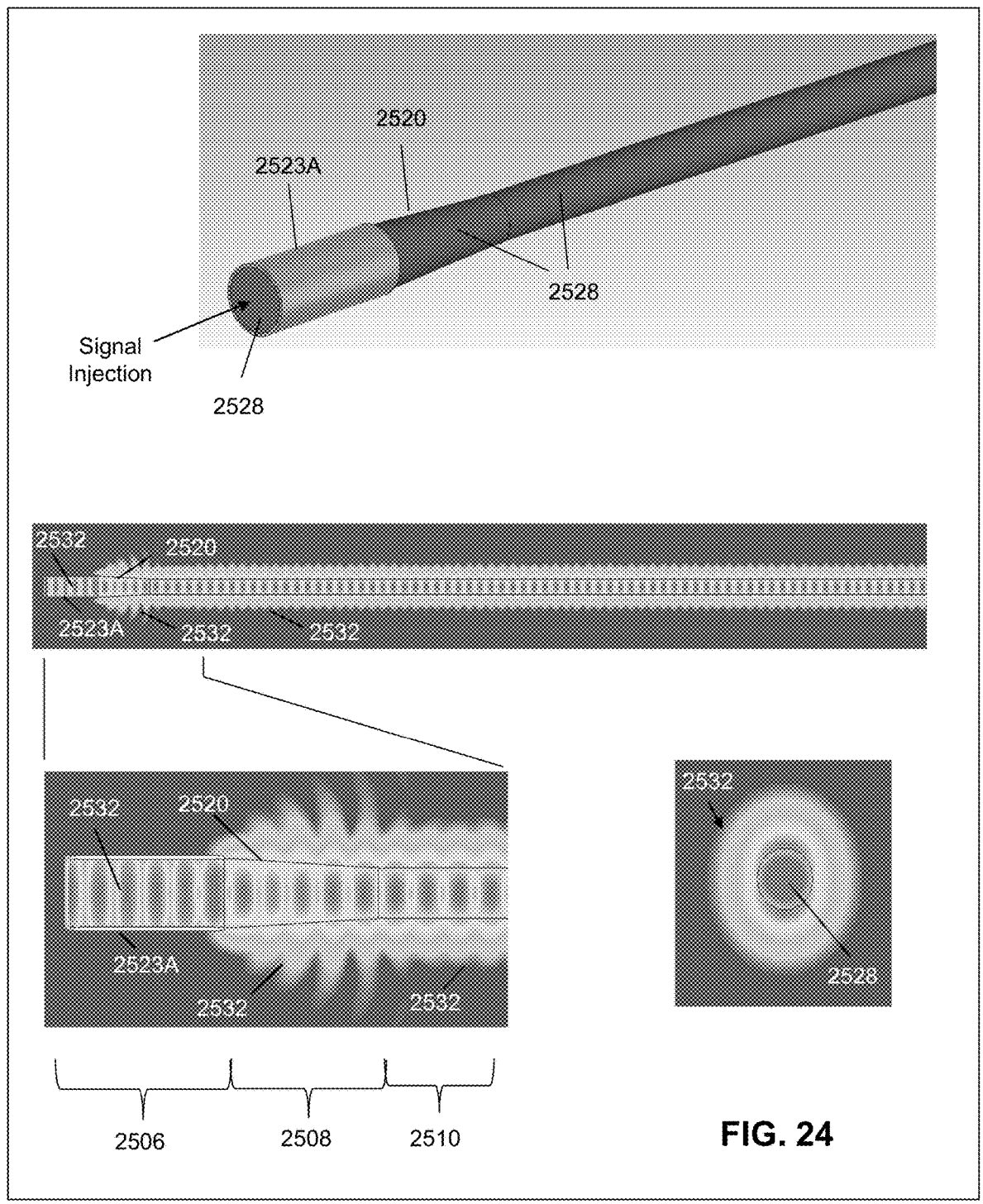

2600

2900

2900

3600

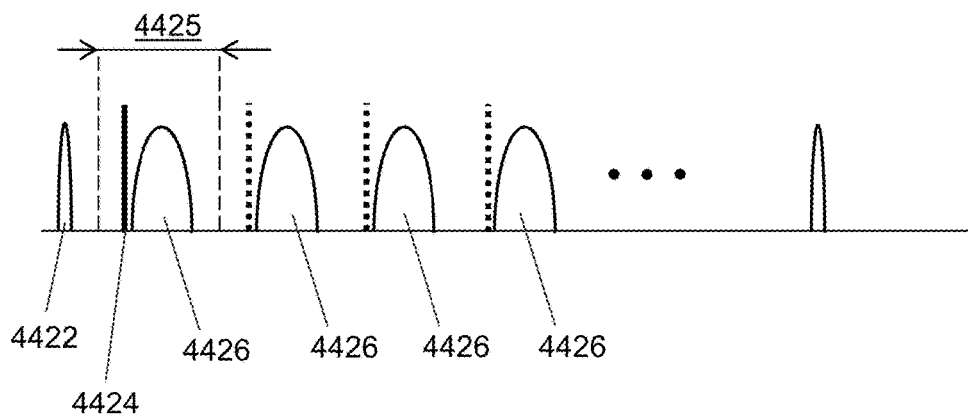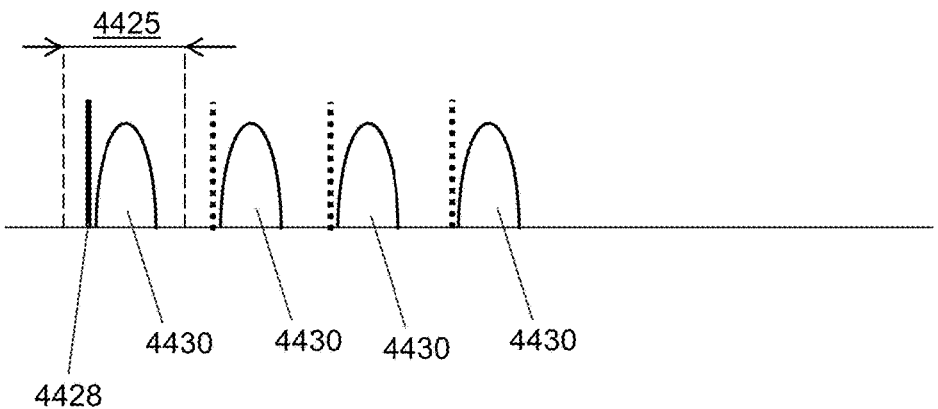
FIG. 44C

4460

4470

4500

4600"

APPARATUS AND METHOD FOR GUIDED WAVE COMMUNICATIONS USING AN ABSORBER

CROSS REFERENCE TO RELATED APPLICATIONS

This application is a continuation of U.S. patent application Ser. No. 15/828,682 filed Dec. 1, 2017. All sections of the aforementioned application are incorporated herein by reference in their entirety.

FIELD OF THE DISCLOSURE

The subject disclosure relates to an apparatus and method for guided wave communication using an absorber.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

In addition, most homes and businesses have grown to rely on broadband data access for services such as voice, video and Internet browsing, etc. Broadband access networks include satellite, 4G or 5G wireless, power line communication, fiber, cable, and telephone networks.

BRIEF DESCRIPTION OF THE DRAWINGS

Reference will now be made to the accompanying drawings, which are not necessarily drawn to scale, and wherein:

FIG. 19C is a block diagram illustrating an example, non-limiting embodiments of a dielectric antenna coupled to a lens in accordance with various aspects described herein.

FIG. 21C is a block diagram illustrating an example, non-limiting embodiment of electric field characteristics of a hybrid wave versus a Goubau wave in accordance with various aspects described herein.

FIGS. 22A and 22B are block diagrams illustrating example, non-limiting embodiments of a waveguide device for launching hybrid waves in accordance with various aspects described herein.

FIG. 24 is a block diagram illustrating an example, non-limiting embodiment of a waveguide device in accordance with various aspects described herein.

FIG. 44C is a graphical diagram illustrating an example, non-limiting embodiment of downlink and uplink communication techniques for enabling a base station to communicate with communication nodes in accordance with various aspects described herein.

DETAILED DESCRIPTION

Figure 1:
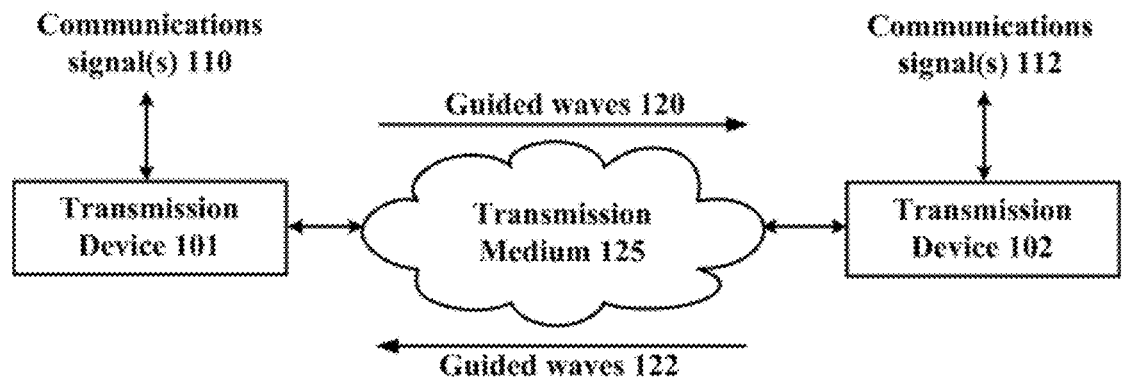
FIG. 1 is a block diagram illustrating an example, non-limiting embodiment of a guided-wave communications system in accordance with various aspects described herein.

One or more embodiments are now described with reference to the drawings, wherein like reference numerals are used to refer to like elements throughout the drawings. In the following description, for purposes of explanation, numerous details are set forth in order to provide a thorough understanding of the various embodiments. It is evident, however, that the various embodiments can be practiced without these details (and without applying to any particular networked environment or standard).

In an embodiment, a guided wave communication system is presented for sending and receiving communication signals such as data or other signaling via guided electromagnetic waves. The guided electromagnetic waves include, for example, surface waves or other electromagnetic waves that are bound to or guided by a transmission medium as described herein. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including unshielded twisted pair cables including single twisted pairs, Category 5e and other twisted pair cable bundles, other wire bundles, cables, rods, rails, pipes; non-conductors such as dielectric pipes, rods, rails, or other dielectric members; combinations of conductors and dielectric materials; or other guided wave transmission media.

The inducement of guided electromagnetic waves that propagate along a transmission medium can be independent of any electrical potential, charge or current that is injected or otherwise transmitted through the transmission medium as part of an electrical circuit. For example, in the case where the transmission medium is a wire, it is to be appreciated that while a small current in the wire may be formed in response to the propagation of the electromagnetic waves guided along the wire, this can be due to the propagation of the electromagnetic wave along the wire surface, and is not formed in response to electrical potential, charge or current that is injected into the wire as part of an electrical circuit. The electromagnetic waves traveling along the wire therefore do not require an electrical circuit (i.e., ground or another electrical return path) to propagate along the wire surface. The wire therefore is a single wire transmission line that is not part of an electrical circuit. For example, electromagnetic waves can propagate along a wire configured as an electrical open circuit. Also, in some embodiments, a wire is not necessary, and the electromagnetic waves can propagate along a single line transmission medium that is not a wire including a single line transmission medium that is conductorless.

More generally, "guided electromagnetic waves" or "guided waves" as described by the subject disclosure are affected by the presence of a physical object that is at least a part of the transmission medium (e.g., a bare wire or other conductor, a dielectric including a dielectric core without a conductive shield and/or without an inner conductor, an insulated wire, a conduit or other hollow element whether conductive or not, a bundle of insulated wires that is coated, covered or surrounded by a dielectric or insulator or other wire bundle, or another form of solid, liquid or otherwise non-gaseous transmission medium) so as to be at least partially bound to or guided by the physical object and so as to propagate along a transmission path of the physical object. Such a physical object can operate as at least a part of a transmission medium that guides, by way of one or more interfaces of the transmission medium (e.g., an outer surface, inner surface, an interior portion between the outer and the inner surfaces or other boundary between elements of the transmission medium). In this fashion, a transmission medium may support multiple transmission paths over different surfaces of the transmission medium. For example, a stranded cable or wire bundle may support electromagnetic waves that are guided by the outer surface of the stranded cable or wire bundle, as well as electromagnetic waves that are guided by inner cable surfaces between two, three or more individual strands or wires within the stranded cable or wire bundle. For example, electromagnetic waves can be guided within interstitial areas of a stranded cable, insulated twisted pair wires, or a wire bundle. The guided electromagnetic waves of the subject disclosure are launched from a sending (transmitting) device and propagate along the transmission medium for reception by at least one receiving device. The propagation of guided electromagnetic waves, can carry energy, data and/or other signals along the transmission path from the sending device to the receiving device.

As used herein the term "conductor" (based on a definition of the term "conductor" from *IEEE* 100, *the Authoritative Dictionary of IEEE Standards Terms*, 7$^{th}$ Edition, 2000) means a substance or body that allows a current of electricity to pass continuously along it. The terms "insulator", "conductorless" or "nonconductor" (based on a definition of the term "insulator" from *IEEE* 100, *the Authoritative Dictionary of IEEE Standards Terms*, 7$^{th}$ Edition, 2000) means a device or material in which electrons or ions cannot be moved easily. It is possible for an insulator, or a conductorless or nonconductive material to be intermixed intentionally (e.g., doped) or unintentionally into a resulting substance with a small amount of another material having the properties of a conductor. However, the resulting substance may remain substantially resistant to a flow of a continuous electrical current along the resulting substance. Furthermore, a conductorless member such as a dielectric rod or other conductorless core lacks an inner conductor and a conductive shield. As used herein, the term "eddy current" (based on a definition of the term "conductor" from *IEEE* 100, *the Authoritative Dictionary of IEEE Standards Terms*, 7$^{th}$ Edition, 2000) means a current that circulates in a metallic material as a result of electromotive forces induced by a variation of magnetic flux. Although it may be possible for an insulator, conductorless or nonconductive material in the foregoing embodiments to allow eddy currents that circulate within the doped or intermixed conductor and/or a very small continuous flow of an electrical current along the extent of the insulator, conductorless or nonconductive material, any such continuous flow of electrical current along such an insulator, conductorless or nonconductive material is de minimis compared to the flow of an electrical current along a conductor. Accordingly, in the subject disclosure an insulator, and a conductorless or nonconductor material are not considered to be a conductor. The term "dielectric" means an insulator that can be polarized by an applied electric field. When a dielectric is placed in an electric field, electric charges do not continuously flow through the material as they do in a conductor, but only slightly shift from their average equilibrium positions causing dielectric polarization. The terms "conductorless transmission medium or non-conductor transmission medium" can mean a transmission medium consisting of any material (or combination of materials) that may or may not contain one or more conductive elements but lacks a continuous conductor between the sending and receiving devices along the conductorless transmission medium or non-conductor transmission medium—similar or identical to the aforementioned properties of an insulator, conductorless or nonconductive material.

Unlike free space propagation of wireless signals such as unguided (or unbounded) electromagnetic waves that decrease in intensity inversely by the square of the distance traveled by the unguided electromagnetic waves, guided electromagnetic waves can propagate along a transmission medium with less loss in magnitude per unit distance than experienced by unguided electromagnetic waves.

Unlike electrical signals, guided electromagnetic waves can propagate from a sending device to a receiving device without requiring a separate electrical return path between the sending device and the receiving device. As a consequence, guided electromagnetic waves can propagate from a sending device to a receiving device along a conductorless transmission medium including a transmission medium having no conductive components (e.g., a dielectric strip, rod, or pipe), or via a transmission medium having no more than a single conductor (e.g., a single bare wire or insulated wire configured in an open electrical circuit). Even if a transmission medium includes one or more conductive components and the guided electromagnetic waves propagating along the transmission medium generate currents that flow in the one or more conductive components in a direction of the guided electromagnetic waves, such guided electromagnetic waves can propagate along the transmission medium from a sending device to a receiving device without requiring a flow of opposing currents on an electrical return path between the sending device and the receiving device (i.e., in an electrical open circuit configuration).

In a non-limiting illustration, consider electrical systems that transmit and receive electrical signals between sending and receiving devices by way of conductive media. Such systems generally rely on an electrical forward path and an electrical return path. For instance, consider a coaxial cable having a center conductor and a ground shield that are separated by an insulator. Typically, in an electrical system a first terminal of a sending (or receiving) device can be connected to the center conductor, and a second terminal of the sending (or receiving) device can be connected to the ground shield or other second conductor. If the sending device injects an electrical signal in the center conductor via the first terminal, the electrical signal will propagate along the center conductor causing forward currents in the center conductor, and return currents in the ground shield or other second conductor. The same conditions apply for a two terminal receiving device.

In contrast, consider a guided wave communication system such as described in the subject disclosure, which can utilize different embodiments of a transmission medium (including among others a coaxial cable) for transmitting and receiving guided electromagnetic waves without requiring an electrical return path. In one embodiment, for example, the guided wave communication system of the subject disclosure can be configured to induce guided electromagnetic waves that propagate along an outer surface of a coaxial cable. Although the guided electromagnetic waves can cause forward currents on the ground shield, the guided electromagnetic waves do not require return currents on, for example, the center conductor to enable the guided electromagnetic waves to propagate along the outer surface of the coaxial cable. The same can be said of other transmission media used by a guided wave communication system for the transmission and reception of guided electromagnetic waves. For example, guided electromagnetic waves induced by the guided wave communication system on a bare wire, an insulated wire, or a dielectric transmission medium (e.g., a dielectric core with no conductive materials), can propagate along the bare wire, the insulated bare wire, or the dielectric transmission medium without requiring return currents on an electrical return path.

Consequently, electrical systems that require forward and return conductors for carrying corresponding forward and reverse currents on conductors to enable the propagation of electrical signals injected by a sending device are distinct from guided wave systems that induce guided electromagnetic waves on an interface of a transmission medium without requiring an electrical return path to enable the propagation of the guided electromagnetic waves along the interface of the transmission medium.

It is further noted that guided electromagnetic waves as described in the subject disclosure can have an electromagnetic field structure that lies primarily or substantially on an outer surface of a transmission medium so as to be bound to or guided by the outer surface of the transmission medium and so as to propagate non-trivial distances on or along the outer surface of the transmission medium. In other embodiments, guided electromagnetic waves can have an electromagnetic field structure that lies primarily or substantially below an outer surface of a transmission medium so as to be bound to or guided by an inner material of the transmission medium (e.g., dielectric material) and so as to propagate non-trivial distances within the inner material of the transmission medium. In other embodiments, guided electromagnetic waves can have an electromagnetic field structure that lies within a region that is partially below and partially above an outer surface of a transmission medium so as to be bound to or guided by this region of the transmission medium and so as to propagate non-trivial distances along this region of the transmission medium. The desired electromagnetic field structure in an embodiment may vary based upon a variety of factors, including the desired transmission distance, the characteristics of the transmission medium itself, and environmental conditions/characteristics outside of the transmission medium (e.g., presence of rain, fog, atmospheric conditions, etc.).

Various embodiments described herein relate to coupling devices, that can be referred to as "waveguide coupling devices", "waveguide couplers" or more simply as "couplers", "coupling devices" or "launchers" for launching and/or receiving/extracting guided electromagnetic waves to and from a transmission medium, wherein a wavelength of the guided electromagnetic waves can be small compared to one or more dimensions of the coupling device and/or the transmission medium such as the circumference of a wire or other cross sectional dimension. Such electromagnetic waves can operate at millimeter wave frequencies (e.g., 30 to 300 GHz), or lower than microwave frequencies such as 300 MHz to 30 GHz. Electromagnetic waves can be induced to propagate along a transmission medium by a coupling device, such as: a strip, arc or other length of dielectric material; a millimeter wave integrated circuit (MMIC), a horn, monopole, rod, slot or other antenna; an array of antennas; a magnetic resonant cavity or other resonant coupler; a coil, a strip line, a coaxial waveguide or other waveguide and/or other coupling device. In operation, the coupling device receives an electromagnetic wave from a transmitter or transmission medium. The electromagnetic field structure of the electromagnetic wave can be carried below an outer surface of the coupling device, substantially on the outer surface of the coupling device, or a combination thereof. When the coupling device is in close proximity to a transmission medium, at least a portion of an electromagnetic wave couples to or is bound to the transmission medium, and continues to propagate as guided electromagnetic waves along the transmission medium. In a reciprocal fashion, a coupling device can receive or extract at least a portion of the guided electromagnetic waves from a transmission medium and transfer these electromagnetic waves to a receiver. The guided electromagnetic waves launched and/or received by the coupling device propagate along the transmission medium from a sending device to a receiving device without requiring an electrical return path between the sending device and the receiving device. In this circumstance, the transmission medium acts as a waveguide to support the propagation of the guided electromagnetic waves from the sending device to the receiving device.

According to an example embodiment, a surface wave is a type of guided wave that is guided by a surface of a transmission medium, such as an exterior or outer surface or an interior or inner surface including an interstitial surface of the transmission medium such as the interstitial area between wires in a multistranded cable, insulated twisted pair wires, or wire bundle, and/or another surface of the transmission medium that is adjacent to or exposed to another type of medium having different properties (e.g., dielectric properties). Indeed, in an example embodiment, a surface of the transmission medium that guides a surface wave can represent a transitional surface between two different types of media. For example, in the case of a bare wire or uninsulated wire, the surface of the wire can be the outer or exterior conductive surface of the bare wire or uninsulated wire that is exposed to air or free space. As another example, in the case of insulated wire, the surface of the wire can be the conductive portion of the wire that meets an inner surface of the insulator portion of the wire. A surface of the transmission medium can be any one of an inner surface of an insulator surface of a wire or a conductive surface of the wire that is separated by a gap composed of, for example, air or free space. A surface of a transmission medium can otherwise be any material region of the transmission medium. For example, the surface of the transmission medium can be an inner portion of an insulator disposed on a conductive portion of the wire that meets the insulator portion of the wire. The surface that guides an electromagnetic wave can depend upon the relative differences in the properties (e.g., dielectric properties) of the insulator, air, and/or the conductor and further dependent on the frequency and propagation mode or modes of the guided wave.

According to an example embodiment, the term "about" a wire or other transmission medium used in conjunction with a guided wave can include fundamental guided wave propagation modes such as a guided waves having a circular or substantially circular field pattern/distribution, a symmetrical electromagnetic field pattern/distribution (e.g., electric field or magnetic field) or other fundamental mode pattern at least partially around a wire or other transmission medium. Unlike Zenneck waves that propagate along a single planar surface of a planar transmission medium, the guided electromagnetic waves of the subject disclosure that are bound to a transmission medium can have a non-planar surface have electromagnetic field patterns that surround or circumscribe, at least in part, the non-planar surface of the transmission medium with electromagnetic energy in all directions, or in all but a finite number of azimuthal null directions characterized by field strengths that approach zero field strength for infinitesimally small azimuthal widths.

For example, such non-circular field distributions can be unilateral or multi-lateral with one or more axial lobes characterized by relatively higher field strength and/or one or more nulls directions of zero field strength or substantially zero-field strength or null regions characterized by relatively low-field strength, zero-field strength and/or substantially zero-field strength. Further, the field distribution can otherwise vary as a function of azimuthal orientation around a transmission medium such that one or more angular regions around the transmission medium have an electric or magnetic field strength (or combination thereof) that is higher than one or more other angular regions of azimuthal orientation, according to an example embodiment. It will be appreciated that the relative orientations or positions of the guided wave higher order modes, particularly asymmetrical modes, can vary as the guided wave travels along the wire.

In addition, when a guided wave propagates "about" a wire or other type of transmission medium, it can do so according to a guided wave propagation mode that includes not only the fundamental wave propagation modes (e.g., zero order modes), but additionally or alternatively, non-fundamental wave propagation modes such as higher-order guided wave modes (e.g., $1^{st}$ order modes, $2^{nd}$ order modes, etc.). Higher-order modes include symmetrical modes that have a circular or substantially circular electric or magnetic field distribution and/or a symmetrical electric or magnetic field distribution, or asymmetrical modes and/or other guided (e.g., surface) waves that have non-circular and/or asymmetrical field distributions around the wire or other transmission medium. For example, the guided electromagnetic waves of the subject disclosure can propagate along a transmission medium from the sending device to the receiving device or along a coupling device via one or more guided wave modes such as a fundamental transverse magnetic (TM) TM00 mode (or Goubau mode), a fundamental hybrid mode (EH or HE) "EH00" mode or "HEOO" mode, a transverse electromagnetic "TEMnm" mode, a total internal reflection (TIR) mode or any other mode such as EHnm, HEnm or TMnm, where n and/or m have integer values greater than or equal to 0, and other fundamental, hybrid and non-fundamental wave modes.

As used herein, the term "guided wave mode" refers to a guided wave propagation mode of a transmission medium, coupling device or other system component of a guided wave communication system that propagates for non-trivial distances along the length of the transmission medium, coupling device or other system component.

As used herein, the term "millimeter-wave" can refer to electromagnetic waves/signals that fall within the "millimeter-wave frequency band" of 30 GHz to 300 GHz. The term "microwave" can refer to electromagnetic waves/signals that fall within a "microwave frequency band" of 300 MHz to 300 GHz. The term "radio frequency" or "RF" can refer to electromagnetic waves/signals that fall within the "radio frequency band" of 10 kHz to 1 THz. It is appreciated that wireless signals, electrical signals, and guided electromagnetic waves as described in the subject disclosure can be configured to operate at any desirable frequency range, such as, for example, at frequencies within, above or below millimeter-wave and/or microwave frequency bands. In particular, when a coupling device or transmission medium includes a conductive element, the frequency of the guided electromagnetic waves that are carried by the coupling device and/or propagate along the transmission medium can be below the mean collision frequency of the electrons in the conductive element. Further, the frequency of the guided electromagnetic waves that are carried by the coupling device and/or propagate along the transmission medium can be a non-optical frequency, e.g., a radio frequency below the range of optical frequencies that begins at 1 THz.

It is further appreciated that a transmission medium as described in the subject disclosure can be configured to be opaque or otherwise resistant to (or at least substantially reduce) a propagation of electromagnetic waves operating at optical frequencies (e.g., greater than 1 THz).

As used herein, the term "antenna" can refer to a device that is part of a transmitting or receiving system to transmit/radiate or receive free space wireless signals.

In accordance with one or more embodiments, a communication device can include an absorber and a launcher. The absorber can have absorbent material that absorbs radiation. The launcher can have a distal end surrounded by the absorbent material. The launcher can induce an electromagnetic wave that propagates along a transmission medium without requiring an electrical return path, where the absorbent material absorbs the radiation in proximity to the distal end of the launcher.

In accordance with one or more embodiments, a communication device can include an absorber and a coupling device. The absorber can have absorbent material that absorbs radiation. The coupling device can be positioned in and surrounded by the absorber. The coupling device facilitates transmitting or receiving of an electromagnetic wave along a transmission medium, where the electromagnetic wave propagates along the transmission medium without requiring an electrical return path.

In accordance with one or more embodiments, a method can include generating, by a launcher of a communication device, an electromagnetic wave that propagates along a transmission medium without requiring an electrical return path. The method can include absorbing, by an absorber of the communication device, radiation in proximity to a distal end of the launcher.

Referring now to FIG. 1, a block diagram 100 illustrating an example, non-limiting embodiment of a guided wave communications system is shown. In operation, a transmission device 101 receives one or more communication signals 110 from a communication network or other communications device that includes data and generates guided waves 120 to convey the data via the transmission medium 125 to the transmission device 102. The transmission device 102 receives the guided waves 120 and converts them to communication signals 112 that include the data for transmission to a communications network or other communications device. The guided waves 120 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The communication network or networks can include a wireless communication network such as a mobile data network, a cellular voice and data network, a wireless local area network (e.g., WiFi or an IEEE 802.xx network), a satellite communications network, a personal area network or other wireless network. The communication network or networks can also include a wired communication network such as a telephone network, an Ethernet network, a local area network, a wide area network such as the Internet, a broadband access network, a cable network, a fiber optic network, or other wired network. The communication devices can include a network edge device, bridge device or home gateway, a set-top box, broadband modem, telephone adapter, access point, base station, or other fixed communication device, a mobile communication device such as an automotive gateway or automobile, laptop computer, tablet, smartphone, cellular telephone, or other communication device.

In an example embodiment, the guided wave communication system 100 can operate in a bi-directional fashion where transmission device 102 receives one or more communication signals 112 from a communication network or device that includes other data and generates guided waves 122 to convey the other data via the transmission medium 125 to the transmission device 101. In this mode of operation, the transmission device 101 receives the guided waves 122 and converts them to communication signals 110 that include the other data for transmission to a communications network or device. The guided waves 122 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The transmission medium 125 can include a cable having at least one inner portion surrounded by a dielectric material such as an insulator or other dielectric cover, coating or other dielectric material, the dielectric material having an outer surface and a corresponding circumference. In an example embodiment, the transmission medium 125 operates as a single-wire transmission line to guide the transmission of an electromagnetic wave. When the transmission medium 125 is implemented as a single wire transmission system, it can include a wire. The wire can be insulated or uninsulated, and single-stranded or multi-stranded (e.g., braided). In other embodiments, the transmission medium 125 can contain conductors of other shapes or configurations including wire bundles, cables, rods, rails, pipes. In addition, the transmission medium 125 can include non-conductors such as dielectric pipes, rods, rails, or other dielectric members; combinations of conductors and dielectric materials, conductors without dielectric materials or other guided wave transmission media and/or consist essentially of non-conductors such as dielectric pipes, rods, rails, or other dielectric members that operate without a continuous conductor such as an inner conductor or a conductive shield. It should be noted that the transmission medium 125 can otherwise include any of the transmission media previously discussed.

Further, as previously discussed, the guided waves 120 and 122 can be contrasted with radio transmissions over free space/air or conventional propagation of electrical power or signals through the conductor of a wire via an electrical circuit. In addition to the propagation of guided waves 120 and 122, the transmission medium 125 may optionally contain one or more wires that propagate electrical power or other communication signals in a conventional manner as a part of one or more electrical circuits.

Figure 2:
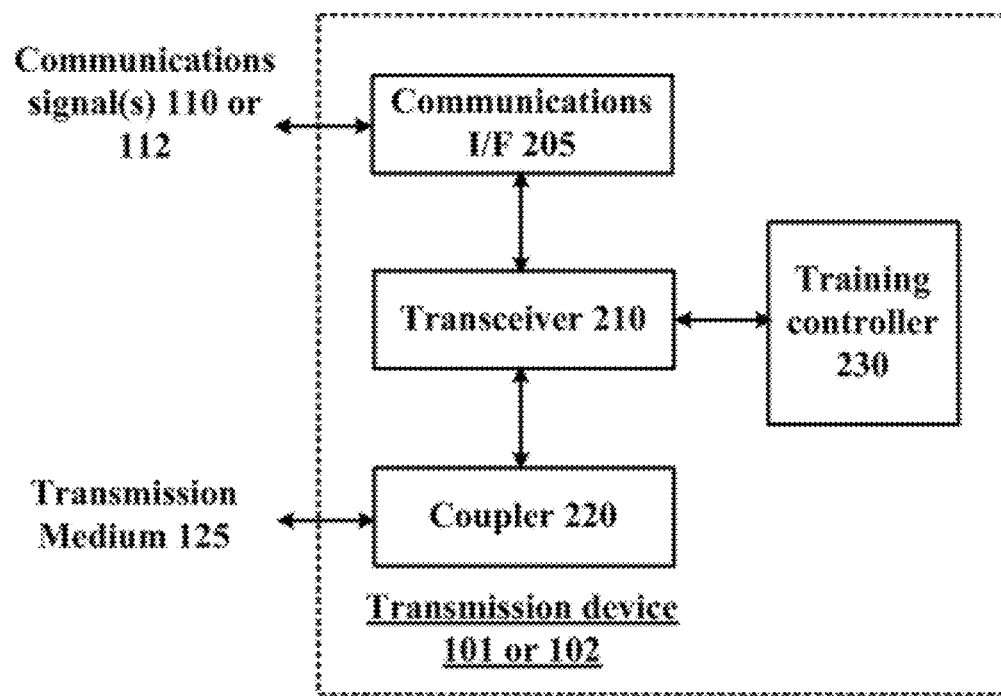
FIG. 2 is a block diagram illustrating an example, non-limiting embodiment of a transmission device in accordance with various aspects described herein.

Referring now to FIG. 2, a block diagram 200 illustrating an example, non-limiting embodiment of a transmission device is shown. The transmission device 101 or 102 includes a communications interface (I/F) 205, a transceiver 210 and a coupler 220.

In an example of operation, the communications interface 205 receives a communication signal 110 or 112 that includes data. In various embodiments, the communications interface 205 can include a wireless interface for receiving a wireless communication signal in accordance with a wireless standard protocol such as LTE or other cellular voice and data protocol, WiFi or an 802.11 protocol, WIMAX protocol, Ultra Wideband protocol, Bluetooth® protocol, Zigbee® protocol, a direct broadcast satellite (DBS) or other satellite communication protocol or other wireless protocol. In addition or in the alternative, the communications interface 205 includes a wired interface that operates in accordance with an Ethernet protocol, universal serial bus (USB) protocol, a data over cable service interface specification (DOCSIS) protocol, a digital subscriber line (DSL) protocol, a Firewire (IEEE 1394) protocol, or other wired protocol. In additional to standards-based protocols, the communications interface 205 can operate in conjunction with other wired or wireless protocol. In addition, the communications interface 205 can optionally operate in conjunction with a protocol stack that includes multiple protocol layers including a MAC protocol, transport protocol, application protocol, etc.

In an example of operation, the transceiver 210 generates an electromagnetic wave based on the communication signal 110 or 112 to convey the data. The electromagnetic wave has at least one carrier frequency and at least one corresponding wavelength. The carrier frequency can be within a millimeter-wave frequency band of 30 GHz-300 GHz, such as 60 GHz or a carrier frequency in the range of 30-40 GHz or a lower frequency band of 300 MHz-30 GHz in the microwave frequency range such as 26-30 GHz, 11 GHz, or 3-6 GHz, but it will be appreciated that other carrier frequencies are possible in other embodiments. In one mode of operation, the transceiver 210 merely upconverts the communications signal or signals 110 or 112 for transmission of the electromagnetic signal in the microwave or millimeter-wave band as a guided electromagnetic wave that is guided by or bound to the transmission medium 125. In another mode of operation, the communications interface 205 either converts the communication signal 110 or 112 to a baseband or near baseband signal or extracts the data from the communication signal 110 or 112 and the transceiver 210 modulates a high-frequency carrier with the data, the baseband or near baseband signal for transmission. It should be appreciated that the transceiver 210 can modulate the data received via the communication signal 110 or 112 to preserve one or more data communication protocols of the communication signal 110 or 112 either by encapsulation in the payload of a different protocol or by simple frequency shifting. In the alternative, the transceiver 210 can otherwise translate the data received via the communication signal 110 or 112 to a protocol that is different from the data communication protocol or protocols of the communication signal 110 or 112.

In an example of operation, the coupler 220 couples the electromagnetic wave to the transmission medium 125 as a guided electromagnetic wave to convey the communications signal or signals 110 or 112. While the prior description has focused on the operation of the transceiver 210 as a transmitter, the transceiver 210 can also operate to receive electromagnetic waves that convey other data from the single wire transmission medium via the coupler 220 and to generate communications signals 110 or 112, via communications interface 205 that includes the other data. Consider embodiments where an additional guided electromagnetic wave conveys other data that also propagates along the transmission medium 125. The coupler 220 can also couple this additional electromagnetic wave from the transmission medium 125 to the transceiver 210 for reception.

The transmission device 101 or 102 includes an optional training controller 230. In an example embodiment, the training controller 230 is implemented by a standalone processor or a processor that is shared with one or more other components of the transmission device 101 or 102. The training controller 230 selects the carrier frequencies, modulation schemes and/or guided wave modes for the guided electromagnetic waves based on testing of the transmission medium 125, environmental conditions and/or feedback data received by the transceiver 210 from at least one remote transmission device coupled to receive the guided electromagnetic wave.

In an example embodiment, a guided electromagnetic wave transmitted by a remote transmission device 101 or 102 conveys data that also propagates along the transmission medium 125. The data from the remote transmission device 101 or 102 can be generated to include the feedback data. In operation, the coupler 220 also couples the guided electromagnetic wave from the transmission medium 125 and the transceiver receives the electromagnetic wave and processes the electromagnetic wave to extract the feedback data.

In an example embodiment, the training controller 230 operates based on the feedback data to evaluate a plurality of candidate frequencies, modulation schemes and/or transmission modes to select a carrier frequency, modulation scheme and/or transmission mode to enhance performance, such as throughput, signal strength, reduce propagation loss, etc.

Consider the following example: a transmission device 101 begins operation under control of the training controller 230 by sending a plurality of guided waves as test signals such as pilot waves or other test signals at a corresponding plurality of candidate frequencies and/or candidate modes directed to a remote transmission device 102 coupled to the transmission medium 125. The guided waves can include, in addition or in the alternative, test data. The test data can indicate the particular candidate frequency and/or guidewave mode of the signal. In an embodiment, the training controller 230 at the remote transmission device 102 receives the test signals and/or test data from any of the guided waves that were properly received and determines the best candidate frequency and/or guided wave mode, a set of acceptable candidate frequencies and/or guided wave modes, or a rank ordering of candidate frequencies and/or guided wave modes. This selection of candidate frequenc(ies) or/and guided-mode(s) are generated by the training controller 230 based on one or more optimizing criteria such as received signal strength, bit error rate, packet error rate, signal to noise ratio, propagation loss, etc. The training controller 230 generates feedback data that indicates the selection of candidate frequenc(ies) or/and guided wave mode(s) and sends the feedback data to the transceiver 210 for transmission to the transmission device 101. The transmission device 101 and 102 can then communicate data with one another based on the selection of candidate frequenc(ies) or/and guided wave mode(s).

In other embodiments, the guided electromagnetic waves that contain the test signals and/or test data are reflected back, repeated back or otherwise looped back by the remote transmission device 102 to the transmission device 101 for reception and analysis by the training controller 230 of the transmission device 101 that initiated these waves. For example, the transmission device 101 can send a signal to the remote transmission device 102 to initiate a test mode where a physical reflector is switched on the line, a termination impedance is changed to cause reflections, a loop back mode is switched on to couple electromagnetic waves back to the source transmission device 102, and/or a repeater mode is enabled to amplify and retransmit the electromagnetic waves back to the source transmission device 102. The training controller 230 at the source transmission device 102 receives the test signals and/or test data from any of the guided waves that were properly received and determines selection of candidate frequenc(ies) or/and guided wave mode(s).

While the procedure above has been described in a start-up or initialization mode of operation, each transmission device 101 or 102 can send test signals, evaluate candidate frequencies or guided wave modes via non-test conditions such as normal transmissions or otherwise evaluate candidate frequencies or guided wave modes at other times or continuously as well. In an example embodiment, the communication protocol between the transmission devices 101 and 102 can include an on-request or periodic test mode where either full testing or more limited testing of a subset of candidate frequencies and guided wave modes are tested and evaluated. In other modes of operation, the re-entry into such a test mode can be triggered by a degradation of performance due to a disturbance, weather conditions, etc. In an example embodiment, the receiver bandwidth of the transceiver 210 is either sufficiently wide or swept to receive all candidate frequencies or can be selectively adjusted by the training controller 230 to a training mode where the receiver bandwidth of the transceiver 210 is sufficiently wide or swept to receive all candidate frequencies.

Figure 3:
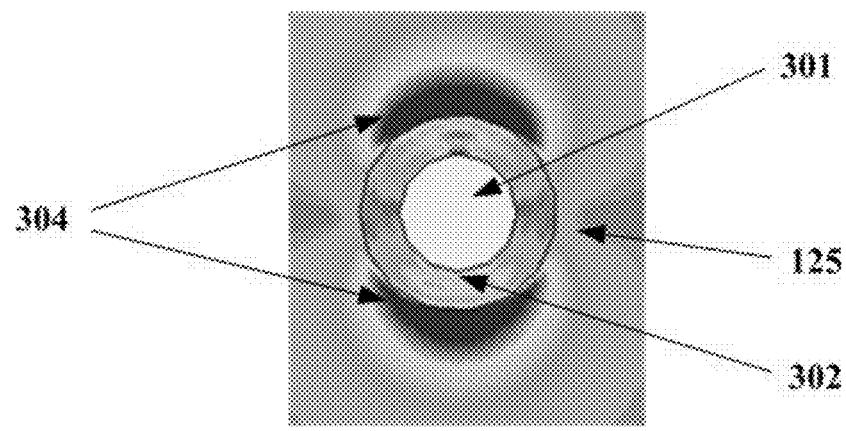
FIG. 3 is a graphical diagram illustrating an example, non-limiting embodiment of an electromagnetic field distribution in accordance with various aspects described herein.

Referring now to FIG. 3, a graphical diagram 300 illustrating an example, non-limiting embodiment of an electromagnetic field distribution is shown. In this embodiment, a transmission medium 125 in air includes an inner conductor 301 and an insulating jacket 302 of dielectric material, as shown in cross section. The diagram 300 includes different gray-scales that represent differing electromagnetic field strengths generated by the propagation of the guided wave having a non-circular and non-fundamental guided wave mode.

In particular, the electromagnetic field distribution corresponds to a modal "sweet spot" that enhances guided electromagnetic wave propagation along an insulated transmission medium and reduces end-to-end transmission loss. In this particular mode, electromagnetic waves are guided by the transmission medium 125 to propagate along an outer surface of the transmission medium—in this case, the outer surface of the insulating jacket 302. Electromagnetic waves are partially embedded in the insulator and partially radiating on the outer surface of the insulator. In this fashion, electromagnetic waves are "lightly" coupled to the insulator so as to enable electromagnetic wave propagation at long distances with low propagation loss.

As shown, the guided wave has a field structure that lies primarily or substantially outside of the transmission medium 125 that serves to guide the electromagnetic waves. The regions inside the conductor 301 have little or no field. Likewise regions inside the insulating jacket 302 have low field strength. The majority of the electromagnetic field strength is distributed in the lobes 304 at the outer surface of the insulating jacket 302 and in close proximity thereof. The presence of a non-circular and non-fundamental guided wave mode is shown by the high electromagnetic field strengths at the top and bottom of the outer surface of the insulating jacket 302 (in the orientation of the diagram)—as opposed to very small field strengths on the other sides of the insulating jacket 302.

The example shown corresponds to a 38 GHz electromagnetic wave guided by a wire with a diameter of 1.1 cm and a dielectric insulation of thickness of 0.36 cm. Because the electromagnetic wave is guided by the transmission medium 125 and the majority of the field strength is concentrated in the air outside of the insulating jacket 302 within a limited distance of the outer surface, the guided wave can propagate longitudinally down the transmission medium 125 with very low loss. In the example shown, this "limited distance" corresponds to a distance from the outer surface that is less than half the largest cross sectional dimension of the transmission medium 125. In this case, the largest cross sectional dimension of the wire corresponds to the overall diameter of 1.82 cm, however, this value can vary with the size and shape of the transmission medium 125. For example, should the transmission medium 125 be of a rectangular shape with a height of 0.3 cm and a width of 0.4 cm, the largest cross sectional dimension would be the diagonal of 0.5 cm and the corresponding limited distance would be 0.25 cm. The dimensions of the area containing the majority of the field strength also vary with the frequency, and in general, increase as carrier frequencies decrease.

It should also be noted that the components of a guided wave communication system, such as couplers and transmission media can have their own cut-off frequencies for each guided wave mode. The cut-off frequency generally sets forth the lowest frequency that a particular guided wave mode is designed to be supported by that particular component. In an example embodiment, the particular non-circular and non-fundamental mode of propagation shown is induced on the transmission medium 125 by an electromagnetic wave having a frequency that falls within a limited range (such as Fc to 2Fc) of the cut-off frequency Fc for this particular non-fundamental mode. The cut-off frequency Fc is particular to the characteristics of transmission medium 125. For embodiments as shown that include an inner conductor 301 surrounded by an insulating jacket 302, this cutoff frequency can vary based on the dimensions and properties of the insulating jacket 302 and potentially the dimensions and properties of the inner conductor 301 and can be determined experimentally to have a desired mode pattern. It should be noted however, that similar effects can be found for a hollow dielectric or insulator without an inner conductor or conductive shield. In this case, the cutoff frequency can vary based on the dimensions and properties of the hollow dielectric or insulator.

At frequencies lower than the cut-off frequency, the non-circular mode is difficult to induce in the transmission medium 125 and fails to propagate for all but trivial distances. As the frequency increases above the limited range of frequencies about the cut-off frequency, the non-circular mode shifts more and more inward of the insulating jacket 302. At frequencies much larger than the cut-off frequency, the field strength is no longer concentrated outside of the insulating jacket, but primarily inside of the insulating jacket 302. While the transmission medium 125 provides strong guidance to the electromagnetic wave and propagation is still possible, ranges are more limited by increased losses due to propagation within the insulating jacket 302—as opposed to the surrounding air.

Figure 4:
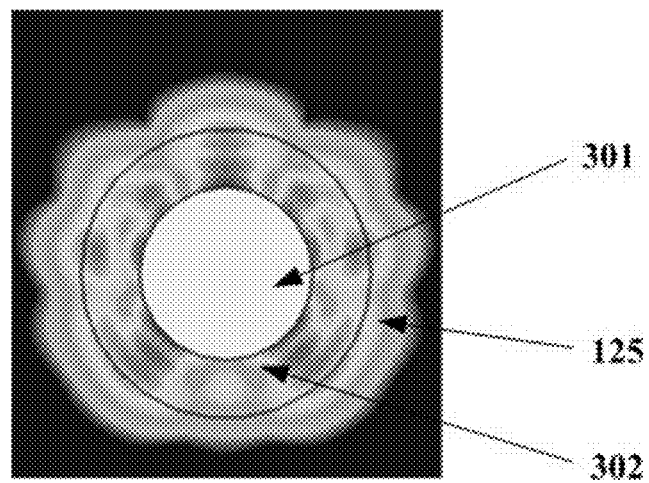
FIG. 4 is a graphical diagram illustrating an example, non-limiting embodiment of an electromagnetic field distribution in accordance with various aspects described herein.

Referring now to FIG. 4, a graphical diagram 400 illustrating an example, non-limiting embodiment of an electromagnetic field distribution is shown. In particular, a cross section diagram 400, similar to FIG. 3 is shown with common reference numerals used to refer to similar elements. The example shown corresponds to a 60 GHz wave guided by a wire with a diameter of 1.1 cm and a dielectric insulation of thickness of 0.36 cm. Because the frequency of the guided wave is above the limited range of the cut-off frequency of this particular non-fundamental mode, much of the field strength has shifted inward of the insulating jacket 302. In particular, the field strength is concentrated primarily inside of the insulating jacket 302. While the transmission medium 125 provides strong guidance to the electromagnetic wave and propagation is still possible, ranges are more limited when compared with the embodiment of FIG. 3, by increased losses due to propagation within the insulating jacket 302.

Figure 5A:
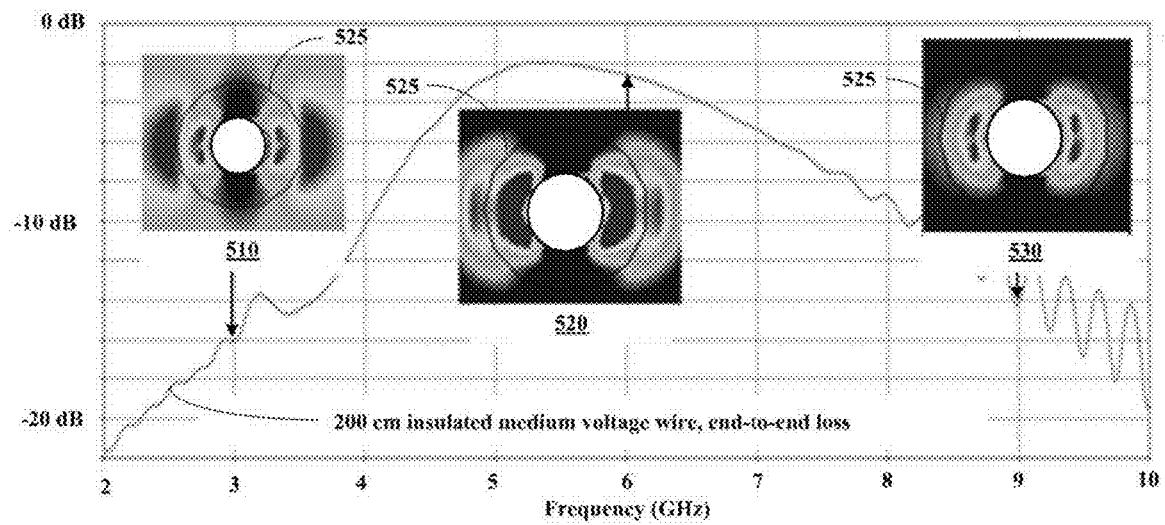
FIG. 5A is a graphical diagram illustrating an example, non-limiting embodiment of a frequency response in accordance with various aspects described herein.

Referring now to FIG. 5A, a graphical diagram illustrating an example, non-limiting embodiment of a frequency response is shown. In particular, diagram 500 presents a graph of end-to-end loss (in dB) as a function of frequency, overlaid with electromagnetic field distributions 510, 520 and 530 at three points for a 200 cm insulated medium voltage wire. The boundary between the insulator and the surrounding air is represented by reference numeral 525 in each electromagnetic field distribution.

As discussed in conjunction with FIG. 3, an example of a desired non-circular mode of propagation shown is induced on the transmission medium 125 by an electromagnetic wave having a frequency that falls within a limited range (such as Fc to 2Fc) of the lower cut-off frequency Fc of the transmission medium for this particular non-circular mode. In particular, the electromagnetic field distribution 520 at 6 GHz falls within this modal "sweet spot" that enhances electromagnetic wave propagation along an insulated transmission medium and reduces end-to-end transmission loss. In this particular mode, guided waves are partially embedded in the insulator and partially radiating on the outer surface of the insulator. In this fashion, the electromagnetic waves are "lightly" coupled to the insulator so as to enable guided electromagnetic wave propagation at long distances with low propagation loss.

At lower frequencies represented by the electromagnetic field distribution 510 at 3 GHz, the non-circular mode radiates more heavily generating higher propagation losses. At higher frequencies represented by the electromagnetic field distribution 530 at 9 GHz, the non-circular mode shifts more and more inward of the insulating jacket providing too much absorption, again generating higher propagation losses.

Figure 5B:
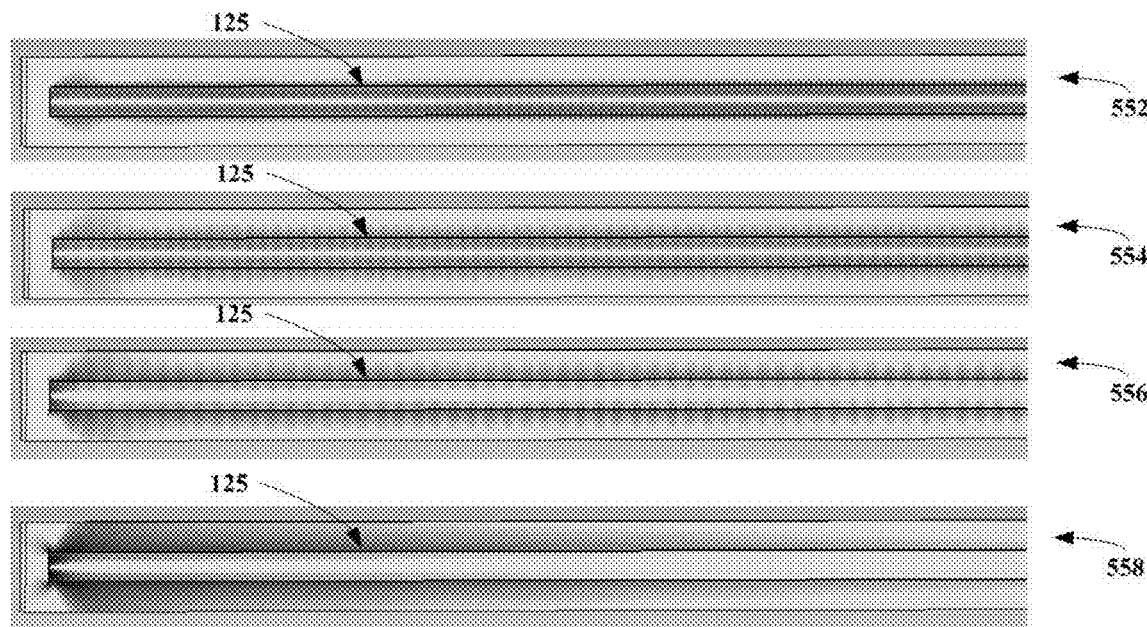
FIG. 5B is a graphical diagram illustrating example, non-limiting embodiments of a longitudinal cross-section of an insulated wire depicting fields of guided electromagnetic waves at various operating frequencies in accordance with various aspects described herein.

Referring now to FIG. 5B, a graphical diagram 550 illustrating example, non-limiting embodiments of a longitudinal cross-section of a transmission medium 125, such as an insulated wire, depicting fields of guided electromagnetic waves at various operating frequencies is shown. As shown in diagram 556, when the guided electromagnetic waves are at approximately the cutoff frequency ($f_c$) corresponding to the modal "sweet spot", the guided electromagnetic waves are loosely coupled to the insulated wire so that absorption is reduced, and the fields of the guided electromagnetic waves are bound sufficiently to reduce the amount radiated into the environment (e.g., air). Because absorption and radiation of the fields of the guided electromagnetic waves is low, propagation losses are consequently low, enabling the guided electromagnetic waves to propagate for longer distances.

As shown in diagram 554, propagation losses increase when an operating frequency of the guide electromagnetic waves increases above about two-times the cutoff frequency ($f_c$)—or as referred to, above the range of the "sweet spot". More of the field strength of the electromagnetic wave is driven inside the insulating layer, increasing propagation losses. At frequencies much higher than the cutoff frequency ($f_c$) the guided electromagnetic waves are strongly bound to the insulated wire as a result of the fields emitted by the guided electromagnetic waves being concentrated in the insulation layer of the wire, as shown in diagram 552. This in turn raises propagation losses further due to absorption of the guided electromagnetic waves by the insulation layer. Similarly, propagation losses increase when the operating frequency of the guided electromagnetic waves is substantially below the cutoff frequency ($f_c$), as shown in diagram 558. At frequencies much lower than the cutoff frequency ($f_c$) the guided electromagnetic waves are weakly (or nominally) bound to the insulated wire and thereby tend to radiate into the environment (e.g., air), which in turn, raises propagation losses due to radiation of the guided electromagnetic waves.

Figure 6:
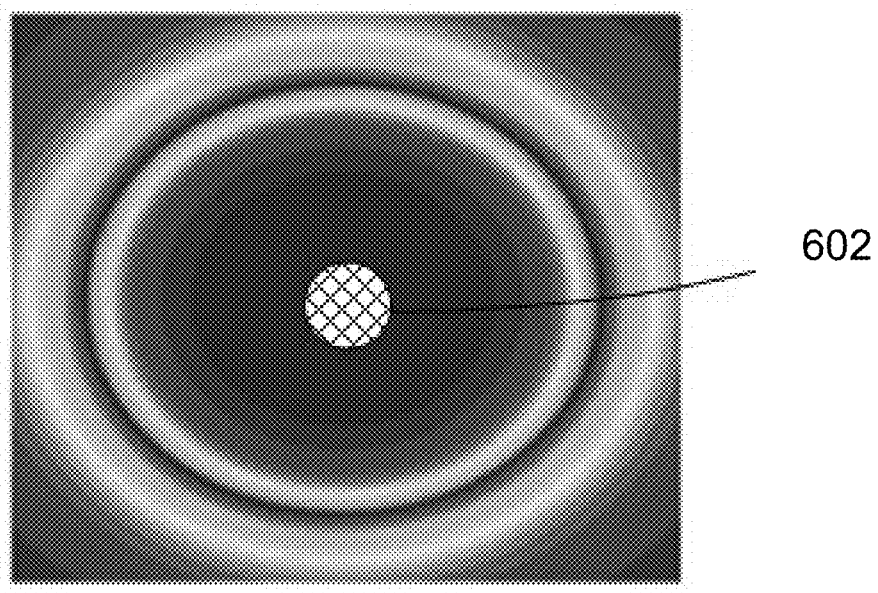
FIG. 6 is a graphical diagram illustrating an example, non-limiting embodiment of an electromagnetic field distribution in accordance with various aspects described herein.

Referring now to FIG. 6, a graphical diagram 600 illustrating an example, non-limiting embodiment of an electromagnetic field distribution is shown. In this embodiment, a transmission medium 602 is a bare wire, as shown in cross section. The diagram 600 includes different gray-scales that represent differing electromagnetic field strengths generated by the propagation of a guided wave having a symmetrical and fundamental TM00 guided wave mode at a single carrier frequency.

In this particular mode, electromagnetic waves are guided by the transmission medium 602 to propagate along an outer surface of the transmission medium—in this case, the outer surface of the bare wire. Electromagnetic waves are "lightly" coupled to the wire so as to enable electromagnetic wave propagation at long distances with low propagation loss. As shown, the guided wave has a field structure that lies substantially outside of the transmission medium 602 that serves to guide the electromagnetic waves. The regions inside the conductor of the transmission medium 602 have little or no field strength.

Figure 7:
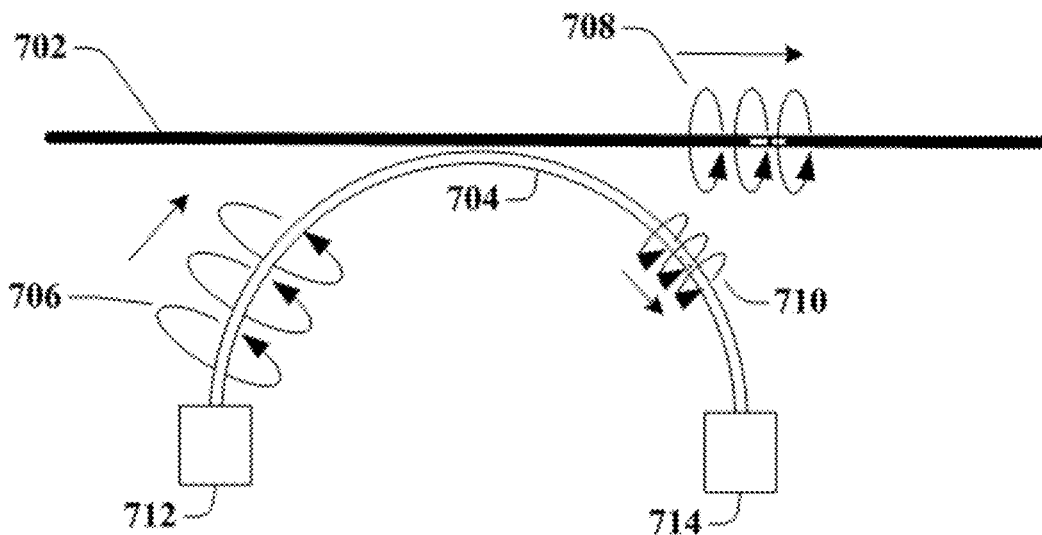
FIG. 7 is a block diagram illustrating an example, non-limiting embodiment of an arc coupler in accordance with various aspects described herein.

Referring now to FIG. 7, a block diagram 700 illustrating an example, non-limiting embodiment of an arc coupler is shown. In particular a coupling device is presented for use in a transmission device, such as transmission device 101 or 102 presented in conjunction with FIG. 1. The coupling device includes an arc coupler 704 coupled to a transmitter circuit 712 and termination or damper 714. The arc coupler 704 can be made of a dielectric material, or other low-loss insulator (e.g., Teflon, polyethylene, etc.), or made of a conducting (e.g., metallic, non-metallic, etc.) material, or any combination of the foregoing materials. As shown, the arc coupler 704 operates as a waveguide and has a wave 706 propagating as a guided wave, within and about a waveguide surface of the arc coupler 704. In the embodiment shown, at least a portion of the arc coupler 704 can be placed near a wire 702 or other transmission medium, (such as transmission medium 125), in order to facilitate coupling between the arc coupler 704 and the wire 702 or other transmission medium, as described herein to launch the guided wave 708 on the wire. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 706 travelling along the arc coupler 704 couples, at least in part, to the wire 702, and propagates as guided wave 708 around or about the wire surface of the wire 702 and longitudinally along the wire 702. The guided wave 708 can be characterized as a surface wave or other electromagnetic wave that is guided by or bound to the wire 702 or other transmission medium.

A portion of the wave 706 that does not couple to the wire 702 propagates as a wave 710 along the arc coupler 704. It will be appreciated that the arc coupler 704 can be configured and arranged in a variety of positions in relation to the wire 702 to achieve a desired level of coupling or non-coupling of the wave 706 to the wire 702. For example, the curvature and/or length of the arc coupler 704 that is parallel or substantially parallel, as well as its separation distance (which can include zero separation distance in an embodiment), to the wire 702 can be varied without departing from example embodiments. Likewise, the arrangement of arc coupler 704 in relation to the wire 702 may be varied based upon considerations of the respective intrinsic characteristics (e.g., thickness, composition, electromagnetic properties, etc.) of the wire 702 and the arc coupler 704, as well as the characteristics (e.g., frequency, energy level, etc.) of the waves 706 and 708.

The guided wave 708 stays parallel or substantially parallel to the wire 702, even as the wire 702 bends and flexes. Bends in the wire 702 can increase transmission losses, which are also dependent on wire diameters, frequency, and materials. If the dimensions of the arc coupler 704 are chosen for efficient power transfer, most of the power in the wave 706 is transferred to the wire 702, with little power remaining in wave 710. It will be appreciated that the guided wave 708 can still be multi-modal in nature (discussed herein), including having modes that are non-circular, non-fundamental and/or asymmetric, while traveling along a path that is parallel or substantially parallel to the wire 702, with or without a fundamental transmission mode. In an embodiment, non-circular, non-fundamental and/or asymmetric modes can be utilized to minimize transmission losses and/or obtain increased propagation distances.

It is noted that the term "parallel" is generally a geometric construct which often is not exactly achievable in real systems. Accordingly, the term "parallel" as utilized in the subject disclosure represents an approximation rather than an exact configuration when used to describe embodiments disclosed in the subject disclosure. In an embodiment, "substantially parallel" can include approximations that are within 30 degrees of true parallel in all dimensions.

In an embodiment, the wave 706 can exhibit one or more wave propagation modes. The arc coupler modes can be dependent on the shape and/or design of the coupler 704. The one or more arc coupler modes of wave 706 can generate, influence, or impact one or more wave propagation modes of the guided wave 708 propagating along wire 702. It should be particularly noted however that the guided wave modes present in the guided wave 706 may be the same or different from the guided wave modes of the guided wave 708. In this fashion, one or more guided wave modes of the guided wave 706 may not be transferred to the guided wave 708, and further one or more guided wave modes of guided wave 708 may not have been present in guided wave 706. It should also be noted that the cut-off frequency of the arc coupler 704 for a particular guided wave mode may be different than the cutoff frequency of the wire 702 or other transmission medium for that same mode. For example, while the wire 702 or other transmission medium may be operated slightly above its cutoff frequency for a particular guided wave mode, the arc coupler 704 may be operated well above its cut-off frequency for that same mode for low loss, slightly below its cut-off frequency for that same mode to, for example, induce greater coupling and power transfer, or some other point in relation to the arc coupler's cutoff frequency for that mode.

In an embodiment, the wave propagation modes on the wire 702 can be similar to the arc coupler modes since both waves 706 and 708 propagate about the outside of the arc coupler 704 and wire 702 respectively. In some embodiments, as the wave 706 couples to the wire 702, the modes can change form, or new modes can be created or generated, due to the coupling between the arc coupler 704 and the wire 702. For example, differences in size, material, and/or impedances of the arc coupler 704 and wire 702 may create additional modes not present in the arc coupler modes and/or suppress some of the arc coupler modes. The wave propagation modes can comprise the fundamental transverse magnetic mode ($TM_{00}$), where only small magnetic fields extend in the direction of propagation, and the electric field extends radially outwards and then longitudinally while the guided wave propagates along the wire. This guided wave mode can be donut shaped, where only a portion of the electromagnetic fields exist within the arc coupler 704 or wire 702.

While the waves 706 and 708 can comprise a fundamental TM mode, the waves 706 and 708, also or in the alternative, can comprise non-fundamental TM modes. While particular wave propagation modes are discussed above, other wave propagation modes in or along the coupler and/or along the wire are likewise possible such as transverse electric (TE) and hybrid (EH or HE) modes, based on the frequencies employed, the design of the arc coupler 704, the dimensions and composition of the wire 702, as well as its surface characteristics, its insulation if present, the electromagnetic properties of the surrounding environment, etc. It should be noted that, depending on the frequency, the electrical and physical characteristics of the wire 702 and the particular wave propagation modes that are generated, guided wave 708 can travel along the conductive surface of an oxidized uninsulated wire, an unoxidized uninsulated wire, an insulated wire and/or along the insulating surface of an insulated wire.

In an embodiment, a diameter of the arc coupler 704 is smaller than the diameter of the wire 702. For the millimeter-band wavelength being used, the arc coupler 704 supports a single waveguide mode that makes up wave 706. This single waveguide mode can change as it couples to the wire 702 as guided wave 708. If the arc coupler 704 were larger, more than one waveguide mode can be supported, but these additional waveguide modes may not couple to the wire 702 as efficiently, and higher coupling losses can result. However, in some alternative embodiments, the diameter of the arc coupler 704 can be equal to or larger than the diameter of the wire 702, for example, where higher coupling losses are desirable or when used in conjunction with other techniques to otherwise reduce coupling losses (e.g., impedance matching with tapering, etc.).

In an embodiment, the wavelength of the waves 706 and 708 are comparable in size, or smaller than a circumference of the arc coupler 704 and the wire 702. In an example, if the wire 702 has a diameter of 0.5 cm, and a corresponding circumference of around 1.5 cm, the wavelength of the transmission is around 1.5 cm or less, corresponding to a frequency of 70 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the arc coupler 704 and wire 702 is comparable in size to, or greater, than a wavelength of the transmission, the waves 706 and 708 can exhibit multiple wave propagation modes including fundamental and/or non-fundamental (symmetric and/or asymmetric, circular and/or non-circular) modes that propagate over sufficient distances to support various communication systems described herein. The waves 706 and 708 can therefore comprise more than one type of electric and magnetic field configuration. In an embodiment, as the guided wave 708 propagates down the wire 702, the electrical and magnetic field configurations will remain the same from end to end of the wire 702. In other embodiments, as the guided wave 708 encounters interference (distortion or obstructions) or loses energy due to transmission losses or scattering, the electric and magnetic field configurations can change as the guided wave 708 propagates down wire 702.

In an embodiment, the arc coupler 704 can be composed of nylon, Teflon, polyethylene, a polyamide, or other plastics. In other embodiments, other dielectric materials can be employed. The wire surface of wire 702 can be metallic with either a bare metallic surface, or can be insulated using plastic, dielectric, insulator or other coating, jacket or sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 702 (e.g., resulting from exposure of the bare metallic surface to oxygen/air) can also provide insulating or dielectric properties similar to those provided by some insulators or sheathings.

It is noted that the graphical representations of waves 706, 708 and 710 are presented merely to illustrate the principles that wave 706 induces or otherwise launches a guided wave 708 on a wire 702 that operates, for example, as a single wire transmission line. Wave 710 represents the portion of wave 706 that remains on the arc coupler 704 after the generation of guided wave 708. The actual electric and magnetic fields generated as a result of such wave propagation may vary depending on the frequencies employed, the particular wave propagation mode or modes, the design of the arc coupler 704, the dimensions and composition of the wire 702, as well as its surface characteristics, its optional insulation, the electromagnetic properties of the surrounding environment, etc.

It is noted that arc coupler 704 can include a termination circuit or damper 714 at the end of the arc coupler 704 that can absorb leftover radiation or energy from wave 710. The termination circuit or damper 714 can prevent and/or minimize the leftover radiation or energy from wave 710 reflecting back toward transmitter circuit 712. In an embodiment, the termination circuit or damper 714 can include termination resistors, absorbing materials and/or other components that perform impedance matching to attenuate reflection. In some embodiments, if the coupling efficiencies are high enough, and/or wave 710 is sufficiently small, it may not be necessary to use a termination circuit or damper 714. For the sake of simplicity, these transmitter 712 and termination circuits or dampers 714 may not be depicted in the other figures, but in those embodiments, transmitter and termination circuits or dampers may possibly be used.

Further, while a single arc coupler 704 is presented that generates a single guided wave 708, multiple arc couplers 704 placed at different points along the wire 702 and/or at different azimuthal orientations about the wire can be employed to generate and receive multiple guided waves 708 at the same or different frequencies, at the same or different phases, at the same or different wave propagation modes.

Figure 8:
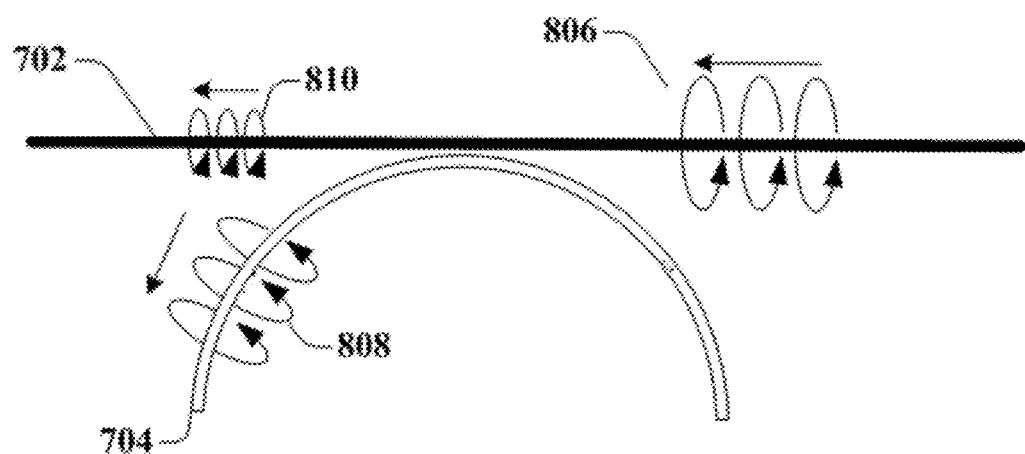
FIG. 8 is a block diagram illustrating an example, non-limiting embodiment of an arc coupler in accordance with various aspects described herein.

FIG. 8, a block diagram 800 illustrating an example, non-limiting embodiment of an arc coupler is shown. In the embodiment shown, at least a portion of the coupler 704 can be placed near a wire 702 or other transmission medium, (such as transmission medium 125), in order to facilitate coupling between the arc coupler 704 and the wire 702 or other transmission medium, to extract a portion of the guided wave 806 as a guided wave 808 as described herein. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 806 travelling along the wire 702 couples, at least in part, to the arc coupler 704, and propagates as guided wave 808 along the arc coupler 704 to a receiving device (not expressly shown). A portion of the wave 806 that does not couple to the arc coupler propagates as wave 810 along the wire 702 or other transmission medium.

In an embodiment, the wave 806 can exhibit one or more wave propagation modes. The arc coupler modes can be dependent on the shape and/or design of the coupler 704. The one or more modes of guided wave 806 can generate, influence, or impact one or more guide-wave modes of the guided wave 808 propagating along the arc coupler 704. It should be particularly noted however that the guided wave modes present in the guided wave 806 may be the same or different from the guided wave modes of the guided wave 808. In this fashion, one or more guided wave modes of the guided wave 806 may not be transferred to the guided wave 808, and further one or more guided wave modes of guided wave 808 may not have been present in guided wave 806.

Figure 9A:
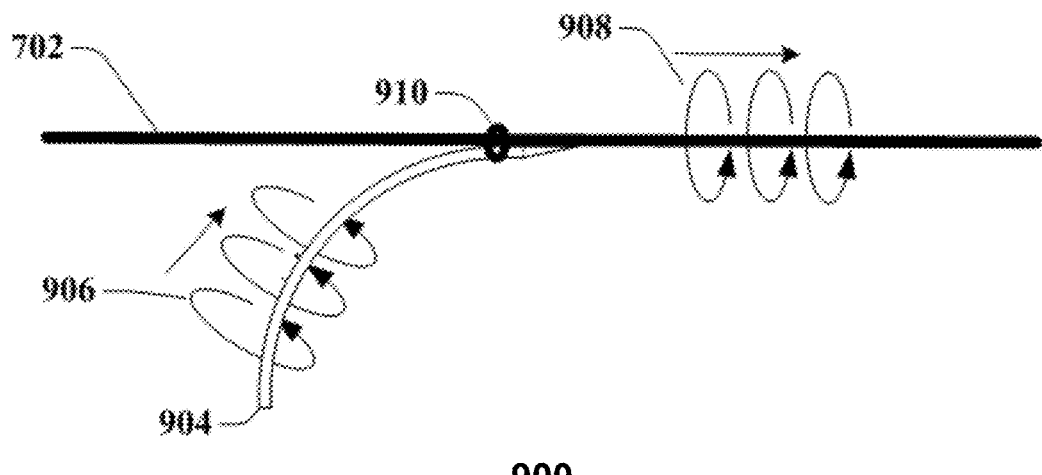
FIG. 9A is a block diagram illustrating an example, non-limiting embodiment of a stub coupler in accordance with various aspects described herein.

Referring now to FIG. 9A, a block diagram 900 illustrating an example, non-limiting embodiment of a stub coupler is shown. In particular a coupling device that includes stub coupler 904 is presented for use in a transmission device, such as transmission device 101 or 102 presented in conjunction with FIG. 1. The stub coupler 904 can be made of a dielectric material, or other low-loss insulator (e.g., Teflon, polyethylene and etc.), or made of a conducting (e.g., metallic, non-metallic, etc.) material, or any combination of the foregoing materials. As shown, the stub coupler 904 operates as a waveguide and has a wave 906 propagating as a guided wave within and about a waveguide surface of the stub coupler 904. In the embodiment shown, at least a portion of the stub coupler 904 can be placed near a wire 702 or other transmission medium, (such as transmission medium 125), in order to facilitate coupling between the stub coupler 904 and the wire 702 or other transmission medium, as described herein to launch the guided wave 908 on the wire.

In an embodiment, the stub coupler 904 is curved, and an end of the stub coupler 904 can be tied, fastened, or otherwise mechanically coupled to a wire 702. When the end of the stub coupler 904 is fastened to the wire 702, the end of the stub coupler 904 is parallel or substantially parallel to the wire 702. Alternatively, another portion of the dielectric waveguide beyond an end can be fastened or coupled to wire 702 such that the fastened or coupled portion is parallel or substantially parallel to the wire 702. The fastener 910 can be a nylon cable tie or other type of non-conducting/dielectric material that is either separate from the stub coupler 904 or constructed as an integrated component of the stub coupler 904. The stub coupler 904 can be adjacent to the wire 702 without surrounding the wire 702.

Like the arc coupler 704 described in conjunction with FIG. 7, when the stub coupler 904 is placed with the end parallel to the wire 702, the guided wave 906 travelling along the stub coupler 904 couples to the wire 702, and propagates as guided wave 908 about the wire surface of the wire 702. In an example embodiment, the guided wave 908 can be characterized as a surface wave or other electromagnetic wave.

It is noted that the graphical representations of waves 906 and 908 are presented merely to illustrate the principles that wave 906 induces or otherwise launches a guided wave 908 on a wire 702 that operates, for example, as a single wire transmission line. The actual electric and magnetic fields generated as a result of such wave propagation may vary depending on one or more of the shape and/or design of the coupler, the relative position of the dielectric waveguide to the wire, the frequencies employed, the design of the stub coupler 904, the dimensions and composition of the wire 702, as well as its surface characteristics, its optional insulation, the electromagnetic properties of the surrounding environment, etc.

In an embodiment, an end of stub coupler 904 can taper towards the wire 702 in order to increase coupling efficiencies. Indeed, the tapering of the end of the stub coupler 904 can provide impedance matching to the wire 702 and reduce reflections, according to an example embodiment of the subject disclosure. For example, an end of the stub coupler 904 can be gradually tapered in order to obtain a desired level of coupling between waves 906 and 908 as illustrated in FIG. 9A.

In an embodiment, the fastener 910 can be placed such that there is a short length of the stub coupler 904 between the fastener 910 and an end of the stub coupler 904. Maximum coupling efficiencies are realized in this embodiment when the length of the end of the stub coupler 904 that is beyond the fastener 910 is at least several wavelengths long for whatever frequency is being transmitted.

Figure 9B:
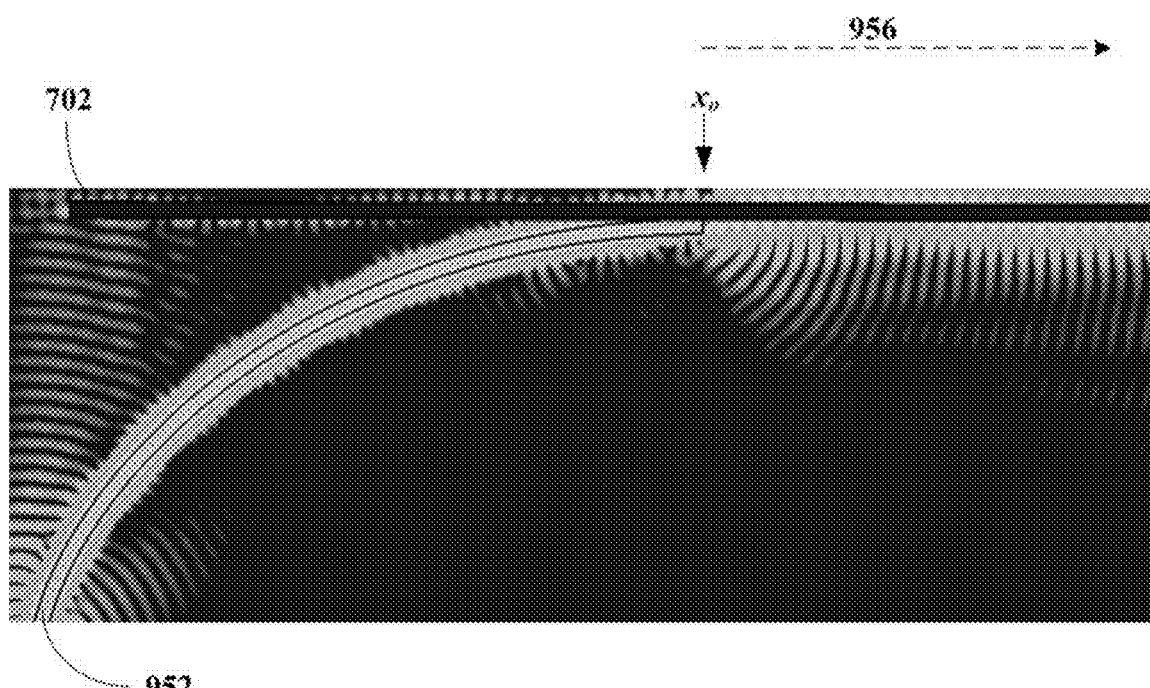
FIG. 9B is a diagram illustrating an example, non-limiting embodiment of an electromagnetic distribution in accordance with various aspects described herein.

Turning now to FIG. 9B, a diagram 950 illustrating an example, non-limiting embodiment of an electromagnetic distribution in accordance with various aspects described herein is shown. In particular, an electromagnetic distribution is presented in two dimensions for a transmission device that includes coupler 952, shown in an example stub coupler constructed of a dielectric material. The coupler 952 couples an electromagnetic wave for propagation as a guided wave along an outer surface of a wire 702 or other transmission medium.

The coupler 952 guides the electromagnetic wave to a junction at $x_0$ via a symmetrical guided wave mode. While some of the energy of the electromagnetic wave that propagates along the coupler 952 is outside of the coupler 952, the majority of the energy of this electromagnetic wave is contained within the coupler 952. The junction at $x_0$ couples the electromagnetic wave to the wire 702 or other transmission medium at an azimuthal angle corresponding to the bottom of the transmission medium. This coupling induces an electromagnetic wave that is guided to propagate along the outer surface of the wire 702 or other transmission medium via at least one guided wave mode in direction 956. The majority of the energy of the guided electromagnetic wave is outside or, but in close proximity to the outer surface of the wire 702 or other transmission medium. In the example shown, the junction at $x_0$ forms an electromagnetic wave that propagates via both a fundamental TM00 mode and at least one non-fundamental mode, such as the first order mode presented in conjunction with FIG. 3, that skims the surface of the wire 702 or other transmission medium.

It is noted that the graphical representations of guided waves are presented merely to illustrate an example of guided wave coupling and propagation. The actual electric and magnetic fields generated as a result of such wave propagation may vary depending on the frequencies employed, the design and/or configuration of the coupler 952, the dimensions and composition of the wire 702 or other transmission medium, as well as its surface characteristics, its insulation if present, the electromagnetic properties of the surrounding environment, etc.

Figure 10:
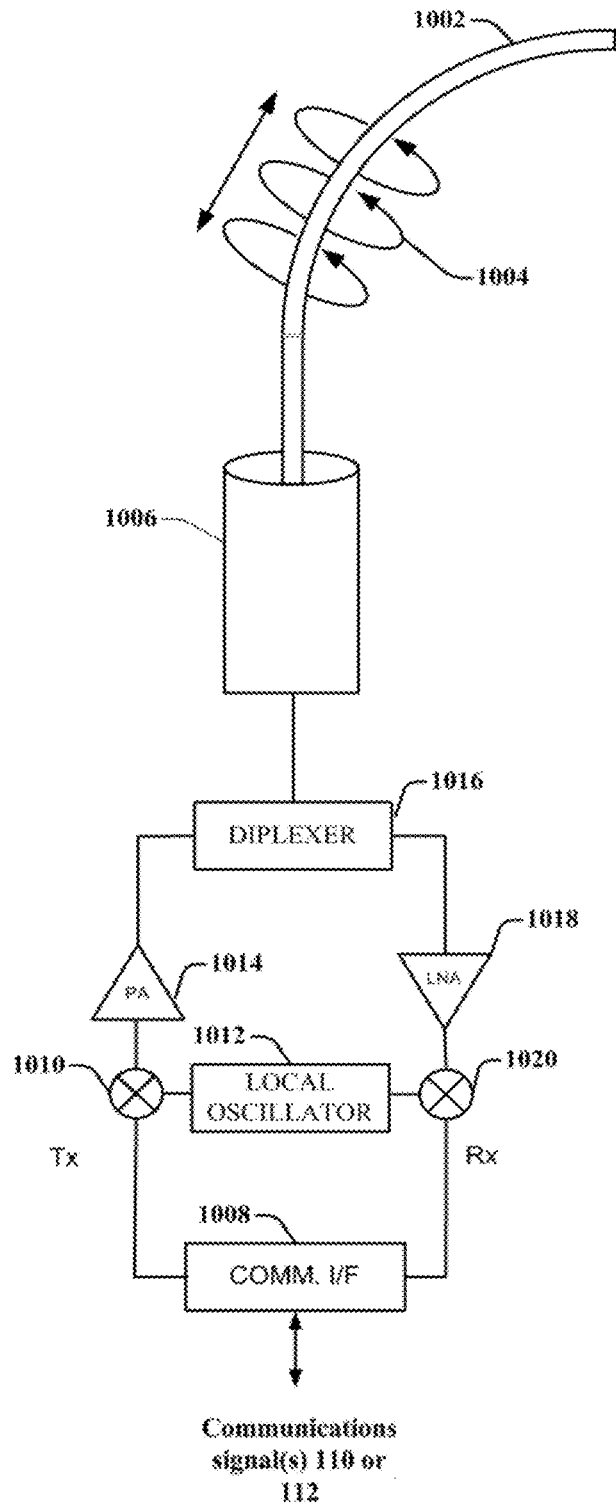
FIG. 10 is a block diagram illustrating an example, non-limiting embodiment of a coupler and transceiver in accordance with various aspects described herein.

Turning now to FIG. 10, illustrated is a block diagram 1000 of an example, non-limiting embodiment of a coupler and transceiver system in accordance with various aspects described herein. The system is an example of transmission device 101 or 102. In particular, the communications interface 1008 is an example of communications interface 205, the stub coupler 1002 is an example of coupler 220, and the transmitter/receiver device 1006, diplexer 1016, power amplifier 1014, low noise amplifier 1018, frequency mixers 1010 and 1020 and local oscillator 1012 collectively form an example of transceiver 210.

In operation, the transmitter/receiver device 1006 launches and receives waves (e.g., guided wave 1004 onto stub coupler 1002). The guided waves 1004 can be used to transport signals received from and sent to a host device, base station, mobile devices, a building or other device by way of a communications interface 1008. The communications interface 1008 can be an integral part of system 1000. Alternatively, the communications interface 1008 can be tethered to system 1000. The communications interface 1008 can comprise a wireless interface for interfacing to the host device, base station, mobile devices, a building or other device utilizing any of various present or future wireless signaling protocols (e.g., LTE, WiFi, WiMAX, IEEE 802.xx, 5G, etc.) including an infrared protocol such as an infrared data association (IrDA) protocol or other line of sight optical protocol. The communications interface 1008 can also comprise a wired interface such as a fiber optic line, coaxial cable, twisted pair, category 5 (CAT-5) cable or other suitable wired or optical media for communicating with the host device, base station, mobile devices, a building or other device via a protocol such as an Ethernet protocol, universal serial bus (USB) protocol, a data over cable service interface specification (DOCSIS) protocol, a digital subscriber line (DSL) protocol, a Firewire (IEEE 1394) protocol, or other wired or optical protocol. For embodiments where system 1000 functions as a repeater, the communications interface 1008 may not be necessary.

The output signals (e.g., Tx) of the communications interface 1008 can be combined with a carrier wave (e.g., millimeter-wave carrier wave) generated by a local oscillator 1012 at frequency mixer 1010. Frequency mixer 1010 can use heterodyning techniques or other frequency shifting techniques to frequency shift the output signals from communications interface 1008. For example, signals sent to and from the communications interface 1008 can be modulated signals such as orthogonal frequency division multiplexed (OFDM) signals formatted in accordance with a Long-Term Evolution (LTE) wireless protocol or other wireless 3G, 4G, 5G or higher voice and data protocol, a Zigbee®, WIMAX, UltraWideband or IEEE 802.11 wireless protocol; a wired protocol such as an Ethernet protocol, universal serial bus (USB) protocol, a data over cable service interface specification (DOCSIS) protocol, a digital subscriber line (DSL) protocol, a Firewire (IEEE 1394) protocol or other wired or wireless protocol. In an example embodiment, this frequency conversion can be done in the analog domain, and as a result, the frequency shifting can be done without regard to the type of communications protocol used by a base station, mobile devices, or in-building devices. As new communications technologies are developed, the communications interface 1008 can be upgraded (e.g., updated with software, firmware, and/or hardware) or replaced and the frequency shifting and transmission apparatus can remain, simplifying upgrades. The carrier wave can then be sent to a power amplifier ("PA") 1014 and can be transmitted via the transmitter receiver device 1006 via the diplexer 1016.

Signals received from the transmitter/receiver device 1006 that are directed towards the communications interface 1008 can be separated from other signals via diplexer 1016. The received signal can then be sent to low noise amplifier ("LNA") 1018 for amplification. A frequency mixer 1020, with help from local oscillator 1012 can downshift the received signal (which is in the millimeter-wave band or around 38 GHz in some embodiments) to the native frequency. The communications interface 1008 can then receive the transmission at an input port (Rx).

In an embodiment, transmitter/receiver device 1006 can include a cylindrical or non-cylindrical metal (which, for example, can be hollow in an embodiment, but not necessarily drawn to scale) or other conducting or non-conducting waveguide and an end of the stub coupler 1002 can be placed in or in proximity to the waveguide or the transmitter/receiver device 1006 such that when the transmitter/receiver device 1006 generates a transmission, the guided wave couples to stub coupler 1002 and propagates as a guided wave 1004 about the waveguide surface of the stub coupler 1002. In some embodiments, the guided wave 1004 can propagate in part on the outer surface of the stub coupler 1002 and in part inside the stub coupler 1002. In other embodiments, the guided wave 1004 can propagate substantially or completely on the outer surface of the stub coupler 1002. In yet other embodiments, the guided wave 1004 can propagate substantially or completely inside the stub coupler 1002. In this latter embodiment, the guided wave 1004 can radiate at an end of the stub coupler 1002 (such as the tapered end shown in FIG. 4) for coupling to a transmission medium such as a wire 702 of FIG. 7. Similarly, if guided wave 1004 is incoming (coupled to the stub coupler 1002 from a wire 702), guided wave 1004 then enters the transmitter/receiver device 1006 and couples to the cylindrical waveguide or conducting waveguide. While transmitter/receiver device 1006 is shown to include a separate waveguide—an antenna, cavity resonator, klystron, magnetron, travelling wave tube, or other radiating element can be employed to induce a guided wave on the coupler 1002, with or without the separate waveguide.

In an embodiment, stub coupler 1002 can be wholly constructed of a dielectric material (or another suitable insulating material), without any metallic or otherwise conducting materials therein. Stub coupler 1002 can be composed of nylon, Teflon, polyethylene, a polyamide, other plastics, or other materials that are non-conducting and suitable for facilitating transmission of electromagnetic waves at least in part on an outer surface of such materials. In another embodiment, stub coupler 1002 can include a core that is conducting/metallic, and have an exterior dielectric surface. Similarly, a transmission medium that couples to the stub coupler 1002 for propagating electromagnetic waves induced by the stub coupler 1002 or for supplying electromagnetic waves to the stub coupler 1002 can, in addition to being a bare or insulated wire, be wholly constructed of a dielectric material (or another suitable insulating material), without any metallic or otherwise conducting materials therein.

It is noted that although FIG. 10 shows that the opening of transmitter receiver device 1006 is much wider than the stub coupler 1002, this is not to scale, and that in other embodiments the width of the stub coupler 1002 is comparable or slightly smaller than the opening of the hollow waveguide. It is also not shown, but in an embodiment, an end of the coupler 1002 that is inserted into the transmitter/receiver device 1006 tapers down in order to reduce reflection and increase coupling efficiencies. The stub coupler 1002 can be representative of the arch coupler 704 of FIGS. 7 and 8, the stub coupler 904 of FIG. 9A, the coupler 952, or any other couplers described in the subject disclosure.

Before coupling to the stub coupler 1002, the one or more waveguide modes of the guided wave generated by the transmitter/receiver device 1006 can couple to the stub coupler 1002 to induce one or more wave propagation modes of the guided wave 1004. The wave propagation modes of the guided wave 1004 can be different than the hollow metal waveguide modes due to the different characteristics of the hollow metal waveguide and the dielectric waveguide. For instance, wave propagation modes of the guided wave 1004 can comprise the fundamental transverse magnetic mode ($TM_{00}$), where only small magnetic fields extend in the direction of propagation, HE11 or other modes supported by the stub coupler 1002 that generate one or more desired wave modes on the transmission medium. The fundamental transverse electromagnetic mode wave propagation mode may or may not exist inside a waveguide that is hollow. Therefore, the hollow metal waveguide modes that are used by transmitter/receiver device 1006 are waveguide modes, such as TE01 or TE11, that can propagate inside a circular, rectangular or other hollow metallic waveguide and couple effectively and efficiently to wave propagation modes of stub coupler 1002.

It will be appreciated that other constructs or combinations of the transmitter/receiver device 1006 and stub coupler 1002 are possible.

Figure 11:
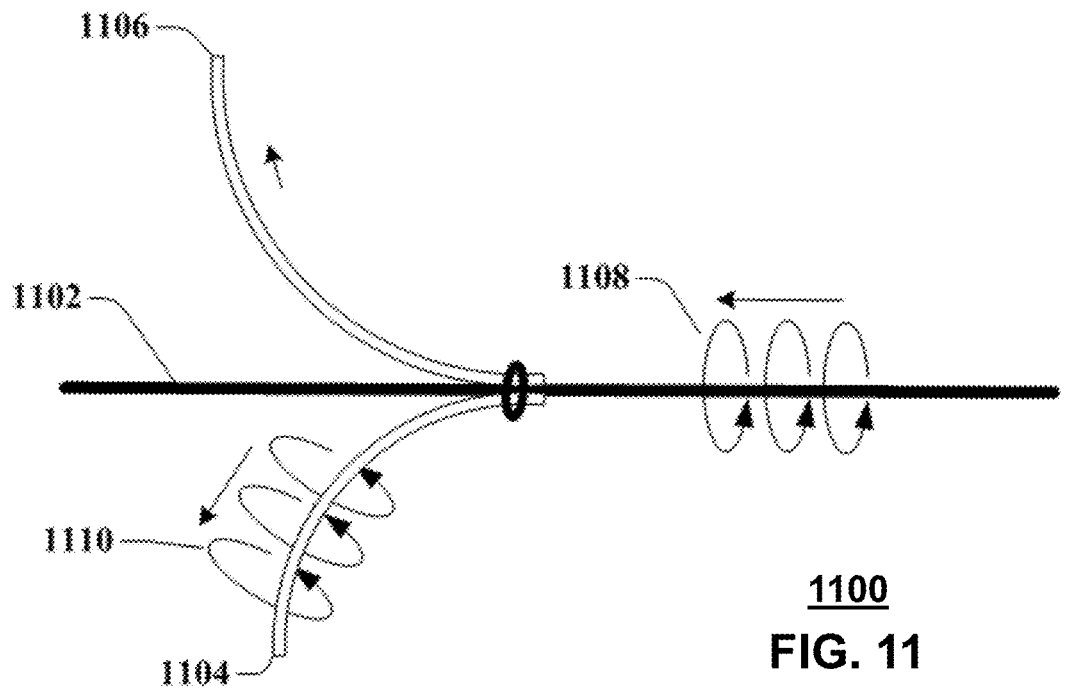
FIG. 11 is a block diagram illustrating an example, non-limiting embodiment of a dual stub coupler in accordance with various aspects described herein.

Referring now to FIG. 11, a block diagram 1100 illustrating an example, non-limiting embodiment of a dual stub coupler is shown. In particular, a dual coupler design is presented for use in a transmission device, such as transmission device 101 or 102 presented in conjunction with FIG. 1. In an embodiment, two or more couplers (such as the stub couplers 1104 and 1106) can be positioned around a wire 1102 in order to receive guided wave 1108. In an embodiment, one coupler is enough to receive the guided wave 1108. In that case, guided wave 1108 couples to coupler 1104 and propagates as guided wave 1110. If the field structure of the guided wave 1108 oscillates or undulates around the wire 1102 due to the particular guided wave mode(s) or various outside factors, then coupler 1106 can be placed such that guided wave 1108 couples to coupler 1106. In some embodiments, four or more couplers can be placed around a portion of the wire 1102, e.g., at 90 degrees or another spacing with respect to each other, in order to receive guided waves that may oscillate or rotate around the wire 1102, that have been induced at different azimuthal orientations or that have non-fundamental or higher order modes that, for example, have lobes and/or nulls or other asymmetries that are orientation dependent. However, it will be appreciated that there may be less than or more than four couplers placed around a portion of the wire 1102 without departing from example embodiments.

It should be noted that while couplers 1106 and 1104 are illustrated as stub couplers, any other of the coupler designs described herein including arc couplers, antenna or horn couplers, magnetic couplers, etc., could likewise be used. It will also be appreciated that while some example embodiments have presented a plurality of couplers around at least a portion of a wire 1102, this plurality of couplers can also be considered as part of a single coupler system having multiple coupler subcomponents. For example, two or more couplers can be manufactured as single system that can be installed around a wire in a single installation such that the couplers are either pre-positioned or adjustable relative to each other (either manually or automatically with a controllable mechanism such as a motor or other actuator) in accordance with the single system.

Receivers coupled to couplers 1106 and 1104 can use diversity combining to combine signals received from both couplers 1106 and 1104 in order to maximize the signal quality. In other embodiments, if one or the other of the couplers 1104 and 1106 receive a transmission that is above a predetermined threshold, receivers can use selection diversity when deciding which signal to use. Further, while reception by a plurality of couplers 1106 and 1104 is illustrated, transmission by couplers 1106 and 1104 in the same configuration can likewise take place. In particular, a wide range of multi-input multi-output (MIMO) transmission and reception techniques can be employed for transmissions where a transmission device, such as transmission device 101 or 102 presented in conjunction with FIG. 1 includes multiple transceivers and multiple couplers. For example, such MIMO transmission and reception techniques include precoding, spatial multiplexing, diversity coding and guided wave mode division multiplexing applied to transmission and reception by multiple couplers/launchers that operate on a transmission medium with one or more surfaces that support guided wave communications.

It is noted that the graphical representations of waves 1108 and 1110 are presented merely to illustrate the principles that guided wave 1108 induces or otherwise launches a wave 1110 on a coupler 1104. The actual electric and magnetic fields generated as a result of such wave propagation may vary depending on the frequencies employed, the design of the coupler 1104, the dimensions and composition of the wire 1102, as well as its surface characteristics, its insulation if any, the electromagnetic properties of the surrounding environment, etc.

Figure 12:
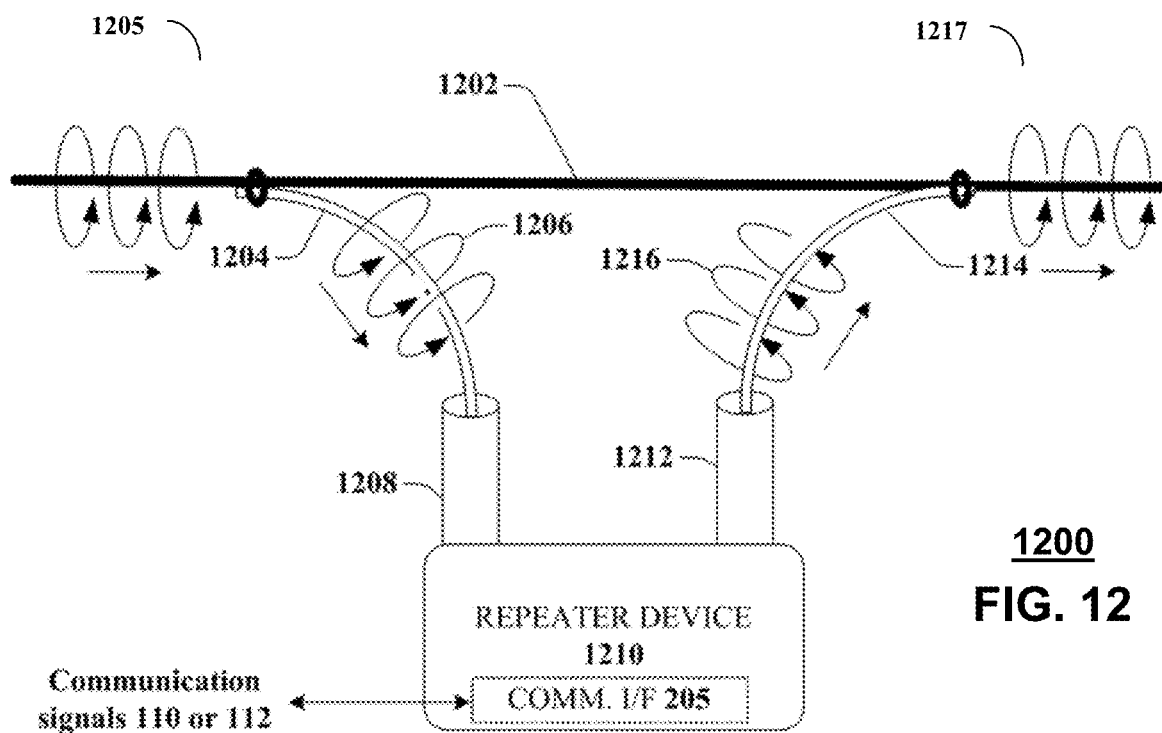
FIG. 12 is a block diagram illustrating an example, non-limiting embodiment of a repeater system in accordance with various aspects described herein.

Referring now to FIG. 12, a block diagram 1200 illustrating an example, non-limiting embodiment of a repeater system is shown. In particular, a repeater device 1210 is presented for use in a transmission device, such as transmission device 101 or 102 presented in conjunction with FIG. 1. In this system, two couplers 1204 and 1214 can be placed near a wire 1202 or other transmission medium such that guided waves 1205 propagating along the wire 1202 are extracted by coupler 1204 as wave 1206 (e.g. as a guided wave), and then are boosted or repeated by repeater device 1210 and launched as a wave 1216 (e.g. as a guided wave) onto coupler 1214. The wave 1216 can then be launched on the wire 1202 and continue to propagate along the wire 1202 as a guided wave 1217. In an embodiment, the repeater device 1210 can receive at least a portion of the power utilized for boosting or repeating through magnetic coupling with the wire 1202, for example, when the wire 1202 is a power line or otherwise contains a power-carrying conductor. It should be noted that while couplers 1204 and 1214 are illustrated as stub couplers, any other of the coupler designs described herein including arc couplers, antenna or horn couplers, magnetic couplers, or the like, could likewise be used.

In some embodiments, repeater device 1210 can repeat the transmission associated with wave 1206, and in other embodiments, repeater device 1210 can include a communications interface 205 that extracts data or other signals from the wave 1206 for supplying such data or signals to another network and/or one or more other devices as communication signals 110 or 112 and/or receiving communication signals 110 or 112 from another network and/or one or more other devices and launch guided wave 1216 having embedded therein the received communication signals 110 or 112. In a repeater configuration, receiver waveguide 1208 can receive the wave 1206 from the coupler 1204 and transmitter waveguide 1212 can launch guided wave 1216 onto coupler 1214 as guided wave 1217. Between receiver waveguide 1208 and transmitter waveguide 1212, the signal embedded in guided wave 1206 and/or the guided wave 1216 itself can be amplified to correct for signal loss and other inefficiencies associated with guided wave communications or the signal can be received and processed to extract the data contained therein and regenerated for transmission. In an embodiment, the receiver waveguide 1208 can be configured to extract data from the signal, process the data to correct for data errors utilizing for example error correcting codes, and regenerate an updated signal with the corrected data. The transmitter waveguide 1212 can then transmit guided wave 1216 with the updated signal embedded therein. In an embodiment, a signal embedded in guided wave 1206 can be extracted from the transmission and processed for communication with another network and/or one or more other devices via communications interface 205 as communication signals 110 or 112. Similarly, communication signals 110 or 112 received by the communications interface 205 can be inserted into a transmission of guided wave 1216 that is generated and launched onto coupler 1214 by transmitter waveguide 1212.

It is noted that although FIG. 12 shows guided wave transmissions 1206 and 1216 entering from the left and exiting to the right respectively, this is merely a simplification and is not intended to be limiting. In other embodiments, receiver waveguide 1208 and transmitter waveguide 1212 can also function as transmitters and receivers respectively, allowing the repeater device 1210 to be bi-directional.

In an embodiment, repeater device 1210 can be placed at locations where there are discontinuities or obstacles on the wire 1202 or other transmission medium. In the case where the wire 1202 is a power line, these obstacles can include transformers, connections, utility poles, and other such power line devices. The repeater device 1210 can help the guided (e.g., surface) waves jump over these obstacles on the line and boost the transmission power at the same time. In other embodiments, a coupler can be used to jump over the obstacle without the use of a repeater device. In that embodiment, both ends of the coupler can be tied or fastened to the wire, thus providing a path for the guided wave to travel without being blocked by the obstacle.

Figure 13:
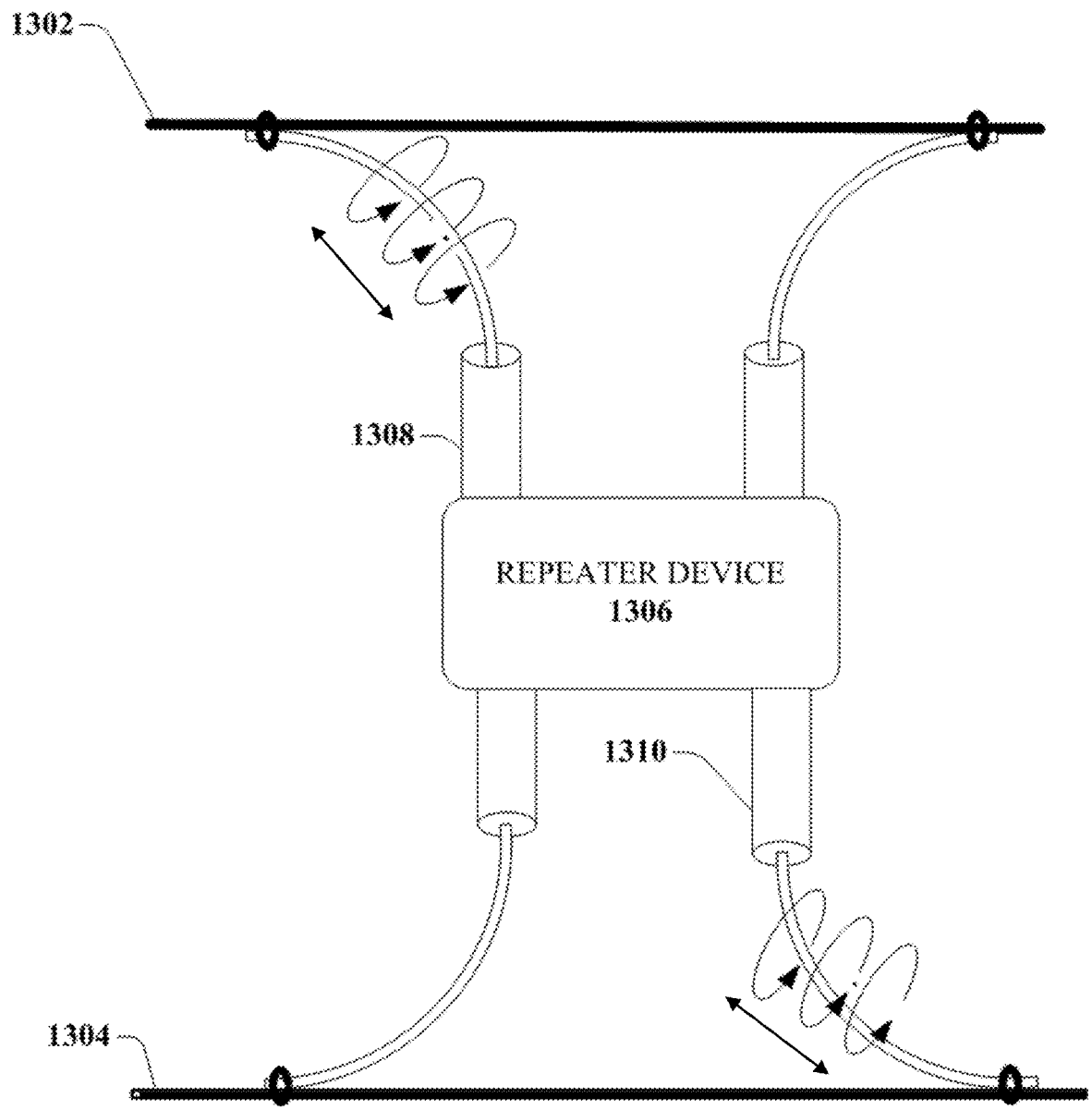
FIG. 13 illustrates a block diagram illustrating an example, non-limiting embodiment of a bidirectional repeater in accordance with various aspects described herein.

Turning now to FIG. 13, illustrated is a block diagram 1300 of an example, non-limiting embodiment of a bidirectional repeater in accordance with various aspects described herein. In particular, a bidirectional repeater device 1306 is presented for use in a transmission device, such as transmission device 101 or 102 presented in conjunction with FIG. 1. It should be noted that while the couplers are illustrated as stub couplers, any other of the coupler designs described herein including arc couplers, antenna or horn couplers, magnetic couplers, or the like, could likewise be used. The bidirectional repeater 1306 can employ diversity paths in the case of when two or more wires or other transmission media are present. Since guided wave transmissions have different transmission efficiencies and coupling efficiencies for transmission medium of different types such as insulated wires, un-insulated wires or other types of transmission media and further, if exposed to the elements, can be affected by weather, and other atmospheric conditions, it can be advantageous to selectively transmit on different transmission media at certain times. In various embodiments, the various transmission media can be designated as a primary, secondary, tertiary, etc. whether or not such designation indicates a preference of one transmission medium over another.

In the embodiment shown, the transmission media include an insulated or uninsulated wire 1302 and an insulated or uninsulated wire 1304 (referred to herein as wires 1302 and 1304, respectively). The repeater device 1306 uses a receiver coupler 1308 to receive a guided wave traveling along wire 1302 and repeats the transmission using transmitter waveguide 1310 as a guided wave along wire 1304. In other embodiments, repeater device 1306 can switch from the wire 1304 to the wire 1302, or can repeat the transmissions along the same paths. Repeater device 1306 can include sensors, or be in communication with sensors (or a network management system 1601 depicted in FIG. 16A) that indicate conditions that can affect the transmission. Based on the feedback received from the sensors, the repeater device 1306 can make the determination about whether to keep the transmission along the same wire, or transfer the transmission to the other wire.

Figure 14:
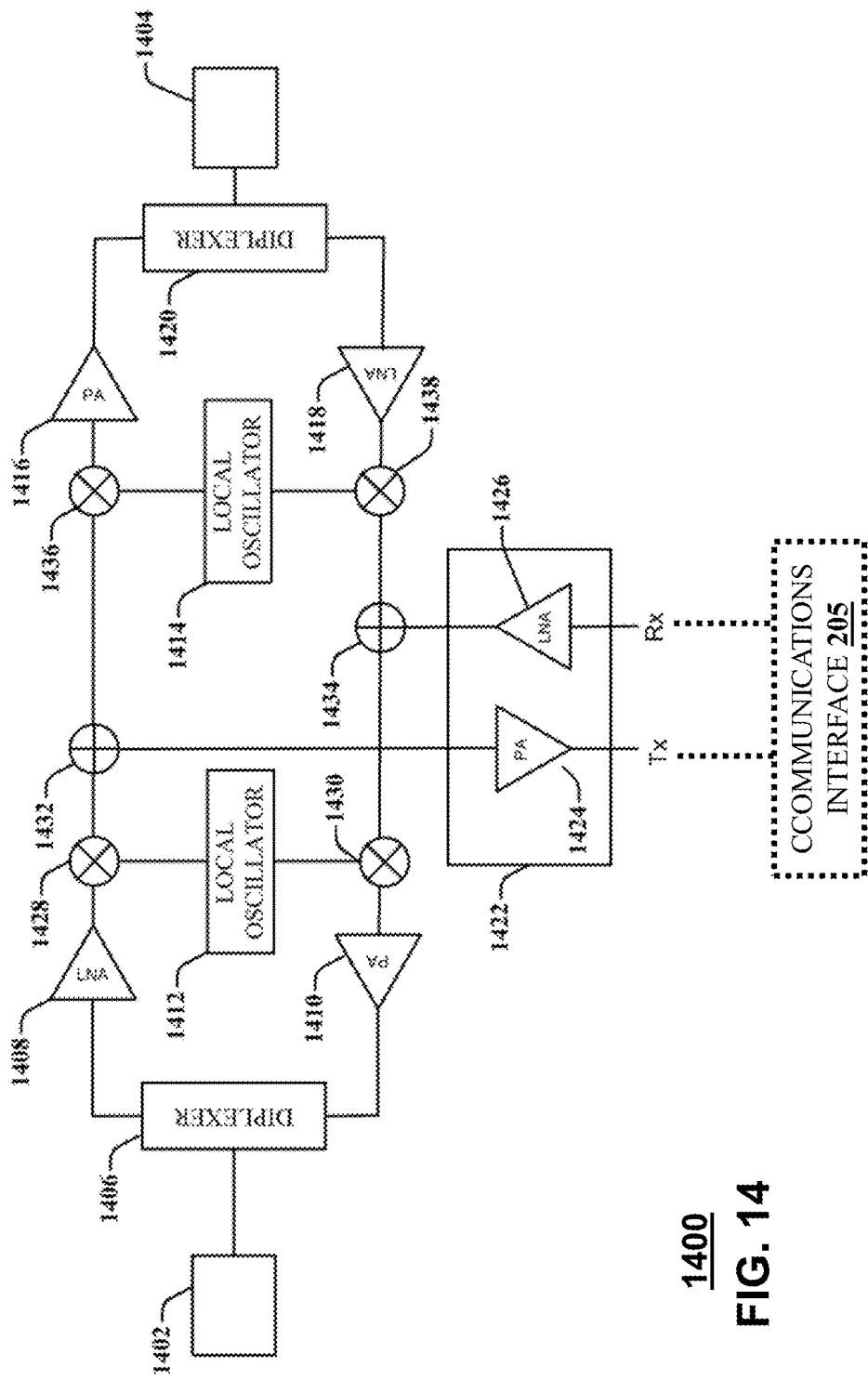
FIG. 14 is a block diagram illustrating an example, non-limiting embodiment of a waveguide system in accordance with various aspects described herein.

Turning now to FIG. 14, illustrated is a block diagram 1400 illustrating an example, non-limiting embodiment of a bidirectional repeater system. In particular, a bidirectional repeater system is presented for use in a transmission device, such as transmission device 101 or 102 presented in conjunction with FIG. 1. The bidirectional repeater system includes waveguide coupling devices 1402 and 1404 that receive and transmit transmissions from other coupling devices located in a distributed antenna system or backhaul system.

In various embodiments, waveguide coupling device 1402 can receive a transmission from another waveguide coupling device, wherein the transmission has a plurality of subcarriers. Diplexer 1406 can separate the transmission from other transmissions, and direct the transmission to low-noise amplifier ("LNA") 1408. A frequency mixer 1428, with help from a local oscillator 1412, can downshift the transmission (which is in the millimeter-wave band or around 38 GHz in some embodiments) to a lower frequency, such as a cellular band (~1.9 GHz) for a distributed antenna system, a native frequency, or other frequency for a backhaul system. An extractor (or demultiplexer) 1432 can extract the signal on a subcarrier and direct the signal to an output component 1422 for optional amplification, buffering or isolation by power amplifier 1424 for coupling to communications interface 205. The communications interface 205 can further process the signals received from the power amplifier 1424 or otherwise transmit such signals over a wireless or wired interface to other devices such as a base station, mobile devices, a building, etc. For the signals that are not being extracted at this location, extractor 1432 can redirect them to another frequency mixer 1436, where the signals are used to modulate a carrier wave generated by local oscillator 1414. The carrier wave, with its subcarriers, is directed to a power amplifier ("PA") 1416 and is retransmitted by waveguide coupling device 1404 to another system, via diplexer 1420.

An LNA 1426 can be used to amplify, buffer or isolate signals that are received by the communication interface 205 and then send the signal to a multiplexer 1434 which merges the signal with signals that have been received from waveguide coupling device 1404. The signals received from coupling device 1404 have been split by diplexer 1420, and then passed through LNA 1418, and downshifted in frequency by frequency mixer 1438. When the signals are combined by multiplexer 1434, they are upshifted in frequency by frequency mixer 1430, and then boosted by PA 1410, and transmitted to another system by waveguide coupling device 1402. In an embodiment bidirectional repeater system can be merely a repeater without the output device 1422. In this embodiment, the multiplexer 1434 would not be utilized and signals from LNA 1418 would be directed to mixer 1430 as previously described. It will be appreciated that in some embodiments, the bidirectional repeater system could also be implemented using two distinct and separate unidirectional repeaters. In an alternative embodiment, a bidirectional repeater system could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 15:
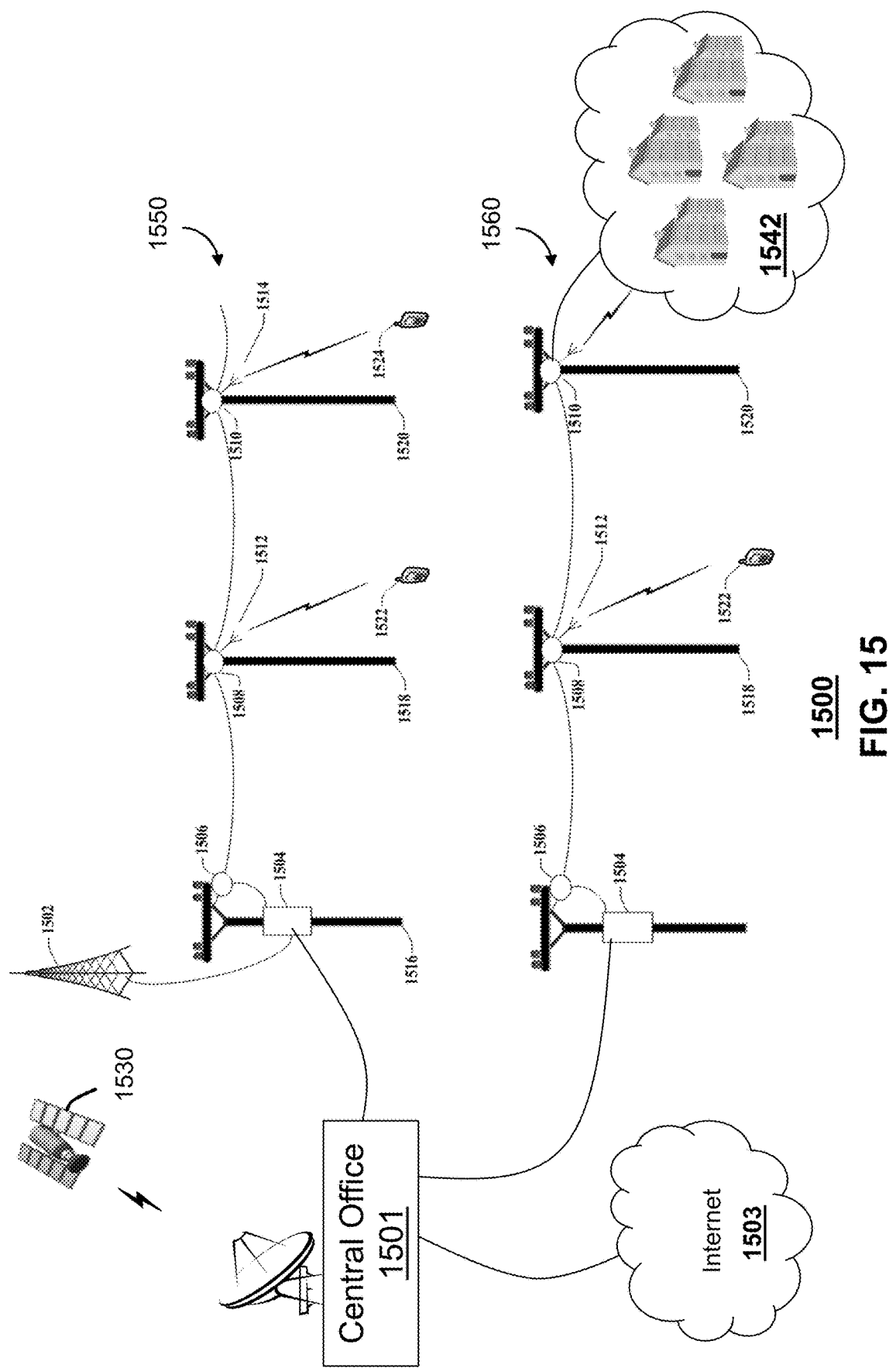
FIG. 15 is a block diagram illustrating an example, non-limiting embodiment of a guided-wave communications system in accordance with various aspects described herein.

Referring now to FIG. 15, a block diagram 1500 illustrating an example, non-limiting embodiment of a guided wave communications system is shown. This diagram depicts an exemplary environment in which a guided wave communication system, such as the guided wave communication system presented in conjunction with FIG. 1, can be used.

To provide network connectivity to additional base station devices, a backhaul network that links the communication cells (e.g., microcells and macrocells) to network devices of a core network correspondingly expands. Similarly, to provide network connectivity to a distributed antenna system, an extended communication system that links base station devices and their distributed antennas is desirable. A guided wave communication system 1500 such as shown in FIG. 15 can be provided to enable alternative, increased or additional network connectivity and a waveguide coupling system can be provided to transmit and/or receive guided wave (e.g., surface wave) communications on a transmission medium such as a wire that operates as a single-wire transmission line (e.g., a utility line), and that can be used as a waveguide and/or that otherwise operates to guide the transmission of an electromagnetic wave.

The guided wave communication system 1500 can comprise a first instance of a distribution system 1550 that includes one or more base station devices (e.g., base station device 1504) that are communicably coupled to a central office 1501 and/or a macrocell site 1502. Base station device 1504 can be connected by a wired (e.g., fiber and/or cable), or by a wireless (e.g., microwave wireless) connection to the macrocell site 1502 and the central office 1501. A second instance of the distribution system 1560 can be used to provide wireless voice and data services to mobile device 1522 and to residential and/or commercial establishments 1542 (herein referred to as establishments 1542). System 1500 can have additional instances of the distribution systems 1550 and 1560 for providing voice and/or data services to mobile devices 1522-1524 and establishments 1542 as shown in FIG. 15.

Macrocells such as macrocell site 1502 can have dedicated connections to a mobile network and base station device 1504 or can share and/or otherwise use another connection. Central office 1501 can be used to distribute media content and/or provide internet service provider (ISP) services to mobile devices 1522-1524 and establishments 1542. The central office 1501 can receive media content from a constellation of satellites 1530 (one of which is shown in FIG. 15) or other sources of content, and distribute such content to mobile devices 1522-1524 and establishments 1542 via the first and second instances of the distribution system 1550 and 1560. The central office 1501 can also be communicatively coupled to the Internet 1503 for providing internet data services to mobile devices 1522-1524 and establishments 1542.

Base station device 1504 can be mounted on, or attached to, utility pole 1516. In other embodiments, base station device 1504 can be near transformers and/or other locations situated nearby a power line. Base station device 1504 can facilitate connectivity to a mobile network for mobile devices 1522 and 1524. Antennas 1512 and 1514, mounted on or near utility poles 1518 and 1520, respectively, can receive signals from base station device 1504 and transmit those signals to mobile devices 1522 and 1524 over a much wider area than if the antennas 1512 and 1514 were located at or near base station device 1504.

It is noted that FIG. 15 displays three utility poles, in each instance of the distribution systems 1550 and 1560, with one base station device, for purposes of simplicity. In other embodiments, utility pole 1516 can have more base station devices, and more utility poles with distributed antennas and/or tethered connections to establishments 1542.

A transmission device 1506, such as transmission device 101 or 102 presented in conjunction with FIG. 1, can transmit a signal from base station device 1504 to antennas 1512 and 1514 via utility or power line(s) that connect the utility poles 1516, 1518, and 1520. To transmit the signal, radio source and/or transmission device 1506 upconverts the signal (e.g., via frequency mixing) from base station device 1504 or otherwise converts the signal from the base station device 1504 to a microwave band signal and the transmission device 1506 launches a microwave band wave that propagates as a guided wave traveling along the utility line or other wire as described in previous embodiments. At utility pole 1518, another transmission device 1508 receives the guided wave (and optionally can amplify it as needed or desired or operate as a repeater to receive it and regenerate it) and sends it forward as a guided wave on the utility line or other wire. The transmission device 1508 can also extract a signal from the microwave band guided wave and shift it down in frequency or otherwise convert it to its original cellular band frequency (e.g., 1.9 GHz or other defined cellular frequency) or another cellular (or non-cellular) band frequency. An antenna 1512 can wireless transmit the downshifted signal to mobile device 1522. The process can be repeated by transmission device 1510, antenna 1514 and mobile device 1524, as necessary or desirable.

Transmissions from mobile devices 1522 and 1524 can also be received by antennas 1512 and 1514 respectively. The transmission devices 1508 and 1510 can upshift or otherwise convert the cellular band signals to microwave band and transmit the signals as guided wave (e.g., surface wave or other electromagnetic wave) transmissions over the power line(s) to base station device 1504.

Media content received by the central office 1501 can be supplied to the second instance of the distribution system 1560 via the base station device 1504 for distribution to mobile devices 1522 and establishments 1542. The transmission device 1510 can be tethered to the establishments 1542 by one or more wired connections or a wireless interface. The one or more wired connections may include without limitation, a power line, a coaxial cable, a fiber cable, a twisted pair cable, a guided wave transmission medium or other suitable wired media for distribution of media content and/or for providing internet services. In an example embodiment, the wired connections from the transmission device 1510 can be communicatively coupled to one or more very high bit rate digital subscriber line (VDSL) modems located at one or more corresponding service area interfaces (SAIs—not shown) or pedestals, each SAI or pedestal providing services to a portion of the establishments 1542. The VDSL modems can be used to selectively distribute media content and/or provide internet services to gateways (not shown) located in the establishments 1542. The SAIs or pedestals can also be communicatively coupled to the establishments 1542 over a wired medium such as a power line, a coaxial cable, a fiber cable, a twisted pair cable, a guided wave transmission medium or other suitable wired media. In other example embodiments, the transmission device 1510 can be communicatively coupled directly to establishments 1542 without intermediate interfaces such as the SAIs or pedestals.

In another example embodiment, system 1500 can employ diversity paths, where two or more utility lines or other wires are strung between the utility poles 1516, 1518, and 1520 (e.g., for example, two or more wires between poles 1516 and 1520) and redundant transmissions from base station/macrocell site 1502 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 1500 can enable alternate routing capabilities, load balancing, increased load handling, concurrent bi-directional or synchronous communications, spread spectrum communications, etc.

It is noted that the use of the transmission devices 1506, 1508, and 1510 in FIG. 15 are by way of example only, and that in other embodiments, other uses are possible. For instance, transmission devices can be used in a backhaul communication system, providing network connectivity to base station devices. Transmission devices 1506, 1508, and 1510 can be used in many circumstances where it is desirable to transmit guided wave communications over a wire, whether insulated or not insulated. Transmission devices 1506, 1508, and 1510 are improvements over other coupling devices due to no contact or limited physical and/or electrical contact with the wires that may carry high voltages. The transmission device can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 1504 and macrocell site 1502 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, Bluetooth® protocol, Zigbee® protocol or other wireless protocol.

Figure 16A:
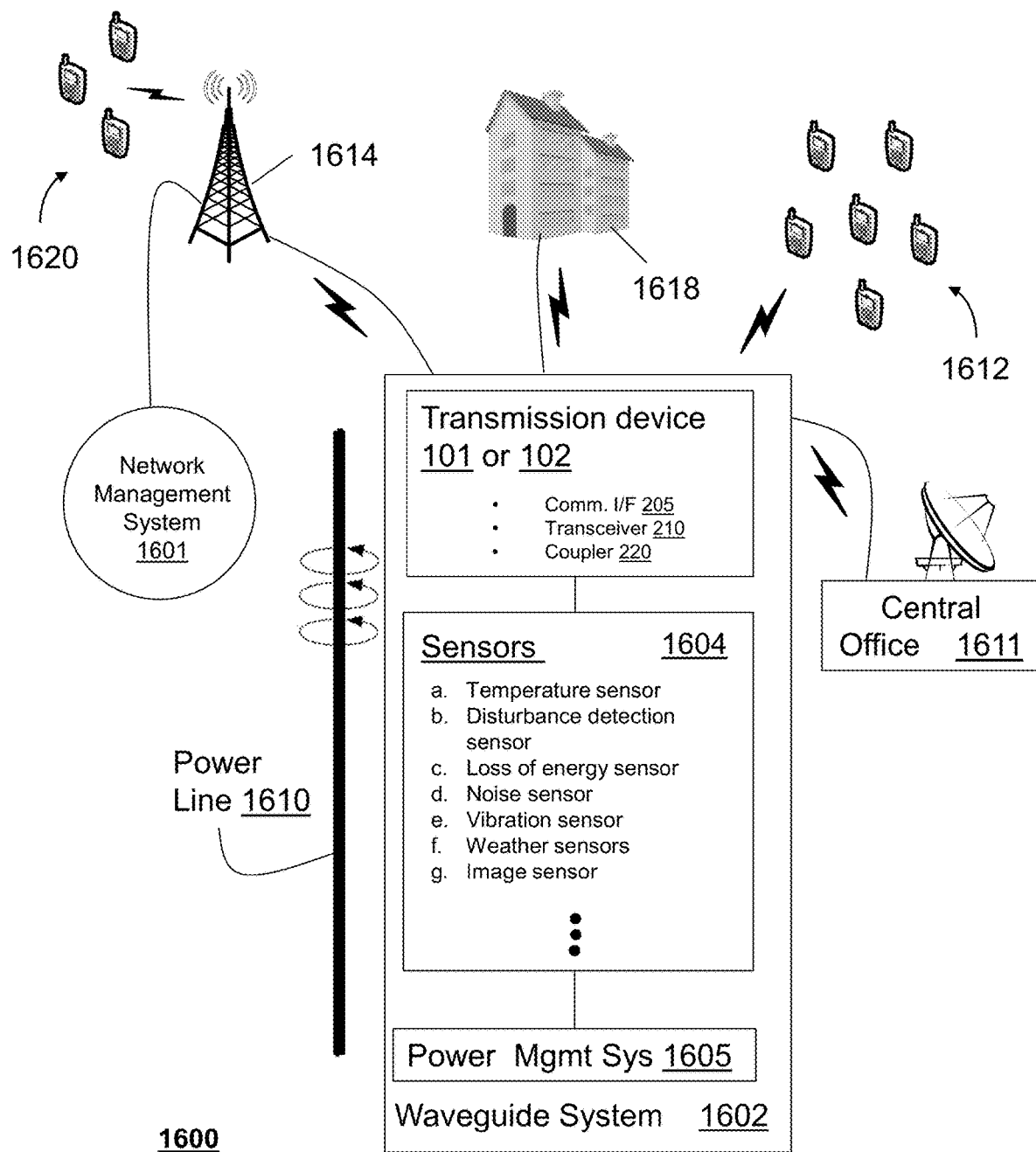
FIGS. 16A & 16B are block diagrams illustrating an example, non-limiting embodiment of a system for managing a power grid communication system in accordance with various aspects described herein.
Figure 16B:
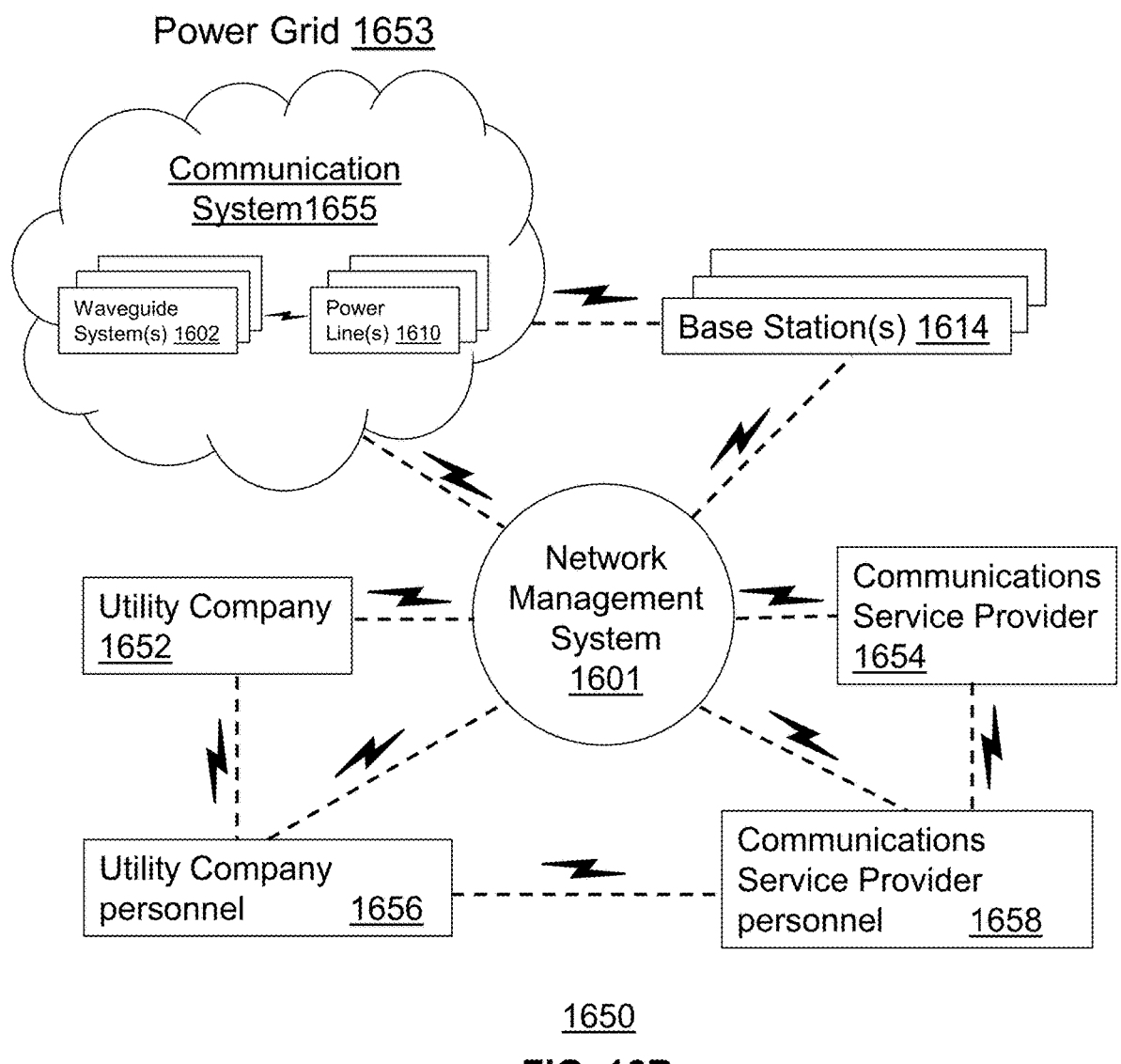

Referring now to FIGS. 16A & 16B, block diagrams illustrating an example, non-limiting embodiment of a system for managing a power grid communication system are shown. Considering FIG. 16A, a waveguide system 1602 is presented for use in a guided wave communications system 1600, such as the system presented in conjunction with FIG. 15. The waveguide system 1602 can comprise sensors 1604, a power management system 1605, a transmission device 101 or 102 that includes at least one communication interface 205, transceiver 210 and coupler 220.

The waveguide system 1602 can be coupled to a power line 1610 for facilitating guided wave communications in accordance with embodiments described in the subject disclosure. In an example embodiment, the transmission device 101 or 102 includes coupler 220 for inducing electromagnetic waves on a surface of the power line 1610 that longitudinally propagate along the surface of the power line 1610 as described in the subject disclosure. The transmission device 101 or 102 can also serve as a repeater for retransmitting electromagnetic waves on the same power line 1610 or for routing electromagnetic waves between power lines 1610 as shown in FIGS. 12-13.

The transmission device 101 or 102 includes transceiver 210 configured to, for example, up-convert a signal operating at an original frequency range to electromagnetic waves operating at, exhibiting, or associated with a carrier frequency that propagate along a coupler to induce corresponding guided electromagnetic waves that propagate along a surface of the power line 1610. A carrier frequency can be represented by a center frequency having upper and lower cutoff frequencies that define the bandwidth of the electromagnetic waves. The power line 1610 can be a wire (e.g., single stranded or multi-stranded) having a conducting surface or insulated surface. The transceiver 210 can also receive signals from the coupler 220 and down-convert the electromagnetic waves operating at a carrier frequency to signals at their original frequency.

Signals received by the communications interface 205 of transmission device 101 or 102 for up-conversion can include without limitation signals supplied by a central office 1611 over a wired or wireless interface of the communications interface 205, a base station 1614 over a wired or wireless interface of the communications interface 205, wireless signals transmitted by mobile devices 1620 to the base station 1614 for delivery over the wired or wireless interface of the communications interface 205, signals supplied by in-building communication devices 1618 over the wired or wireless interface of the communications interface 205, and/or wireless signals supplied to the communications interface 205 by mobile devices 1612 roaming in a wireless communication range of the communications interface 205.

In embodiments where the waveguide system 1602 functions as a repeater, such as shown in FIGS. 12-13, the communications interface 205 may or may not be included in the waveguide system 1602.

The electromagnetic waves propagating along the surface of the power line 1610 can be modulated and formatted to include packets or frames of data that include a data payload and further include networking information (such as header information for identifying one or more destination waveguide systems 1602). The networking information may be provided by the waveguide system 1602 or an originating device such as the central office 1611, the base station 1614, mobile devices 1620, or in-building devices 1618, or a combination thereof. Additionally, the modulated electromagnetic waves can include error correction data for mitigating signal disturbances. The networking information and error correction data can be used by a destination waveguide system 1602 for detecting transmissions directed to it, and for down-converting and processing with error correction data transmissions that include voice and/or data signals directed to recipient communication devices communicatively coupled to the destination waveguide system 1602.

Referring now to the sensors 1604 of the waveguide system 1602, the sensors 1604 can comprise one or more of a temperature sensor 1604a, a disturbance detection sensor 1604b, a loss of energy sensor 1604c, a noise sensor 1604d, a vibration sensor 1604e, an environmental (e.g., weather) sensor 1604f, and/or an image sensor 1604g. The temperature sensor 1604a can be used to measure ambient temperature, a temperature of the transmission device 101 or 102, a temperature of the power line 1610, temperature differentials (e.g., compared to a setpoint or baseline, between transmission device 101 or 102 and 1610, etc.), or any combination thereof. In one embodiment, temperature metrics can be collected and reported periodically to a network management system 1601 by way of the base station 1614.

The disturbance detection sensor 1604b can perform measurements on the power line 1610 to detect disturbances such as signal reflections, which may indicate a presence of a downstream disturbance that may impede the propagation of electromagnetic waves on the power line 1610. A signal reflection can represent a distortion resulting from, for example, an electromagnetic wave transmitted on the power line 1610 by the transmission device 101 or 102 that reflects in whole or in part back to the transmission device 101 or 102 from a disturbance in the power line 1610 located downstream from the transmission device 101 or 102.

Signal reflections can be caused by obstructions on the power line 1610. For example, a tree limb may cause electromagnetic wave reflections when the tree limb is lying on the power line 1610, or is in close proximity to the power line 1610 which may cause a corona discharge. Other obstructions that can cause electromagnetic wave reflections can include without limitation an object that has been entangled on the power line 1610 (e.g., clothing, a shoe wrapped around a power line 1610 with a shoe string, etc.), a corroded build-up on the power line 1610 or an ice build-up. Power grid components may also impede or obstruct with the propagation of electromagnetic waves on the surface of power lines 1610. Illustrations of power grid components that may cause signal reflections include without limitation a transformer and a joint for connecting spliced power lines. A sharp angle on the power line 1610 may also cause electromagnetic wave reflections.

The disturbance detection sensor 1604b can comprise a circuit to compare magnitudes of electromagnetic wave reflections to magnitudes of original electromagnetic waves transmitted by the transmission device 101 or 102 to determine how much a downstream disturbance in the power line 1610 attenuates transmissions. The disturbance detection sensor 1604*b* can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1604*b* or may be remotely accessible by the disturbance detection sensor 1604*b*. The profiles can comprise spectral data that models different disturbances that may be encountered on power lines 1610 to enable the disturbance detection sensor 1604*b* to identify disturbances locally. An identification of the disturbance if known can be reported to the network management system 1601 by way of the base station 1614. The disturbance detection sensor 1604*b* can also utilize the transmission device 101 or 102 to transmit electromagnetic waves as test signals to determine a roundtrip time for an electromagnetic wave reflection. The round trip time measured by the disturbance detection sensor 1604*b* can be used to calculate a distance traveled by the electromagnetic wave up to a point where the reflection takes place, which enables the disturbance detection sensor 1604*b* to calculate a distance from the transmission device 101 or 102 to the downstream disturbance on the power line 1610.

The distance calculated can be reported to the network management system 1601 by way of the base station 1614. In one embodiment, the location of the waveguide system 1602 on the power line 1610 may be known to the network management system 1601, which the network management system 1601 can use to determine a location of the disturbance on the power line 1610 based on a known topology of the power grid. In another embodiment, the waveguide system 1602 can provide its location to the network management system 1601 to assist in the determination of the location of the disturbance on the power line 1610. The location of the waveguide system 1602 can be obtained by the waveguide system 1602 from a pre-programmed location of the waveguide system 1602 stored in a memory of the waveguide system 1602, or the waveguide system 1602 can determine its location using a GPS receiver (not shown) included in the waveguide system 1602.

The power management system 1605 provides energy to the aforementioned components of the waveguide system 1602. The power management system 1605 can receive energy from solar cells, or from a transformer (not shown) coupled to the power line 1610, or by inductive coupling to the power line 1610 or another nearby power line. The power management system 1605 can also include a backup battery and/or a super capacitor or other capacitor circuit for providing the waveguide system 1602 with temporary power. The loss of energy sensor 1604*c* can be used to detect when the waveguide system 1602 has a loss of power condition and/or the occurrence of some other malfunction. For example, the loss of energy sensor 1604*c* can detect when there is a loss of power due to defective solar cells, an obstruction on the solar cells that causes them to malfunction, loss of power on the power line 1610, and/or when the backup power system malfunctions due to expiration of a backup battery, or a detectable defect in a super capacitor. When a malfunction and/or loss of power occurs, the loss of energy sensor 1604*c* can notify the network management system 1601 by way of the base station 1614.

The noise sensor 1604*d* can be used to measure noise on the power line 1610 that may adversely affect transmission of electromagnetic waves on the power line 1610. The noise sensor 1604*d* can sense unexpected electromagnetic interference, noise bursts, or other sources of disturbances that may interrupt reception of modulated electromagnetic waves on a surface of a power line 1610. A noise burst can be caused by, for example, a corona discharge, or other source of noise. The noise sensor 1604*d* can compare the measured noise to a noise profile obtained by the waveguide system 1602 from an internal database of noise profiles or from a remotely located database that stores noise profiles via pattern recognition, an expert system, curve fitting, matched filtering or other artificial intelligence, classification or comparison technique. From the comparison, the noise sensor 1604*d* may identify a noise source (e.g., corona discharge or otherwise) based on, for example, the noise profile that provides the closest match to the measured noise. The noise sensor 1604*d* can also detect how noise affects transmissions by measuring transmission metrics such as bit error rate, packet loss rate, jitter, packet retransmission requests, etc. The noise sensor 1604*d* can report to the network management system 1601 by way of the base station 1614 the identity of noise sources, their time of occurrence, and transmission metrics, among other things.

The vibration sensor 1604*e* can include accelerometers and/or gyroscopes to detect 2D or 3D vibrations on the power line 1610. The vibrations can be compared to vibration profiles that can be stored locally in the waveguide system 1602, or obtained by the waveguide system 1602 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1604*e* to the network management system 1601 by way of the base station 1614.

The environmental sensor 1604*f* can include a barometer for measuring atmospheric pressure, ambient temperature (which can be provided by the temperature sensor 1604*a*), wind speed, humidity, wind direction, and rainfall, among other things. The environmental sensor 1604*f* can collect raw information and process this information by comparing it to environmental profiles that can be obtained from a memory of the waveguide system 1602 or a remote database to predict weather conditions before they arise via pattern recognition, an expert system, knowledge-based system or other artificial intelligence, classification or other weather modeling and prediction technique. The environmental sensor 1604*f* can report raw data as well as its analysis to the network management system 1601.

The image sensor 1604*g* can be a digital camera (e.g., a charged coupled device or CCD imager, infrared camera, etc.) for capturing images in a vicinity of the waveguide system 1602. The image sensor 1604*g* can include an electromechanical mechanism to control movement (e.g., actual position or focal points/zooms) of the camera for inspecting the power line 1610 from multiple perspectives (e.g., top surface, bottom surface, left surface, right surface and so on). Alternatively, the image sensor 1604*g* can be designed such that no electromechanical mechanism is needed in order to obtain the multiple perspectives. The collection and retrieval of imaging data generated by the image sensor 1604g can be controlled by the network management system 1601, or can be autonomously collected and reported by the image sensor 1604g to the network management system 1601.

Other sensors that may be suitable for collecting telemetry information associated with the waveguide system 1602 and/or the power lines 1610 for purposes of detecting, predicting and/or mitigating disturbances that can impede the propagation of electromagnetic wave transmissions on power lines 1610 (or any other form of a transmission medium of electromagnetic waves) may be utilized by the waveguide system 1602.

Referring now to FIG. 16B, block diagram 1650 illustrates an example, non-limiting embodiment of a system for managing a power grid 1653 and a communication system 1655 embedded therein or associated therewith in accordance with various aspects described herein. The communication system 1655 comprises a plurality of waveguide systems 1602 coupled to power lines 1610 of the power grid 1653. At least a portion of the waveguide systems 1602 used in the communication system 1655 can be in direct communication with a base station 1614 and/or the network management system 1601. Waveguide systems 1602 not directly connected to a base station 1614 or the network management system 1601 can engage in communication sessions with either a base station 1614 or the network management system 1601 by way of other downstream waveguide systems 1602 connected to a base station 1614 or the network management system 1601.

The network management system 1601 can be communicatively coupled to equipment of a utility company 1652 and equipment of a communications service provider 1654 for providing each entity, status information associated with the power grid 1653 and the communication system 1655, respectively. The network management system 1601, the equipment of the utility company 1652, and the communications service provider 1654 can access communication devices utilized by utility company personnel 1656 and/or communication devices utilized by communications service provider personnel 1658 for purposes of providing status information and/or for directing such personnel in the management of the power grid 1653 and/or communication system 1655.

Figure 17A:
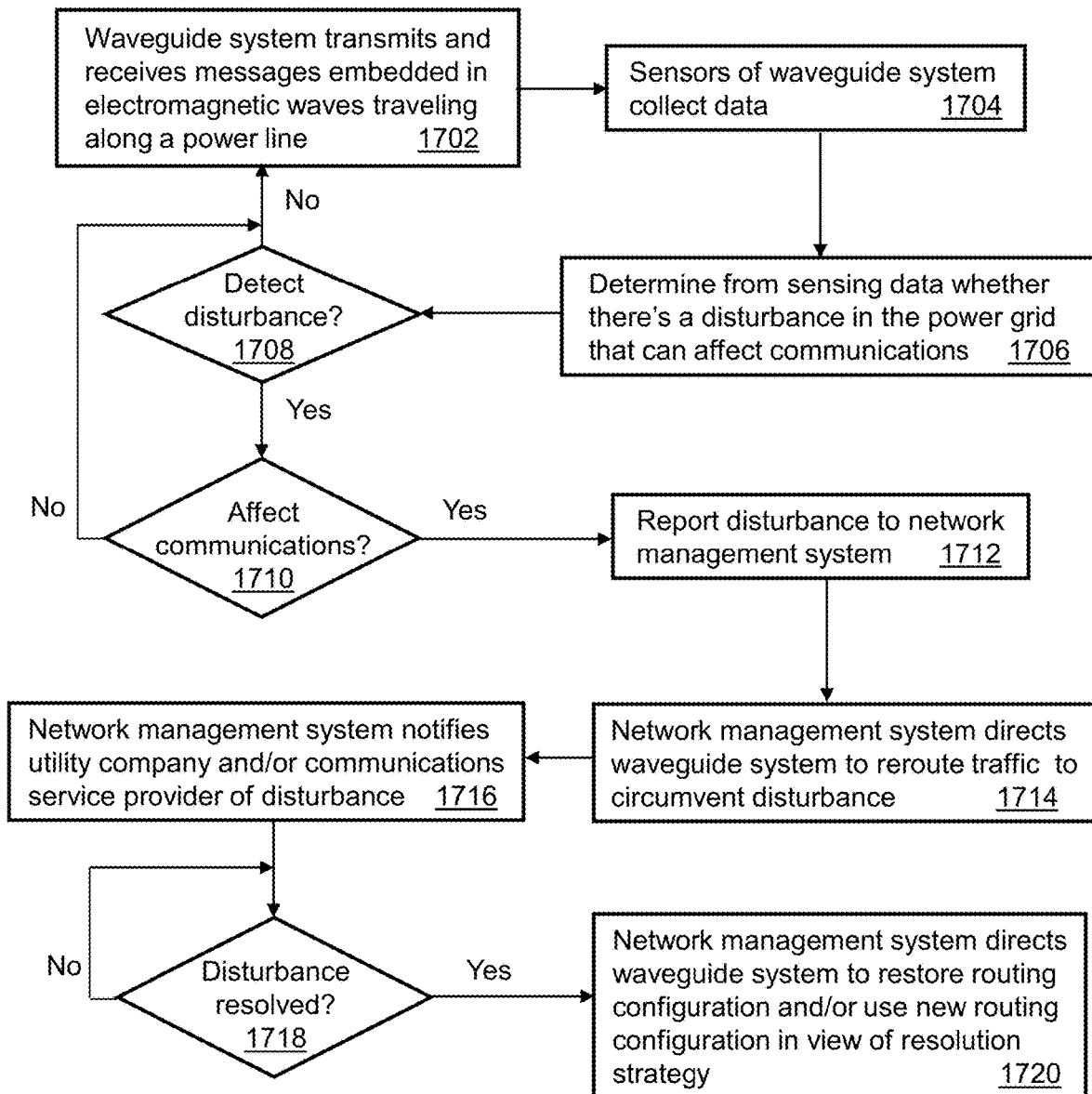
FIG. 17A illustrates a flow diagram of an example, non-limiting embodiment of a method for detecting and mitigating disturbances occurring in a communication network of the system of FIGS. 16A and 16B.

FIG. 17A illustrates a flow diagram of an example, non-limiting embodiment of a method 1700 for detecting and mitigating disturbances occurring in a communication network of the systems of FIGS. 16A & 16B. Method 1700 can begin with step 1702 where a waveguide system 1602 transmits and receives messages embedded in, or forming part of, modulated electromagnetic waves or another type of electromagnetic waves traveling along a surface of a power line 1610. The messages can be voice messages, streaming video, and/or other data/information exchanged between communication devices communicatively coupled to the communication system 1655. At step 1704 the sensors 1604 of the waveguide system 1602 can collect sensing data. In an embodiment, the sensing data can be collected in step 1704 prior to, during, or after the transmission and/or receipt of messages in step 1702. At step 1706 the waveguide system 1602 (or the sensors 1604 themselves) can determine from the sensing data an actual or predicted occurrence of a disturbance in the communication system 1655 that can affect communications originating from (e.g., transmitted by) or received by the waveguide system 1602. The waveguide system 1602 (or the sensors 1604) can process temperature data, signal reflection data, loss of energy data, noise data, vibration data, environmental data, or any combination thereof to make this determination. The waveguide system 1602 (or the sensors 1604) may also detect, identify, estimate, or predict the source of the disturbance and/or its location in the communication system 1655. If a disturbance is neither detected/identified nor predicted/estimated at step 1708, the waveguide system 1602 can proceed to step 1702 where it continues to transmit and receive messages embedded in, or forming part of, modulated electromagnetic waves traveling along a surface of the power line 1610.

If at step 1708 a disturbance is detected/identified or predicted/estimated to occur, the waveguide system 1602 proceeds to step 1710 to determine if the disturbance adversely affects (or alternatively, is likely to adversely affect or the extent to which it may adversely affect) transmission or reception of messages in the communication system 1655. In one embodiment, a duration threshold and a frequency of occurrence threshold can be used at step 1710 to determine when a disturbance adversely affects communications in the communication system 1655. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1655 when the duration threshold alone is exceeded. In another embodiment, a disturbance may be considered as adversely affecting signal integrity in the communication systems 1655 when both the duration threshold and the frequency of occurrence threshold are exceeded. The latter embodiment is thus more conservative than the former embodiment for classifying disturbances that adversely affect signal integrity in the communication system 1655. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1602 may proceed to step 1702 and continue processing messages. For instance, if the disturbance detected in step 1708 has a duration of 1 msec with a single occurrence in a 10 sec time period, then neither threshold will be exceeded. Consequently, such a disturbance may be considered as having a nominal effect on signal integrity in the communication system 1655 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1602 can proceed to step 1712 and report the incident to the network management system 1601. The report can include raw sensing data collected by the sensors 1604, a description of the disturbance if known by the waveguide system 1602, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1602, the report can include a type of disturbance expected, and if predictable, an expected time occurrence of the disturbance, and an expected frequency of occurrence of the predicted disturbance when the prediction is based on historical sensing data collected by the sensors 1604 of the waveguide system 1602.

At step 1714, the network management system 1601 can determine a mitigation, circumvention, or correction technique, which may include directing the waveguide system 1602 to reroute traffic to circumvent the disturbance if the location of the disturbance can be determined. In one embodiment, the waveguide coupling device 1402 detecting the disturbance may direct a repeater such as the one shown in FIGS. 13-14 to connect the waveguide system 1602 from a primary power line affected by the disturbance to a secondary power line to enable the waveguide system 1602 to reroute traffic to a different transmission medium and avoid the disturbance. In an embodiment where the waveguide system 1602 is configured as a repeater the waveguide system 1602 can itself perform the rerouting of traffic from the primary power line to the secondary power line. It is further noted that for bidirectional communications (e.g., full or half-duplex communications), the repeater can be configured to reroute traffic from the secondary power line back to the primary power line for processing by the waveguide system 1602.

In another embodiment, the waveguide system 1602 can redirect traffic by instructing a first repeater situated upstream of the disturbance and a second repeater situated downstream of the disturbance to redirect traffic from a primary power line temporarily to a secondary power line and back to the primary power line in a manner that avoids the disturbance. It is further noted that for bidirectional communications (e.g., full or half-duplex communications), repeaters can be configured to reroute traffic from the secondary power line back to the primary power line.

To avoid interrupting existing communication sessions occurring on a secondary power line, the network management system 1601 may direct the waveguide system 1602 to instruct repeater(s) to utilize unused time slot(s) and/or frequency band(s) of the secondary power line for redirecting data and/or voice traffic away from the primary power line to circumvent the disturbance.

At step 1716, while traffic is being rerouted to avoid the disturbance, the network management system 1601 can notify equipment of the utility company 1652 and/or equipment of the communications service provider 1654, which in turn may notify personnel of the utility company 1656 and/or personnel of the communications service provider 1658 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1610 that may change a topology of the communication system 1655.

Once the disturbance has been resolved (as determined in decision 1718), the network management system 1601 can direct the waveguide system 1602 at step 1720 to restore the previous routing configuration used by the waveguide system 1602 or route traffic according to a new routing configuration if the restoration strategy used to mitigate the disturbance resulted in a new network topology of the communication system 1655. In another embodiment, the waveguide system 1602 can be configured to monitor mitigation of the disturbance by transmitting test signals on the power line 1610 to determine when the disturbance has been removed. Once the waveguide system 1602 detects an absence of the disturbance it can autonomously restore its routing configuration without assistance by the network management system 1601 if it determines the network topology of the communication system 1655 has not changed, or it can utilize a new routing configuration that adapts to a detected new network topology.

Figure 17B:
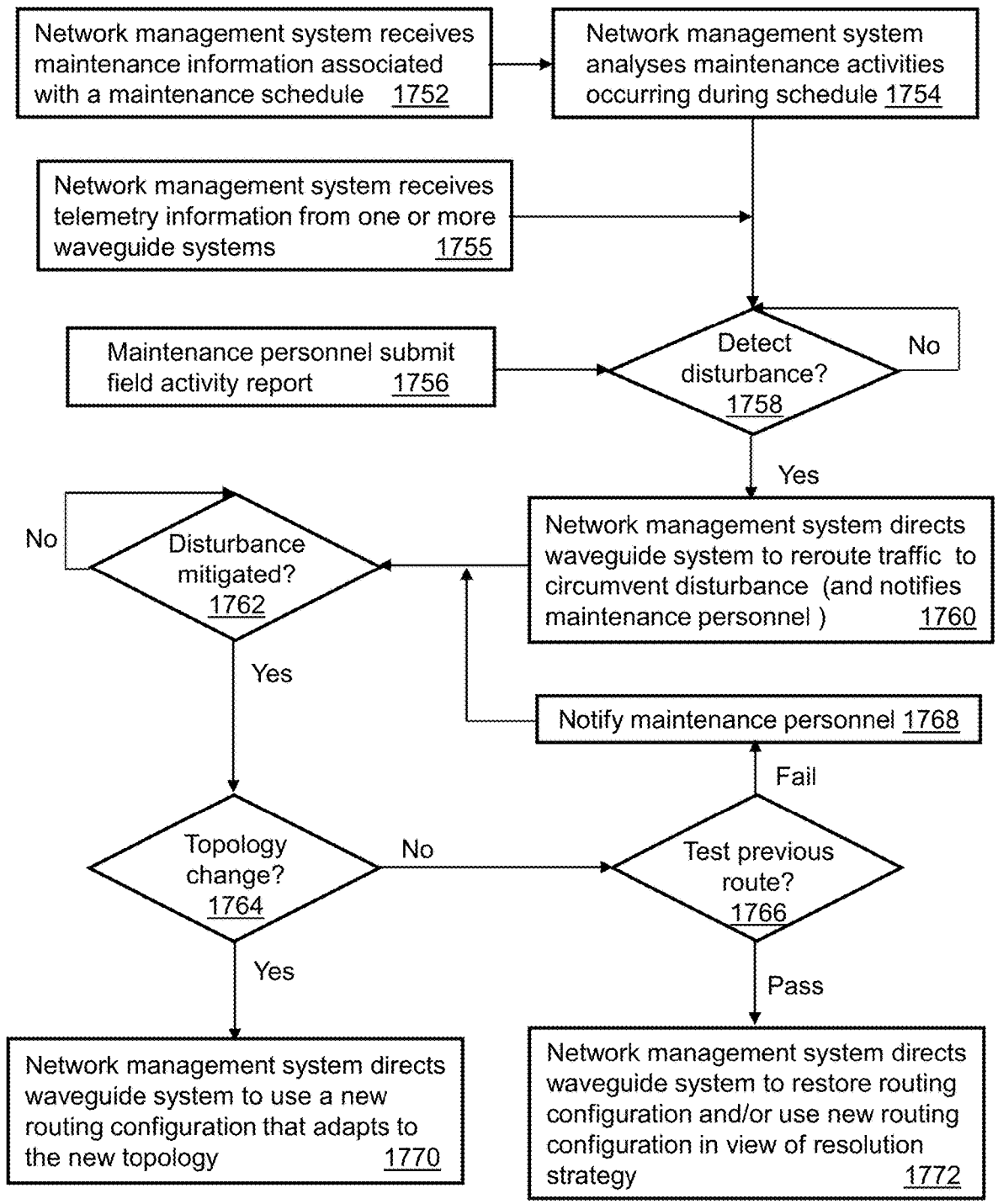
FIG. 17B illustrates a flow diagram of an example, non-limiting embodiment of a method for detecting and mitigating disturbances occurring in a communication network of the system of FIGS. 16A and 16B.

FIG. 17B illustrates a flow diagram of an example, non-limiting embodiment of a method 1750 for detecting and mitigating disturbances occurring in a communication network of the system of FIGS. 16A and 16B. In one embodiment, method 1750 can begin with step 1752 where a network management system 1601 receives from equipment of the utility company 1652 or equipment of the communications service provider 1654 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1610, scheduled replacement of a waveguide system 1602 on the power line 1610, scheduled reconfiguration of power lines 1610 in the power grid 1653, etc.).

In another embodiment, the network management system 1601 can receive at step 1755 telemetry information from one or more waveguide systems 1602. The telemetry information can include among other things an identity of each waveguide system 1602 submitting the telemetry information, measurements taken by sensors 1604 of each waveguide system 1602, information relating to predicted, estimated, or actual disturbances detected by the sensors 1604 of each waveguide system 1602, location information associated with each waveguide system 1602, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1602 to isolate and identify the disturbance. Additionally, the network management system 1601 can request telemetry information from waveguide systems 1602 in a vicinity of an affected waveguide system 1602 to triangulate a location of the disturbance and/or validate an identification of the disturbance by receiving similar telemetry information from other waveguide systems 1602.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1653 resulting from field personnel addressing discovered issues in the communication system 1655 and/or power grid 1653, changes to one or more waveguide systems 1602 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1602 or other waveguide systems 1602 of the communication system 1655.

When a disturbance is detected or predicted at step 1758, the network management system 1601 can proceed to step 1760 where it can direct one or more waveguide systems 1602 to reroute traffic to circumvent the disturbance. When the disturbance is permanent due to a permanent topology change of the power grid 1653, the network management system 1601 can proceed to step 1770 and skip steps 1762, 1764, 1766, and 1772. At step 1770, the network management system 1601 can direct one or more waveguide systems 1602 to use a new routing configuration that adapts to the new topology. However, when the disturbance has been detected from telemetry information supplied by one or more waveguide systems 1602, the network management system 1601 can notify maintenance personnel of the utility company 1656 or the communications service provider 1658 of a location of the disturbance, a type of disturbance if known, and related information that may be helpful to such personnel to mitigate the disturbance. When a disturbance is expected due to maintenance activities, the network management system 1601 can direct one or more waveguide systems 1602 to reconfigure traffic routes at a given schedule (consistent with the maintenance schedule) to avoid disturbances caused by the maintenance activities during the maintenance schedule.

Returning back to step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1610, reconfiguring a waveguide system 1602 to utilize a different power line 1610, otherwise utilizing an alternative link to bypass the disturbance and so on. If a topology change has taken place, the network management system 1601 can direct at step 1770 one or more waveguide systems 1602 to use a new routing configuration that adapts to the new topology.

If, however, a topology change has not been reported by field personnel, the network management system 1601 can proceed to step 1766 where it can direct one or more waveguide systems 1602 to send test signals to test a routing configuration that had been used prior to the detected disturbance(s). Test signals can be sent to affected waveguide systems 1602 in a vicinity of the disturbance. The test signals can be used to determine if signal disturbances (e.g., electromagnetic wave reflections) are detected by any of the waveguide systems 1602. If the test signals confirm that a prior routing configuration is no longer subject to previously detected disturbance(s), then the network management system 1601 can at step 1772 direct the affected waveguide systems 1602 to restore a previous routing configuration. If, however, test signals analyzed by one or more waveguide coupling device 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1602 can be configured to be self-adapting to changes in the power grid 1653 and/or to mitigation of disturbances. That is, one or more affected waveguide systems 1602 can be configured to self-monitor mitigation of disturbances and reconfigure traffic routes without requiring instructions to be sent to them by the network management system 1601. In this embodiment, the one or more waveguide systems 1602 that are self-configurable can inform the network management system 1601 of its routing choices so that the network management system 1601 can maintain a macro-level view of the communication topology of the communication system 1655.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 18A:
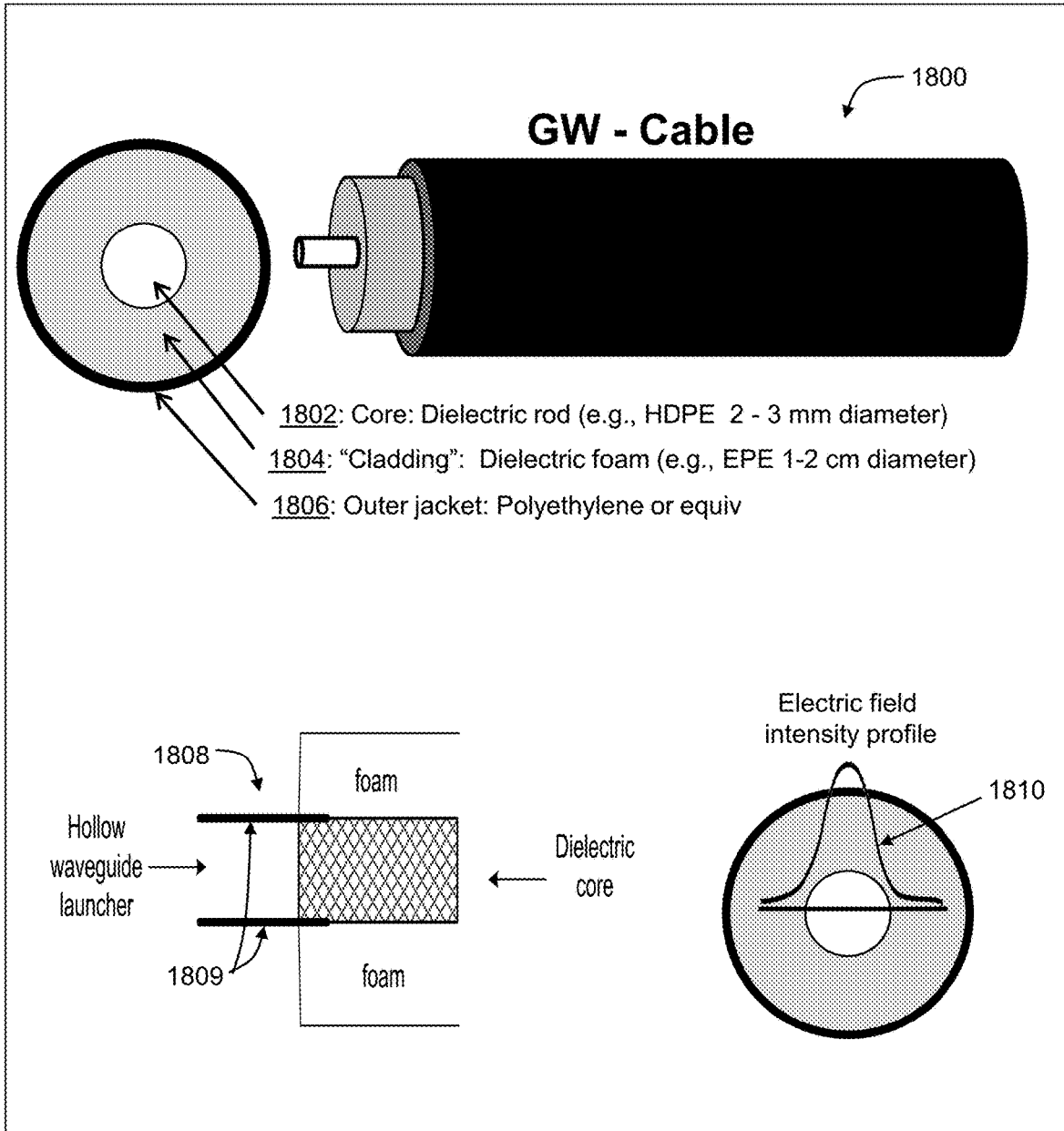
FIG. 18A is a block diagram illustrating an example, non-limiting embodiment of a transmission medium for propagating guided electromagnetic waves.

Turning now to FIG. 18A, a block diagram illustrating an example, non-limiting embodiment of a transmission medium 1800 for propagating guided electromagnetic waves is shown. In particular, a further example of transmission medium 125 presented in conjunction with FIG. 1 is presented. In an embodiment, the transmission medium 1800 can comprise a first dielectric material 1802 and a second dielectric material 1804 disposed thereon. In an embodiment, the first dielectric material 1802 can comprise a dielectric core (referred to herein as dielectric core 1802) and the second dielectric material 1804 can comprise a cladding or shell such as a dielectric foam that surrounds in whole or in part the dielectric core (referred to herein as dielectric foam 1804). In an embodiment, the dielectric core 1802 and dielectric foam 1804 can be coaxially aligned to each other (although not necessary). In an embodiment, the combination of the dielectric core 1802 and the dielectric foam 1804 can be flexed or bent at least by 45 degrees without damaging the materials of the dielectric core 1802 and the dielectric foam 1804. In an embodiment, an outer surface of the dielectric foam 1804 can be further surrounded in whole or in part by a third dielectric material 1806, which can serve as an outer jacket (referred to herein as jacket 1806). The jacket 1806 can prevent exposure of the dielectric core 1802 and the dielectric foam 1804 to an environment that can adversely affect the propagation of electromagnetic waves (e.g., water, soil, etc.).

The dielectric core 1802 can comprise, for example, a high density polyethylene material, a high density polyurethane material, or other suitable dielectric material(s). The dielectric foam 1804 can comprise, for example, a cellular plastic material such an expanded polyethylene material, or other suitable dielectric material(s). The jacket 1806 can comprise, for example, a polyethylene material or equivalent. In an embodiment, the dielectric constant of the dielectric foam 1804 can be (or substantially) lower than the dielectric constant of the dielectric core 1802. For example, the dielectric constant of the dielectric core 1802 can be approximately 2.3 while the dielectric constant of the dielectric foam 1804 can be approximately 1.15 (slightly higher than the dielectric constant of air).

The dielectric core 1802 can be used for receiving signals in the form of electromagnetic waves from a launcher or other coupling device described herein which can be configured to launch guided electromagnetic waves on the transmission medium 1800. In one embodiment, the transmission 1800 can be coupled to a hollow waveguide 1808 structured as, for example, a circular waveguide 1809, which can receive electromagnetic waves from a radiating device such as a stub antenna (not shown). The hollow waveguide 1808 can in turn induce guided electromagnetic waves in the dielectric core 1802. In this configuration, the guided electromagnetic waves are guided by or bound to the dielectric core 1802 and propagate longitudinally along the dielectric core 1802. By adjusting electronics of the launcher, an operating frequency of the electromagnetic waves can be chosen such that a field intensity profile 1810 of the guided electromagnetic waves extends nominally (or not at all) outside of the jacket 1806.

By maintaining most (if not all) of the field strength of the guided electromagnetic waves within portions of the dielectric core 1802, the dielectric foam 1804 and/or the jacket 1806, the transmission medium 1800 can be used in hostile environments without adversely affecting the propagation of the electromagnetic waves propagating therein. For example, the transmission medium 1800 can be buried in soil with no (or nearly no) adverse effect to the guided electromagnetic waves propagating in the transmission medium 1800. Similarly, the transmission medium 1800 can be exposed to water (e.g., rain or placed underwater) with no (or nearly no) adverse effect to the guided electromagnetic waves propagating in the transmission medium 1800. In an embodiment, the propagation loss of guided electromagnetic waves in the foregoing embodiments can be 1 to 2 dB per meter or better at an operating frequency of 60 GHz. Depending on the operating frequency of the guided electromagnetic waves and/or the materials used for the transmission medium 1800 other propagation losses may be possible. Additionally, depending on the materials used to construct the transmission medium 1800, the transmission medium 1800 can in some embodiments be flexed laterally with no (or nearly no) adverse effect to the guided electromagnetic waves propagating through the dielectric core 1802 and the dielectric foam 1804.

Other configurations of the transmission medium 1800 are possible including, a transmission medium that comprises a conductive core with or without an insulation layer surrounding the conductive core in whole or in part that is, in turn, covered in whole or in part by a dielectric foam 1804 and jacket 1806, which can be constructed from the materials previously described.

It should be noted that the hollow launcher 1808 used with the transmission medium 1800 can be replaced with other launchers, couplers or coupling devices described in the subject disclosure. Additionally, the propagation mode(s) of the electromagnetic waves for any of the foregoing embodiments can be fundamental mode(s), non-fundamental mode(s), or combinations thereof.

Figure 18B:
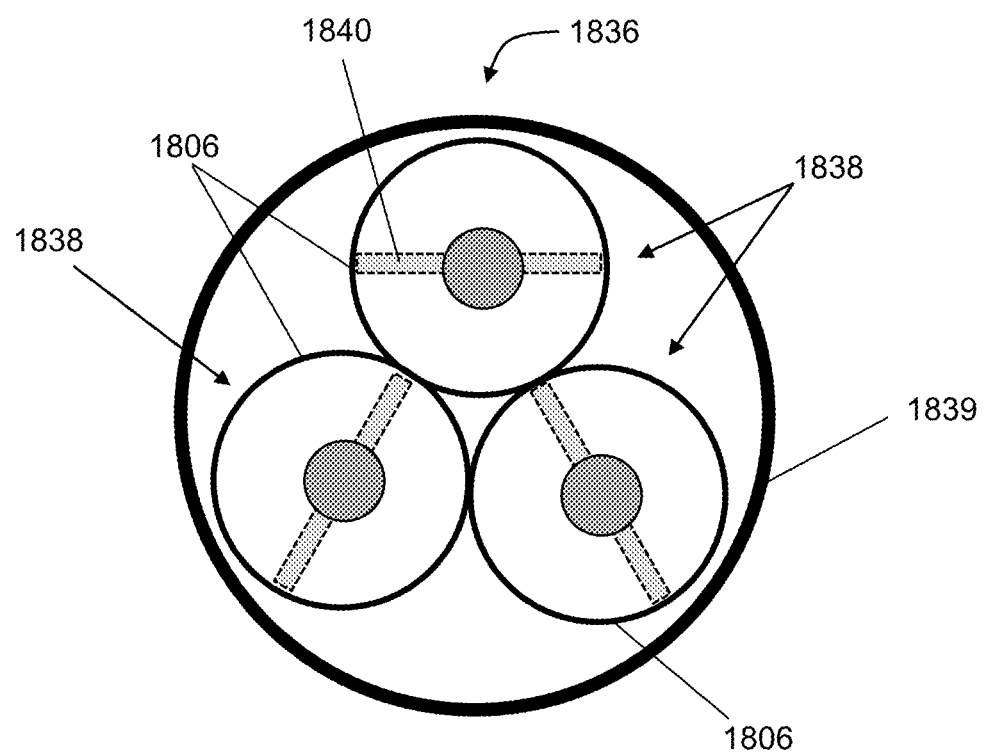
FIG. 18B is a block diagram illustrating an example, non-limiting embodiment of bundled transmission media in accordance with various aspects described herein.

FIG. 18B is a block diagram illustrating an example, non-limiting embodiment of bundled transmission media 1836 in accordance with various aspects described herein. The bundled transmission media 1836 can comprise a plurality of cables 1838 held in place by a flexible sleeve 1839. The plurality of cables 1838 can comprise multiple instances of cable 1800 of FIG. 18A. The sleeve 1839 can comprise a dielectric material that prevents soil, water or other external materials from making contact with the plurality of cables 1838. In an embodiment, a plurality of launchers, each utilizing a transceiver similar to the one depicted in FIG. 10 or other coupling devices described herein, can be adapted to selectively induce a guided electromagnetic wave in each cable, each guided electromagnetic wave conveys different data (e.g., voice, video, messaging, content, etc.). In an embodiment, by adjusting operational parameters of each launcher or other coupling device, the electric field intensity profile of each guided electromagnetic wave can be fully or substantially confined within layers of a corresponding cable 1838 to reduce cross-talk between cables 1838.

In situations where the electric field intensity profile of each guided electromagnetic wave is not fully or substantially confined within a corresponding cable 1838, cross-talk of electromagnetic signals can occur between cables 1838. Several mitigation options can be used to reduce cross-talk between the cables 1838 of FIG. 18B. In an embodiment, an absorption material 1840 that can absorb electromagnetic fields, such as carbon, can be applied to the cables 1838 as shown in FIG. 18B to polarize each guided electromagnetic wave at various polarization states to reduce cross-talk between cables 1838. In another embodiment (not shown), carbon beads can be added to gaps between the cables 1838 to reduce cross-talk.

In yet another embodiment (not shown), a diameter of cable 1838 can be configured differently to vary a speed of propagation of guided electromagnetic waves between the cables 1838 in order to reduce cross-talk between cables 1838. In an embodiment (not shown), a shape of each cable 1838 can be made asymmetric (e.g., elliptical) to direct the guided electromagnetic fields of each cable 1838 away from each other to reduce cross-talk. In an embodiment (not shown), a filler material such as dielectric foam can be added between cables 1838 to sufficiently separate the cables 1838 to reduce cross-talk therebetween. In an embodiment (not shown), longitudinal carbon strips or swirls can be applied to on an outer surface of the jacket 1806 of each cable 1838 to reduce radiation of guided electromagnetic waves outside of the jacket 1806 and thereby reduce cross-talk between cables 1838. In yet another embodiment, each launcher can be configured to launch a guided electromagnetic wave having a different frequency, modulation, wave propagation mode, such as an orthogonal frequency, modulation or mode, to reduce cross-talk between the cables 1838.

In yet another embodiment (not shown), pairs of cables 1838 can be twisted in a helix to reduce cross-talk between the pairs and other cables 1838 in a vicinity of the pairs. In some embodiments, certain cables 1838 can be twisted while other cables 1838 are not twisted to reduce cross-talk between the cables 1838. Additionally, each twisted pair cable 1838 can have different pitches (i.e., different twist rates, such as twists per meter) to further reduce cross-talk between the pairs and other cables 1838 in a vicinity of the pairs. In another embodiment (not shown), launchers or other coupling devices can be configured to induce guided electromagnetic waves in the cables 1838 having electromagnetic fields that extend beyond the jacket 1806 into gaps between the cables to reduce cross-talk between the cables 1838. It is submitted that any one of the foregoing embodiments for mitigating cross-talk between cables 1838 can be combined to further reduce cross-talk therebetween.

Figure 18C:
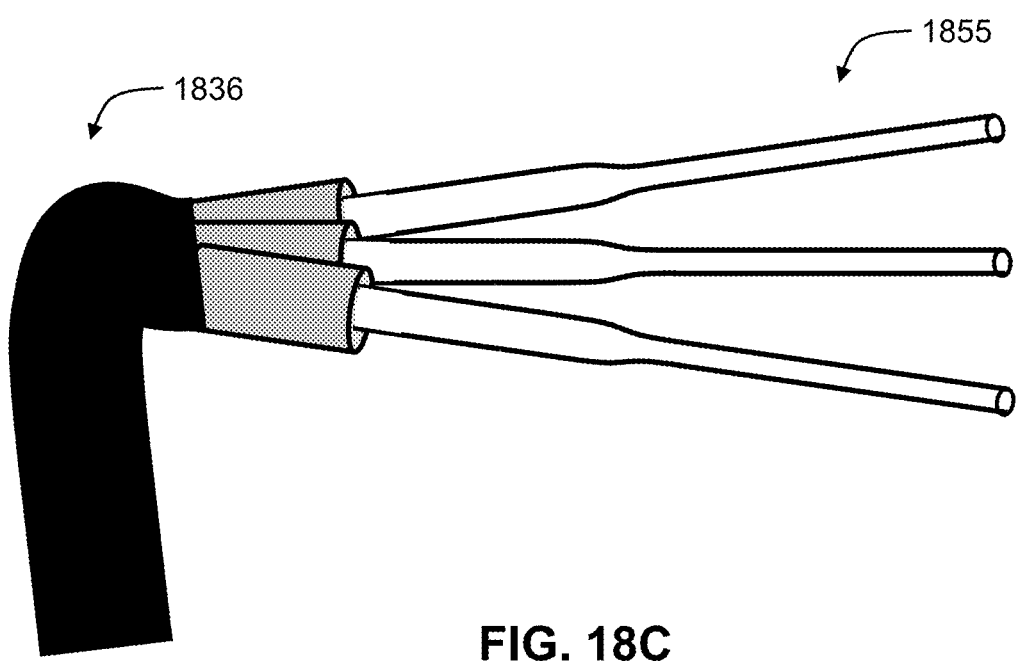
FIG. 18C is a block diagram illustrating an example, non-limiting embodiment of exposed stubs from the bundled transmission media for use as antennas in accordance with various aspects described herein.

Turning now to FIG. 18C, a block diagram illustrating an example, non-limiting embodiment of exposed tapered stubs from the bundled transmission media 1836 for use as antennas 1855 is shown. Each antenna 1855 can serve as a directional antenna for radiating wireless signals directed to wireless communication devices or for inducing electromagnetic wave propagation on a surface of a transmission medium (e.g., a power line). In an embodiment, the wireless signals radiated by the antennas 1855 can be beam steered by adapting the phase and/or other characteristics of the wireless signals generated by each antenna 1855. In an embodiment, the antennas 1855 can individually be placed in a pie-pan antenna assembly for directing wireless signals in various directions.

It is further noted that the terms "core", "cladding", "shell", and "foam" as utilized in the subject disclosure can comprise any types of materials (or combinations of materials) that enable electromagnetic waves to remain bound to the core while propagating longitudinally along the core. For example, a strip of dielectric foam 1804" described earlier can be replaced with a strip of an ordinary dielectric material (e.g., polyethylene) for wrapping around the dielectric core 1802 (referred to herein for illustration purposes only as a "wrap"). In this configuration an average density of the wrap can be small as a result of air space between sections of the wrap. Consequently, an effective dielectric constant of the wrap can be less than the dielectric constant of the dielectric core 1802, thereby enabling guided electromagnetic waves to remain bound to the core. Accordingly, any of the embodiments of the subject disclosure relating to materials used for core(s) and wrappings about the core(s) can be structurally adapted and/or modified with other dielectric materials that achieve the result of maintaining electromagnetic waves bound to the core(s) while they propagate along the core(s). Additionally, a core in whole or in part as described in any of the embodiments of the subject disclosure can comprise an opaque material (e.g., polyethylene) that is resistant to propagation of electromagnetic waves having an optical operating frequency. Accordingly, electromagnetic waves guided and bound to the core will have a non-optical frequency range (e.g., less than the lowest frequency of visible light).

Figure 18D:
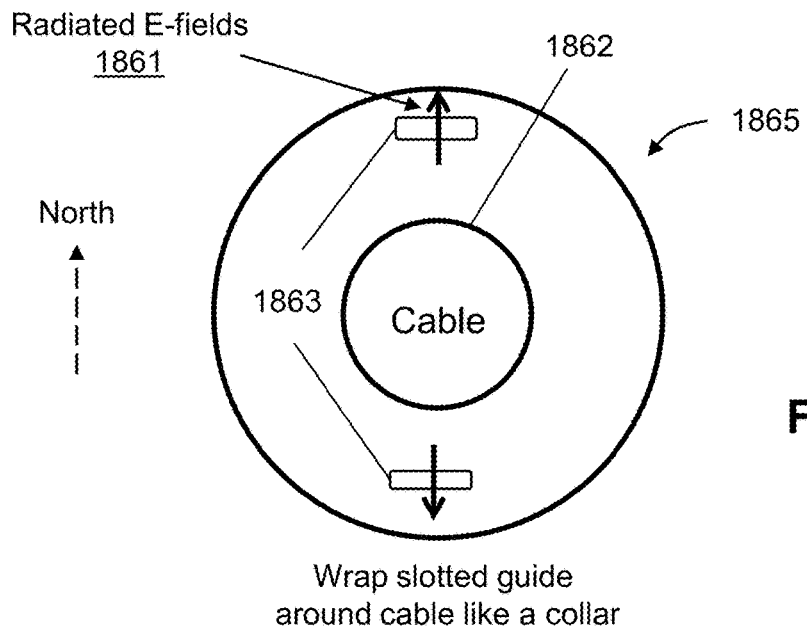
FIGS. 18D, 18E, 18F, 18G, 18H, 18I, 18J and 18K are block diagrams illustrating example, non-limiting embodiments of a waveguide device for transmitting or receiving electromagnetic waves in accordance with various aspects described herein.

FIGS. 18D, 18E, 18F, 18G, 18H, and 18I and 18J are block diagrams illustrating example, non-limiting embodiments of a waveguide device for transmitting or receiving electromagnetic waves in accordance with various aspects described herein. In an embodiment, FIG. 18D illustrates a front view of a waveguide device 1865 having a plurality of slots 1863 (e.g., openings or apertures) for emitting electromagnetic waves having radiated electric fields (e-fields) 1861. In an embodiment, the radiated e-fields 1861 of pairs of symmetrically positioned slots 1863 (e.g., north and south slots of the waveguide 1865) can be directed away from each other (i.e., polar opposite radial orientations about the cable 1862). While the slots 1863 are shown as having a rectangular shape, other shapes such as other polygons, sector and arc shapes, ellipsoid shapes and other shapes are likewise possible. For illustration purposes only, the term north will refer to a relative azimuthal direction/orientation as shown in the figures. All references in the subject disclosure to other directions/orientations (e.g., south, east, west, northwest, and so forth) will be relative to northern illustration. In an embodiment, to achieve e-fields with opposing orientations at the north and south slots 1863, for example, the north and south slots 1863 can be arranged to have a circumferential distance between each other that is approximately one wavelength of electromagnetic waves signals supplied to these slots. The waveguide 1865 can have a cylindrical cavity in a center of the waveguide 1865 to enable placement of a cable 1862. In one embodiment, the cable 1862 can comprise an insulated conductor. In another embodiment, the cable 1862 can comprise an uninsulated conductor. In yet other embodiments, the cable 1862 can comprise any of the embodiments of a transmission core 1852 of cable 1850 previously described.

In one embodiment, the cable 1862 can slide into the cylindrical cavity of the waveguide 1865. In another embodiment, the waveguide 1865 can utilize an assembly mechanism (not shown). The assembly mechanism (e.g., a hinge or other suitable mechanism that provides a way to open the waveguide 1865 at one or more locations) can be used to enable placement of the waveguide 1865 on an outer surface of the cable 1862 or otherwise to assemble separate pieces together to form the waveguide 1865 as shown. According to these and other suitable embodiments, the waveguide 1865 can be configured to wrap around the cable 1862 like a collar.

Figure 18E:
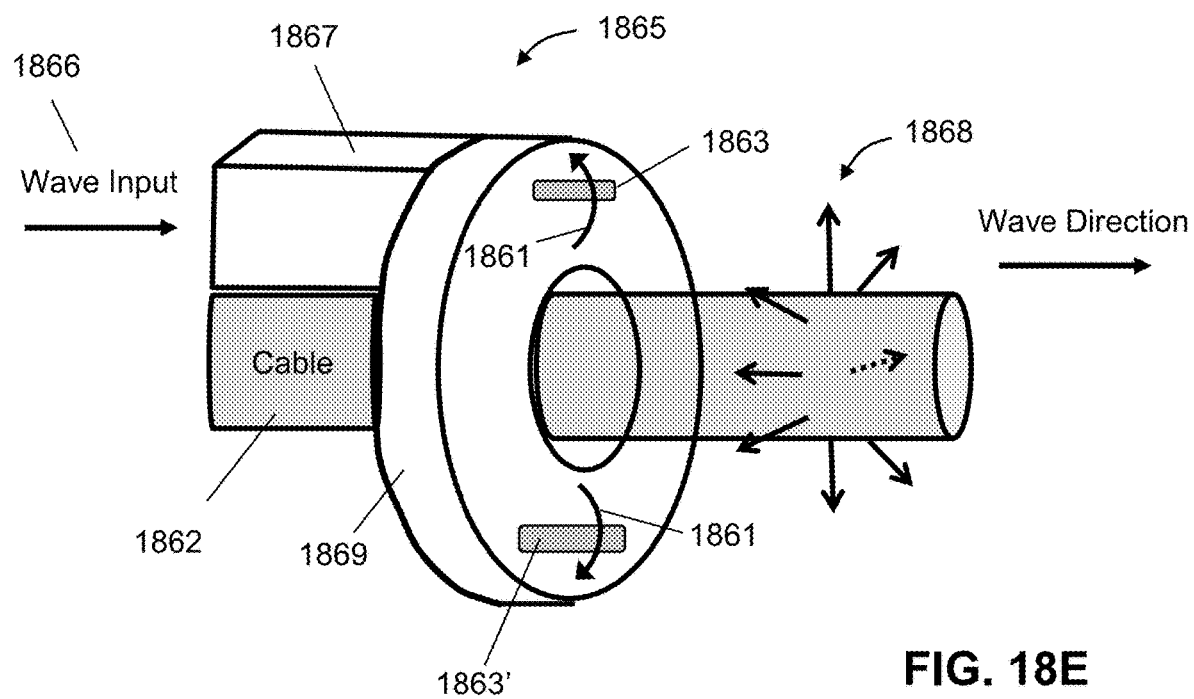

FIG. 18E illustrates a side view of an embodiment of the waveguide 1865. The waveguide 1865 can be adapted to have a hollow rectangular waveguide portion 1867 that receives electromagnetic waves 1866 generated by a transmitter circuit as previously described in the subject disclosure (e.g., see FIGS. 1 and 10). The electromagnetic waves 1866 can be distributed by the hollow rectangular waveguide portion 1867 into in a hollow collar 1869 of the waveguide 1865. The rectangular waveguide portion 1867 and the hollow collar 1869 can be constructed of materials suitable for maintaining the electromagnetic waves within the hollow chambers of these assemblies (e.g., carbon fiber materials). It should be noted that while the waveguide portion 1867 is shown and described in a hollow rectangular configuration, other shapes and/or other non-hollow configurations can be employed. In particular, the waveguide portion 1867 can have a square or other polygonal cross section, an arc or sector cross section that is truncated to conform to the outer surface of the cable 1862, a circular or ellipsoid cross section or cross sectional shape. In addition, the waveguide portion 1867 can be configured as, or otherwise include, a solid dielectric material.

As previously described, the hollow collar 1869 can be configured to emit electromagnetic waves from each slot 1863 with opposite e-fields 1861 at pairs of symmetrically positioned slots 1863 and 1863'. In an embodiment, the electromagnetic waves emitted by the combination of slots 1863 and 1863' can in turn induce electromagnetic waves 1868 on that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

It should be noted that since the hollow rectangular waveguide portion 1867 of FIG. 18E is closer to slot 1863 (at the northern position of the waveguide 1865), slot 1863 can emit electromagnetic waves having a stronger magnitude than electromagnetic waves emitted by slot 1863' (at the southern position). To reduce magnitude differences between these slots, slot 1863' can be made larger than slot 1863. The technique of utilizing different slot sizes to balance signal magnitudes between slots can be applied to any of the embodiments of the subject disclosure relating to FIGS. 18D, 18E, 18G, and 18I-some of which are described below.

Figure 18F:
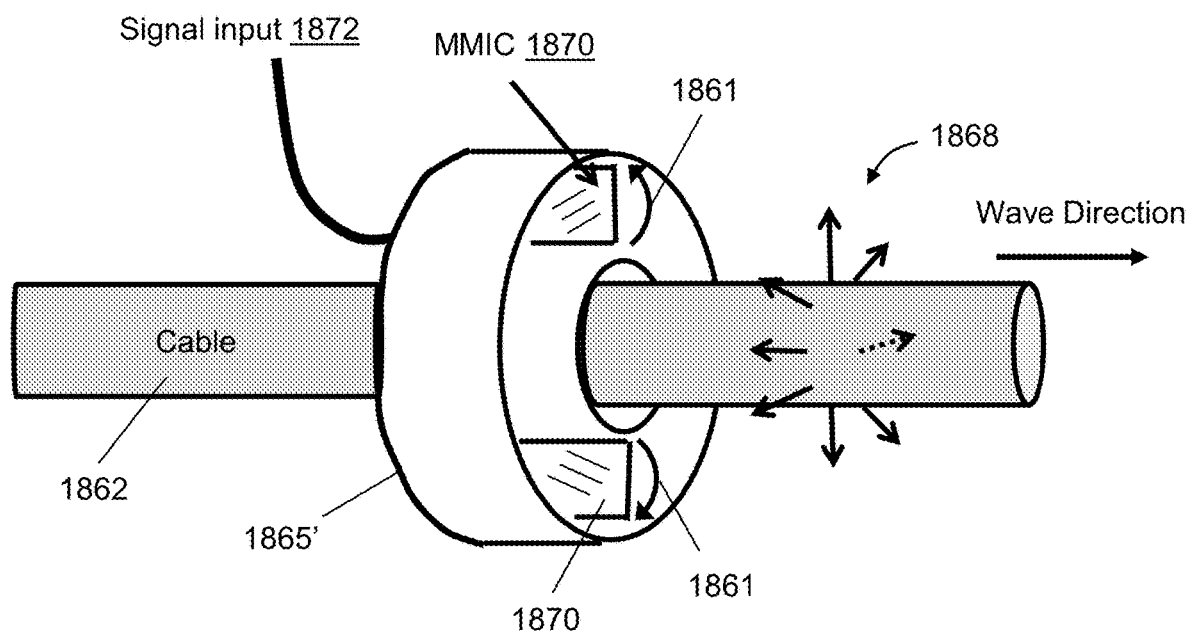

In another embodiment, FIG. 18F depicts a waveguide 1865' that can be configured to utilize circuitry such as monolithic microwave integrated circuits (MMICs) 1870 each coupled to a signal input 1872 (e.g., coaxial cable that provides a communication signal). The signal input 1872 can be generated by a transmitter circuit as previously described in the subject disclosure (e.g., see reference 101, 1000 of FIGS. 1 and 10) adapted to provide electrical signals to the MMICs 1870. Each MMIC 1870 can be configured to receive signal 1872 which the MMIC 1870 can modulate and transmit with a radiating element (e.g., an antenna) to emit electromagnetic waves having radiated e-fields 1861. In one embodiment, the MMICs 1870 can be configured to receive the same signal 1872, but transmit electromagnetic waves having e-fields 1861 of opposing orientation. This can be accomplished by configuring one of the MMICs 1870 to transmit electromagnetic waves that are 180 degrees out of phase with the electromagnetic waves transmitted by the other MMIC 1870. In an embodiment, the combination of the electromagnetic waves emitted by the MMICs 1870 can together induce electromagnetic waves 1868 that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

Figure 18G:
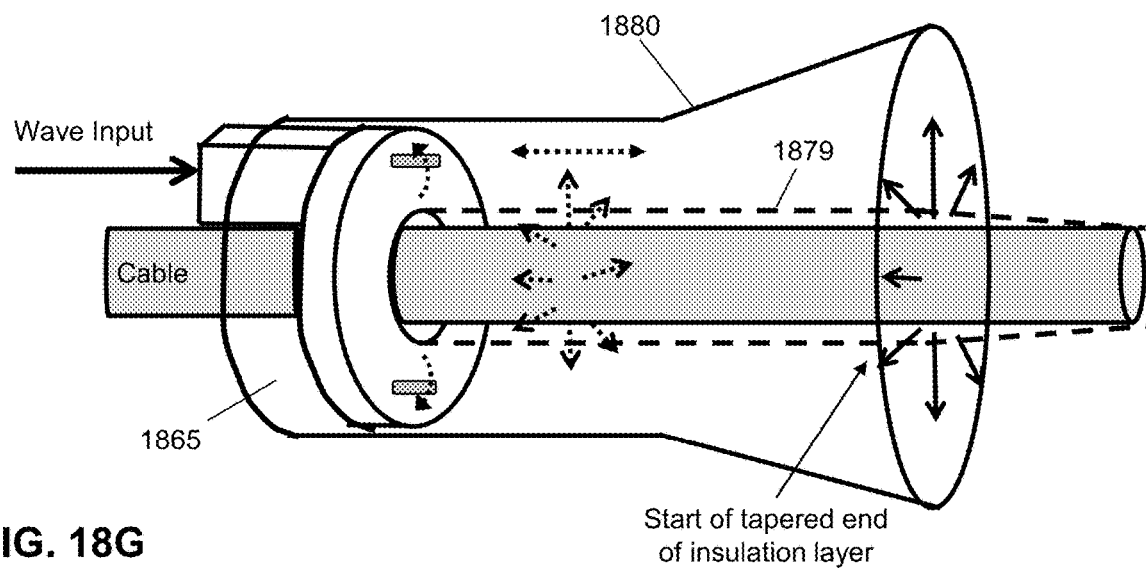
Figure 18H:
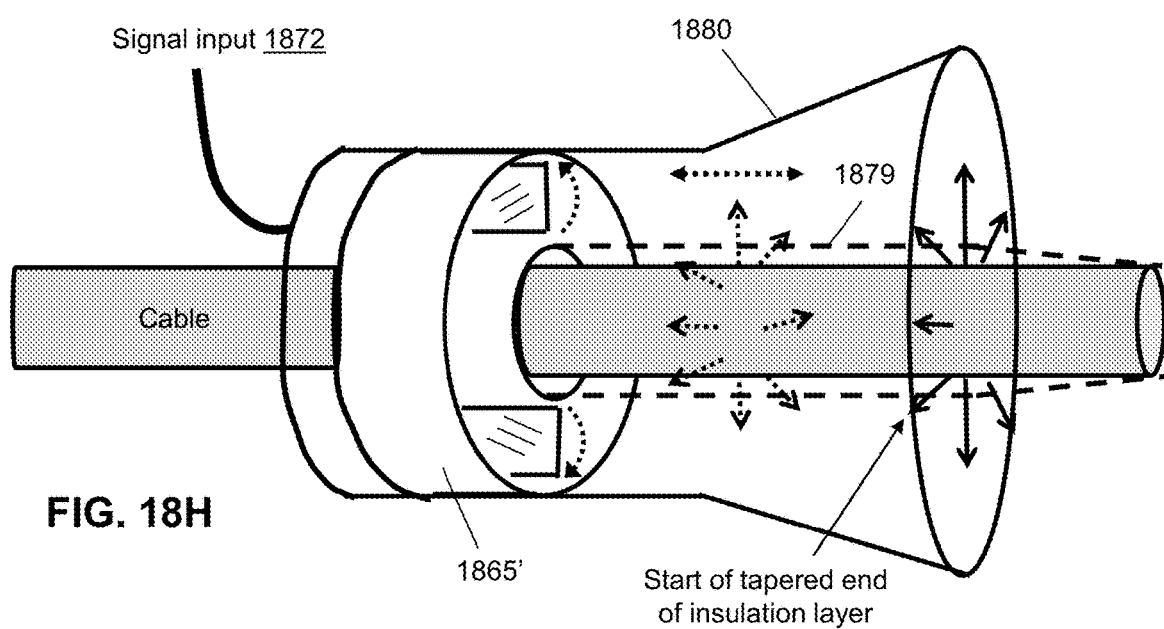

A tapered horn 1880 can be added to the embodiments of FIGS. 18E and 18F to assist in the inducement of the electromagnetic waves 1868 on cable 1862 as depicted in FIGS. 18G and 18H. In an embodiment where the cable 1862 is an uninsulated conductor, the electromagnetic waves induced on the cable 1862 can have a large radial dimension (e.g., 1 meter). To enable use of a smaller tapered horn 1880, an insulation layer 1879 can be applied on a portion of the cable 1862 at or near the cavity as depicted with hash lines in FIGS. 18G and 18H. The insulation layer 1879 can have a tapered end facing away from the waveguide 1865. The added insulation enables the electromagnetic waves 1868 initially launched by the waveguide 1865 (or 1865') to be tightly bound to the insulation, which in turn reduces the radial dimension of the electromagnetic fields 1868 (e.g., centimeters). As the electromagnetic waves 1868 propagate away from the waveguide 1865 (1865') and reach the tapered end of the insulation layer 1879, the radial dimension of the electromagnetic waves 1868 begin to increase eventually achieving the radial dimension they would have had had the electromagnetic waves 1868 been induced on the uninsulated conductor without an insulation layer. In the illustration of FIGS. 18G and 18H the tapered end begins at an end of the tapered horn 1880. In other embodiments, the tapered end of the insulation layer 1879 can begin before or after the end of the tapered horn 1880. The tapered horn can be metallic or constructed of other conductive material or constructed of a plastic or other non-conductive material that is coated or clad with a dielectric layer or doped with a conductive material to provide reflective properties similar to a metallic horn.

Figure 18I:
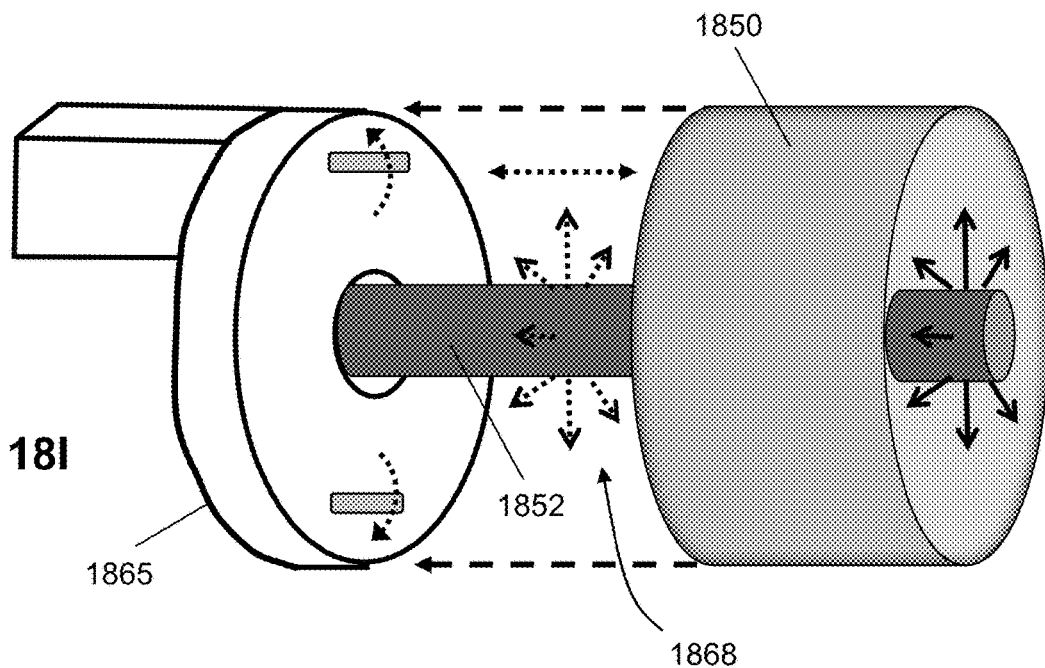
Figure 18J:
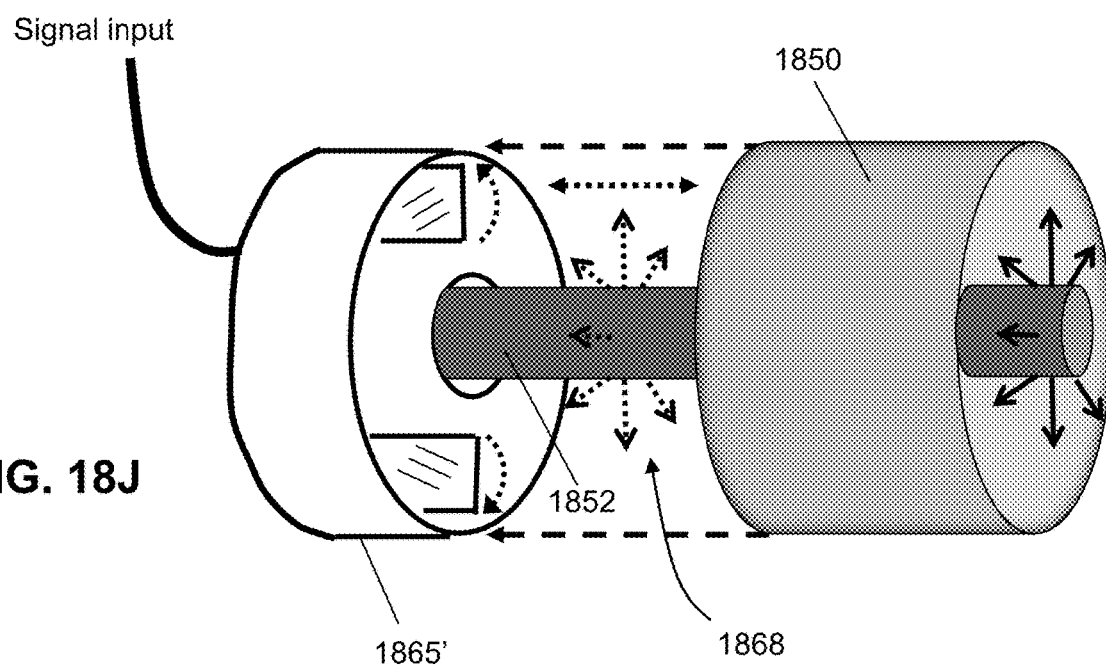

In an embodiment, cable 1862 can comprise any of the embodiments of cable 1850 described earlier. In this embodiment, waveguides 1865 and 1865' can be coupled to a transmission core 1852 of cable 1850 as depicted in FIGS. 18I and 18J. The waveguides 1865 and 1865' can induce, as previously described, electromagnetic waves 1868 on the transmission core 1852 for propagation entirely or partially within inner layers of cable 1850.

It is noted that for the foregoing embodiments of FIGS. 18G, 18H, 18I and 18J, electromagnetic waves 1868 can be bidirectional. For example, electromagnetic waves 1868 of a different operating frequency can be received by slots 1863 or MMICs 1870 of the waveguides 1865 and 1865', respectively. Once received, the electromagnetic waves can be converted by a receiver circuit (e.g., see reference 101, 1000 of FIGS. 1 and 10) for generating a communication signal for processing.

Although not shown, it is further noted that the waveguides 1865 and 1865' can be adapted so that the waveguides 1865 and 1865' can direct electromagnetic waves 1868 upstream or downstream longitudinally. For example, a first tapered horn 1880 coupled to a first instance of a waveguide 1865 or 1865' can be directed westerly on cable 1862, while a second tapered horn 1880 coupled to a second instance of a waveguide 1865 or 1865' can be directed easterly on cable 1862. The first and second instances of the waveguides 1865 or 1865' can be coupled so that in a repeater configuration, signals received by the first waveguide 1865 or 1865' can be provided to the second waveguide 1865 or 1865' for retransmission in an easterly direction on cable 1862. The repeater configuration just described can also be applied from an easterly to westerly direction on cable 1862.

Figure 18K:
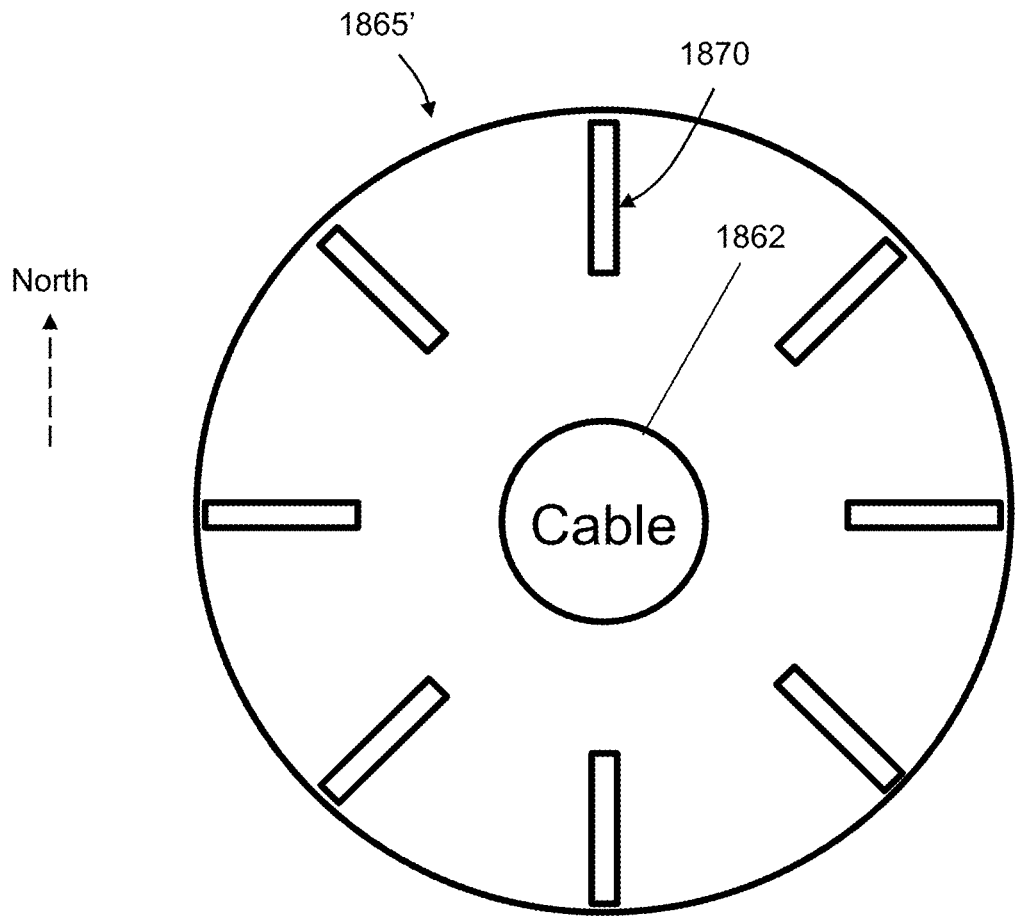

In another embodiment, the waveguide 1865' of FIGS. 18G, 18H, 18I and 18J can also be configured to generate electromagnetic waves having non-fundamental wave modes. This can be accomplished by adding more MMICs 1870 as depicted in FIG. 18K. Each MMIC 1870 can be configured to receive the same signal input 1872. However, MMICs 1870 can selectively be configured to emit electromagnetic waves having differing phases using controllable phase-shifting circuitry in each MMIC 1870. For example, the northerly and southerly MMICs 1870 can be configured to emit electromagnetic waves having a 180 degree phase difference, thereby aligning the e-fields either in a northerly or southerly direction. Any combination of pairs of MMICs 1870 (e.g., westerly and easterly MMICs 1870, northwesterly and southeasterly MMICs 1870, northeasterly and southwesterly MMICs 1870) can be configured with opposing or aligned e-fields. Consequently, waveguide 1865' can be configured to generate electromagnetic waves with one or more non-fundamental wave modes such as TMnm, HEnm or EHnm modes where n and m are non-negative integers and either n or m is non-zero, electromagnetic waves with one or more fundamental wave modes such as TM00, or any combinations thereof.

It is submitted that it is not necessary to select slots 1863 in pairs to generate electromagnetic waves having a non-fundamental wave mode. For example, electromagnetic waves having a non-fundamental wave mode can be generated by enabling a single slot from a plurality of slots and disabling all other slots. In particular, a single MMIC 1870 of the MMICs 1870 shown in FIG. 18K can be configured to generate electromagnetic waves having a non-fundamental wave mode while all other MMICs 1870 are not in use or disabled. Likewise, other wave modes and wave mode combinations can be induced by enabling other non-null proper subsets of waveguide slots 1863 or the MMICs 1870.

It is further noted that in some embodiments, the waveguide systems 1865 and 1865' may generate combinations of fundamental and non-fundamental wave modes where one wave mode is dominant over the other. For example, in one embodiment electromagnetic waves generated by the waveguide systems 1865 and 1865' may have a weak signal component that has a non-fundamental wave mode, and a substantially strong signal component that has a fundamental wave mode. Accordingly, in this embodiment, the electromagnetic waves have a substantially fundamental wave mode. In another embodiment electromagnetic waves generated by the waveguide systems 1865 and 1865' may have a weak signal component that has a fundamental wave mode, and a substantially strong signal component that has a non-fundamental wave mode. Accordingly, in this embodiment, the electromagnetic waves have a substantially non-fundamental wave mode. Further, a non-dominant wave mode may be generated that propagates only trivial distances along the length of the transmission medium.

It is also noted that the waveguide systems 1865 and 1865' can be configured to generate instances of electromagnetic waves that have wave modes that can differ from a resulting wave mode or modes of the combined electromagnetic wave. It is further noted that each MMIC 1870 of the waveguide system 1865' of FIG. 18K can be configured to generate an instance of electromagnetic waves having wave characteristics that differ from the wave characteristics of another instance of electromagnetic waves generated by another MMIC 1870. One MMIC 1870, for example, can generate an instance of an electromagnetic wave having a spatial orientation and a phase, frequency, magnitude, electric field orientation, and/or magnetic field orientation that differs from the spatial orientation and phase, frequency, magnitude, electric field orientation, and/or magnetic field orientation of a different instance of another electromagnetic wave generated by another MMIC 1870. The waveguide system 1865' can thus be configured to generate instances of electromagnetic waves having different wave and spatial characteristics, which when combined achieve resulting electromagnetic waves having one or more desirable wave modes.

From these illustrations, it is submitted that the waveguide systems 1865 and 1865' can be adapted to generate electromagnetic waves with one or more selectable wave modes. In one embodiment, for example, the waveguide systems 1865 and 1865' can be adapted to select one or more wave modes and generate electromagnetic waves having a single wave mode or multiple wave modes selected and produced from a process of combining instances of electromagnetic waves having one or more configurable wave and spatial characteristics. In an embodiment, for example, parametric information can be stored in a look-up table. Each entry in the look-up table can represent a selectable wave mode. A selectable wave mode can represent a single wave mode, or a combination of wave modes. The combination of wave modes can have one or dominant wave modes. The parametric information can provide configuration information for generating instances of electromagnetic waves for producing resultant electromagnetic waves that have the desired wave mode.

For example, once a wave mode or modes is selected, the parametric information obtained from the look-up table from the entry associated with the selected wave mode(s) can be used to identify which of one or more MMICs 1870 to utilize, and/or their corresponding configurations to achieve electromagnetic waves having the desired wave mode(s). The parametric information may identify the selection of the one or more MMICs 1870 based on the spatial orientations of the MMICs 1870, which may be required for producing electromagnetic waves with the desired wave mode. The parametric information can also provide information to configure each of the one or more MMICs 1870 with a particular phase, frequency, magnitude, electric field orientation, and/or magnetic field orientation which may or may not be the same for each of the selected MMICs 1870. A look-up table with selectable wave modes and corresponding parametric information can be adapted for configuring the slotted waveguide system 1865.

In some embodiments, a guided electromagnetic wave can be considered to have a desired wave mode if the corresponding wave mode propagates non-trivial distances on a transmission medium and has a field strength that is substantially greater in magnitude (e.g., 20 dB higher in magnitude) than other wave modes that may or may not be desirable. Such a desired wave mode or modes can be referred to as dominant wave mode(s) with the other wave modes being referred to as non-dominant wave modes. In a similar fashion, a guided electromagnetic wave that is said to be substantially without the fundamental wave mode has either no fundamental wave mode or a non-dominant fundamental wave mode. A guided electromagnetic wave that is said to be substantially without a non-fundamental wave mode has either no non-fundamental wave mode(s) or only non-dominant non-fundamental wave mode(s). In some embodiments, a guided electromagnetic wave that is said to have only a single wave mode or a selected wave mode may have only one corresponding dominant wave mode.

Figure 19A:
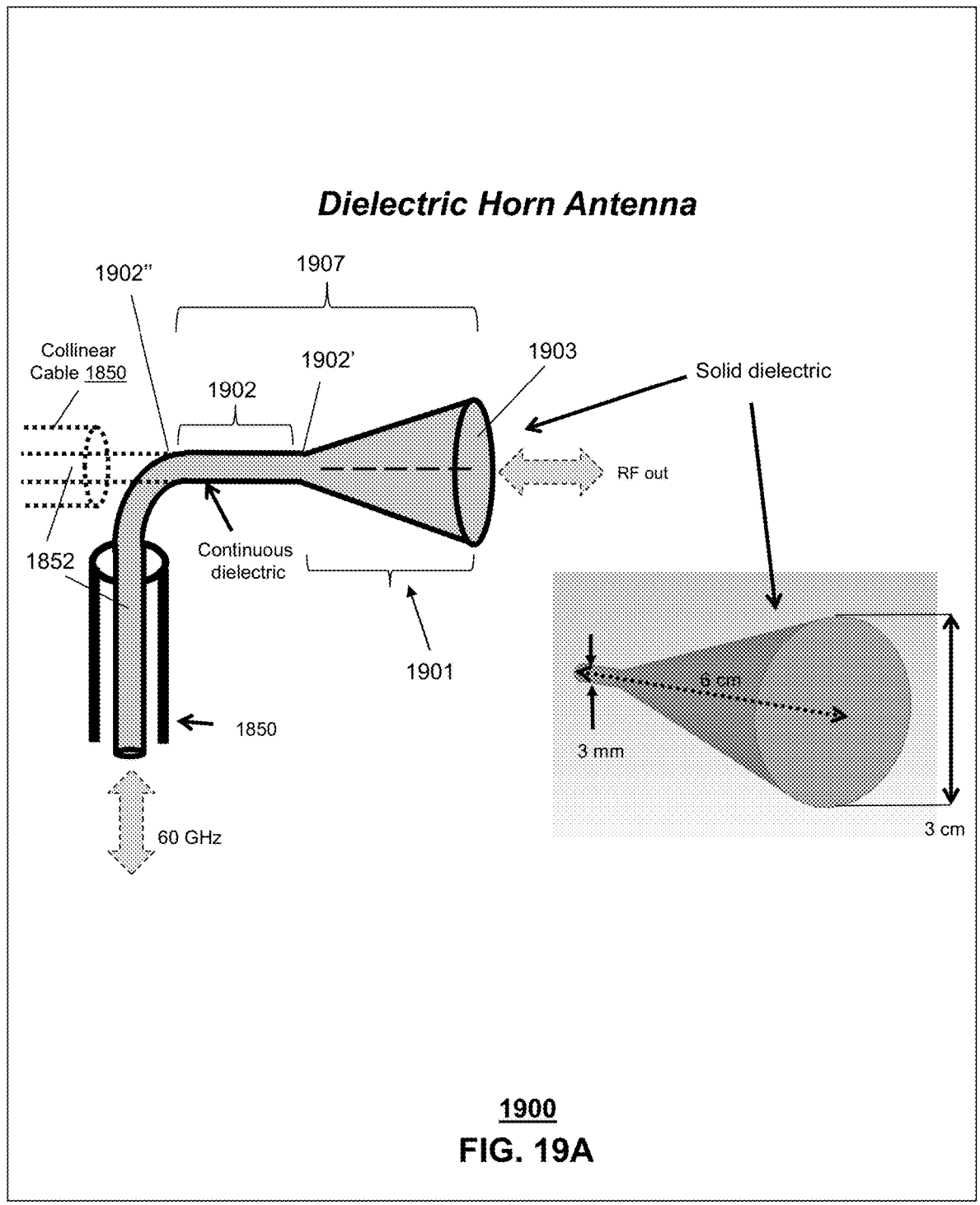
FIGS. 19A and 19B are block diagrams illustrating example, non-limiting embodiments of a dielectric antenna and corresponding gain and field intensity plots in accordance with various aspects described herein.
Figure 19B:
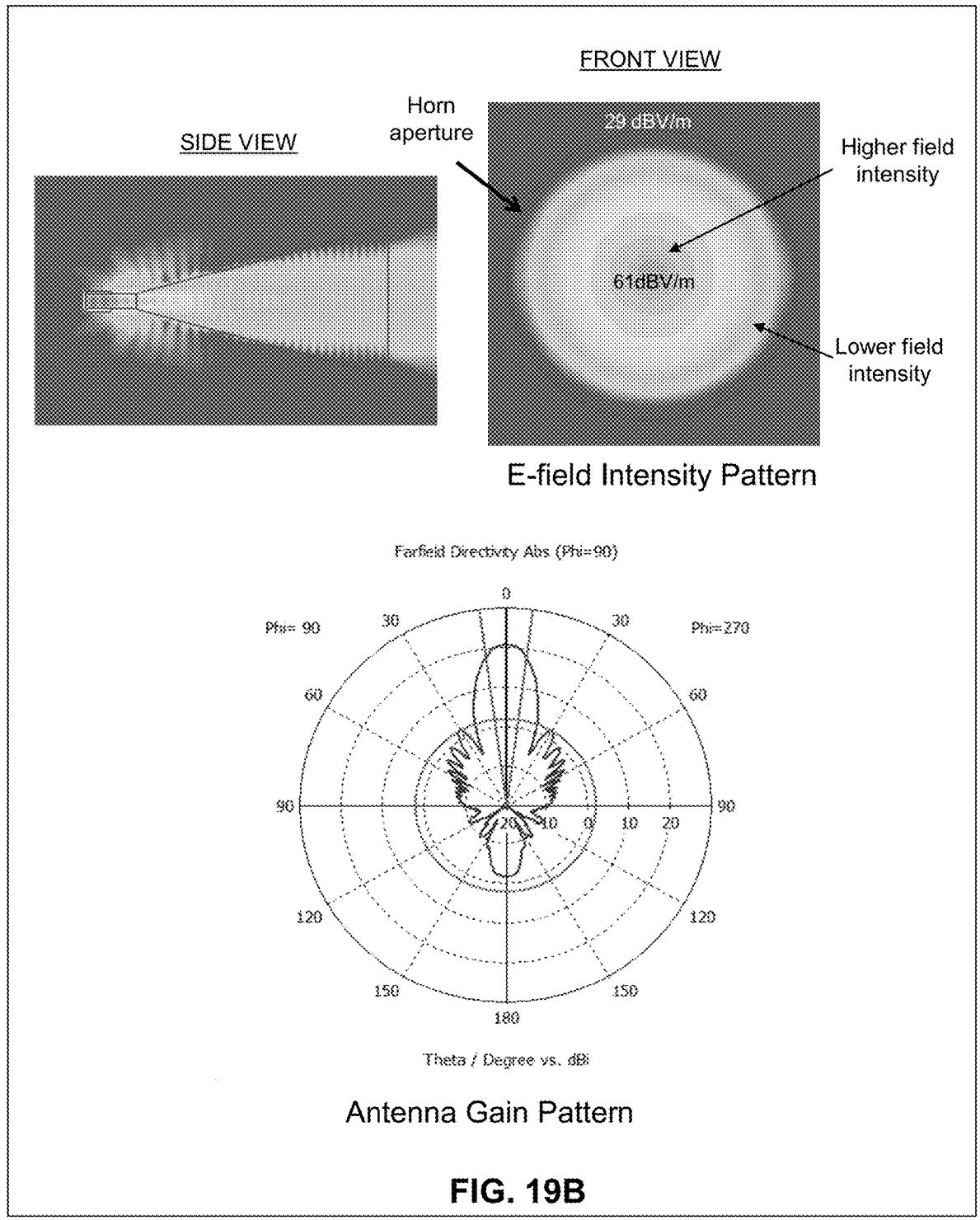

Turning now to FIGS. 19A and 19B, block diagrams illustrating example, non-limiting embodiments of a dielectric antenna and corresponding gain and field intensity plots in accordance with various aspects described herein are shown. FIG. 19A depicts a dielectric horn antenna 1901 having a conical structure. The dielectric horn antenna 1901 is coupled to one end 1902' of a feedline 1902 having a feed point 1902" at an opposite end of the feedline 1902. The dielectric horn antenna 1901 and the feedline 1902 (as well as other embodiments of the dielectric antenna described below in the subject disclosure) can be constructed of dielectric materials such as a polyethylene material, a polyurethane material or other suitable dielectric material (e.g., a synthetic resin, other plastics, etc.). The dielectric horn antenna 1901 and the feedline 1902 (as well as other embodiments of the dielectric antenna described below in the subject disclosure) can be conductorless and/or be substantially or entirely devoid of any conductive materials.

For example, the external surfaces 1907 of the dielectric horn antenna 1901 and the feedline 1902 can be non-conductive or substantially non-conductive with at least 95% of the external surface area being non-conductive and the dielectric materials used to construct the dielectric horn antenna 1901 and the feedline 1902 can be such that they substantially do not contain impurities that may be conductive (e.g., such as less than 1 part per thousand) or result in imparting conductive properties. In other embodiments, however, a limited number of conductive components can be used such as a metallic connector component used for coupling to the feed point 1902" of the feedline 1902 with one or more screws, rivets or other coupling elements used to bind components to one another, and/or one or more structural elements that do not significantly alter the radiation pattern of the dielectric antenna.

The feed point 1902" can be adapted to couple to a core 1852 such as core 1802 previously described by way of illustration in FIG. 18A. In one embodiment, the feed point 1902" can be coupled to the core 1852 utilizing a joint (not shown in FIG. 19A). Other embodiments for coupling the feed point 1902" to the core 1852 can be used. In an embodiment, the joint can be configured to cause the feed point 1902" to touch an endpoint of the core 1852. In another embodiment, the joint can create a gap between the feed point 1902" and an end of the core 1852. In yet another embodiment, the joint can cause the feed point 1902" and the core 1852 to be coaxially aligned or partially misaligned. Notwithstanding any combination of the foregoing embodiments, electromagnetic waves can in whole or at least in part propagate between the junction of the feed point 1902" and the core 1852.

The cable 1850 can be coupled to the waveguide system 1865 or the waveguide system 1865'. For illustration purposes only, reference will be made to the waveguide system 1865'. It is understood, however, that the waveguide system 1865 or other waveguide systems can also be utilized in accordance with the discussions that follow. The waveguide system 1865' can be configured to select a wave mode (e.g., non-fundamental wave mode, fundamental wave mode, a hybrid wave mode, or combinations thereof as described earlier) and transmit instances of electromagnetic waves having a non-optical operating frequency (e.g., 60 GHz). The electromagnetic waves can be directed to an interface of the cable 1850.

The instances of electromagnetic waves generated by the waveguide system 1865' can induce a combined electromagnetic wave having the selected wave mode that propagates from the core 1852 to the feed point 1902". The combined electromagnetic wave can propagate partly inside the core 1852 and partly on an outer surface of the core 1852. Once the combined electromagnetic wave has propagated through the junction between the core 1852 and the feed point 1902", the combined electromagnetic wave can continue to propagate partly inside the feedline 1902 and partly on an outer surface of the feedline 1902. In some embodiments, the portion of the combined electromagnetic wave that propagates on the outer surface of the core 1852 and the feedline 1902 is small. In these embodiments, the combined electromagnetic wave can be said to be guided by and tightly coupled to the core 1852 and the feedline 1902 while propagating longitudinally towards the dielectric antenna 1901.

When the combined electromagnetic wave reaches a proximal portion of the dielectric antenna 1901 (at a junction 1902' between the feedline 1902 and the dielectric antenna 1901), the combined electromagnetic wave enters the proximal portion of the dielectric antenna 1901 and propagates longitudinally along an axis of the dielectric antenna 1901 (shown as a hashed line). By the time the combined electromagnetic wave reaches the aperture 1903, the combined electromagnetic wave has an intensity pattern similar to the one shown by the side view and front view depicted in FIG. 19B. The electric field intensity pattern of FIG. 19B shows that the electric fields of the combined electromagnetic waves are strongest in a center region of the aperture 1903 and weaker in the outer regions. In an embodiment, where the wave mode of the electromagnetic waves propagating in the dielectric antenna 1901 is a hybrid wave mode (e.g., HE11), the leakage of the electromagnetic waves at the external surfaces 1907 is reduced or in some instances eliminated. It is further noted that while the dielectric antenna 1901 is constructed of a solid dielectric material having no physical opening, the front or operating face of the dielectric antenna 1901 from which free space wireless signals are radiated or received will be referred to as the aperture 1903 of the dielectric antenna 1901 even though in some prior art systems the term aperture may be used to describe an opening of an antenna that radiates or receives free space wireless signals. Methods for launching a hybrid wave mode on cable 1850 is discussed below.

In an embodiment, the far-field antenna gain pattern depicted in FIG. 19B can be widened by decreasing the operating frequency of the combined electromagnetic wave from a nominal frequency. Similarly, the gain pattern can be narrowed by increasing the operating frequency of the combined electromagnetic wave from the nominal frequency. Accordingly, a width of a beam of wireless signals emitted by the aperture 1903 can be controlled by configuring the waveguide system 1865' to increase or decrease the operating frequency of the combined electromagnetic wave.

The dielectric antenna 1901 of FIG. 19A can also be used for receiving wireless signals, such as free space wireless signals transmitted by either a similar antenna or conventional antenna design. Wireless signals received by the dielectric antenna 1901 at the aperture 1903 induce electromagnetic waves in the dielectric antenna 1901 that propagate towards the feedline 1902. The electromagnetic waves continue to propagate from the feedline 1902 to the junction between the feed point 1902" and an endpoint of the core 1852, and are thereby delivered to the waveguide system 1865' coupled to the cable 1850. In this configuration, the waveguide system 1865' can perform bidirectional communications utilizing the dielectric antenna 1901. It is further noted that in some embodiments the core 1852 of the cable 1850 (shown with dashed lines) can be configured to be collinear with the feed point 1902" to avoid a bend shown in FIG. 19A. In some embodiments, a collinear configuration can reduce an alteration in the propagation of the electromagnetic due to the bend in cable 1850.

Turning now to FIG. 19C, a block diagram is shown illustrating an example, non-limiting embodiment of a dielectric antenna 1901 coupled to or integrally constructed with a lens 1912 in accordance with various aspects described herein. In one embodiment, the lens 1912 can comprise a dielectric material having a first dielectric constant that is substantially similar or equal to a second dielectric constant of the dielectric antenna 1901. In other embodiments, the lens 1912 can comprise a dielectric material having a first dielectric constant that differs from a second dielectric constant of the dielectric antenna 1901. In either of these embodiments, the shape of the lens 1912 can be chosen or formed so as to equalize the delays of the various electromagnetic waves propagating at different points in the dielectric antenna 1901. In one embodiment, the lens 1912 can be an integral part of the dielectric antenna 1901 as depicted in the top diagram of FIG. 19C and in particular, the lens and dielectric antenna 1901 can be molded, machined or otherwise formed from a single piece of dielectric material. Alternatively, the lens 1912 can be an assembly component of the dielectric antenna 1901 as depicted in the bottom diagram of FIG. 19C, which can be attached by way of an adhesive material, brackets on the outer edges, or other suitable attachment techniques. The lens 1912 can have a convex structure as shown in FIG. 19C which is adapted to adjust a propagation of electromagnetic waves in the dielectric antenna 1901. While a round lens and conical dielectric antenna configuration is shown, other shapes include pyramidal shapes, elliptical shapes and other geometric shapes can likewise be implemented.

In particular, the curvature of the lens 1912 can be chosen in manner that reduces phase differences between near-field wireless signals generated by the aperture 1903 of the dielectric antenna 1901. The lens 1912 accomplishes this by applying location-dependent delays to propagating electromagnetic waves. Because of the curvature of the lens 1912, the delays differ depending on where the electromagnetic waves emanate from at the aperture 1903. For example, electromagnetic waves propagating by way of a center axis 1905 of the dielectric antenna 1901 will experience more delay through the lens 1912 than electromagnetic waves propagating radially away from the center axis 1905. Electromagnetic waves propagating towards, for example, the outer edges of the aperture 1903 will experience minimal or no delay through the lens. Propagation delay increases as the electromagnetic waves get close to the center axis 1905. Accordingly, a curvature of the lens 1912 can be configured so that near-field wireless signals have substantially similar phases. By reducing differences between phases of the near-field wireless signals, a width of far-field signals generated by the dielectric antenna 1901 is reduced, which in turn increases the intensity of the far-field wireless signals within the width of the main lobe, producing a relatively narrow beam pattern with high gain.

It should be noted that the lens 1912 can be configured in other lens configurations. For example, the lens 1912 can comprise concentric ridges 1914 configured to have a depth representative of a select wavelength factor. For example, a ridge can be configured to have a depth of one-quarter a wavelength of the electromagnetic waves propagating in the dielectric antenna 1901. Such a configuration causes the electromagnetic wave reflected from one ridge to have a phase difference of 180 degrees relative to the electromagnetic wave reflected from an adjacent ridge. Consequently, the out of phase electromagnetic waves reflected from the adjacent risers 1916 substantially cancel, thereby reducing reflection and distortion caused thereby.

Figure 19D:
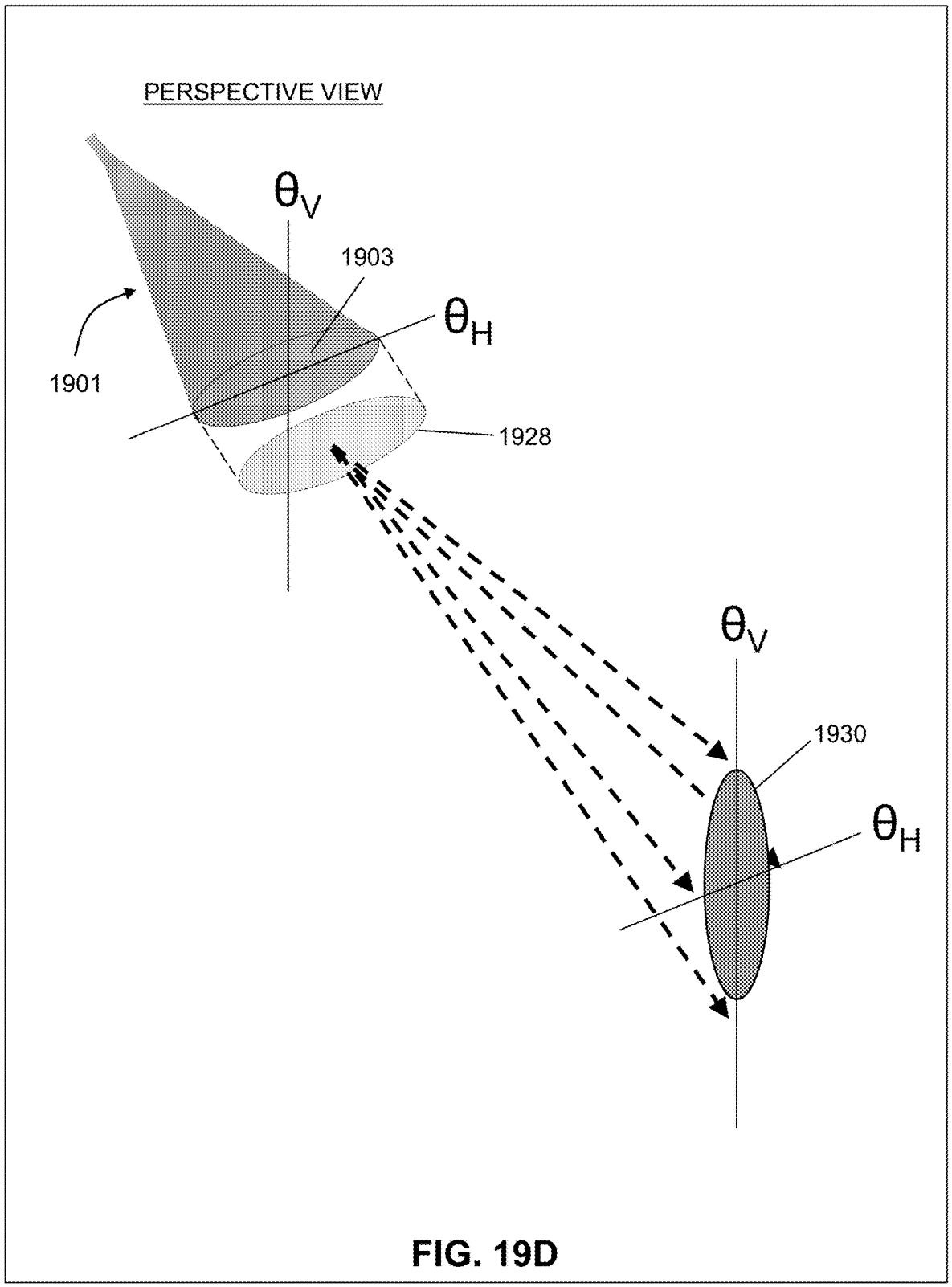
FIG. 19D is a block diagram illustrating an example, non-limiting embodiment of near-field and far-field signals emitted by the dielectric antenna of FIG. 19G in accordance with various aspects described herein.

Turning now to FIG. 19D, a block diagram illustrating an example, non-limiting embodiment of near-field signals 1928 and far-field signals 1930 emitted by the dielectric antenna 1901 having an elliptical aperture in accordance with various aspects described herein is shown. The cross section of the near-field beam pattern 1928 mimics the elliptical shape of the aperture 1903 of the dielectric antenna 1901. The cross section of the far-field beam pattern 1930 have a rotational offset (approximately 90 degrees) that results from the elliptical shape of the near-field signals 1928. The offset can be determined by applying a Fourier Transform to the near-field signals 1928. While the cross section of the near-field beam pattern 1928 and the cross section of the far-field beam pattern 1930 are shown as nearly the same size in order to demonstrate the rotational effect, the actual size of the far-field beam pattern 1930 may increase with the distance from the dielectric antenna 1901.

The elongated shape of the far-field signals 1930 and its orientation can prove useful when aligning a dielectric antenna 1901 in relation to a remotely located receiver configured to receive the far-field signals 1930. The receiver can comprise one or more dielectric antennas coupled to a waveguide system such as described by the subject disclosure. The elongated far-field signals 1930 can increase the likelihood that the remotely located receiver will detect the far-field signals 1930. In addition, the elongated far-field signals 1930 can be useful in situations where a dielectric antenna 1901 coupled to a gimbal assembly, or other actuated antenna mount (not shown) In particular, the elongated far-field signals 1930 can be useful in situations where such as gimbal mount only has two degrees of freedom for aligning the dielectric antenna 1901 in the direction of the receiver (e.g., yaw and pitch is adjustable but roll is fixed).

Although not shown, it will be appreciated that the dielectric antenna 1901 can have an integrated or attachable lens 1912 as previously described to increase an intensity of the far-fields signals 1930 by reducing phase differences in the near-field signals.

Figure 19E:
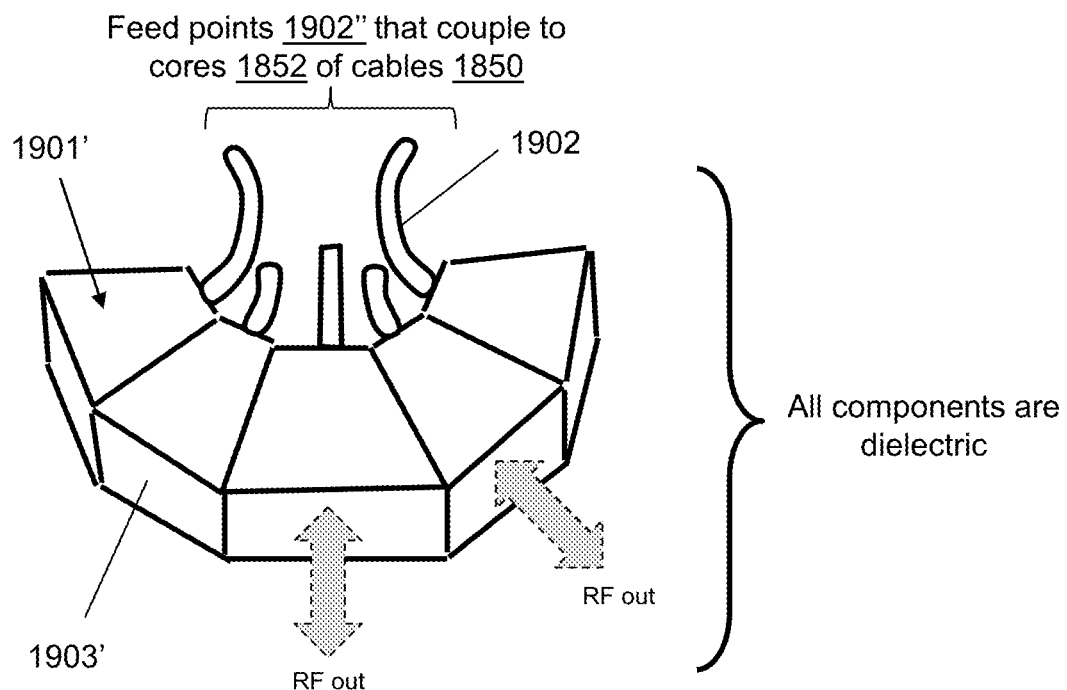
FIG. 19E is a block diagram of an example, non-limiting embodiment of a dielectric antenna in accordance with various aspects described herein.

Turning now to FIG. 19E, a block diagram of an example, non-limiting embodiment of a dielectric antenna 1901' in accordance with various aspects described herein is shown. FIG. 19E depicts an array of pyramidal-shaped dielectric horn antennas 1901', each having a corresponding aperture 1903'. Each antenna of the array of pyramidal-shaped dielectric horn antennas 1901' can have a feedline 1902 with a corresponding feed point 1902" that couples to each corresponding core 1852 of a plurality of cables 1850. Each cable 1850 can be coupled to a different (or a same) waveguide system 1865'. The array of pyramidal-shaped dielectric horn antennas 1901' can be used to transmit wireless signals having a plurality of spatial orientations. An array of pyramidal-shaped dielectric horn antennas 1901' covering 360 degrees can enable a one or more waveguide systems 1865' coupled to the antennas to perform omnidirectional communications with other communication devices or antennas of similar type.

The bidirectional propagation properties of electromagnetic waves previously described for the dielectric antenna 1901 of FIG. 19A are also applicable for electromagnetic waves propagating from the core 1852 to the feed point 1902" guided by the feedline 1902 to the aperture 1903' of the pyramidal-shaped dielectric horn antennas 1901', and in the reverse direction. Similarly, the array of pyramidal-shaped dielectric horn antennas 1901' can be substantially or entirely devoid of conductive external surfaces and internal conductive materials as discussed above. For example, in some embodiments, the array of pyramidal-shaped dielectric horn antennas 1901' and their corresponding feed points 1902' can be constructed of dielectric-only materials such as polyethylene or polyurethane materials or with only trivial amounts of conductive material that does not significantly alter the radiation pattern of the antenna.

It is further noted that each antenna of the array of pyramidal-shaped dielectric horn antennas 1901' can have similar gain and electric field intensity maps as shown for the dielectric antenna 1901 in FIG. 19B. Each antenna of the array of pyramidal-shaped dielectric horn antennas 1901' can also be used for receiving wireless signals as previously described for the dielectric antenna 1901 of FIG. 19A. In some embodiments, a single instance of a pyramidal-shaped dielectric horn antenna can be used. Similarly, multiple instances of the dielectric antenna 1901 of FIG. 19A can be used in an array configuration similar to the one shown in FIG. 19E.

Figure 19F:
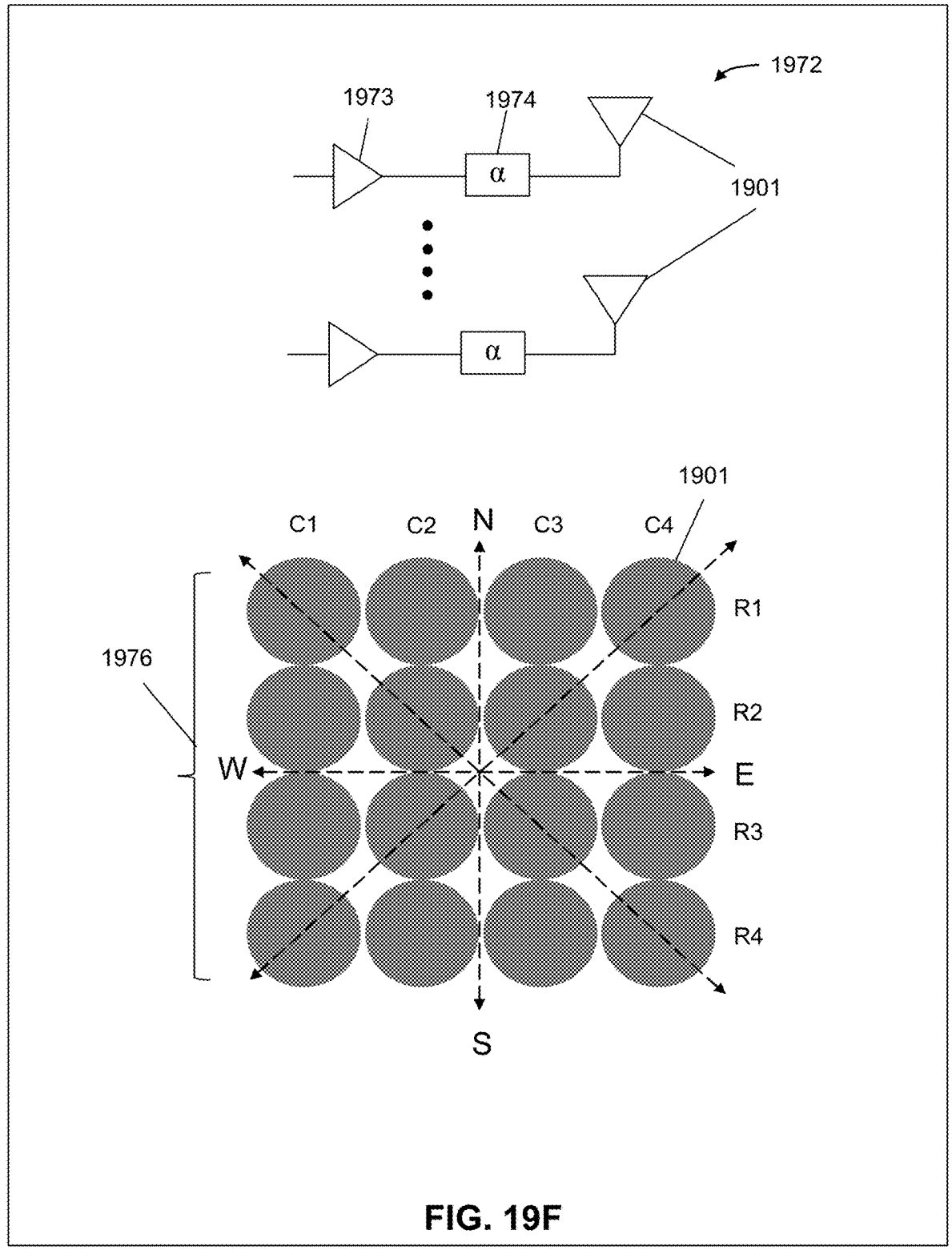
FIG. 19F is a block diagram of an example, non-limiting embodiment of an array of dielectric antennas configurable for steering wireless signals in accordance with various aspects described herein.

Turning now to FIG. 19F, block diagrams of example, non-limiting embodiments of an array 1976 of dielectric antennas 1901 configurable for steering wireless signals in accordance with various aspects described herein is shown. The array 1976 of dielectric antennas 1901 can be conical shaped antennas 1901 or pyramidal-shaped dielectric antennas 1901'. To perform beam steering, a waveguide system coupled to the array 1976 of dielectric antennas 1901 can be adapted to utilize a circuit 1972 comprising amplifiers 1973 and phase shifters 1974, each pair coupled to one of the dielectric antennas 1901 in the array 1976. The waveguide system can steer far-field wireless signals from left to right (west to east) by incrementally increasing a phase delay of signals supplied to the dielectric antennas 1901.

For example, the waveguide system can provide a first signal to the dielectric antennas of column 1 ("C1") having no phase delay. The waveguide system can further provide a second signal to column 2 ("C2"), the second signal comprising the first signal having a first phase delay. The waveguide system can further provide a third signal to the dielectric antennas of column 3 ("C3"), the third signal comprising the second signal having a second phase delay. Lastly, the waveguide system can provide a fourth signal to the dielectric antennas of column 4 ("C4"), the fourth signal comprising the third signal having a third phase delay. These phase shifted signals will cause far-field wireless signals generated by the array to shift from left to right. Similarly, far-field signals can be steered from right to left (east to west) ("C4" to "C"), north to south ("R1" to "R4"), south to north ("R4" to "R1"), and southwest to northeast ("C1-R4" to "C4-R1").

Utilizing similar techniques beam steering can also be performed in other directions such as southwest to northeast by configuring the waveguide system to incrementally increase the phase of signals transmitted by the following sequence of antennas: "C1-R4", "C1-R3/C2-R4", "C1-R2/C2-R3/C3-R4", "C1-R1/C2-R2/C3-R3/C4-R4", "C2-R1/C3-R2/C4-R3", "C3-R1/C4-R2", "C4-R1". In a similar way, beam steering can be performed northeast to southwest, northwest to southeast, southeast to northwest, as well in other directions in three-dimensional space. Beam steering can be used, among other things, for aligning the array 1976 of dielectric antennas 1901 with a remote receiver and/or for directivity of signals to mobile communication devices. In some embodiments, a phased array 1976 of dielectric antennas 1901 can also be used to circumvent the use of the gimbal assembly of FIG. 19M or other actuated mount. While the foregoing has described beam steering controlled by phase delays, gain and phase adjustment can likewise be applied to the dielectric antennas 1901 of the phased array 1976 in a similar fashion to provide additional control and versatility in the formation of a desired beam pattern.

Figure 20A:
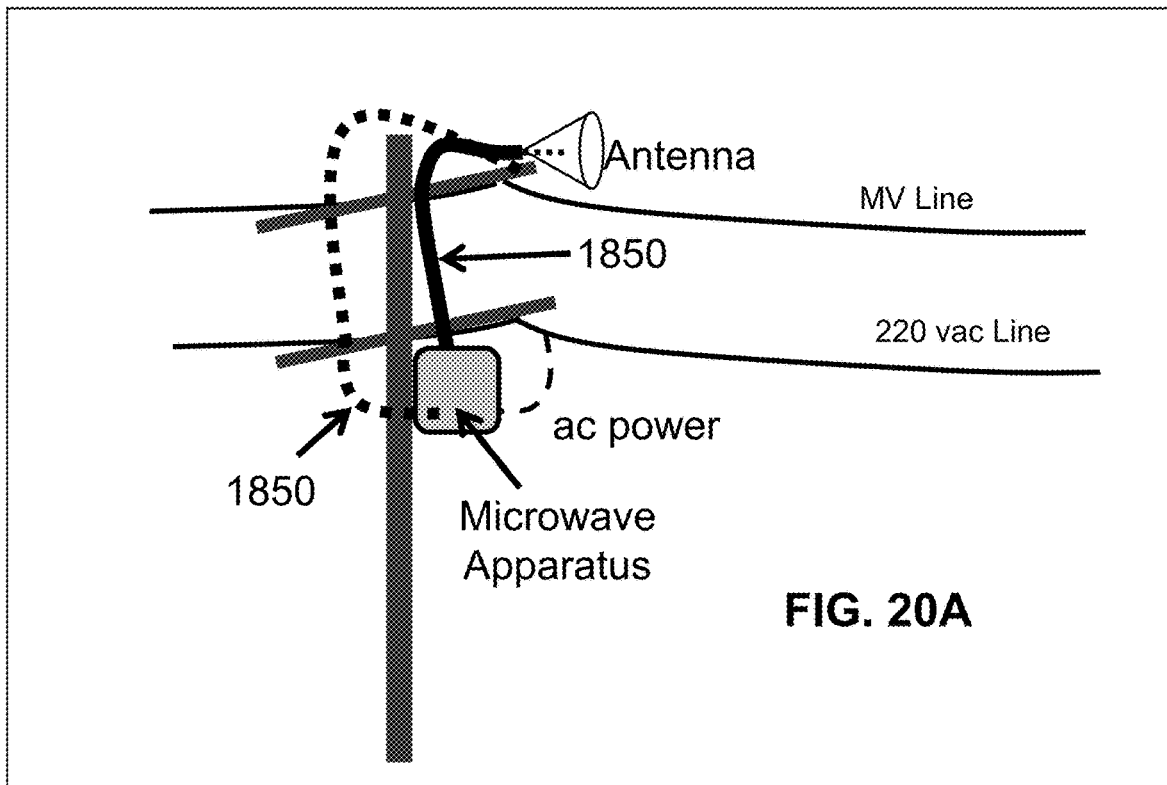
FIGS. 20A and 20B are block diagrams illustrating example, non-limiting embodiments of the transmission medium of FIG. 18A used for inducing guided electromagnetic waves on power lines supported by utility poles.
Figure 20B:
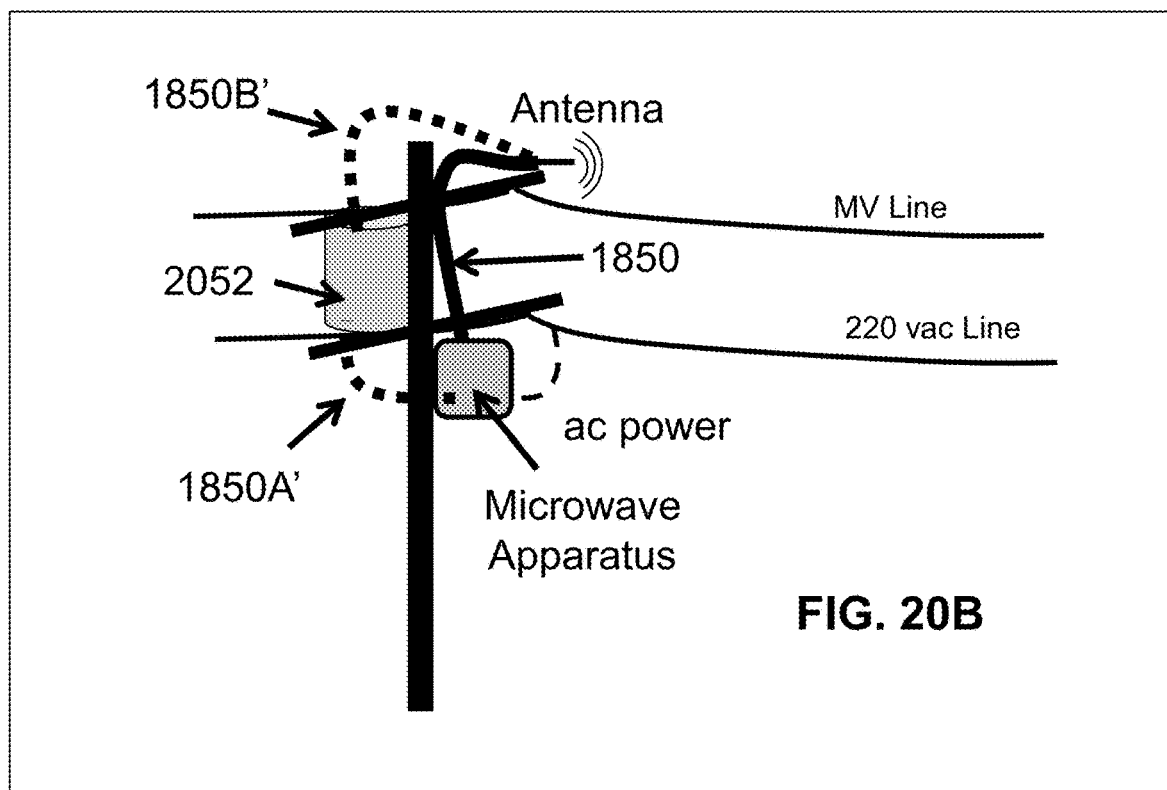

Turning now to FIGS. 20A and 20B, block diagrams illustrating example, non-limiting embodiments of the cable 1850 of FIG. 18A used for inducing guided electromagnetic waves on power lines supported by utility poles. In one embodiment, as depicted in FIG. 20A, a cable 1850 can be coupled at one end to a microwave apparatus that launches guided electromagnetic waves within one or more inner layers of cable 1850 utilizing, for example, the hollow waveguide 1808 shown in FIG. 18A. The microwave apparatus can utilize a microwave transceiver such as shown in FIG. 10 for transmitting or receiving signals from cable 1850. The guided electromagnetic waves induced in the one or more inner layers of cable 1850 can propagate to an exposed stub of the cable 1850 located inside a horn antenna (shown as a dotted line in FIG. 20A) for radiating the electromagnetic waves via the horn antenna. The radiated signals from the horn antenna in turn can induce guided electromagnetic waves that propagate longitudinally on power line such as a medium voltage (MV) power line. In one embodiment, the microwave apparatus can receive AC power from a low voltage (e.g., 220V) power line. Alternatively, the horn antenna can be replaced with a stub antenna as shown in FIG. 20B to induce guided electromagnetic waves that propagate longitudinally on a power line such as the MV power line or to transmit wireless signals to other antenna system(s).

Figure 20C:
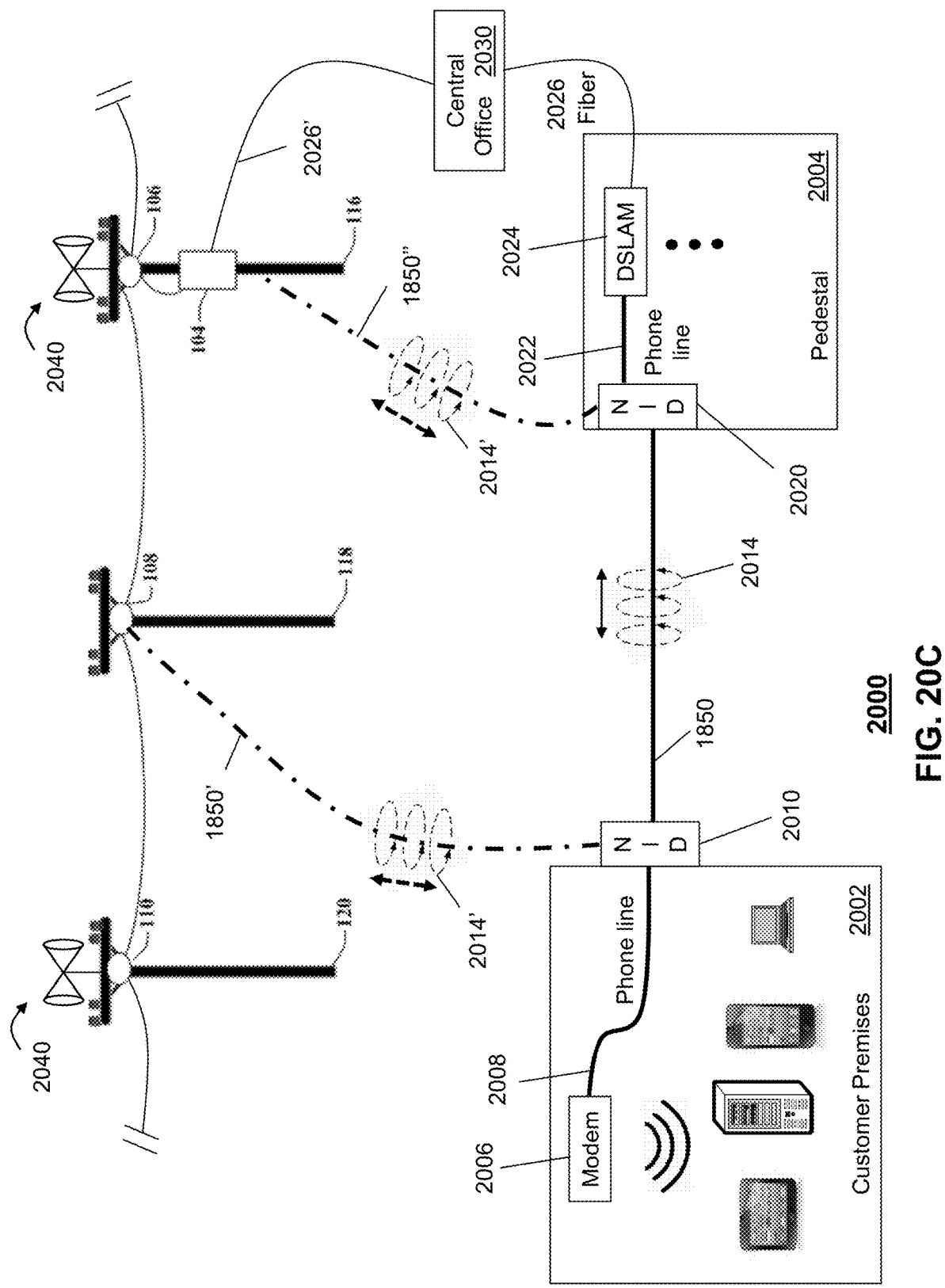
FIG. 20C is a block diagram of an example, non-limiting embodiment of a communication network in accordance with various aspects described herein.

In an alternative embodiment, the hollow horn antenna shown in FIG. 20A can be replaced with a solid dielectric antenna such as the dielectric antenna 1901 of FIG. 19A, or the pyramidal-shaped horn antenna 1901' of FIG. 19E. In this embodiment the horn antenna can radiate wireless signals directed to another horn antenna such as the bidirectional horn antennas 2040 shown in FIG. 20C. In this embodiment, each horn antenna 2040 can transmit wireless signals to another horn antenna 2040 or receive wireless signals from the other horn antenna 2040 as shown in FIG. 20C. Such an arrangement can be used for performing bidirectional wireless communications between antennas. Although not shown, the horn antennas 2040 can be configured with an electromechanical device to steer a direction of the horn antennas 2040.

In alternate embodiments, first and second cables 1850A' and 1850B' can be coupled to the microwave apparatus and to a transformer 2052, respectively, as shown in FIGS. 20A and 20B. The first and second cables 1850A' and 1850B' can be represented by, for example, cable 1800 each modified to have a conductive core. A first end of the conductive core of the first cable 1850A' can be coupled to the microwave apparatus for propagating guided electromagnetic waves launched therein. A second end of the conductive core of the first cable 1850A' can be coupled to a first end of a conductive coil of the transformer 2052 for receiving the guided electromagnetic waves propagating in the first cable 1850A' and for supplying signals associated therewith to a first end of a second cable 1850B' by way of a second end of the conductive coil of the transformer 2052. A second end of the second cable 1850B' can be coupled to the horn antenna of FIG. 20A or can be exposed as a stub antenna of FIG. 20B for inducing guided electromagnetic waves that propagate longitudinally on the MV power line.

In an embodiment where cable 1850, 1850A' and 1850B' each comprise multiple instances of transmission media 1800, a poly-rod structure of antennas 1855 can be formed such as shown in FIG. 18C. Each antenna 1855 can be coupled, for example, to a horn antenna assembly as shown in FIG. 20A or a pie-pan antenna assembly (not shown) for radiating multiple wireless signals. Alternatively, the antennas 1855 can be used as stub antennas in FIG. 20B. The microwave apparatus of FIGS. 20A-20B can be configured to adjust the guided electromagnetic waves to beam steer the wireless signals emitted by the antennas 1855. One or more of the antennas 1855 can also be used for inducing guided electromagnetic waves on a power line.

Turning now to FIG. 20C, a block diagram of an example, non-limiting embodiment of a communication network 2000 in accordance with various aspects described herein is shown. In one embodiment, for example, the waveguide system 1602 of FIG. 16A can be incorporated into network interface devices (NIDs) such as NIDs 2010 and 2020 of FIG. 20C. A NID having the functionality of waveguide system 1602 can be used to enhance transmission capabilities between customer premises 2002 (enterprise or residential) and a pedestal 2004 (sometimes referred to as a service area interface or SAI).

In one embodiment, a central office 2030 can supply one or more fiber cables 2026 to the pedestal 2004. The fiber cables 2026 can provide high-speed full-duplex data services (e.g., 1-100 Gbps or higher) to mini-DSLAMs 2024 located in the pedestal 2004. The data services can be used for transport of voice, internet traffic, media content services (e.g., streaming video services, broadcast TV), and so on. In prior art systems, mini-DSLAMs 2024 typically connect to twisted pair phone lines (e.g., twisted pairs included in category 5e or Cat. 5e unshielded twisted-pair (UTP) cables that include an unshielded bundle of twisted pair cables, such as 24 gauge insulated solid wires, surrounded by an outer insulating sheath), which in turn connect to the customer premises 2002 directly. In such systems, DSL data rates taper off at 100 Mbps or less due in part to the length of legacy twisted pair cables to the customer premises 2002 among other factors.

The embodiments of FIG. 20C, however, are distinct from prior art DSL systems. In the illustration of FIG. 20C, a mini-DSLAM 2024, for example, can be configured to connect to NID 2020 via cable 1850 (which can represent in whole or in part any of the cable embodiments described in relation to FIGS. 18A and 18B singly or in combination). Utilizing cable 1850 between customer premises 2002 and a pedestal 2004, enables NIDs 2010 and 2020 to transmit and receive guide electromagnetic waves for uplink and downlink communications. Based on embodiments previously described, cable 1850 can be exposed to rain, or can be buried without adversely affecting electromagnetic wave propagation either in a downlink path or an uplink path so long as the electric field profile of such waves in either direction is confined at least in part or entirely within inner layers of cable 1850. In the present illustration, downlink communications represents a communication path from the pedestal 2004 to customer premises 2002, while uplink communications represents a communication path from customer premises 2002 to the pedestal 2004. In an embodiment where cable 1850 includes an inner conductor, cable 1850 can also serve the purpose of supplying power to the NID 2010 and 2020 and other equipment of the customer premises 2002 and the pedestal 2004.

In customer premises 2002, DSL signals can originate from a DSL modem 2006 (which may have a built-in router and which may provide wireless services such as WiFi to user equipment shown in the customer premises 2002). The DSL signals can be supplied to NID 2010 by a twisted pair phone 2008. The NID 2010 can utilize the integrated waveguide 1602 to launch within cable 1850 guided electromagnetic waves 2014 directed to the pedestal 2004 on an uplink path. In the downlink path, DSL signals generated by the mini-DSLAM 2024 can flow through a twisted pair phone line 2022 to NID 2020. The waveguide system 1602 integrated in the NID 2020 can convert the DSL signals, or a portion thereof, from electrical signals to guided electromagnetic waves 2014 that propagate within cable 1850 on the downlink path. To provide full duplex communications, the guided electromagnetic waves 2014 on the uplink can be configured to operate at a different carrier frequency and/or a different modulation approach than the guided electromagnetic waves 2014 on the downlink to reduce or avoid interference. Additionally, on the uplink and downlink paths, the guided electromagnetic waves 2014 are guided by a core section of cable 1850, as previously described, and such waves can be configured to have a field intensity profile that confines the guide electromagnetic waves in whole or in part in the inner layers of cable 1850. Although the guided electromagnetic waves 2014 are shown outside of cable 1850, the depiction of these waves is for illustration purposes only. For this reason, the guided electromagnetic waves 2014 are drawn with "hash marks" to indicate that they are guided by the inner layers of cable 1850.

On the downlink path, the integrated waveguide system 1602 of NID 2010 receives the guided electromagnetic waves 2014 generated by NID 2020 and converts them back to DSL signals conforming to the requirements of the DSL modem 2006. The DSL signals are then supplied to the DSL modem 2006 via a set of twisted pair wires of phone line 2008 for processing. Similarly, on the uplink path, the integrated waveguide system 1602 of NID 2020 receives the guided electromagnetic waves 2014 generated by NID 2010 and converts them back to DSL signals conforming to the requirements of the mini-DSLAM 2024. The DSL signals are then supplied to the mini-DSLAM 2024 via a set of twisted pair wires of phone line 2022 for processing. Because of the short length of phone lines 2008 and 2022, the DSL modem 2006 and the mini-DSLAM 2024 can send and receive DSL signals between themselves on the uplink and downlink at very high speeds (e.g., 1 Gbps to 60 Gbps or more). Consequently, the uplink and downlink paths can in most circumstances exceed the data rate limits of traditional DSL communications over twisted pair phone lines.

Typically, DSL devices are configured for asymmetric data rates because the downlink path usually supports a higher data rate than the uplink path. However, cable 1850 can provide much higher speeds both on the downlink and uplink paths. With a firmware update, a legacy DSL modem 2006 such as shown in FIG. 20C can be configured with higher speeds on both the uplink and downlink paths. Similar firmware updates can be made to the mini-DSLAM 2024 to take advantage of the higher speeds on the uplink and downlink paths. Since the interfaces to the DSL modem 2006 and mini-DSLAM 2024 remain as traditional twisted pair phone lines, no hardware change is necessary for a legacy DSL modem or legacy mini-DSLAM other than firmware changes and the addition of the NIDs 2010 and 2020 to perform the conversion from DSL signals to guided electromagnetic waves 2014 and vice-versa. The use of NIDs enables a reuse of legacy modems 2006 and mini-DSLAMs 2024, which in turn can substantially reduce installation costs and system upgrades. For new construction, updated versions of mini-DSLAMs and DSL modems can be configured with integrated waveguide systems to perform the functions described above, thereby eliminating the need for NIDs 2010 and 2020 with integrated waveguide systems. In this embodiment, an updated version of modem 2006 and updated version of mini-DSLAM 2024 would connect directly to cable 1850 and communicate via bidirectional guided electromagnetic wave transmissions, thereby averting a need for transmission or reception of DSL signals using twisted pair phone lines 2008 and 2022.

In an embodiment where use of cable 1850 between the pedestal 2004 and customer premises 2002 is logistically impractical or costly, NID 2010 can be configured instead to couple to a cable 1850' (similar to cable 1850 of the subject disclosure) that originates from a waveguide 108 on a utility pole 118, and which may be buried in soil before it reaches NID 2010 of the customer premises 2002. Cable 1850' can be used to receive and transmit guided electromagnetic waves 2014' between the NID 2010 and the waveguide 108. Waveguide 108 can connect via waveguide 106, which can be coupled to base station 104. Base station 104 can provide data communication services to customer premises 2002 by way of its connection to central office 2030 over fiber 2026'. Similarly, in situations where access from the central office 2030 to pedestal 2004 is not practical over a fiber link, but connectivity to base station 104 is possible via fiber link 2026', an alternate path can be used to connect to NID 2020 of the pedestal 2004 via cable 1850" (similar to cable 1850 of the subject disclosure) originating from pole 116. Cable 1850" can also be buried before it reaches NID 2020.

Figure 20D:
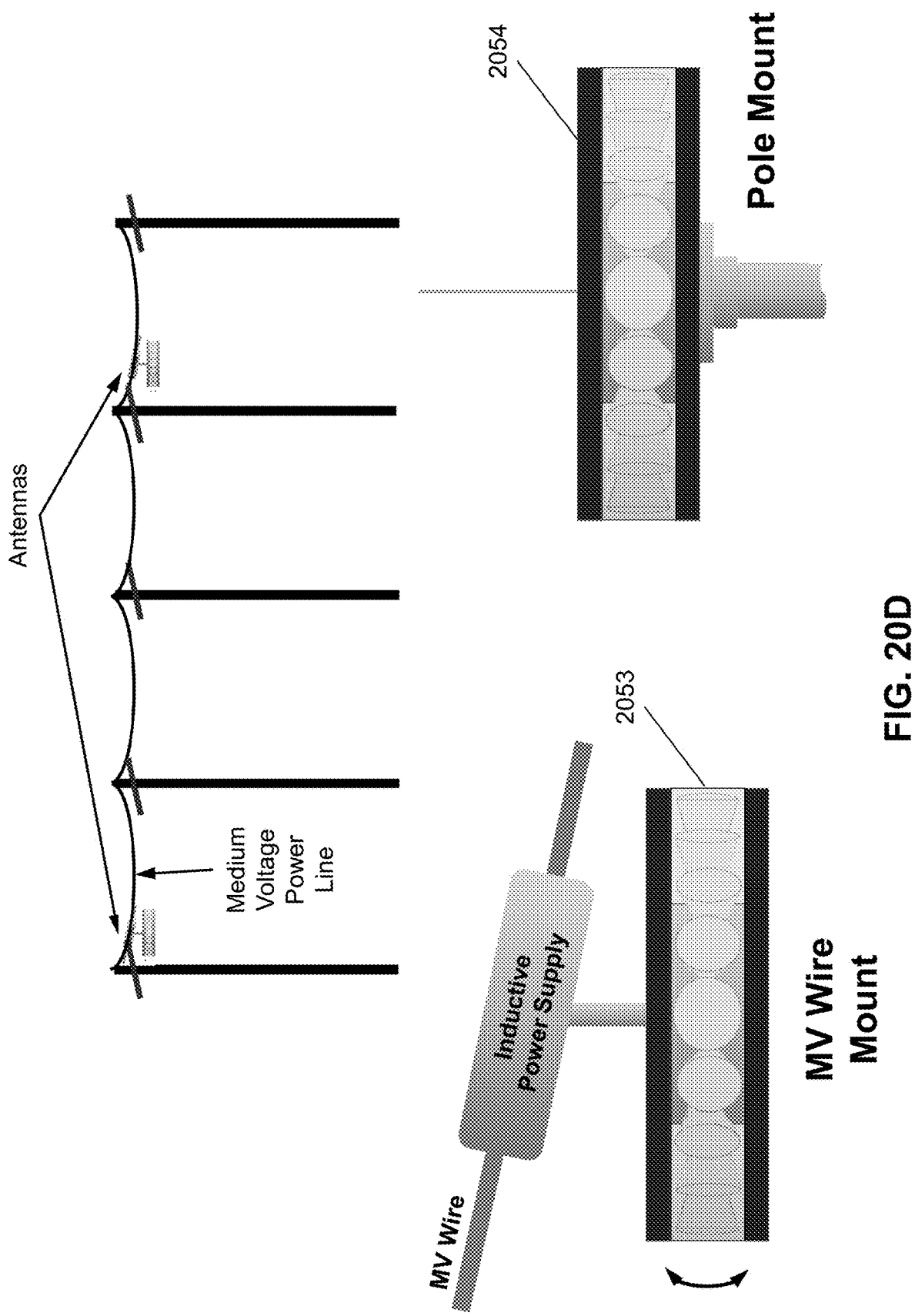
FIG. 20D is a block diagram of an example, non-limiting embodiment of an antenna mount for use in a communication network in accordance with various aspects described herein.
Figure 20E:
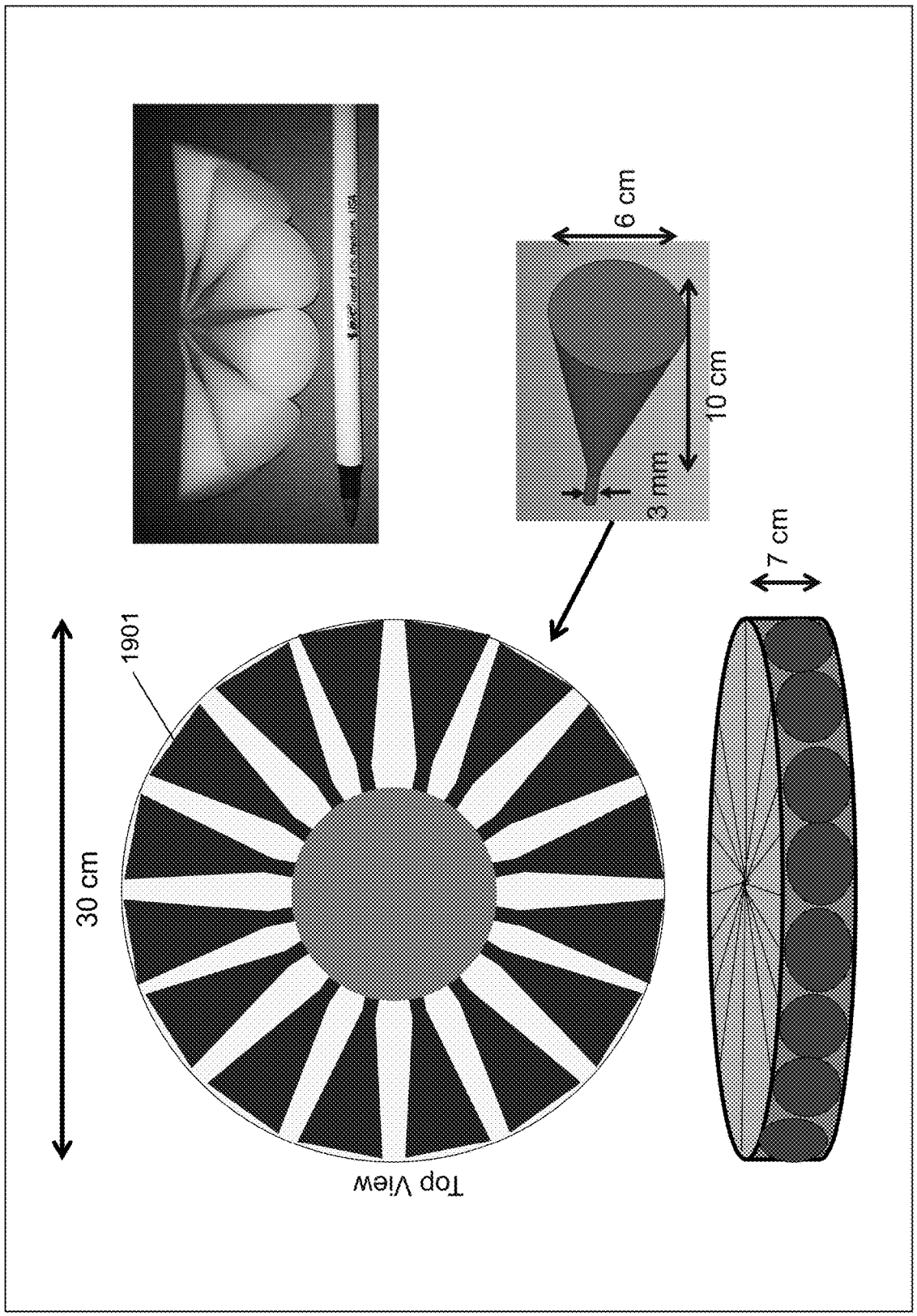
FIG. 20E is a block diagram of an example, non-limiting embodiment of an antenna mount for use in a communication network in accordance with various aspects described herein.

Turning now to FIGS. 20D and 20E, diagrams of example, non-limiting embodiments of antenna mounts that can be used in the communication network 2000 of FIG. 20C (or other suitable communication networks) in accordance with various aspects described herein are shown. In some embodiments, an antenna mount 2053 can be coupled to a medium voltage power line by way of an inductive power supply that supplies energy to one or more waveguide systems (not shown) integrated in the antenna mount 2053 as depicted in FIG. 20D. The antenna mount 2053 can include an array of dielectric antennas 1901 (e.g., 16 antennas) such as shown by the top and side views depicted in FIG. 20F. The dielectric antennas 1901 shown in FIG. 20F can be small in dimension as illustrated by a picture comparison between groups of dielectric antennas 1901 and a conventional ballpoint pen. In other embodiments, a pole mounted antenna 2054 can be used as depicted in FIG. 20D. In yet other embodiments, an antenna mount can be attached to a pole with an arm assembly. In other embodiments, an antenna mount can be placed on a top portion of a pole coupled to a cable 1800 or 1836 such as the cables as described in the subject disclosure.

The array of dielectric antennas 1901 of the antenna mount of FIG. 20D can include one or more waveguide systems as described in the subject disclosure by way of FIGS. 1-20. The waveguide systems can be configured to perform beam steering with the array of dielectric antennas 1901 (for transmission or reception of wireless signals). Alternatively, each dielectric antenna 1901 can be utilized as a separate sector for receiving and transmitting wireless signals. In other embodiments, the one or more waveguide systems integrated in the antenna mount of FIG. 20D can be configured to utilize combinations of the dielectric antennas 1901 in a wide range of multi-input multi-output (MIMO) transmission and reception techniques. The one or more waveguide systems integrated in the antenna mount of FIG. 20D can also be configured to apply communication techniques such as SISO, SIMO, MISO, SISO, signal diversity (e.g., frequency, time, space, polarization, or other forms of signal diversity techniques), and so on, with any combination of the dielectric antennas 1901 in any of the antenna mount of FIG. 20D. In yet other embodiments, the antenna mount of FIG. 20D can be adapted with two or more stacks of the antenna arrays shown in FIG. 20E.

Figure 21A:
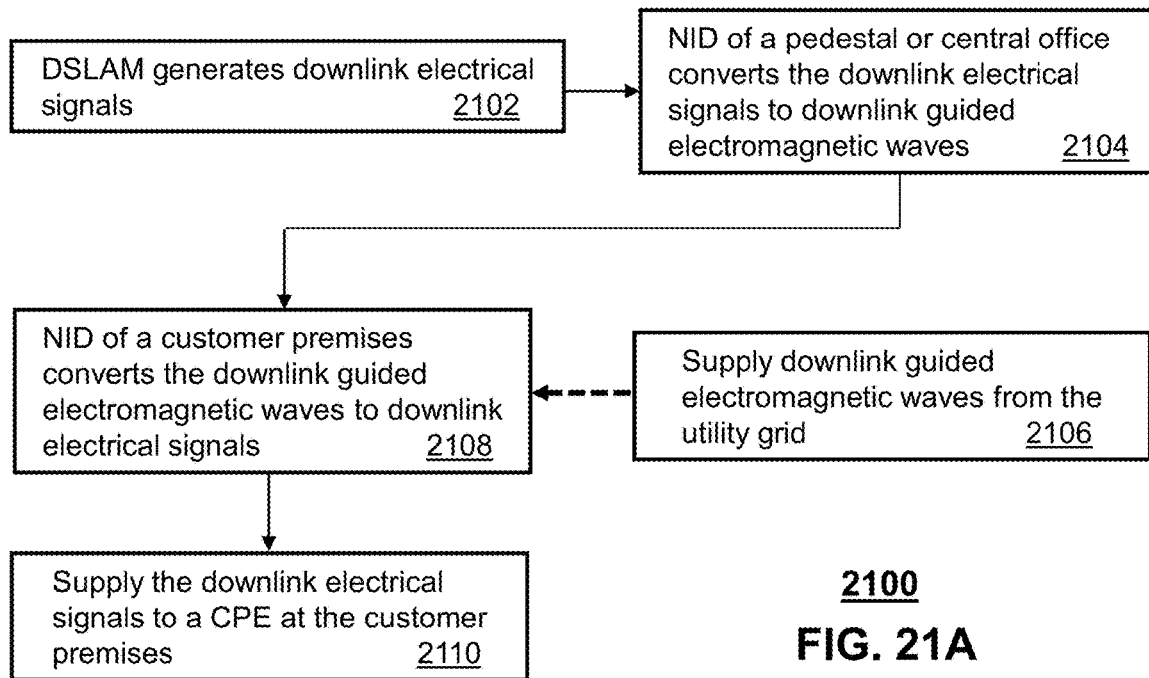
FIG. 21A illustrates a flow diagram of an example, non-limiting embodiment of a method for transmitting downlink signals.
Figure 21B:
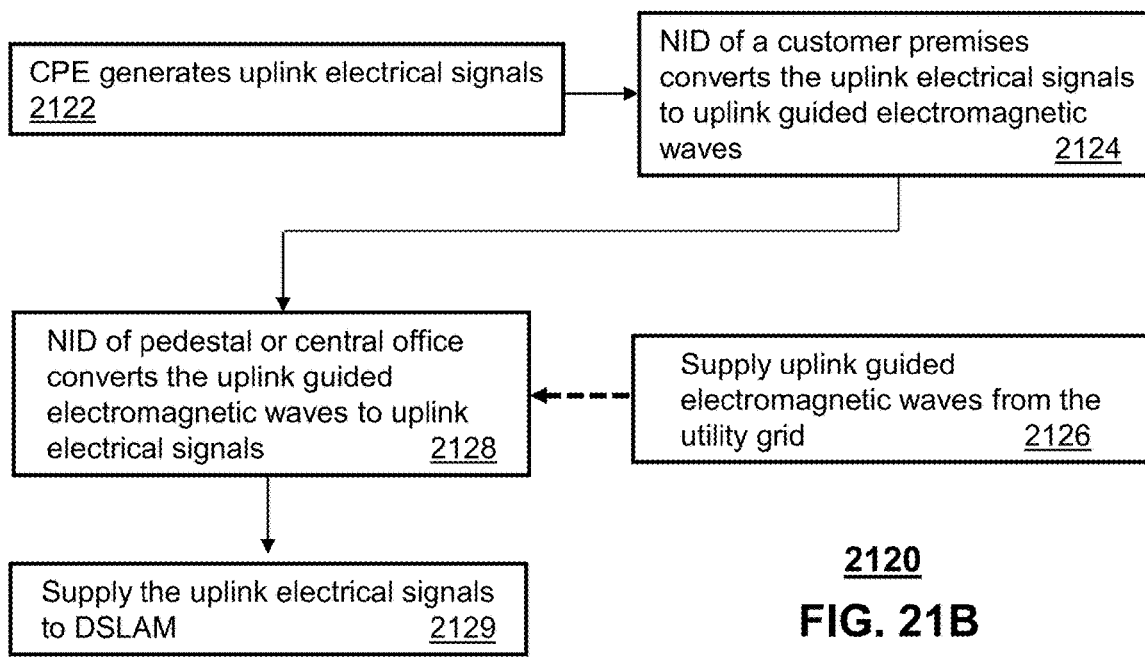
FIG. 21B illustrates a flow diagram of an example, non-limiting embodiment of a method for transmitting uplink signals.

FIGS. 21A and 21B describe embodiments for downlink and uplink communications. Method 2100 of FIG. 21A can begin with step 2102 where electrical signals (e.g., DSL signals) are generated by a DSLAM (e.g., mini-DSLAM 2024 of pedestal 2004 or from central office 2030), which are converted to guided electromagnetic waves 2014 at step 2104 by NID 2020 and which propagate on a transmission medium such as cable 1850 for providing downlink services to the customer premises 2002. At step 2108, the NID 2010 of the customer premises 2002 converts the guided electromagnetic waves 2014 back to electrical signals (e.g., DSL signals) which are supplied at step 2110 to customer premises equipment (CPE) such as DSL modem 2006 over phone line 2008. Alternatively, or in combination, power and/or guided electromagnetic waves 2014' can be supplied from a power line 1850' of a utility grid (having an inner waveguide as illustrated in FIG. 18G or 18H) to NID 2010 as an alternate or additional downlink (and/or uplink) path.

At step 2122 of method 2120 of FIG. 21B, the DSL modem 2006 can supply electrical signals (e.g., DSL signals) via phone line 2008 to NID 2010, which in turn at step 2124, converts the DSL signals to guided electromagnetic waves directed to NID 2020 by way of cable 1850. At step 2128, the NID 2020 of the pedestal 2004 (or central office 2030) converts the guided electromagnetic waves 2014 back to electrical signals (e.g., DSL signals) which are supplied at step 2129 to a DSLAM (e.g., mini-DSLAM 2024). Alternatively, or in combination, power and guided electromagnetic waves 2014' can be supplied from a power line 1850' of a utility grid (having an inner waveguide as illustrated in FIG. 18G or 18H) to NID 2020 as an alternate or additional uplink (and/or downlink) path.

Turning now to FIG. 21C, a block diagram 2151 illustrating an example, non-limiting embodiment of electric field characteristics of a hybrid wave versus a Goubau wave in accordance with various aspects described herein is shown. Diagram 2158 shows a distribution of energy between HE11 mode waves and Goubau waves for an insulated conductor. The energy plots of diagram 2158 assume that the amount of power used to generate the Goubau waves is the same as the HE11 waves (i.e., the area under the energy curves is the same). In the illustration of diagram 2158, Goubau waves have a steep drop in power when Goubau waves extend beyond the outer surface of an insulated conductor, while HE11 waves have a substantially lower drop in power beyond the insulation layer. Consequently, Goubau waves have a higher concentration of energy near the insulation layer than HE 11 waves. Diagram 2167 depicts similar Goubau and HE11 energy curves when a water film is present on the outer surface of the insulator. The difference between the energy curves of diagrams 2158 and 2167 is that the drop in power for the Goubau and the HE11 energy curves begins on an outer edge of the insulator for diagram 2158 and on an outer edge of the water film for diagram 2167. The energy curves diagrams 2158 and 2167, however, depict the same behavior. That is, the electric fields of Goubau waves are tightly bound to the insulation layer, which when exposed to water results in greater propagation losses than electric fields of HE11 waves having a higher concentration outside the insulation layer and the water film. These properties are depicted in the HE11 and Goubau diagrams 2168 and 2159, respectively.

Figure 21D:
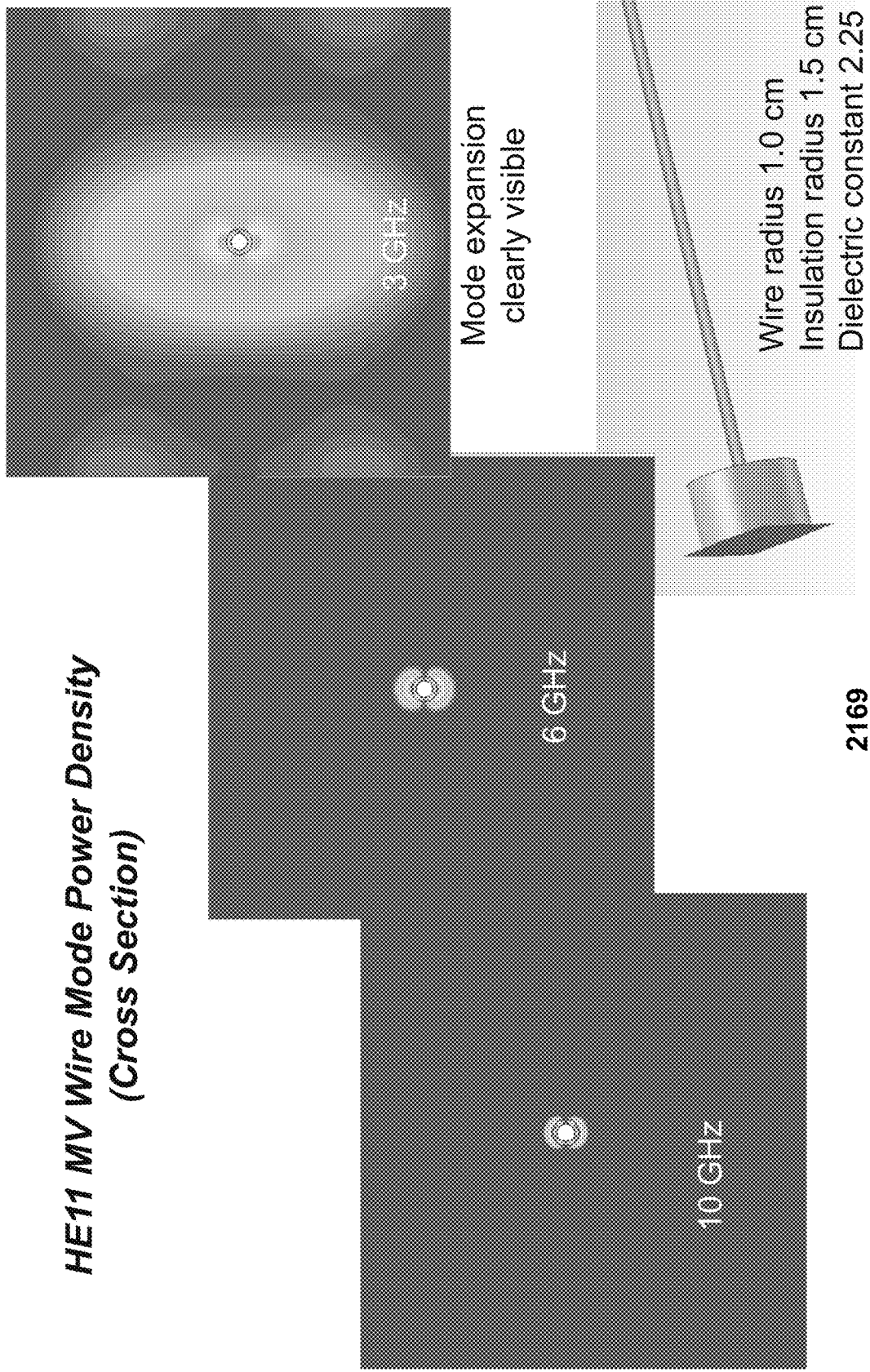
FIG. 21D is a block diagram illustrating an example, non-limiting embodiment of mode sizes of hybrid waves at various operating frequencies in accordance with various aspects described herein.

By adjusting an operating frequency of HE11 waves, e-fields of HE11 waves can be configured to extend substantially above a thin water film as shown in block diagram 2169 of FIG. 21D having a greater accumulated field strength in areas in the air when compared to fields in the insulator and a water layer surrounding the outside of the insulator. FIG. 21D depicts a wire having a radius of 1 cm and an insulation radius of 1.5 cm with a dielectric constant of 2.25. As the operating frequency of HE11 waves is reduced, the e-fields extend outwardly expanding the size of the wave mode. At certain operating frequencies (e.g., 3 GHz) the wave mode expansion can be substantially greater than the diameter of the insulated wire and any obstructions that may be present on the insulated wire.

By having e-fields that are perpendicular to a water film and by placing most of its energy outside the water film, HE11 waves have less propagation loss than Goubau waves when a transmission medium is subjected to water or other obstructions. Although Goubau waves have radial e-fields which are desirable, the waves are tightly coupled to the insulation layer, which results in the e-fields being highly concentrated in the region of an obstruction. Consequently, Goubau waves are still subject to high propagation losses when an obstruction such as a water film is present on the outer surface of an insulated conductor.

Turning now to FIGS. 22A and 22B, block diagrams illustrating example, non-limiting embodiments of a waveguide system 2200 for launching hybrid waves in accordance with various aspects described herein is shown. The waveguide system 2200 can comprise probes 2202 coupled to a slideable or rotatable mechanism 2204 that enables the probes 2202 to be placed at different positions or orientations relative to an outer surface of an insulated conductor 2208. The mechanism 2204 can comprise a coaxial feed 2206 or other coupling that enables transmission of electromagnetic waves by the probes 2202. The coaxial feed 2206 can be placed at a position on the mechanism 2204 so that the path difference between the probes 2202 is one-half a wavelength or some odd integer multiple thereof. When the probes 2202 generate electromagnetic signals of opposite phase, electromagnetic waves can be induced on the outer surface of the insulated conductor 2208 having a hybrid mode (such as an HE11 mode).

The mechanism 2204 can also be coupled to a motor or other actuator (not shown) for moving the probes 2202 to a desirable position. In one embodiment, for example, the waveguide system 2200 can comprise a controller that directs the motor to rotate the probes 2202 (assuming they are rotatable) to a different position (e.g., east and west) to generate electromagnetic waves that have a horizontally polarized HE11 mode. To guide the electromagnetic waves onto the outer surface of the insulated conductor 2208, the waveguide system 2200 can further comprise a tapered horn 2210 shown in FIG. 22B. The tapered horn 2210 can be coaxially aligned with the insulated conductor 2208. To reduce the cross-sectional dimension of the tapered horn 2210, an additional insulation layer (not shown) can placed on the insulated conductor 2208. The additional insulation layer can be similar to the tapered insulation layer 1879 shown in FIGS. 18G and 18H. The additional insulation layer can have a tapered end that points away from the tapered horn 2210. The tapered insulation layer 1879 can reduce a size of an initial electromagnetic wave launched according to an HE11 mode. As the electromagnetic waves propagate towards the tapered end of the insulation layer, the HE11 mode expands until it reaches its full size. In other embodiments, the waveguide system 2200 may not need to use the tapered insulation layer 1879.

HE11 mode waves can be used to mitigate obstructions such as rain water. For example, suppose that rain water has caused a water film to surround an outer surface of the insulated conductor 2208. Further assume that water droplets have collected at the bottom of the insulated conductor 2208. The water film occupies a small fraction of the total HE11 wave. Also, by having horizontally polarized HE11 waves, the water droplets are in a least-intense area of the HE11 waves reducing losses caused by the droplets. Consequently, the HE11 waves experience much lower propagation losses than Goubau waves or waves having a mode that is tightly coupled to the insulated conductor 2208 and thus greater energy in the areas occupied by the water.

It is submitted that the waveguide system 2200 of FIGS. 22A-22B can be replaced with other waveguide systems of the subject disclosure capable of generating electromagnetic waves having an HE mode. For example, the waveguide system 1865' of FIG. 18K can be configured to generate electromagnetic waves having an HE mode. In an embodiment, two or more MMICs 1870 of the waveguide system 1865' can be configured to generate electromagnetic waves of opposite phase to generate polarized e-fields such as those present in an HE mode. In another embodiment, different pairs of MMICs 1870 can be selected to generate HE waves that are polarized at different spatial positions (e.g., north and south, west and east, northwest and southeast, northeast and southeast, or other sub-fractional coordinates). Additionally, the waveguide systems of FIGS. 18D-18K can be configured to launch electromagnetic waves having an HE mode onto the core 1852 of one or more embodiments of cable 1850 suitable for propagating HE mode waves.

Although HE waves can have desirable characteristics for mitigating obstructions on a transmission medium, it is submitted that certain wave modes having a cutoff frequency (e.g., TE modes, TM modes or combinations thereof) may also exhibit waves that are sufficiently large and have polarized e-fields that are orthogonal (or approximately orthogonal) to a region of an obstruction enabling their use for mitigating propagation losses caused by the obstruction.

Turning to the illustration of FIG. 23, the waveguide 2522 covers a first region 2506 of a core 2528. Within the first region 2506, waveguide 2522 has an outer surface 2522A and an inner surface 2523. The inner surface 2523 of the waveguide 2522 can be constructed from a metallic material or other material that reflects electromagnetic waves and thereby enables the waveguide 2522 to be configured at step 2404 to guide the first electromagnetic wave 2502 towards the core 2528. The core 2528 can comprise a dielectric core (as described in the subject disclosure) that extends to the inner surface 2523 of the waveguide 2522. In other embodiments, the dielectric core can be surrounded by cladding (such as shown in FIG. 18A), whereby the cladding extends to the inner surface 2523 of the waveguide 2522. In yet other embodiments, the core 2528 can comprise an insulated conductor, where the insulation extends to the inner surface 2523 of the waveguide 2522. In this embodiment, the insulated conductor can be a power line, a coaxial cable, or other types of insulated conductors.

In the first region 2506, the core 2528 comprises an interface 2526 for receiving the first electromagnetic wave 2502. In one embodiment, the interface 2526 of the core 2528 can be configured to reduce reflections of the first electromagnetic wave 2502. In one embodiment, the interface 2526 can be a tapered structure to reduce reflections of the first electromagnetic wave 2502 from a surface of the core 2528. Other structures can be used for the interface 2526. For example, the interface 2526 can be partially tapered with a rounded point. Accordingly, any structure, configuration, or adaptation of the interface 2526 that can reduced reflections of the first electromagnetic wave 2502 is contemplated by the subject disclosure. The first electromagnetic wave 2502 induces (or otherwise generates) a second electromagnetic wave 2504 that propagates within the core 2528 in the first region 2506 covered by the waveguide 2522. The inner surface 2523 of the waveguide 2522 confines the second electromagnetic wave 2504 within the core 2528.

A second region 2508 of the core 2528 is not covered by the waveguide 2522, and is thereby exposed to the environment (e.g., air). In the second region 2508, the second electromagnetic wave 2504 expands outwardly beginning from the discontinuity between the edge of the waveguide 2522 and the exposed core 2528. To reduce the radiation into the environment from the second electromagnetic wave 2504, the core 2528 can be configured to have a tapered structure 2520. As the second electromagnetic wave 2504 propagates along the tapered structure 2520, the second electromagnetic wave 2504 remains substantially bound to the tapered structure 2520 thereby reducing radiation losses. The tapered structure 2520 ends at a transition from the second region 2508 to a third region 2510. In the third region, the core has a cylindrical structure 2529 having a diameter equal to the endpoint of the tapered structure 2520 at the juncture between the second region 2508 and the third region 2510. In the third region 2510 of the core 2528, the second electromagnetic wave 2504 experiences a low propagation loss. In one embodiment, this can be accomplished by selecting a diameter of the core 2528 that enables the second electromagnetic wave 2504 to be loosely bound to the outer surface of the core 2528 in the third region 2510. Alternatively, or in combination, propagation losses of the second electromagnetic wave 2504 can be reduced by configuring the MMICs 2524 to adjust a wave mode, wave length, operating frequency, or other operational parameter of the first electromagnetic wave 2502.

Figure 23A:
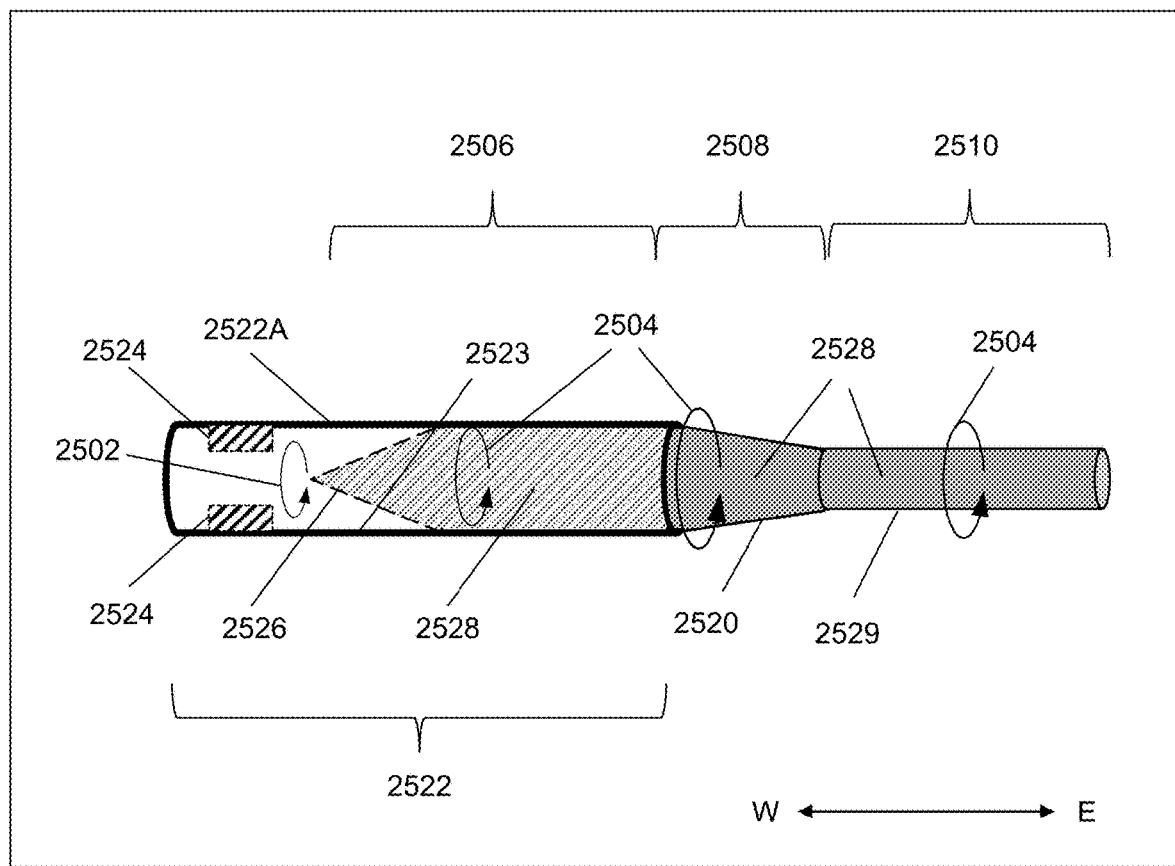
FIGS. 23A, 23B, and 23C are block diagrams illustrating example, non-limiting embodiments of a waveguide device in accordance with various aspects described herein.

FIG. 24 illustrates a portion of the waveguide 2522 of FIG. 23A depicted as a cylindrical ring (that does not show the MMICs 2524 or the tapered structure 2526 of FIG. 23A). In the simulations, a first electromagnetic wave is injected at the endpoint of the core 2528 shown in FIG. 24. The simulation assumes no reflections of the first electromagnetic wave based on an assumption that a tapered structure 2526 (or other suitable structure) is used to reduce such reflections. The simulations are shown as two longitudinal cross-sectional views of the core 2528 covered in part by waveguide section 2523A, and an orthogonal cross-sectional view of the core 2528. In the case of the longitudinal cross-sectional views, one of the illustrations is a blown up view of a portion of the first illustration.

As can be seen from the simulations, electromagnetic wave fields 2532 of the second electromagnetic wave 2504 are confined within the core 2528 by the inner surface 2523 of the waveguide section 2523A. As the second electromagnetic wave 2504 enters the second region 2508 (no longer covered by the waveguide section 2523A), the tapered structure 2520 reduces radiation losses of the electromagnetic wave fields 2532 as it expands over the outer tapered surface of the core 2528. As the second electromagnetic wave 2504 enters the third region 2510, the electromagnetic wave fields 2532 stabilize and thereafter remain loosely coupled to the core 2528 (depicted in the longitudinal and orthogonal cross-sectional views), which reduces propagation losses.

Figure 23B:
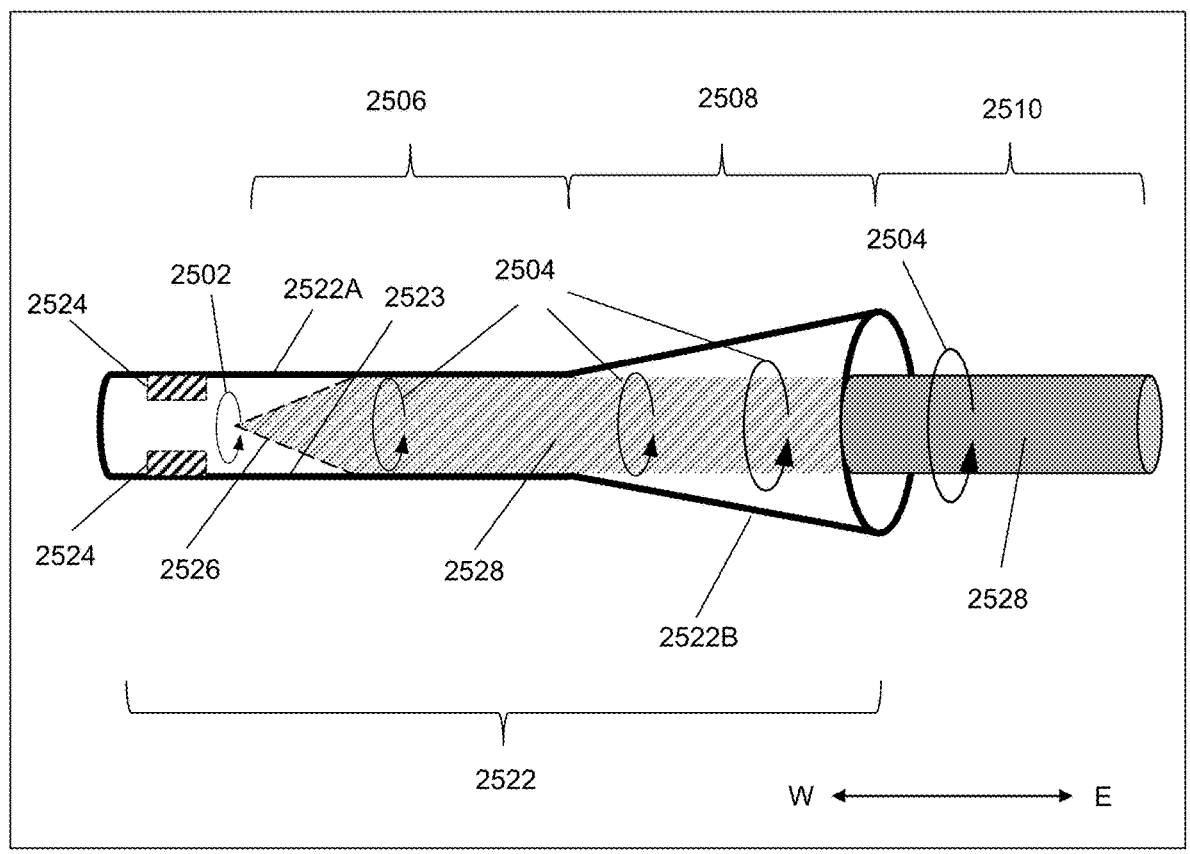

FIG. 23B provides an alternative embodiment to the tapered structure 2520 in the second region 2508. The tapered structure 2520 can be avoided by extending the waveguide 2522 into the second region 2508 with a tapered structure 2522B and maintaining the diameter of the core 2528 throughout the first, second and third regions 2506, 2508 and 2510 of the core 2528 as depicted in FIG. 23B. The horn structure 2522B can be used to reduce radiation losses of the second electromagnetic wave 2504 as the second electromagnetic wave 2504 transitions from the first region 2506 to the second region 2508. In the third region 2510, the core 2528 is exposed to the environment. As noted earlier, the core 2528 is configured in the third region 2510 to reduce propagation losses by the second electromagnetic wave 2504. In one embodiment, this can be accomplished by selecting a diameter of the core 2528 that enables the second electromagnetic wave 2504 to be loosely bound to the outer surface of the core 2528 in the third region 2510. Alternatively, or in combination, propagation losses of the second electromagnetic wave 2504 can be reduced by adjusting a wave mode, wave length, operating frequency, or other performance parameter of the first electromagnetic wave 2502.

The waveguides 2522 of FIGS. 23A and 23B can also be adapted for receiving electromagnetic waves. For example, the waveguide 2522 of FIG. 23A can be adapted to receive an electromagnetic wave at step 2412. This can be represented by an electromagnetic wave 2504 propagating in the third region 2510 from east to west (orientation shown at bottom right of FIGS. 23A-23B) towards the second region 2508. Upon reaching the second region 2508, the electromagnetic wave 2504 gradually becomes more tightly coupled to the tapered structure 2520. When it reaches the boundary between the second region 2508 and the first region 2506 (i.e., the edge of the waveguide 2522), the electromagnetic wave 2504 propagates within the core 2528 confined by the inner surface 2523 of the waveguide 2522. Eventually the electromagnetic wave 2504 reaches an endpoint of the tapered interface 2526 of the core 2528 and radiates as a new electromagnetic wave 2502 which is guided by the inner surface 2523 of the waveguide 2522.

One or more antennas of the MMICs 2524 can be configured to receive the electromagnetic wave 2502 thereby converting the electromagnetic wave 2502 to an electrical signal at step 2414 which can be processed by a processing device (e.g., a receiver circuit and microprocessor). To prevent interference between electromagnetic waves transmitted by the MMICs 2524, a remote waveguide system that transmitted the electromagnetic wave 2504 that is received by the waveguide 2522 of FIG. 23A can be adapted to transmit the electromagnetic wave 2504 at a different operating frequency, different wave mode, different phase, or other adjustable operational parameter to avoid interference. Electromagnetic waves can be received by the waveguide 2522 of FIG. 23B in a similar manner as described above.

Figure 23C:
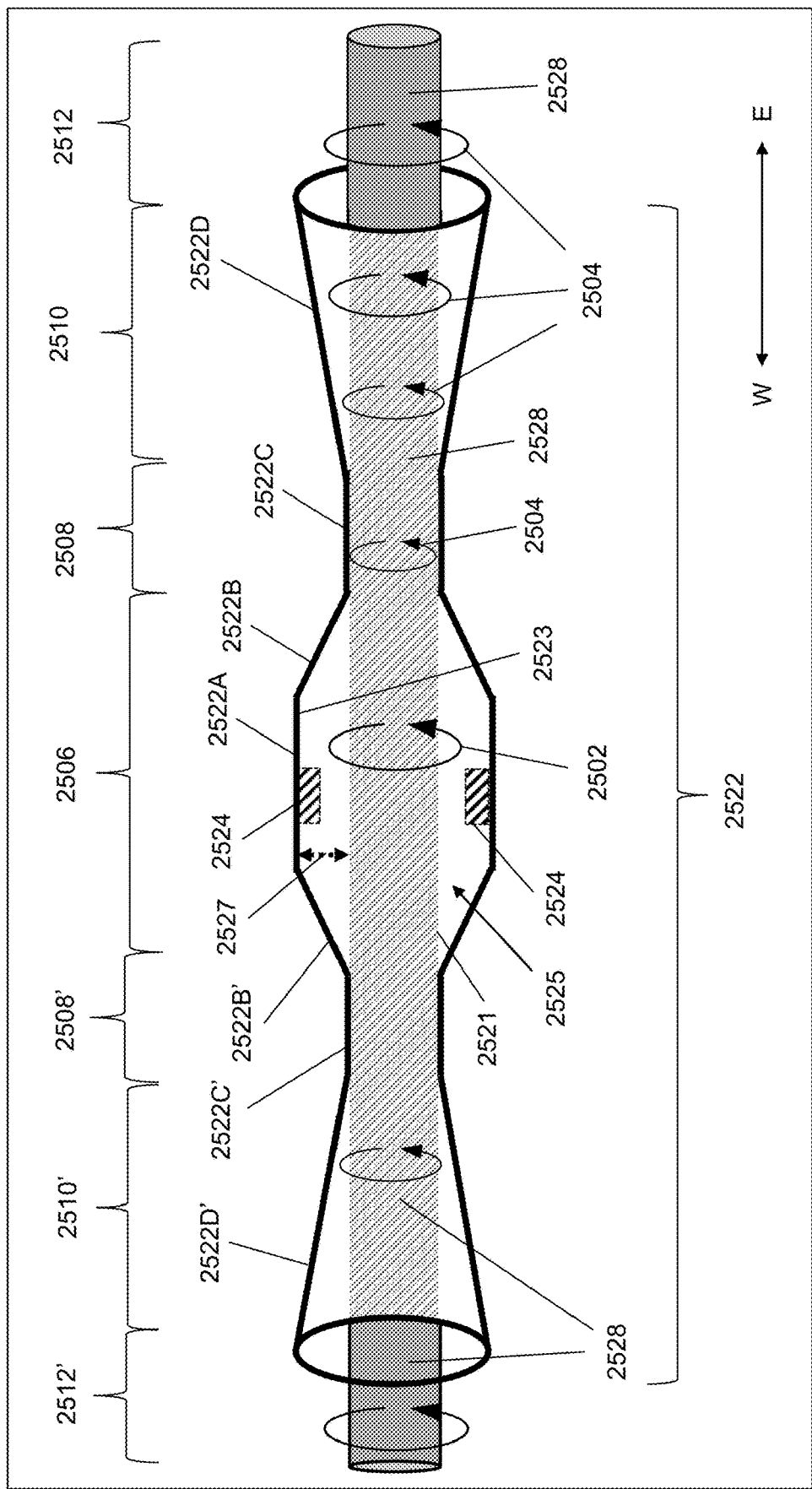

Turning now to FIG. 23C, the waveguide 2522 of FIG. 23B can be adapted to support transmission media 2528 that have no endpoints such as shown in FIG. 23C. In this illustration, the waveguide 2522 comprises a chamber 2525 in a first region 2506 of the core 2528. The chamber 2525 creates a gap 2527 between an outer surface 2521 of the core 2528 and the inner surface 2523 of the waveguide 2522. The gap 2527 provides sufficient room for placement of the MMICs 2524 on the inner surface 2523 of the waveguide 2522. To enable the waveguide 2522 to receive electromagnetic waves from either direction, the waveguide 2522 can be configured with symmetrical regions: 2508 and 2508', 2510 and 2510', and 2512, and 2512'. In the first region 2506, the chamber 2525 of the waveguide 2522 has two tapered structures 2522B' and 2522B". These tapered structures 2522B' and 2522B" enable an electromagnetic wave to gradually enter or exit the chamber 2525 from either direction of the core 2528. The MMICs 2524 can be configured with directional antennas to launch a first electromagnetic wave 2502 directed from east-to-west or from west-to-east in relation to the longitudinal view of the core 2528. Similarly, the directional antennas of the MMICs 2524 can be configured to receive an electromagnetic waves propagating longitudinally on the core 2528 from east-to-west or from west-to-east. The process for transmitting electromagnetic waves is similar to that described for FIG. 23B depending on whether the directional antennas of the MMICs 2524 are transmitting from east-to-west or from west-to-east.

Although not shown, the waveguide 2522 of FIG. 23C can be configured with a mechanism such as one or more hinges that enable splitting the waveguide 2522 into two parts that can be separated. The mechanism can be used to enable installation of the waveguide 2522 onto a core 2528 without endpoints. Other mechanisms for installation of the waveguide 2522 of FIG. 23C on a core 2528 are contemplated by the subject disclosure. For example, the waveguide 2522 can be configured with a slot opening that spans the entire waveguide structure longitudinally. In a slotted design of the waveguide 2522, the regions 2522C' and 2522C of the waveguide 2522 can be configured so that the inner surface 2523 of the waveguide 2522 is tightly coupled to the outer surface of the core 2528. The tight coupling between the inner surface 2523 of the waveguide 2522 the outer surface of the core 2528 prevents sliding or movement of the waveguide 2522 relative to the core 2528. A tight coupling in the regions 2522C' and 2522C can also be applied to a hinged design of the waveguide 2522.

Figure 25A:
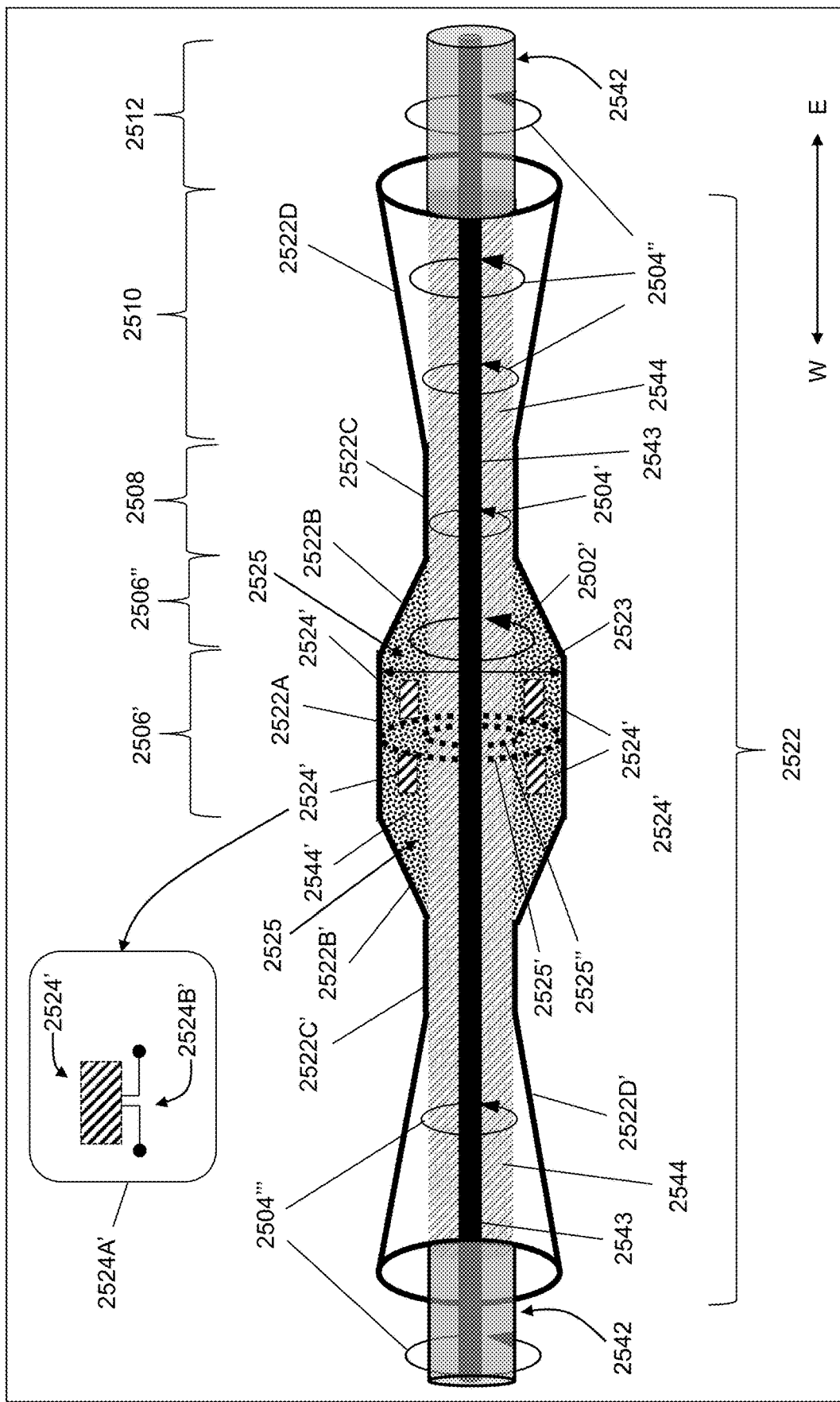
FIG. 25A is a block diagram illustrating an example, non-limiting embodiment of a waveguide device in accordance with various aspects described herein.
Figure 25B:
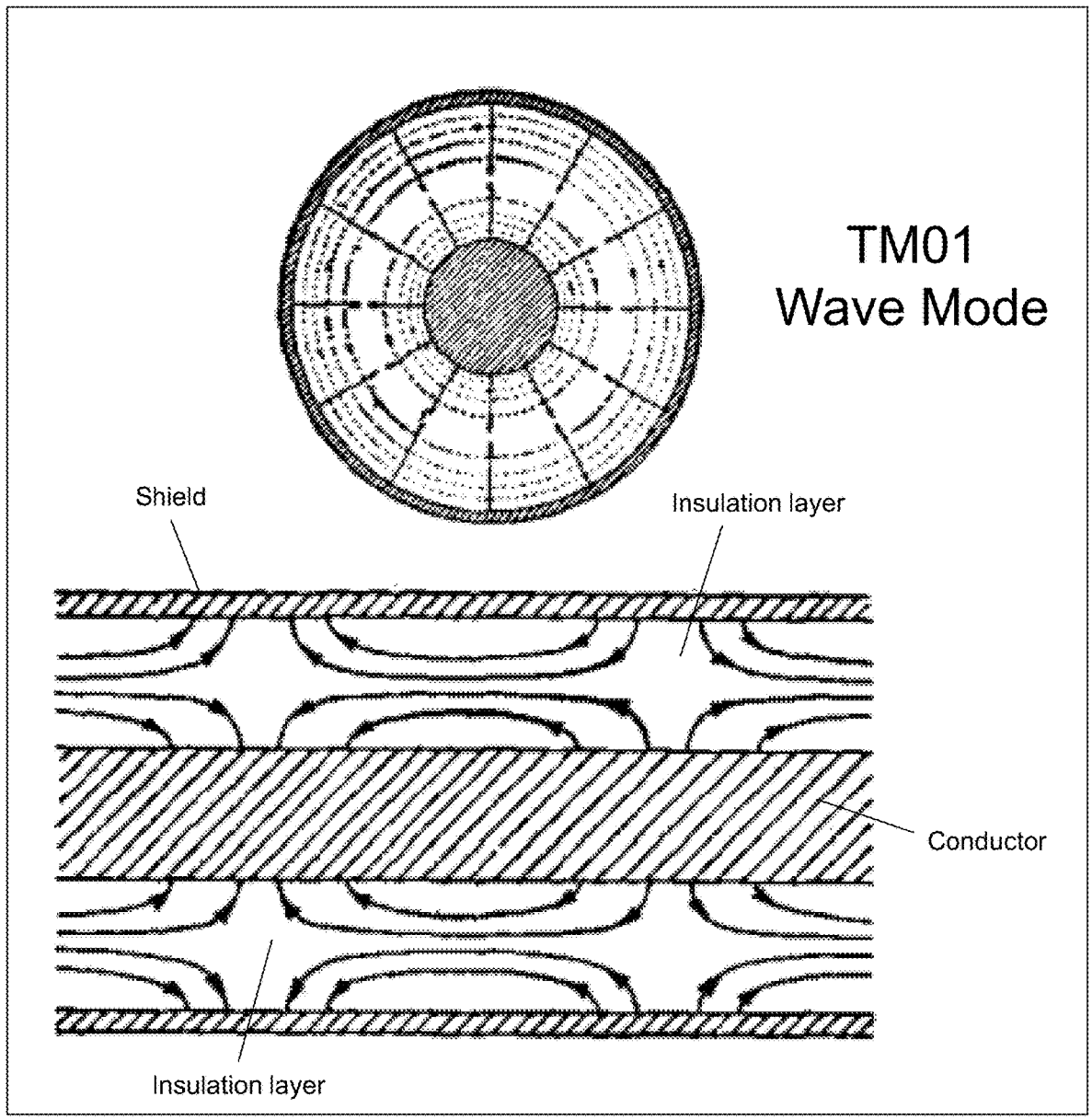
FIGS. 25B, 25C and 25D are block diagrams illustrating example, non-limiting embodiments of wave modes and electric field plots in accordance with various aspects described herein.
Figure 25C:
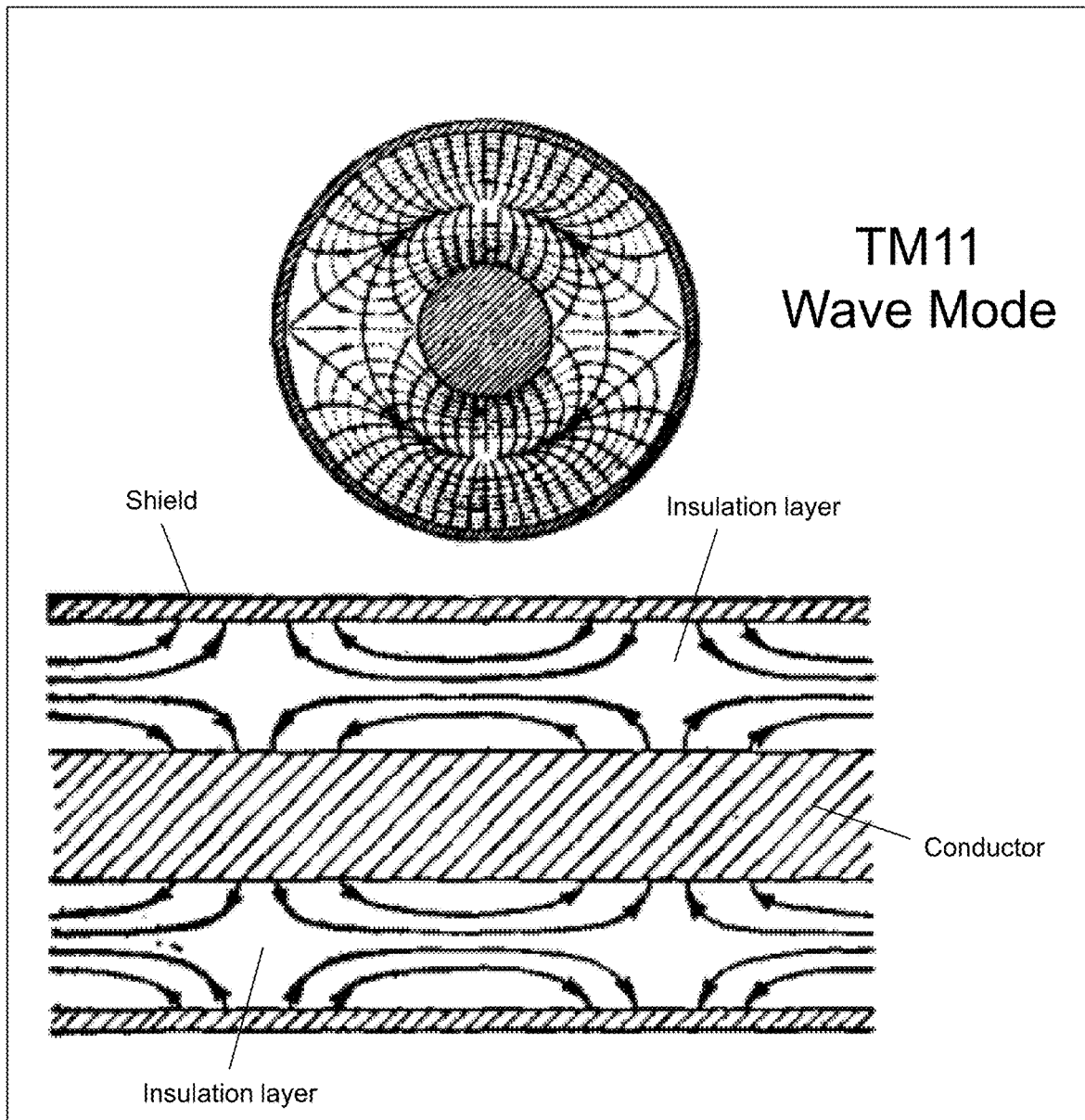

The waveguides 2522 shown in FIGS. 23A, 23B and 25C can be adapted to perform one or more embodiments described in other figures of the subject disclosure. Accordingly, it is contemplated that such embodiments can be applied to the waveguide 2522 of FIGS. 23A, 23B and 23C. Additionally, any adaptations in the subject disclosure of a core can be applied to the waveguide 2522 of FIGS. 23A, 23B and 23C.

It is further noted that the waveguide launchers 2522 of FIGS. 23A-23C and/or other waveguide launchers described and shown in the figures of the subject disclosure (e.g., FIGS. 7-14, 18D-18K, 22A-22B, 23A-23C, 24 and other drawings) and any methods thereof can be adapted to generate along a transmission medium having an outer surface composed of, for example, a dielectric material (e.g., insulation, oxidation, or other material with dielectric properties) a single wave mode or combination of wave modes that reduce propagation losses when propagating through a substance, such as a liquid (e.g., water produced by humidity, snow, dew, sleet and/or rain), disposed on the outer surface of the transmission medium.

Referring now to FIG. 25A, there is illustrated a diagram of an example, non-limiting embodiment of a waveguide device 2522 in accordance with various aspects described herein. In the illustration of FIG. 25A, the waveguide device 2522 is coupled to a transmission medium 2542 comprising a conductor 2543 and insulation layer 2543, which together form an insulated conductor. Although not shown, the waveguide device 2522 can be constructed in two halves, which can be connected together at one longitudinal end with one or more mechanical hinges to enable opening a longitudinal edge at an opposite end of the one or more hinges for placement of the waveguide device 2522 over the transmission medium 2542. Once placed, one or more latches at the longitudinal edge opposite the one or more hinges can be used to secure the waveguide device 2522 to the transmission medium 2542. Other embodiments for coupling the waveguide device 2522 to the transmission medium 2542 can be used and are therefore contemplated by the subject disclosure.

The chamber 2525 of the waveguide device 2522 of FIG. 25A includes a dielectric material 2544'. The dielectric material 2544' in the chamber 2525 can have a dielectric constant similar to the dielectric constant of the dielectric layer 2544 of the insulated conductor. Additionally, a disk 2525' having a center-hole 2525" can be used to divide the chamber 2525 in two halves for transmission or reception of electromagnetic waves. The disk 2525' can be constructed of a material (e.g., carbon, metal or other reflective material) that does not allow electromagnetic waves to progress between the halves of the chamber 2525. The MMICs 2524' can be located inside the dielectric material 2544' of the chamber 2525 as shown in FIG. 25A. Additionally, the MMICs 2524' can be located near an outer surface of the dielectric layer 2543 of the transmission medium 2542. FIG. 25A shows an expanded view 2524A' of an MMIC 2524' that includes an antenna 2524B' (such as a monopole antenna, dipole antenna or other antenna) that can be configured to be longitudinally aligned with the outer surface of the dielectric layer 2543 of the transmission medium 2542. The antenna 2524B' can be configured to radiate signals that have a longitudinal electric field directed east or west as will be discussed shortly. It will be appreciated that other antenna structures that can radiate signals that have a longitudinal electric field can be used in place of the dipole antenna 2524B' of FIG. 25A.

It will be appreciated that although two MMICs 2524' are shown in each half of the chambers 2525 of the waveguide device 2522, more MMICs can be used. For example, FIG. 18K shows a transverse cross-sectional view of a cable (such as the transmission medium 2542) surrounded by a waveguide device with 8 MMICs located in positions: north, south, east, west, northeast, northwest, southeast, and southwest. The two MMICs 2524' shown in FIG. 25A can be viewed, for illustration purposes, as MMICs 2524' located in the north and south positions shown in FIG. 18K. The waveguide device 2522 of FIG. 25A can be further configured with MMICs 2524' at western and eastern positions as shown in FIG. 18K. Additionally, the waveguide device 2522 of FIG. 25A can be further configured with MMICs at northwestern, northeastern, southwestern and southeastern positions as shown in FIG. 18K. Accordingly, the waveguide device 2522 can be configured with more than the 2 MMICs shown in FIG. 25A.

Figure 25D:
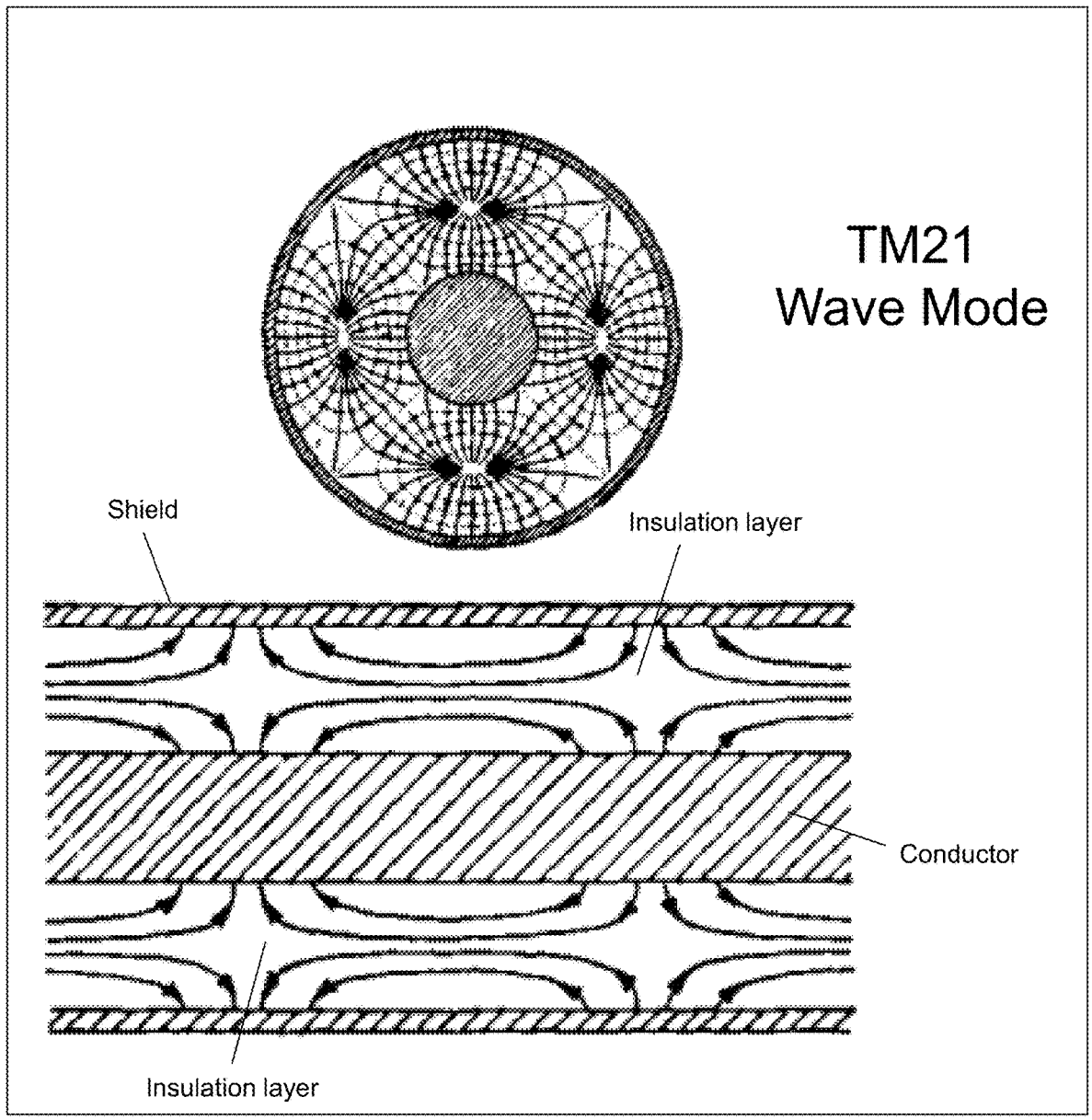

With this in mind, attention is now directed to FIGS. 25B, 25C, 25D, which illustrate diagrams of example, non-limiting embodiments of wave modes and electric field plots in accordance with various aspects described herein. FIG. 25B illustrates the electric fields of a TM01 wave mode. The electric fields are illustrated in a transverse cross-sectional view (top) and a longitudinal cross-sectional view (below) of a coaxial cable having a center conductor with an external conductive shield separated by insulation. FIG. 25C illustrates the electric fields of a TM11 wave mode. The electric fields are also illustrated in a transverse cross-sectional view and a longitudinal cross-sectional view of a coaxial cable having a center conductor with an external conductive shield separated by an insulation. FIG. 25D further illustrates the electric fields of a TM21 wave mode. The electric fields are illustrated in a transverse cross-sectional view and a longitudinal cross-sectional view of a coaxial cable having a center conductor with an external conductive shield separated by an insulation.

As shown in the transverse cross-sectional view, the TM01 wave mode has circularly symmetric electric fields (i.e., electric fields that have the same orientation and intensity at different azimuthal angles), while the transverse cross-sectional views of the TM11 and TM21 wave modes shown in FIGS. 25C-25D, respectively, have non-circularly symmetric electric fields (i.e., electric fields that have different orientations and intensities at different azimuthal angles). Although the transverse cross-sectional views of the TM11 and TM21 wave modes have non-circularly symmetric electric fields, the electric fields in the longitudinal cross-sectional views of the TM01, TM11 and TM21 wave modes are substantially similar with the exception that that the electric field structure of the TM11 wave mode has longitudinal electric fields above the conductor and below the conductor that point in opposite longitudinal directions, while the longitudinal electric fields above the conductor and below the conductor for the TM01 and TM21 wave modes point in the same longitudinal direction.

The longitudinal cross-sectional views of the coaxial cable of FIGS. 25B, 25C and 25D can be said to have a similar structural arrangement to the longitudinal cross-section of the waveguide device 2522 in region 2506' shown in FIG. 25A. Specifically, in FIGS. 25B, 25C and 25D the coaxial cable has a center conductor and a shield separated by insulation, while region 2506' of the waveguide device 2522 has a center conductor 2543, a dielectric layer 2544, covered by the dielectric material 2544' of the chamber 2525, and shielded by the reflective inner surface 2523 of the waveguide device 2522. The coaxial configuration in region 2506' of the waveguide device 2522 continues in the tapered region 2506" of the waveguide device 2522. Similarly, the coaxial configuration continues in regions 2508 and 2510 of the waveguide device 2522 with the exception that no dielectric material 2544' is present in these regions other than the dielectric layer 2544 of the transmission medium 2542. At the outer region 2512, the transmission medium 2542 is exposed to the environment (e.g., air) and thus the coaxial configuration is no longer present.

As noted earlier, the electric field structure of a TM01 wave mode is circularly symmetric in a transverse cross-sectional view of the coaxial cable shown in FIG. 25B. For illustration purposes, it will be assumed that the waveguide device 2522 of FIG. 25A has 4 MMICs located in northern, southern, western and eastern locations as depicted in FIG. 18K. In this configuration, and with an understanding of the longitudinal and transverse electric field structures of the TM01 wave mode shown in FIG. 25B, the 4 MMICs 2524' of the waveguide device 2522 in FIG. 25A can be configured to launch from a common signal source a TM01 wave mode on the transmission medium 2542. This can be accomplished by configuring the north, south, east and west MMICs 2524' to launch wireless signals with the same phase (polarity). The wireless signals generated by the 4 MMICs 2524' combine via superposition of their respective electric fields in the dielectric material 2544' of the chamber 2525 and the dielectric layer 2544 (since both dielectric materials have similar dielectric constants) to form a TM01 electromagnetic wave 2502' bound to these dielectric materials with the electric field structure shown in longitudinal and transverse views of FIG. 25B.

The electromagnetic wave 2502' having the TM01 wave mode in turn propagates toward the tapered structure 2522B of the waveguide device 2522 and thereby becomes an electromagnetic wave 2504' embedded within the dielectric layer 2544 of the transmission medium 2542' in region 2508. In the tapered horn section 2522D the electromagnetic wave 2504' having the TM01 wave mode expands in region 2510 and eventually exits the waveguide device 2522 without change to the TM01 wave mode.

In another embodiment, the waveguide device 2522 can be configured to launch a TM11 wave mode having a vertical polarity in region 2506'. This can be accomplished by configuring the MMIC 2524' in the northern position to radiate from a signal source a first wireless signal having a phase (polarity) opposite to the phase (polarity) of a second wireless signal radiated from the same signal source by the southern MMIC 2524'. These wireless signals combine via superposition of their respective electric fields to form an electromagnetic wave having a TM11 wave mode (vertically polarized) bound to the dielectric materials 2544' and 2544 with the electric field structures shown in the longitudinal and transverse cross-sectional views shown in FIG. 25C. Similarly, the waveguide device 2522 can be configured to launch a TM11 wave mode having a horizontal polarity in region 2506'. This can be accomplished by configuring the MMIC 2524' in the eastern position to radiate a first wireless signal having a phase (polarity) opposite to the phase (polarity) of a second wireless signal radiated by the western MMIC 2524'.

These wireless signals combine via superposition of their respective electric fields to form an electromagnetic wave having a TM11 wave mode (horizontally polarized) bound to the dielectric materials 2544' and 2544 with the electric field structures shown in the longitudinal and transverse cross-sectional views shown in FIG. 25C (but with a horizontal polarization). Since the TM11 wave mode with horizontal and vertical polarizations are orthogonal (i.e., a dot product of corresponding electric field vectors between any pair of these wave modes at each point of space and time produces a summation of zero), the waveguide device 2522 can be configured to launch these wave modes simultaneously without interference, thereby enabling wave mode division multiplexing. It is further noted that the TM01 wave mode is also orthogonal to the TM11 and TM21 wave modes.

While the electromagnetic wave 2502' or 2504' having the TM11 wave mode propagates within the confines of the inner surfaces 2523 of the waveguide device 2522 in regions 2506', 2506", 2508 and 2510, the TM11 wave mode remains unaltered. However, when the electromagnetic wave 2504' having the TM11 wave mode exits the waveguide device 2522 in region 2512 the inner wall 2523 is no longer present and the TM11 wave mode becomes a hybrid wave mode, specifically, an EH11 wave mode (vertically polarized, horizontally polarized, or both if two electromagnetic waves are launched in region 2506').

In yet other embodiments, the waveguide device 2522 can also be configured to launch a TM21 wave mode in region 2506'. This can be accomplished by configuring the MMIC 2524' in the northern position to radiate from a signal source a first wireless signal having a phase (polarity) that is in phase (polarity) to a second wireless signal generated from the same signal source by the southern MMIC 2524'. At the same time, the MMIC 2524' in the western position is configured to radiate from the same signal source a third wireless signal that is in phase with a fourth wireless signal radiated from the same signal source by the MMIC 2524' located in the eastern position. The north and south MMICs 2524', however, generate first and second wireless signals of opposite polarity to the polarity of the third and fourth wireless signals generated by the western and eastern MMICs 2524'. The four wireless signals of alternating polarity combine via superposition of their respective electric fields to form an electromagnetic wave having a TM21 wave mode bound to the dielectric materials 2544' and 2544 with the electric field structures shown in the longitudinal and transverse cross-sectional views shown in FIG. 25D. When the electromagnetic wave 2504' exits the waveguide device 2522 it may be transformed to a hybrid wave mode such as, for example, an HE21 wave mode, an EH21 wave mode, or a hybrid wave mode with a different radial mode (e.g., HE2m or EH2m, where m>1).

FIGS. 25A-25D illustrate several embodiments for launching TM01, EH11, and other hybrid wave modes utilizing the waveguide device 2522 of FIG. 25A. With an understanding of the electric field structures of other wave modes that propagate on a coaxial cable (e.g., TM12, TM22, and so on), the MMICs 2524' can be further configured in other ways to launch other wave modes (e.g., EH12, HE22, etc.) that have a low intensity z-field component and phi-field component in the electric field structures near the outer surface of a transmission medium 2542, which is useful for mitigating propagation losses due to a substance such as water, droplets or other substances that can cause an attenuation of the electric fields of an electromagnetic wave propagating along the outer surface of the transmission medium 2542.

Figure 26:
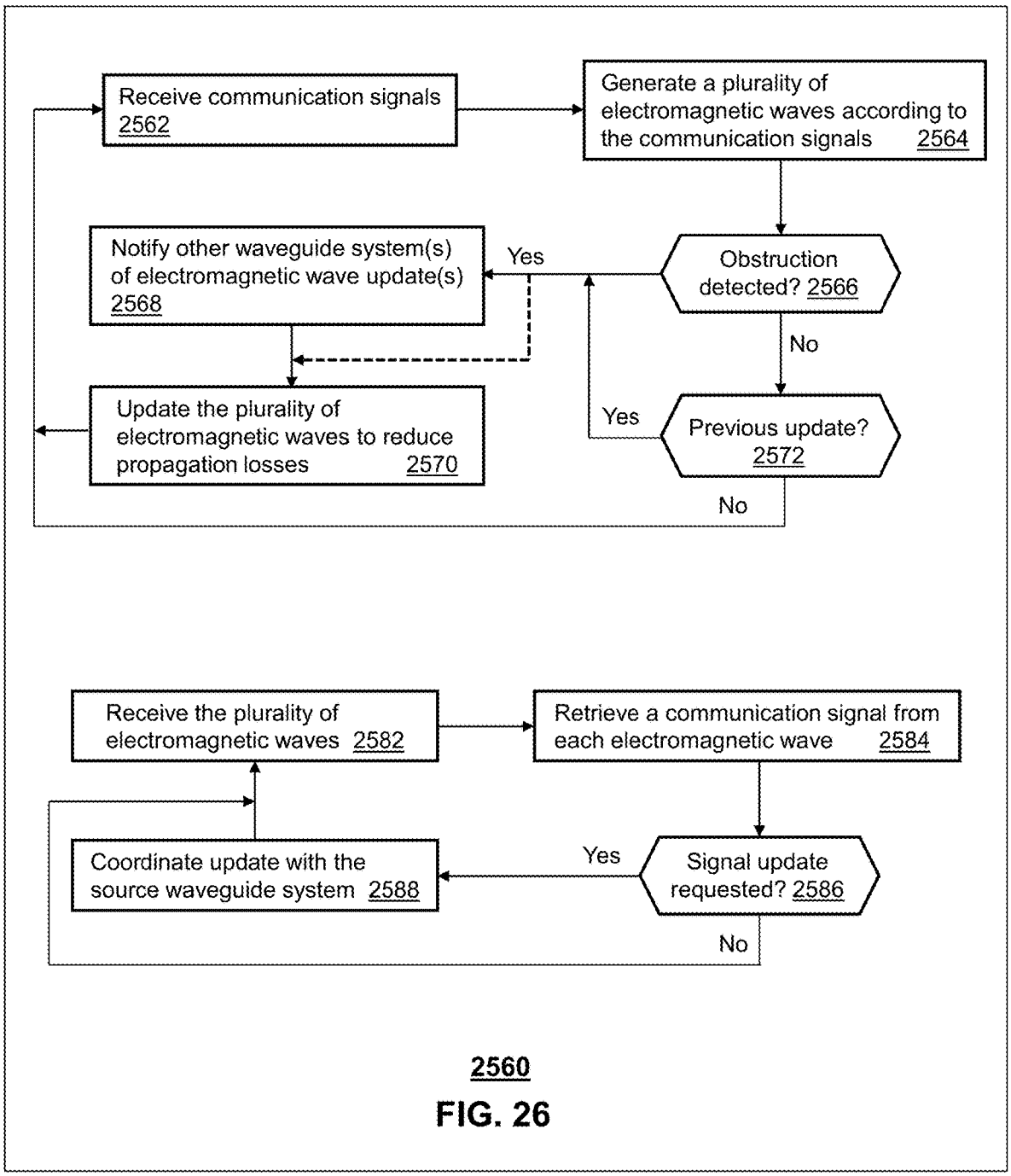
FIG. 26 illustrates a flow diagram of an example, non-limiting embodiment of a method for managing electromagnetic waves.
Figure 27:
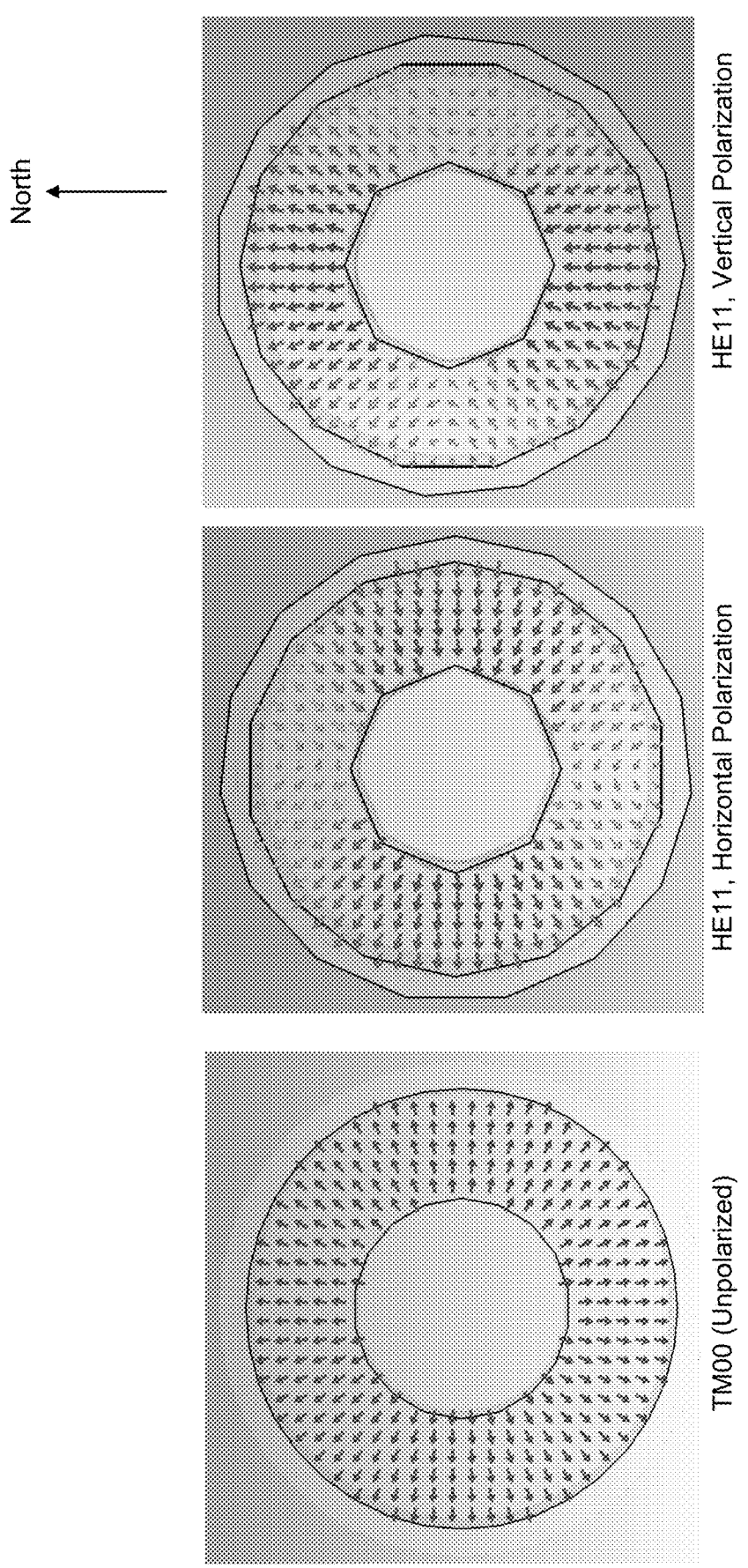
FIG. 27 is a block diagram illustrating an example, non-limiting embodiment of substantially orthogonal wave modes in accordance with various aspects described herein.

FIG. 26 illustrates a flow diagram of an example, non-limiting embodiment of a method 2560 for sending and receiving electromagnetic waves. Method 2560 can be applied to waveguides 2522 of FIGS. 23A-23C, 24 and 25A and/or other waveguide systems or launchers described and shown in the figures of the subject disclosure (e.g., FIGS. 7-14, 18D-18K, 22A-22B and other drawings) for purposes of launching or receiving substantially orthogonal wave modes such as those shown in FIG. 27. FIG. 27 depicts three cross-sectional views of an insulated conductor where a TM00 fundamental wave mode, an HE11 wave mode with horizontal polarization, and an HE11 wave mode with vertical polarization, propagates respectively. The electric field structure shown in FIG. 27 can vary over time and is therefore an illustrative representation at a certain instance or snapshot in time. The wave modes shown in FIG. 27 are orthogonal to each other. That is, a dot product of corresponding electric field vectors between any pair of the wave modes at each point of space and time produces a summation of zero. This property enables the TM00 wave mode, the HE11 wave mode with horizontal polarization, and the HE11 wave mode with vertical polarization to propagate simultaneously along a surface of the same transmission medium in the same frequency band without signal interference.

Figure 28:
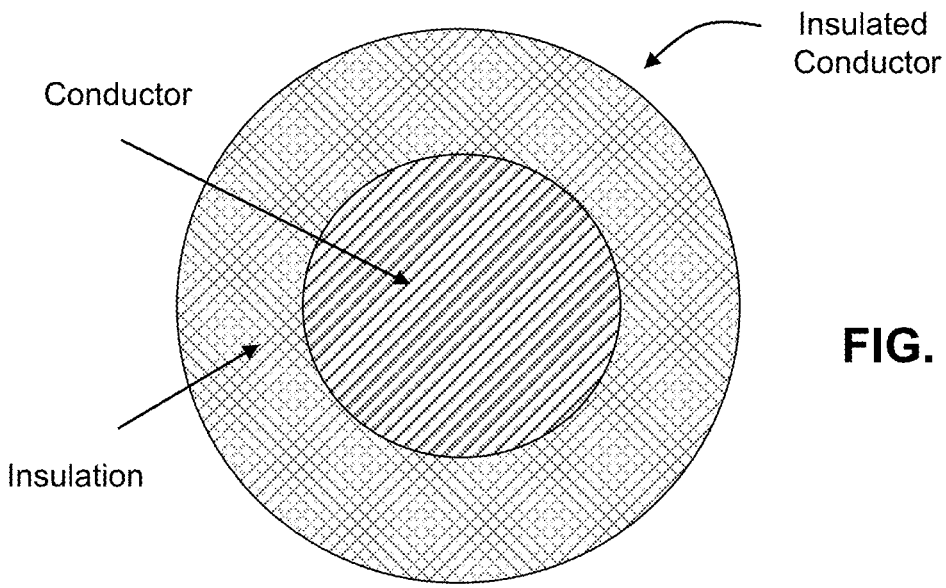
FIG. 28 is a block diagram illustrating an example, non-limiting embodiment of an insulated conductor in accordance with various aspects described herein.
Figure 29:
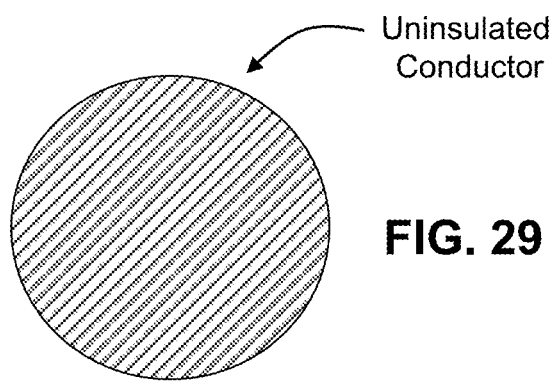
FIG. 29 is a block diagram illustrating an example, non-limiting embodiment of an uninsulated conductor in accordance with various aspects described herein.
Figure 30:
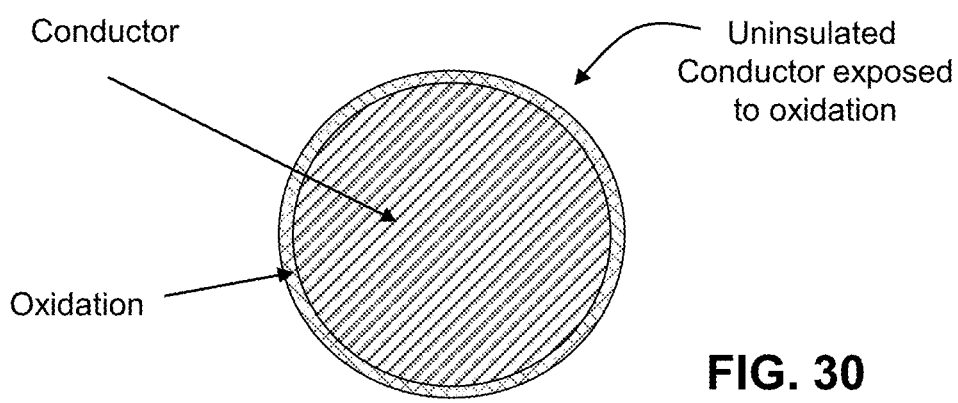
FIG. 30 is a block diagram illustrating an example, non-limiting embodiment of an oxide layer formed on the uninsulated conductor of FIG. 25A in accordance with various aspects described herein.

With this in mind, method 2560 can begin at step 2562 where a waveguide system of the subject disclosure can be adapted to receive communication signals from a source (e.g., a base station, a wireless signal transmitted by a mobile or stationary device to an antenna of the waveguide system as described in the subject disclosure, or by way of another communication source.). The communication signals can be, for example, communication signals modulated according to a specific signaling protocol (e.g., LTE, 5G, DOCSIS, DSL, etc.) operating in a native frequency band (e.g., 900 MHz, 1.9 GHz, 2.4 GHz, 5 GHz, etc.), baseband signals, analog signals, other signals, or any combinations thereof. At step 2564, the waveguide system can be adapted to generate or launch on a transmission medium a plurality of electromagnetic waves according to the communication signals by up-converting (or in some instances down-converting) such communication signals to one or more operating frequencies of the plurality of electromagnetic waves. The transmission medium can be an insulated conductor as shown in FIG. 28, or an uninsulated conductor that is subject to environmental exposure to oxidation (or other chemical reaction based on environmental exposure) as shown in FIGS. 29 and 30. In other embodiments, the transmission medium can be a dielectric material such as a dielectric core described in FIG. 18A.

To avoid interference, the waveguide system can be adapted to simultaneously launch at step 2564 a first electromagnetic wave using a TM00 wave mode, a second electromagnetic wave using an HE11 wave mode with horizontal polarization, and a third electromagnetic wave using an HE11 wave mode with vertical polarization—see FIG. 27. Since the first, second and third electromagnetic waves are orthogonal (i.e., non-interfering) they can be launched in the same frequency band without interference or with a small amount of acceptable interference. The combined transmission of three orthogonal electromagnetic wave modes in the same frequency band constitutes a form of wave mode division multiplexing, which provides a means for increasing the information bandwidth by a factor of three. By combining the principles of frequency division multiplexing with wave mode division multiplexing, bandwidth can be further increased by configuring the waveguide system to launch a fourth electromagnetic wave using a TM00 wave mode, a fifth electromagnetic wave using an HE11 wave mode with horizontal polarization, and a sixth electromagnetic wave using an HE11 wave mode with vertical polarization in a second frequency band that does not overlap with the first frequency band of the first, second and third orthogonal electromagnetic waves. It will be appreciated that other types of multiplexing could be additionally or alternatively used with wave mode division multiplexing without departing from example embodiments.

To illustrate this point, suppose each of three orthogonal electromagnetic waves in a first frequency band supports 1 GHz of transmission bandwidth. And further suppose each of three orthogonal electromagnetic waves in a second frequency band also supports 1 GHz of transmission bandwidth. With three wave modes operating in two frequency bands, 6 GHz of information bandwidth is possible for conveying communication signals by way of electromagnetic surface waves utilizing these wave modes. With more frequency bands, the bandwidth can be increased further.

Now suppose a transmission medium in the form of an insulated conductor (see FIG. 28) is used for surface wave transmissions. Further suppose the transmission medium has a dielectric layer with thickness proportional to the conductor radius (e.g., a conductor having a 4 mm radius and an insulation layer with a 4 mm thickness). With this type of transmission medium, the waveguide system can be configured to select from several options for transmitting electromagnetic waves. For example, the waveguide system can be configured at step 2564 to transmit first through third electromagnetic waves using wave mode division multiplexing at a first frequency band (e.g., at 1 GHz), third through fourth electromagnetic waves using wave mode division multiplexing at a second frequency band (e.g., at 2.1 GHz), seventh through ninth electromagnetic waves using wave mode division multiplexing at a third frequency band (e.g., at 3.2 GHz), and so on. Assuming each electromagnetic wave supports 1 GHz of bandwidth, collectively the first through ninth electromagnetic waves can support 9 GHz of bandwidth.

Alternatively, or contemporaneous with transmitting electromagnetic waves with orthogonal wave modes at step 2564, the waveguide system can be configured at step 2564 to transmit on the insulated conductor one or more high frequency electromagnetic waves (e.g., millimeter waves). In one embodiment, the one or more high frequency electromagnetic waves can be configured in non-overlapping frequencies bands according to one or more corresponding wave modes that are less susceptible to a water film such as a TM0m wave mode and EH1m wave mode (where m>0), or an HE2m wave mode (where m>1) as previously described. In other embodiments, the waveguide system can instead be configured to transmit one or more high frequency electromagnetic waves in non-overlapping frequency bands according to one or more corresponding wave modes that have longitudinal and/or azimuthal fields near the surface of the transmission medium that may be susceptible to water, but nonetheless exhibit low propagation losses when the transmission medium is dry. A waveguide system can thus be configured to transmit several combinations of wave modes on an insulated conductor (as well as a dielectric-only transmission medium such as a dielectric core) when the insulated conductor is dry.

Now suppose a transmission medium in the form of an uninsulated conductor (see FIGS. 29-30) is used for surface wave transmissions. Further consider that the uninsulated conductor or bare conductor is exposed to an environment subject to various levels of moisture and/or rain (as well as air and atmospheric gases like oxygen). Uninsulated conductors, such as overhead power lines and other uninsulated wires, are often made of aluminum which is sometimes reinforced with steel. Aluminum can react spontaneously with water and/or air to form aluminum oxide. An aluminum oxide layer can be thin (e.g., nano to micrometers in thickness). An aluminum oxide layer has dielectric properties and can therefore serve as a dielectric layer. Accordingly, uninsulated conductors can propagate not only TM00 wave modes, but also other wave modes such as an HE11 wave mode with horizontal polarization, and an HE11 wave mode with vertical polarization at high frequencies based at least in part on the thickness of the oxide layer. Accordingly, uninsulated conductors having an environmentally formed dielectric layer such as an oxide layer can be used for transmitting electromagnetic waves using wave mode division multiplexing and frequency division multiplexing. Other electromagnetic waves having a wave mode (with or without a cutoff frequency) that can propagate on an oxide layer are contemplated by the subject disclosure and can be applied to the embodiments described in the subject disclosure.

In one embodiment, the term "environmentally formed dielectric layer" can represent an uninsulated conductor that is exposed to an environment that is not artificially created in a laboratory or other controlled setting (e.g., bare conductor exposed to air, humidity, rain, etc. on a utility pole or other exposed environment). In other embodiments, an environmentally formed dielectric layer can be formed in a controlled setting such as a manufacturing facility that exposes uninsulated conductors to a controlled environment (e.g., controlled humidity, or other gaseous substance) that forms a dielectric layer on the outer surface of the uninsulated conductor. In yet another alternative embodiment, the uninsulated conductor can also be "doped" with particular substances/compounds (e.g., a reactant) that facilitate chemical reactions with other substances/compounds that are either available in a natural environment or in an artificially created laboratory or controlled setting, thereby resulting in the creation of the environmentally formed dielectric layer.

Wave mode division multiplexing and frequency division multiplexing can prove useful in mitigating obstructions such as water accumulating on an outer surface of a transmission medium. To determine if mitigating an obstruction is necessary, a waveguide system can be configured at step 2566 to determine if an obstruction is present on the transmission medium. A film of water (or water droplets) collected on an outer surface of the transmission medium due to rain, condensation, and/or excess humidity can be one form of an obstruction that can cause propagation losses in electromagnetic waves if not mitigated. A splicing of a transmission medium or other object coupled to the outer surface of the transmission medium can also serve as an obstruction.

Obstructions can be detected by a source waveguide system that transmits electromagnetic waves on a transmission medium and measures reflected electromagnetic waves based on these transmissions. Alternatively, or in combination, the source waveguide system can detect obstructions by receiving communication signals (wireless or electromagnetic waves) from a recipient waveguide system that receives and performs quality metrics on electromagnetic waves transmitted by the source waveguide system. When an obstruction is detected at step 2566, the waveguide system can be configured to identify options to update, modify, or otherwise change the electromagnetic waves being transmitted.

Suppose, for example, that in the case of an insulated conductor, the waveguide system had launched at step 2564 a high order wave mode such as TM01 wave mode with a frequency band that starts at 30 GHz having a large bandwidth (e.g., 10 GHz) when the insulated conductor is dry. For illustration purposes, a 10 GHz bandwidth will be assumed for an electromagnetic wave having a TM01 wave mode.

Although it was noted earlier in the subject disclosure that a TM01 wave mode has a desirable electric field alignment that is not longitudinal and not azimuthal near the outer surface, it can nonetheless be subject to some signal attenuation which in turn reduces its operating bandwidth when a water film (or droplets) accumulates on the insulated conductor. An electromagnetic wave having a TM01 wave mode with a bandwidth of approximately 10 GHz (30 to 40 GHz) on a dry insulated conductor can drop to a bandwidth of approximately 1 GHz (30 to 31 GHz) when the insulated conductor is wet. To mitigate the loss in bandwidth, the waveguide system can be configured to launch electromagnetic waves at much lower frequencies (e.g., less than 6 GHz) using wave mode division multiplexing and frequency division multiplexing.

For example, the waveguide system can be configured to transmit a first set of electromagnetic waves; specifically, a first electromagnetic wave having a TM00 wave mode, a second electromagnetic wave having an HE11 wave mode with horizontal polarization, and a third electromagnetic wave having an HE11 wave mode with vertical polarization, each electromagnetic wave having a center frequency at 1 GHz. Assuming a useable frequency band from 500 MHz to 1.5 GHz to convey communication signals, each electromagnetic wave can provide 1 GHz of bandwidth, and collectively 3 GHz of system bandwidth.

Suppose also the waveguide system is configured to transmit a second set of electromagnetic waves; specifically, a fourth electromagnetic wave having a TM00 wave mode, a fifth electromagnetic wave having an HE11 wave mode with horizontal polarization, and a sixth electromagnetic wave having an HE11 wave mode with vertical polarization, each electromagnetic wave having a center frequency at 2.1 GHz. Assuming a frequency band from 1.6 GHz to 2.6 GHz, with a guard band of 100 MHz between the first and second sets of electromagnetic waves, each electromagnetic wave can provide 1 GHz of bandwidth, and collectively 3 GHz of additional bandwidth, thereby now providing up to 6 GHz of system bandwidth.

Further suppose the waveguide system is also configured to transmit a third set of electromagnetic waves; specifically, a seventh electromagnetic wave having a TM00 wave mode, an eighth electromagnetic wave having an HE11 wave mode with horizontal polarization, and a ninth electromagnetic wave having an HE11 wave mode with vertical polarization, each electromagnetic wave having a center frequency at 3.2 GHz. Assuming a frequency band from 2.7 GHz to 3.7 GHz, with a guard band of 100 MHz between the second and third sets of electromagnetic waves, each electromagnetic wave can provide 1 GHz of bandwidth, and collectively 3 GHz of additional bandwidth, thereby now providing up to 9 GHz of system bandwidth.

The combination of the TM01 wave mode, and the three sets of electromagnetic waves configured for wave mode division multiplexing and frequency division multiplexing, provide a total system bandwidth of 10 GHz, thereby restoring a bandwidth of 10 GHz previously available when the high frequency electromagnetic wave having the TM01 wave mode was propagating on a dry insulated conductor.

Figure 31:
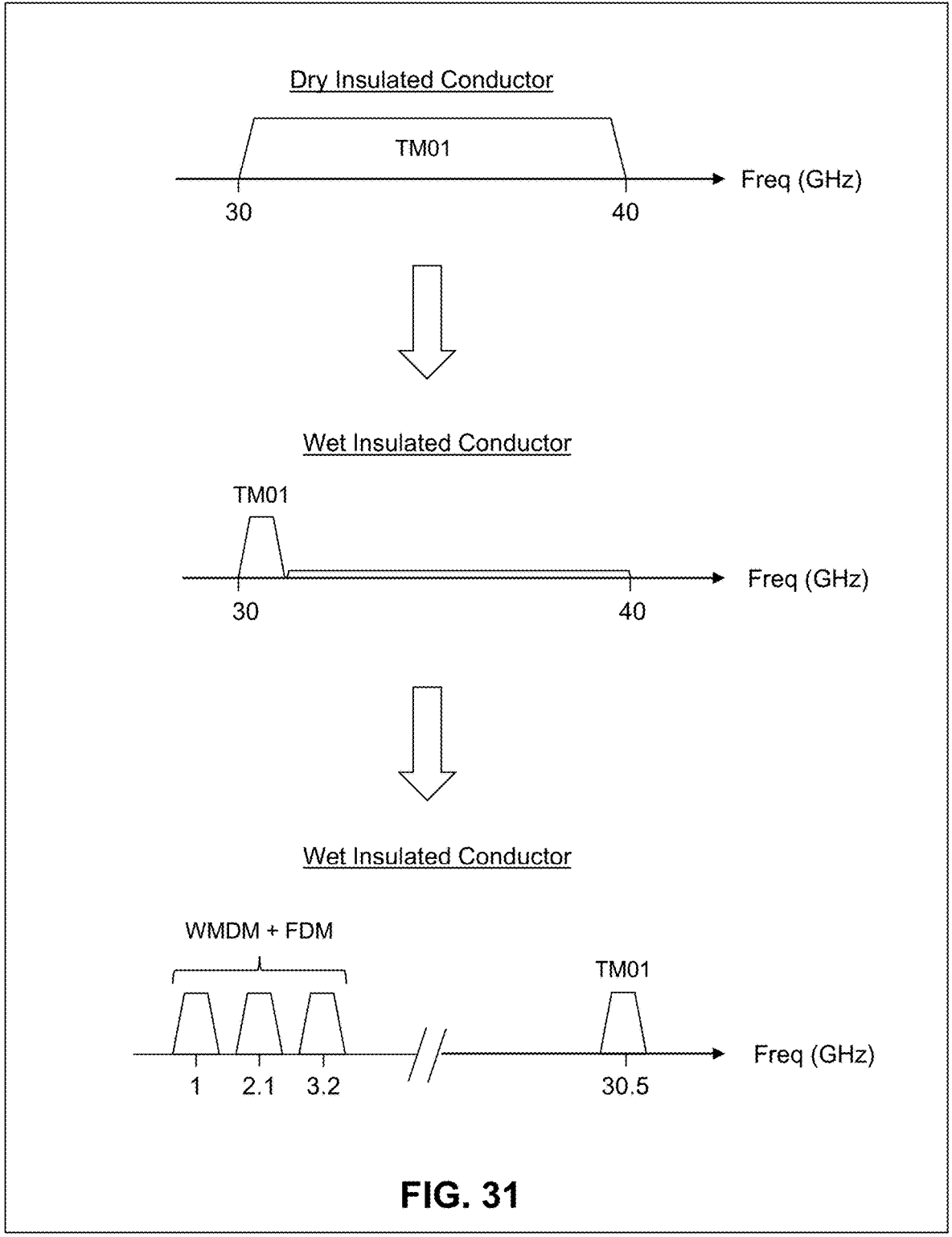
FIG. 31 is a block diagram illustrating example, non-limiting embodiments of spectral plots in accordance with various aspects described herein.

FIG. 31 illustrates a process for performing mitigation of a TM01 wave mode subject to an obstruction such as a water film. FIG. 31 illustrates a transition from a dry insulated conductor that supports a high bandwidth TM01 wave mode to a wet insulated conductor that supports a lower bandwidth TM01 wave mode that is combined with low frequency TM00 and HE11 wave modes configured according to wave mode division multiplexing (WMDM) and frequency division multiplexing (FDM) schemes to restore losses in system bandwidth.

Consider now an uninsulated conductor where the waveguide system had launched at step 2564 a TM00 wave mode with a frequency band that starts at 10 GHz having a large bandwidth (e.g., 10 GHz). Suppose now that transmission medium propagating the 10 GHz TM00 wave mode is exposed to an obstruction such as water. As noted earlier, a high frequency TM00 wave mode on an insulated conductor is subject to a substantial amount of signal attenuation (e.g., 45 dB/M at 10 GHz) when a water film (or droplets) accumulates on the outer surface of the insulated conductor. Similar attenuations will be present for a 10 GHz (or greater) TM00 wave mode propagating on an "uninsulated" conductor. An environmentally exposed uninsulated conductor (e.g., aluminum), however, can have an oxide layer formed on the outer surface which can serve as a dielectric layer that supports wave modes other than TM00 (e.g., HE11 wave modes). It is further noted that at lower frequencies a TM00 wave mode propagating on an insulated conductor exhibits a much lower attenuation (e.g., 0.62 dB/M at 4 GHz). A TM00 wave mode operating at less than 6 GHz would similarly exhibit low propagation losses on an uninsulated conductor. Accordingly, to mitigate the loss in bandwidth, the waveguide system can be configured to launch electromagnetic waves having a TM00 wave mode at lower frequencies (e.g., 6 GHz or less) and electromagnetic waves having an HE11 wave mode configured for WMDM and FDM at higher frequencies.

Referring back to FIG. 26, suppose then that the waveguide system detects an obstruction such as water at step 2566 on an environmentally exposed uninsulated conductor. A waveguide system can be configured to mitigate the obstruction by transmitting a first electromagnetic wave configured with a TM00 wave mode having a center frequency at 2.75 GHz. Assuming a useable frequency band from 500 MHz to 5.5 GHz to convey communication signals, the electromagnetic waves can provide 5 GHz of system bandwidth.

Figure 32:
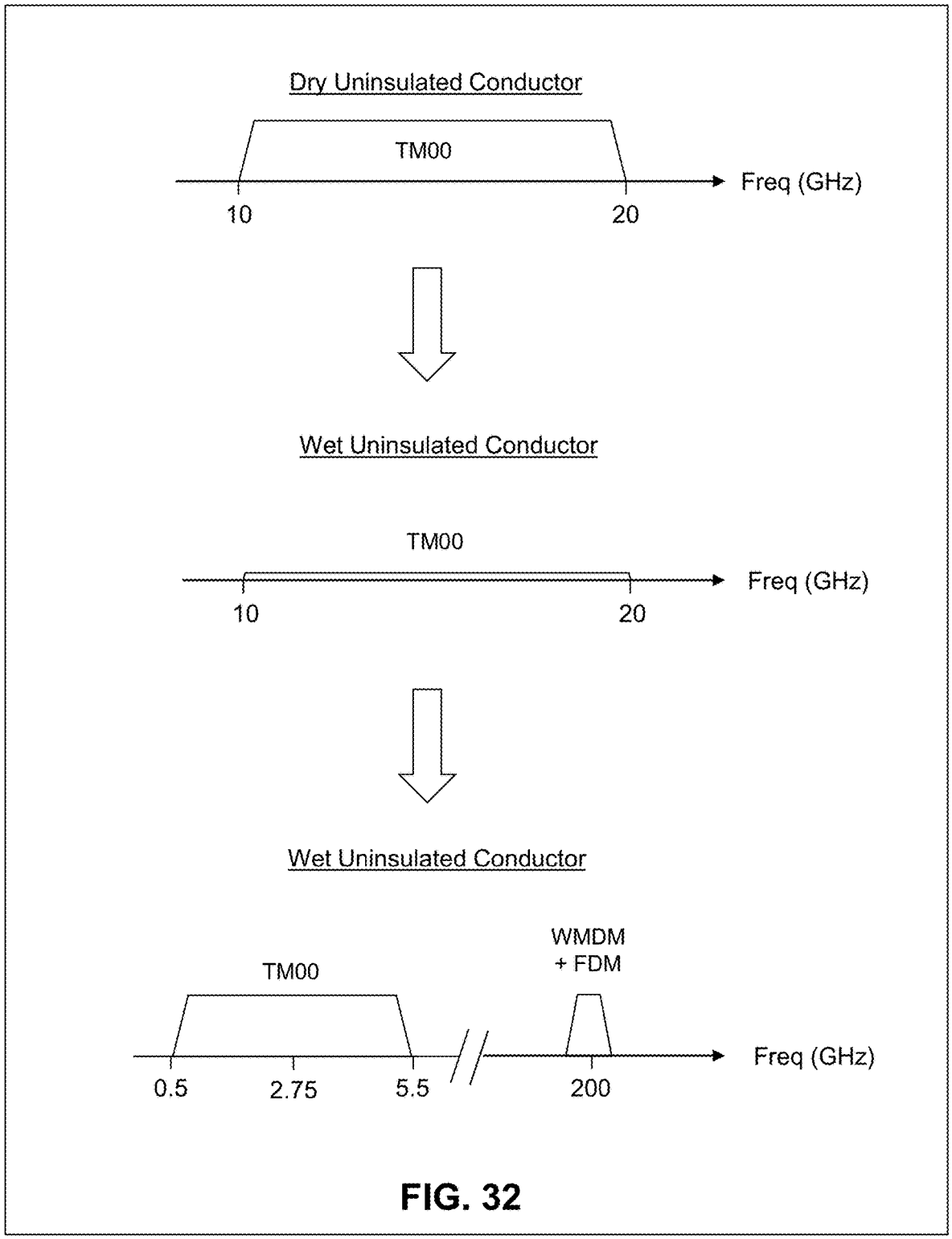
FIG. 32 is a block diagram illustrating example, non-limiting embodiments of spectral plots in accordance with various aspects described herein.

FIG. 32 illustrates a process for performing mitigation of a high frequency TM00 wave mode subject to an obstruction such as a water film detected at step 2566. FIG. 31 illustrates a transition from a dry uninsulated conductor that supports a high bandwidth TM00 wave mode to a wet uninsulated conductor that combines a low frequency TM00 wave mode and high frequency HE11 wave modes configured according to WMDM and FDM schemes to restore losses in system bandwidth.

It will be appreciated that the aforementioned mitigation techniques are non-limiting. For example, the center frequencies described above can differ between systems. Additionally, the original wave mode used before an obstruction is detected can differ from the illustrations above. For example, in the case of an insulated conductor an EH11 wave mode can be used singly or in combination with a TM01 wave mode. It is also appreciated that WMDM and FDM techniques can be used to transmit electromagnetic waves at all times and not just when an obstruction is detected at step 2566. It is further appreciated that other wave modes that can support WMDM and/or FDM techniques can be applied to and/or combined with the embodiments described in the subject disclosure, and are therefore contemplated by the subject disclosure.

Referring back to FIG. 26, once a mitigation scheme using WMDM and/or FDM has been determined in accordance with the above illustrations, the waveguide system can be configured at step 2568 to notify one or more other waveguide systems of the mitigation scheme intended to be used for updating one or more electromagnetic waves prior to executing the update at step 2570. The notification can be sent wirelessly to one or more other waveguide systems utilizing antennas if signal degradation in the electromagnetic waves is too severe. If signal attenuation is tolerable, then the notification can be sent via the affected electromagnetic waves. In other embodiments, the waveguide system can be configured to skip step 2568 and perform the mitigation scheme using WMDM and/or FDM at step 2570 without notification. This embodiment can be applied in cases where, for example, other recipient waveguide system(s) know beforehand what kind of mitigation scheme would be used, or the recipient waveguide system(s) are configured to use signal detection techniques to discover the mitigation scheme. Once the mitigation scheme using WMDM and/or FDM has been initiated at step 2570, the waveguide system can continue to process received communication signals at steps 2562 and 2564 as described earlier using the updated configuration of the electromagnetic waves.

At step 2566, the waveguide system can monitor if the obstruction is still present. This determination can be performed by sending test signals (e.g., electromagnetic surface waves in the original wave mode) to other waveguide system(s) and awaiting test results back from the waveguide systems if the situation has improved, and/or by using other obstruction detection techniques such as signal reflection testing based on the sent test signals. Once the obstruction is determined to have been removed (e.g., the transmission medium becomes dry), the waveguide system can proceed to step 2572 and determine that a signal update was performed at step 2568 using WMDM and/or FDM as a mitigation technique. The waveguide system can then be configured to notify recipient waveguide system(s) at step 2568 of the intent to restore transmissions to the original wave mode, or bypass this step and proceed to step 2570 where it restores transmissions to an original wave mode and assumes the recipient waveguide system(s) know the original wave modes and corresponding transmission parameters, or can otherwise detect this change.

A waveguide system can also be adapted to receive electromagnetic waves configured for WMDM and/or FDM. For example, suppose that an electromagnetic wave having a high bandwidth (e.g., 10 GHz) TM01 wave mode is propagating on an insulated conductor as shown in FIG. 31 and that the electromagnetic wave is generated by a source waveguide system. At step 2582, a recipient waveguide system can be configured to process the single electromagnetic wave with the TM01 wave mode under normal condition. Suppose, however, that the source waveguide system transitions to transmitting electromagnetic waves using WMDM and FDM along with a TM01 wave mode with a lower bandwidth on the insulated conductor, as previously described in FIG. 31. In this instance, the recipient waveguide system would have to process multiple electromagnetic waves of different wave modes. Specifically, the recipient waveguide system would be configured at step 2582 to selectively process each of the first through ninth electromagnetic waves using WMDM and FDM and the electromagnetic wave using the TM01 wave mode as shown in FIG. 31.

Once the one or more electromagnetic waves have been received at step 2582, the recipient waveguide can be configured to use signal processing techniques to obtain the communication signals that were conveyed by the electromagnetic wave(s) generated by the source waveguide system at step 2564 (and/or step 2570 if an update has occurred). At step 2586, the recipient waveguide system can also determine if the source waveguide system has updated the transmission scheme. The update can be detected from data provided in the electromagnetic waves transmitted by the source waveguide system, or from wireless signals transmitted by the source waveguide system. If there are no updates, the recipient waveguide system can continue to receive and process electromagnetic waves at steps 2582 and 2584 as described before. If, however, an update is detected at step 2586, the recipient waveguide system can proceed to step 2588 to coordinate the update with the source waveguide system and thereafter receive and process updated electromagnetic waves at steps 2582 and 2584 as described before.

It will be appreciated that method 2560 can be used in any communication scheme including simplex and duplex communications between waveguide systems. Accordingly, a source waveguide system that performs an update for transmitting electromagnetic waves according to other wave modes will in turn cause a recipient waveguide system to perform similar steps for return electromagnetic wave transmissions. It will also be appreciated that the aforementioned embodiments associated with method 2560 of FIG. 26 and the embodiments shown in FIGS. 27 through 32 can be combined in whole or in part with other embodiments of the subject disclosure for purposes of mitigating propagation losses caused by an obstruction at or in a vicinity of an outer surface of a transmission medium (e.g., insulated conductor, uninsulated conductor, or any transmission medium having an external dielectric layer). The obstruction can be a liquid (e.g., water), a solid object disposed on the outer surface of the transmission medium (e.g., ice, snow, a splice, a tree limb, etc.), or any other objects located at or near the outer surface of the transmission medium.

While for purposes of simplicity of explanation, the respective processes are shown and described as a series of blocks in FIG. 26, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 33:
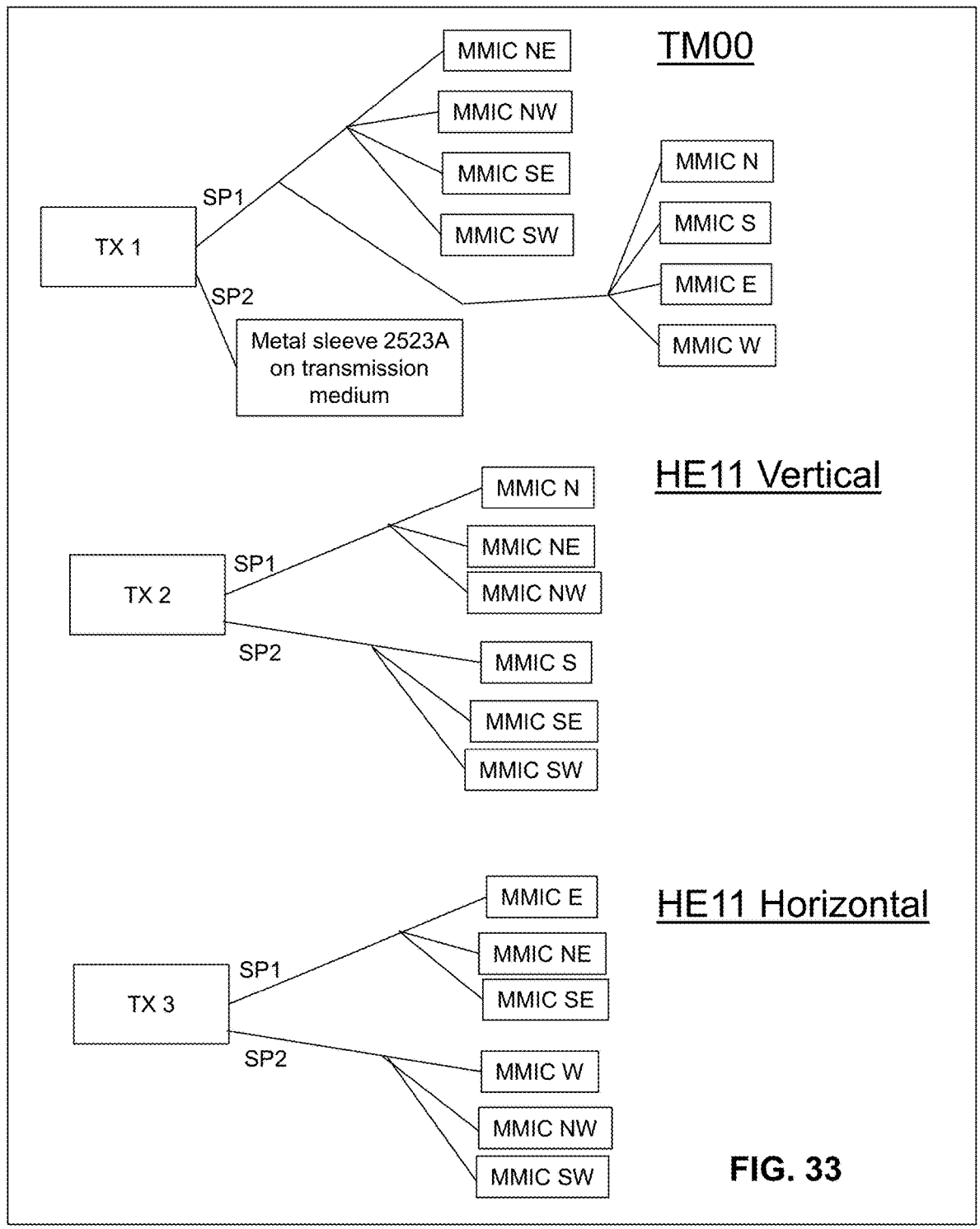
FIG. 33 is a block diagram illustrating example, non-limiting embodiments for transmitting orthogonal wave modes in accordance with various aspects described herein.
Figure 34:
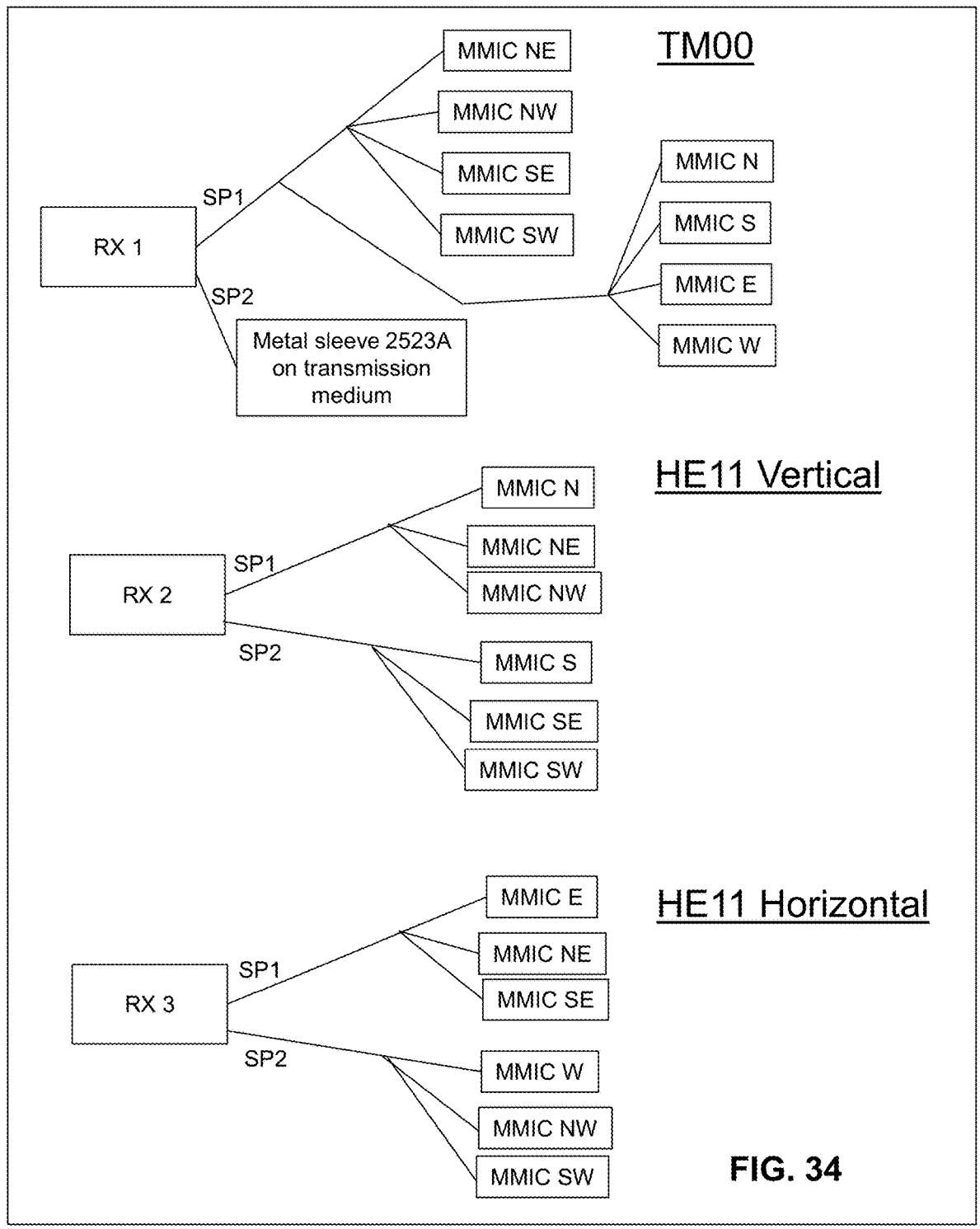
FIG. 34 is a block diagram illustrating example, non-limiting embodiments for transmitting orthogonal wave modes in accordance with various aspects described herein.

Referring now to FIGS. 33 and 34, block diagrams illustrating example, non-limiting embodiments for transmitting orthogonal wave modes according to the method 2560 of FIG. 26 are shown. FIG. 33 depicts an embodiment for simultaneously transmitting a TM00 wave mode, an HE11 wave mode with vertical polarization, and an HE11 wave mode with horizontal polarization as depicted in an instance in time in FIG. 27. In one embodiment, these orthogonal wave modes can be transmitted with a waveguide launcher having eight (8) MMICs as shown in FIG. 18K located at symmetrical locations (e.g., north, northeast, east, southeast, south, southwest, west, and northwest). The waveguide launcher of FIG. (or FIG. 18J) can also be configured with these 8 MMICs. Additionally, the waveguide launcher can be configured with a cylindrical sleeve 2523A and tapered dielectric that wraps around the transmission medium (e.g., insulated conductor, uninsulated conductor, or other cable with a dielectric layer such as dielectric core). The housing assembly of the waveguide launcher (not shown) can be configured to include a mechanism (e.g., a hinge) to enable a longitudinal opening of the waveguide launcher for placement and latching around a circumference of a transmission medium.

With these configurations in mind, the waveguide launcher can include three transmitters (TX1, TX2, and TX3) coupled to MMICs having various coordinate positions (see FIG. 25AG and FIG. 18W). The interconnectivity between the transmitters (TX1, TX2, and TX3) and the MMICs can be implemented with a common printed circuit board or other suitable interconnecting technology. The first transmitter (TX1) can be configured to launch a TM00 wave mode, the second transmitter (TX2) can be configured to launch an HE11 vertical polarization wave mode, and the third transmitter (TX3) can be configured to launch an HE11 horizontal polarization wave mode.

A first signal port (shown as "SP1") of the first transmitter (TX1) can be coupled in parallel to each of the 8 MMICs. A second signal port (shown as "SP2") of the first transmitter (TX1) can be coupled to a conductive sleeve 2523A that is placed on the transmission medium by the waveguide launcher as noted above. The first transmitter (TX1) can be configured to receive a first group of the communication signals described in step 2562 of FIG. 26. The first group of communication signals can be frequency-shifted by the first transmitter (TX1) from their native frequencies (if necessary) for an orderly placement of the communication signals in channels of a first electromagnetic wave configured according to the TM00 wave mode. The 8 MMICs coupled to the first transmitter (TX1) can be configured to up-convert (or down-convert) the first group of the communication signals to the same center frequency (e.g., 1 GHz for the first electromagnetic wave as described in relation to FIG. 31). All 8 MMICs would have synchronized reference oscillators that can be phase locked using various synchronization techniques.

Since the 8 MMICs receive signals from the first signal port of the first transmitter (TX1) based on the reference provided by the second signal port, the 8 MMICs thereby receive signals with the same polarity. Consequently, once these signals have been up-converted (or down-converted) and processed for transmission by the 8 MMICs, one or more antennas of each of the 8 MMICs simultaneously radiates signals with electric fields of the same polarity. Collectively, MMICs that are opposite in location to each other (e.g., MMIC north and MMIC south) will have an electric field structure aligned towards or away from the transmission medium, thereby creating at a certain instance in time an outward field structure like the TM00 wave mode shown in FIG. 27. Due to the constant oscillatory nature of the signals radiated by the 8 MMICs, it will be appreciated that at other instances in time, the field structure shown in FIG. 27 will radiate inward. By symmetrically radiating electric fields with the same polarity the collection of opposing MMICs contribute to the inducement of a first electromagnetic wave having a TM00 wave mode that propagates on a transmission medium with a dielectric layer and can convey the first group of the communication signals to a receiving waveguide system.

Turning now to the second transmitter (TX2) in FIG. 33, this transmitter has a first signal port (SP1) coupled to MMICs located in north, northeast and northwest positions, while a second signal port (SP2) of the second transmitter (TX2) is coupled to the MMICs located in south, southeast and southwest positions (see FIG. 18K). The second transmitter (TX2) can be configured to receive a second group of the communication signals described in step 2562 of FIG. 26, which differs from the first group of the communication signals received by the first transmitter (TX1). The second group of communication signals can be frequency-shifted by the second transmitter (TX2) from their native frequencies (if necessary) for an orderly placement of the communication signals in channels of a second electromagnetic wave configured according to an HE11 wave mode with vertical polarization. The 6 MMICs coupled to the second transmitter (TX2) can be configured to up-convert (or down-conversion) the second group of the communication signals to the same center frequency as used for the TM00 wave mode (i.e., 1 GHz as described in relation to FIG. 31). Since a TM00 wave mode is orthogonal to an HE11 wave mode with vertical polarization, they can share the same center frequency in an overlapping frequency band without interference.

Referring back to FIG. 33, the first signal port (SP1) of the second transmitter (TX2) generates signals of opposite polarity to the signals of the second signal port (SP2). As a result, the electric field alignment of signals generated by one or more antennas of the northern MMIC will be of opposite polarity to the electric field alignment of signals generated by one or more antennas of the southern MMIC. Consequently, the electric fields of the north and south MMICs will have an electric field structure that is vertically aligned in the same direction, thereby creating at a certain instance in time a northern field structure like the HE11 wave mode with vertical polarization shown in FIG. 27. Due to the constant oscillatory nature of the signals radiated by the north and south MMICs, it will be appreciated that at other instances in time, the HE11 wave mode will have a southern field structure. Similarly, based on the opposite polarity of signals supplied to the northeast and southeast MMICs by the first and second signal ports, respectively, these MMICs will generate at a certain instance in time the curved electric field structure shown on the east side of the HE11 wave mode with vertical polarization depicted in FIG. 27. Also, based on the opposite polarity of signals supplied to the northwest and southwest MMICs, these MMICs will generate at a certain instance in time the curved electric field structure shown on the west side of the HE11 wave mode with vertical polarization depicted in FIG. 27.

By radiating electric fields with opposite polarity by opposing MMICs (north, northeast and northwest versus south, southeast and southwest), the collection of signals with a directionally aligned field structure contribute to the inducement of a second electromagnetic wave having the HE11 wave mode with vertical polarization shown in FIG. 27. The second electromagnetic wave propagates along the "same" transmission medium as previously described for the first transmitter (TX1). Given the orthogonality of a TM00 wave mode and an HE11 wave mode with vertical polarization, there will be ideally no interference between the first electromagnetic wave and the second electromagnetic wave. Consequently, the first and second electromagnetic waves having overlapping frequency bands propagating along the same transmission medium can successfully convey the first and second groups of the communication signals to the same (or other) receiving waveguide system.

Turning now to the third transmitter (TX3) in FIG. 33, this transmitter has a first signal port (SP1) coupled to MMICs located in east, northeast and southeast positions, while a second signal port (SP2) of the third transmitter (TX3) is coupled to the MMICs located in west, northwest and southwest positions (see FIG. 18K). The third transmitter (TX3) can be configured to receive a third group of the communication signals described in step 2562 of FIG. 26, which differs from the first and second groups of the communication signals received by the first transmitter (TX1) and the second transmitter (TX2), respectively. The third group of communication signals can be frequency-shifted by the third transmitter (TX3) from their native frequencies (if necessary) for an orderly placement of the communication signals in channels of a second electromagnetic wave configured according to an HE11 wave mode with horizontal polarization. The 6 MMICs coupled to the third transmitter (TX3) can be configured to up-convert (or down-conversion) the third group of the communication signals to the same center frequency as used for the TM00 wave mode and HE11 wave mode with vertical polarization (i.e., 1 GHz as described in relation to FIG. 31). Since a TM00 wave mode, an HE11 wave mode with vertical polarization, and an HE11 wave mode with horizontal polarization are orthogonal, they can share the same center frequency in an overlapping frequency band without interference.

Referring back to FIG. 33, the first signal port (SP1) of the third transmitter (TX3) generates signals of opposite polarity to the signals of the second signal port (SP2). As a result, the electric field alignment of signals generated by one or more antennas of the eastern MMIC will be of opposite polarity to the electric field alignment of signals generated by one or more antennas of the western MMIC. Consequently, the electric fields of the east and west MMICs will have an electric field structure that is horizontally aligned in the same direction, thereby creating at a certain instance in time a western field structure like the HE11 wave mode with horizontal polarization shown in FIG. 27. Due to the constant oscillatory nature of the signals radiated by the east and west MMICs, it will be appreciated that at other instances in time, the HE11 wave mode will have an eastern field structure. Similarly, based on the opposite polarity of signals supplied to the northeast and northwest MMICs by the first and second signal ports, respectively, these MMICs will generate at a certain instance in time the curved electric field structure shown on the north side of the HE11 wave mode with horizontal polarization depicted in FIG. 27. Also, based on the opposite polarity of signals supplied to the southeast and southwest MMICs, these MMICs will generate at a certain instance in time the curved electric field structure shown on the south side of the HE11 wave mode with horizontal polarization depicted in FIG. 27.

By radiating electric fields with opposite polarity by opposing MMICs (east, northeast and southeast versus west, northwest and southwest), the collection of signals with a directionally aligned field structure contribute to the inducement of a third electromagnetic wave having the HE11 wave mode with horizontal polarization shown in FIG. 27. The third electromagnetic wave propagates along the "same" transmission medium as previously described for the first transmitter (TX1) and the second transmitter (TX2). Given the orthogonality of a TM00 wave mode, an HE11 wave mode with vertical polarization, and an HE11 wave mode with horizontal polarization, there will be, ideally, no interference between the first electromagnetic wave, the second electromagnetic wave, and the third electromagnetic wave. Consequently, the first, second and third electromagnetic waves having overlapping frequency bands propagating along the same transmission medium can successfully convey the first, second and third groups of the communication signal to the same (or other) receiving waveguide system.

Because of the orthogonality of the electromagnetic waves described above, a recipient waveguide system can be configured to selectively retrieve the first electromagnetic wave having the TM00 wave mode, the second electromagnetic wave having the HE11 wave mode with vertical polarization, and the third electromagnetic wave having the HE11 wave mode with horizontal polarization. After processing each of these electromagnetic waves, the recipient waveguide system can be further configured to obtain the first, second and third group of the communication signals conveyed by these waves. FIG. 34 illustrates a block diagram for selectively receiving each of the first, second and third electromagnetic waves.

Figure 35:
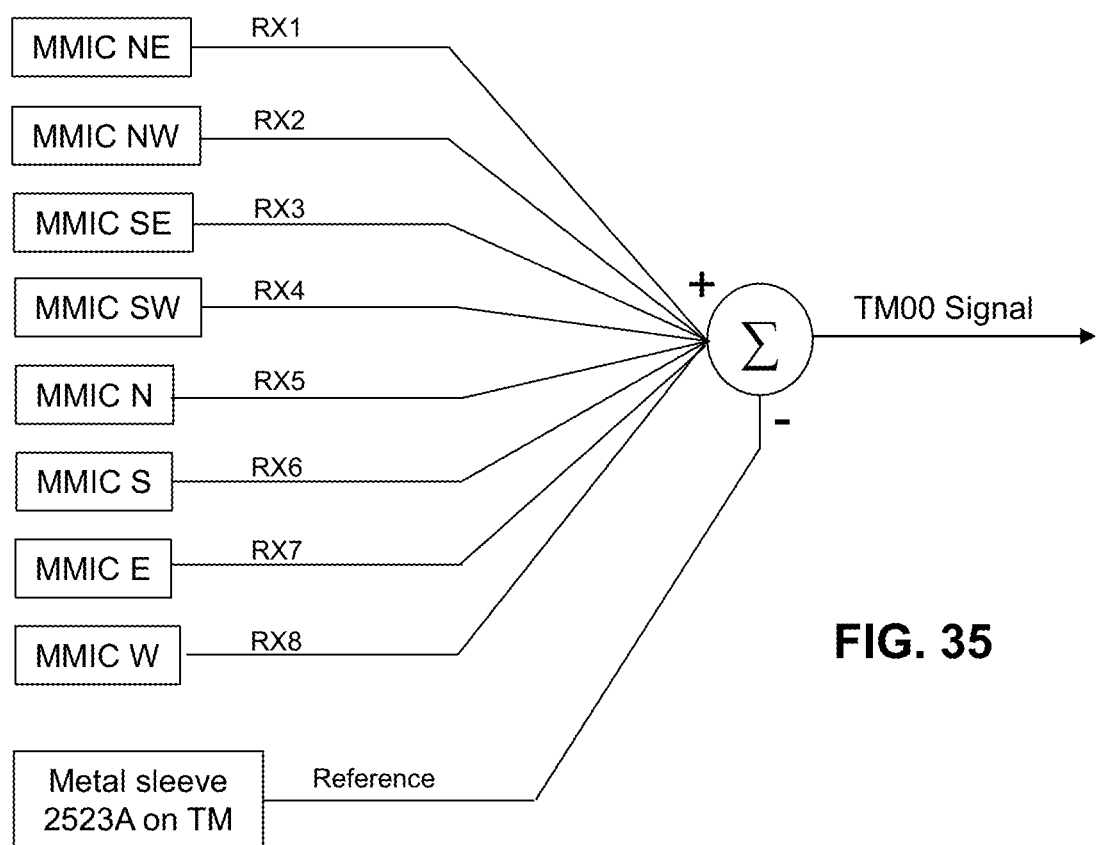
FIG. 35 is a block diagram illustrating example, non-limiting embodiments for selectively receiving a wave mode in accordance with various aspects described herein.

Specifically, the first electromagnetic wave having the TM00 wave mode can be selectively received by a first receiver (RX1) shown in FIG. 34 by taking the difference between the signals received by all 8 MMICs and the signal reference provided by the metal sleeve 2523A as depicted in the block diagram in FIG. 35. The second electromagnetic wave having the HE11 wave mode with vertical polarization can be selectively received by a second receiver (RX2) shown in FIG. 34 by taking the difference between the signals received by the MMICs located in north, northeast and northwest positions and the signals received by the MMICs located in south, southeast and southwest positions as depicted in the block diagram in FIG. 36. The third electromagnetic wave having the HE11 wave mode with horizontal polarization can be selectively received by a third receiver (RX3) shown in FIG. 34 by taking the difference between the signals received by the MMICs located in east, northeast and southeast positions and the signals received by the MMICs located in west, northwest and southwest positions as depicted in the block diagram in FIG. 37.

Figure 38:
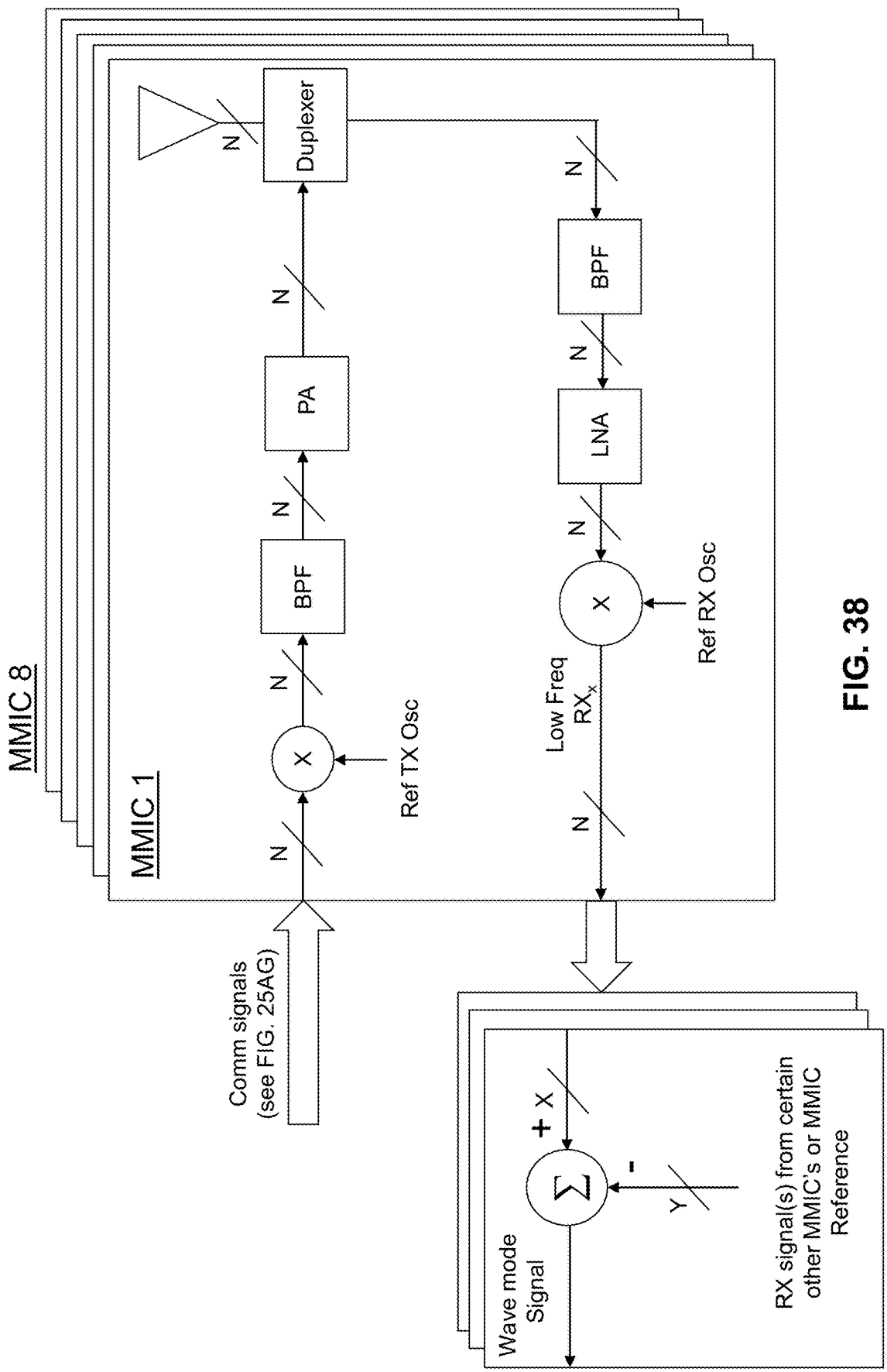
FIG. 38 is a block diagram illustrating example, non-limiting embodiments for selectively receiving a wave mode in accordance with various aspects described herein.

FIG. 38 illustrates a simplified functional block diagram of an MMIC. The MMIC can, for example, utilize a mixer coupled to a reference (TX) oscillator that shifts one of the communication signals supplied by one of the signal ports (SP1 or SP2) of one of the transmitters (TX1, TX2 or TX3) to a desired center frequency in accordance with the configurations shown in FIG. 33. For example, in the case of TX1, the communication signal from SP1 is supplied to a transmit path of each of the MMICs (i.e., NE, NW, SE, SW, N, S, E, and W). In the case of TX2, the communication signal from SP1 is supplied to another transmit path of three MMICs (i.e., N, E, and NW). Note the transmit paths used by MMICs N, E and W for the communication signal supplied by SP1 of TX2 are different from the transmit paths used by the MMICs for the communication signal supplied by SP1 of TX1. Similarly, the communication signal from SP2 of TX2 is supplied to another transmit path of three other MMICs (i.e., S, SE, and SW). Again, the transmit paths used by MMICs S, SE and SW for the communication signal supplied by SP2 of TX2 are different from the transmit paths used by the MMICs for the communication signals from SP1 of TX1, and SP1 of TX2. Lastly, in the case of TX3, the communication signal from SP1 is supplied to yet another transmit path of three MMICs (i.e., E, NE, and SE). Note the transmit paths used for MMICs E, NE, and SE for the communication signal from SP1 of TX3 are different from the transmit paths used by the MMICs for the communication signals supplied by SP1 of TX1, SP1 of TX2, and SP2 of TX2. Similarly, the communication signal from SP2 of TX3 is supplied to another transmit path of three other MMICs (i.e., W, NW, and SW). Again, the transmit paths used by MMICs W, NW, and SW for the communication signal supplied by SP2 of TX3 are different from the transmit paths used by the MMICs for the communication signals from SP1 of TX1, SP1 of TX2, and SP2 of TX2, and SP1 of TX3.

Once the communication signals have been frequency-shifted by the mixer shown in the transmit path, the frequency-shifted signal generated by the mixer can then be filtered by a bandpass filter that removes spurious signals. The output of the bandpass filter in turn can be provided to a power amplifier that couples to an antenna by way of a duplexer for radiating signals in the manner previously described. The duplexer can be used to isolate a transmit path from a receive path. The illustration of FIG. 38 is intentionally oversimplified to enable ease of illustration.

It will be appreciated that other components (not shown) such as an impedance matching circuit, phase lock loop, or other suitable components for improving the accuracy and efficiency of the transmission path (and receive path) is contemplated by the subject disclosure. Furthermore, while a single antenna can be implemented by each MMIC, other designs with multiple antennas can likewise be employed. It is further appreciated that to achieve more than one orthogonal wave mode with overlapping frequency bands (e.g., TM00, HE11 Vertical, and HE11 Horizontal wave modes described above), the transmit path can be repeated N times using the same reference oscillator. N can represent an integer associated with the number of instances the MMIC is used to generate each of the wave modes. For example, in FIG. 33, MMIC NE is used three times; hence, MMIC NE has three transmit paths (N=3), MMIC NW is used three times; hence, MMIC NW has three transmit paths (N=3), MMIC N is used twice; hence, MMIC N has two transmit paths (N=2), and so on. If frequency division multiplexing is employed to generate the same wave modes in other frequency band(s) (see FIGS. 31 and 32), the transmit path can be further repeated using different reference oscillator(s) that are centered at the other frequency band(s).

In the receive path shown in FIG. 38, N signals supplied by N antennas via the duplexer of each transmit path in the MMIC can be filtered by a corresponding N bandpass filters, which supply their output to N low-noise amplifiers. The N low-noise amplifiers in turn supply their signals to N mixers to generate N intermediate-frequency received signals. As before, N is representative of the number of instances the MMIC is used for receiving wireless signals for different wave modes. For example, in FIG. 34, MMIC NE is used in three instances; hence, MMIC NE has three receive paths (N=3), MMIC N is used in two instances; hence, MMIC N has two receive paths (N=2), and so on.

Figure 36:
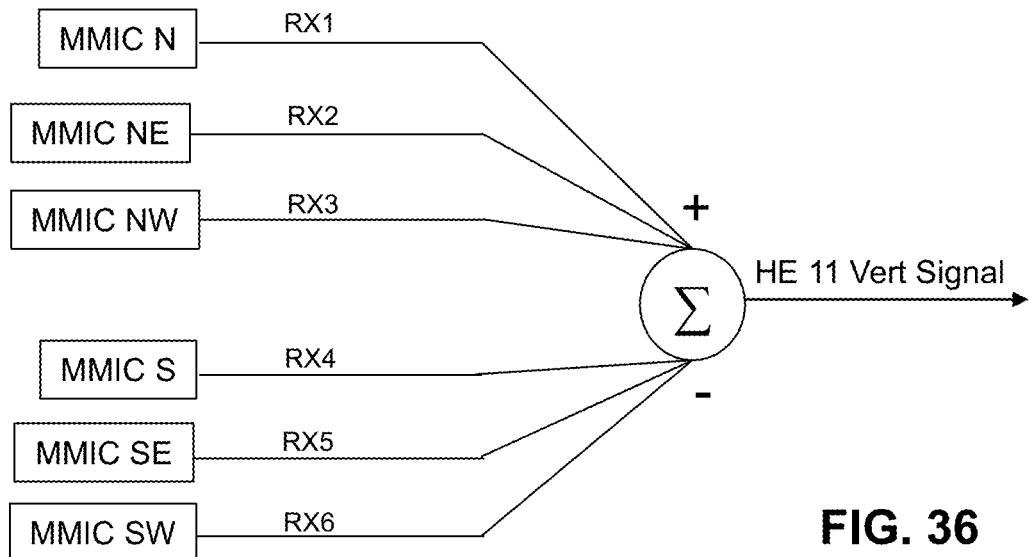
FIG. 36 is a block diagram illustrating example, non-limiting embodiments for selectively receiving a wave mode in accordance with various aspects described herein.
Figure 37:
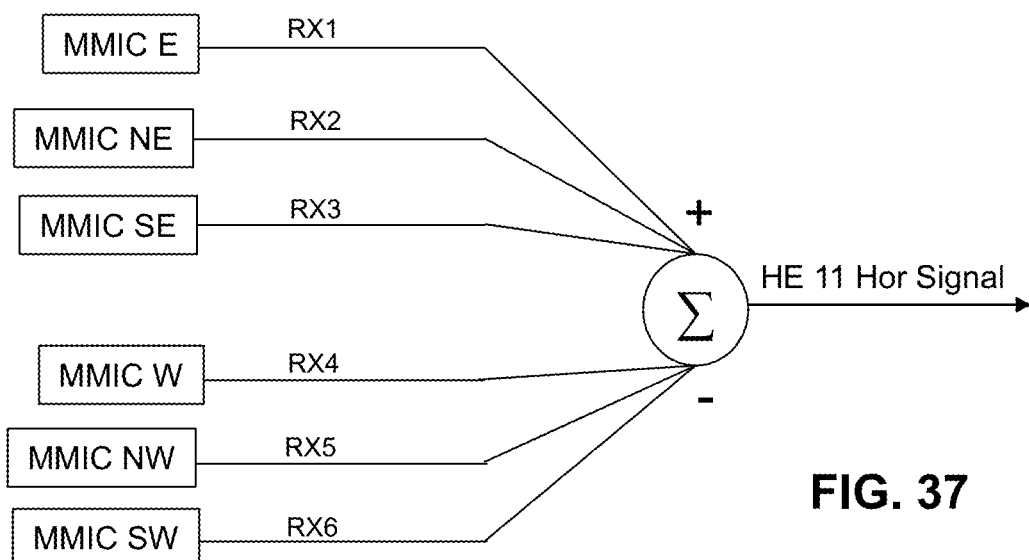
FIG. 37 is a block diagram illustrating example, non-limiting embodiments for selectively receiving a wave mode in accordance with various aspects described herein.

Referring back to FIG. 38, to reconstruct a wave mode signal, Y received signals supplied by receiver paths of certain MMICs or a reference from a metal sleeve is subtracted from X received signals supplied by other MMICs based on the configurations shown in FIGS. 35-37. For example, a TM00 signal is reconstructed by supplying the received signals of all MMICs (NE, NW, SE, SW, N, S, E, W) to the plus port of the summer (i.e., X signals), while the reference signal from the metal sleeve is supplied to the negative port of the summer (i.e., Y signal)—see FIG. 35. The difference between the X and Y signals results in the TM00 signal. To reconstruct the HE11 Vertical signal, the received signals of MMICs N, NE, and NW are supplied to the plus port of the summer (i.e., X signals), while the received signals of MMICs S, SE, and SW are supplied to the negative port of the summer (i.e., Y signals)—see FIG. 36. The difference between the X and Y signals results in the HE11 vertical signal. Lastly, to reconstruct the HE11 Horizontal signal, the received signals of MMICs E, NE, and SE are supplied to the plus port of the summer (i.e., X signals), while the received signals of MMICs W, NW, and SW are supplied to the negative port of the summer (i.e., Y signals)—see FIG. 37. The difference between the X and Y signals results in the HE11 horizontal signal. Since there are three wave mode signals being reconstructed, the block diagram of the summer with the X and Y signals is repeated three times.

Each of these reconstructed signals is at intermediate frequencies. These intermediate-frequency signals are provided to receivers (RX1, RX2 and RX3) which include circuitry (e.g., a DSP, A/D converter, etc.) for processing and to selectively obtain communication signals therefrom. Similar to the transmit paths, the reference oscillators of the three receiver paths can be configured to be synchronized with phase lock loop technology or other suitable synchronization technique. If frequency division multiplexing is employed for the same wave modes in other frequency band(s) (see FIGS. 31 and 32), the receiver paths can be further repeated using a different reference oscillator that is centered at the other frequency band(s).

It will be appreciated that other suitable designs that can serve as alternative embodiments to those shown in FIGS. 33-38 can be used for transmitting and receiving orthogonal wave modes. For example, there can be fewer or more MMICs than described above. In place of the MMICs, or in combination, slotted launchers as shown in FIGS. 18D-18E, 18G, and 18I can be used. It is further appreciated that more or fewer sophisticated functional components can be used for transmitting or receiving orthogonal wave modes. Accordingly, other suitable designs and/or functional components are contemplated by the subject disclosure for transmitting and receiving orthogonal wave modes.

Figure 39:
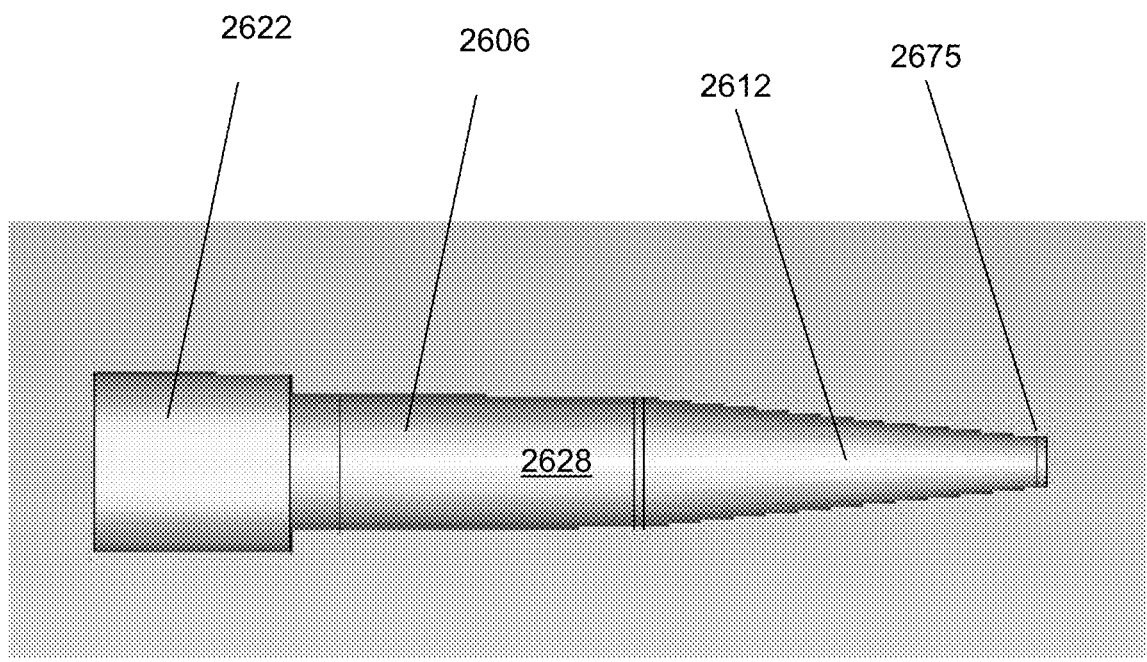
FIG. 39 is a block diagram illustrating example, non-limiting embodiments of a polyrod antenna for transmitting wireless signals in accordance with various aspects described herein.

Referring now to FIG. 39, a block diagram illustrating an example, non-limiting embodiment of a polyrod antenna 2600 for transmitting wireless signals is shown. The polyrod antenna 2600 can be one of a number of polyrod antennas that are utilized in an antenna array, such as array 1976 of FIG. 19F. The antenna array can facilitate or otherwise enable beam steering which can include beam forming. The beam steering can be associated with communication signals, including voice, video, data, messaging, testing signals.

In one or more embodiments, the polyrod antenna 2600 can include a core 2628 having a number of different regions or portions. The core 2628 can be connected with a waveguide 2622 configured to confine an electromagnetic wave at least in part within the core (e.g., in a first region of the core covered by the waveguide). In one embodiment (not shown), the waveguide 2622 can have an opening for accepting a transmission medium (e.g., a dielectric cable) or other coupling devices. In another embodiment, the waveguide 2622 can have a generator, radiating element or other components therein that generate electromagnetic waves for propagating along the core 2628.

In one embodiment, another region 2606 of the core 2628 (e.g., outside of the waveguide 2622) is configured to reduce a propagation loss of an electromagnetic wave as the electromagnetic wave propagates into that region, such as by having a non-tapered or otherwise uniform diameter of the core. The particular length and/or diameter of the region 2606 of the core 2628 can be selected to facilitate the reduction of propagation loss of the electromagnetic wave.

In one embodiment, another region 2612 of the core 2628 (e.g., the distal portion or end of the core that is outside of the waveguide 2622) can be tapered and can facilitate transmitting a wireless signal, such as based on the electromagnetic wave propagating along the core 2628. The particular length, diameter, and/or angle of taper of the region 2612 of the core 2628 can be selected to facilitate transmitting of the wireless signals. In one embodiment, the tip or end 2675 of the region 2612 can be truncated (as shown in FIG. 39) or pointed.

In one embodiment, the length and/or diameter of the core 2628 can be selected based on a wavelength of the electromagnetic wave that will be propagating along the dielectric core. For example, a diameter of greater than $\frac{1}{4}\lambda$ can be used for the region 2606.

In one embodiment, an inner surface of the waveguide 2622 can be constructed from a metallic material or other materials that reflect electromagnetic waves and thereby enables the waveguide 2622 to be configured to guide the electromagnetic wave towards the core 2628. In one embodiment, the core 2628 can comprise a dielectric core (e.g., as described herein) that extends to, or in proximity of, the inner surface of the waveguide 2622. In another embodiment, the dielectric core can be surrounded by cladding (such as shown in FIG. 18A), whereby the cladding extends to the inner surface of the waveguide 2622. In yet other embodiments, the core 2628 can comprise an insulated conductor, where the insulation extends to the inner surface of the waveguide 2622. In this embodiment, the insulated conductor can be a power line, a coaxial cable, or other types of insulated conductors. In one example, the tapered outer shape may extend to the diameter of the metallic wire. In another example, the tapered outer shape may extend to and include tapering of the metallic wire. In yet another example, the metallic wire may or may not continue beyond the tip 2675.

Figure 40:
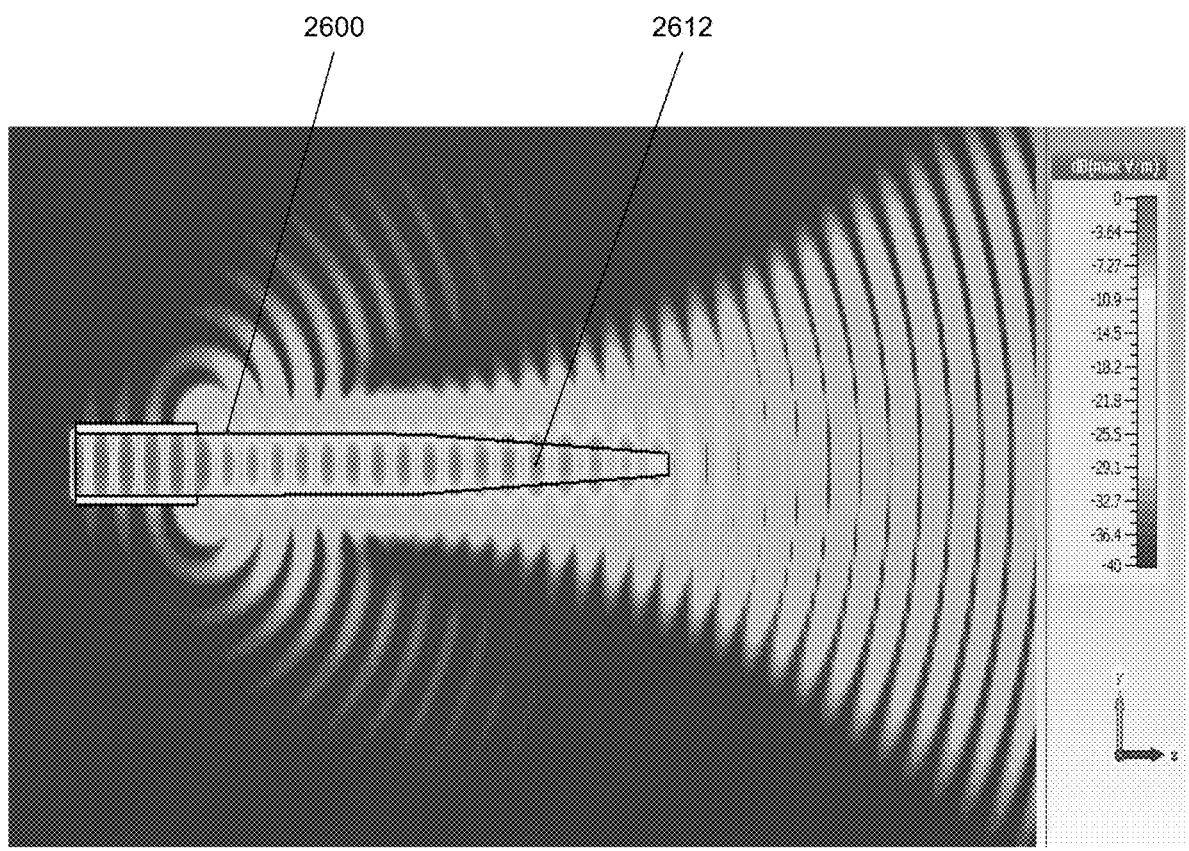
FIG. 40 is a block diagram illustrating an example, non-limiting embodiment of electric field characteristics of transmitted signals from a polyrod antenna in accordance with various aspects described herein.

Referring to FIG. 40, an e-field distribution is illustrated for the polyrod antenna 2600. As shown, the electromagnetic wave is confined or substantially confined within the waveguide 2622 and then propagates along the core 2628 until it is transmitted as a wireless signal from the region 2612 of the core.

Figure 41:
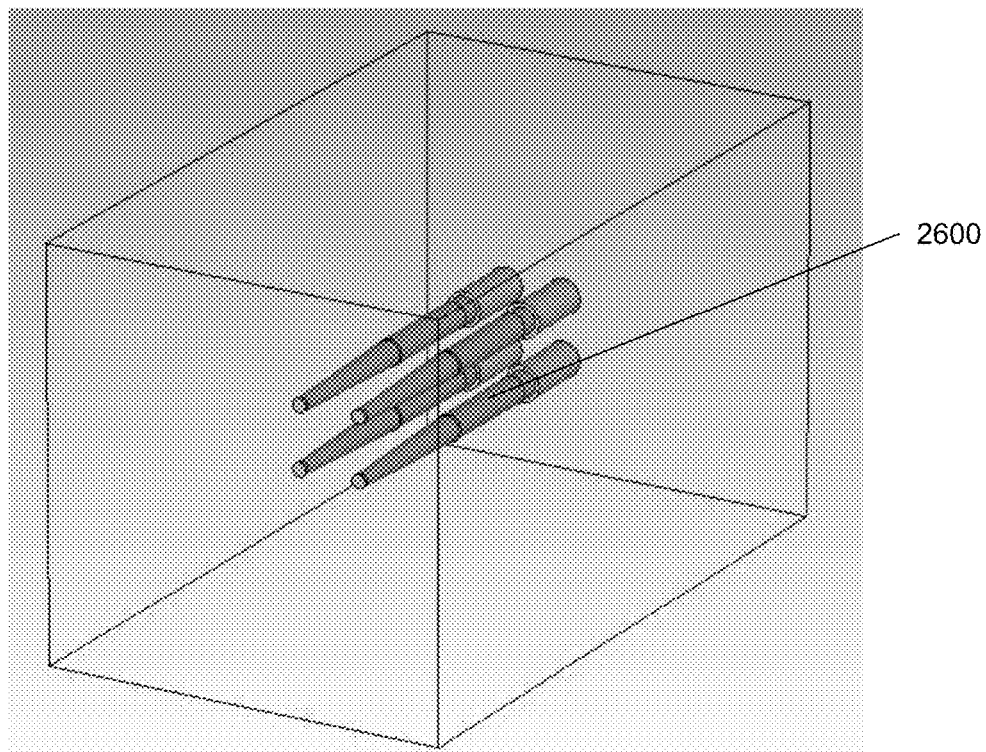
FIGS. 41 and 42 are block diagrams illustrating an example, non-limiting embodiment of a polyrod antenna array in accordance with various aspects described herein.
Figure 42:
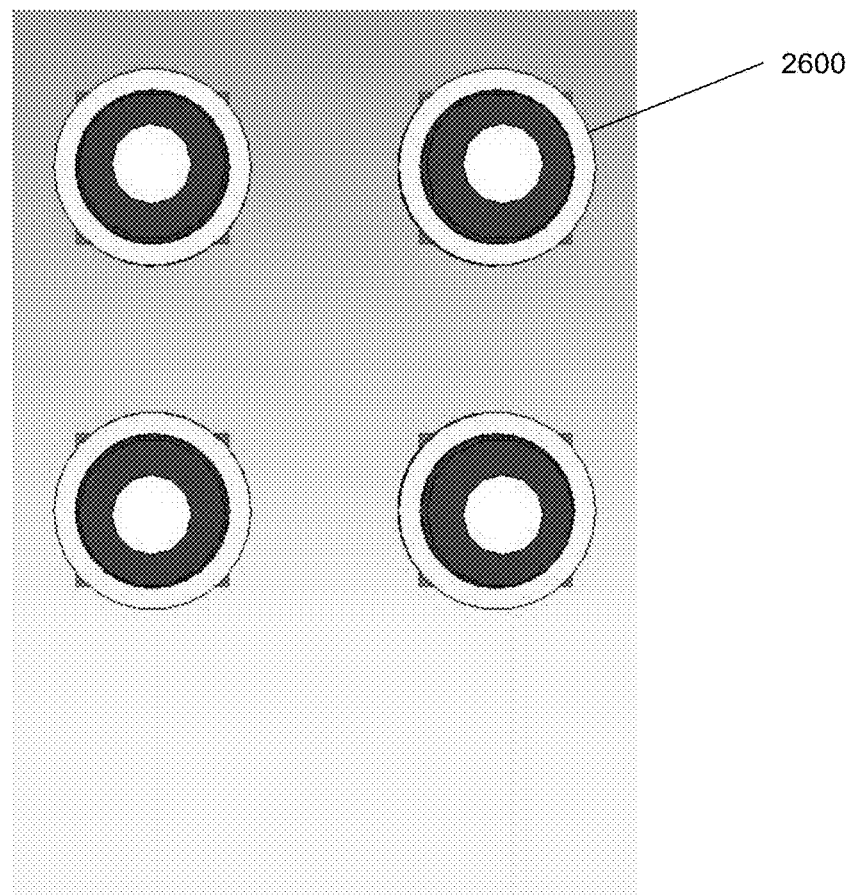

Referring now to FIGS. 41 and 42, diagrams are shown illustrating an example, non-limiting embodiment of a polyrod antenna array 2900 which utilizes four polyrod antennas 2600 for transmitting wireless signals. In this example, the polyrod antenna array 2900 utilizes the same polyrod antennas 2600, which are uniformly spaced apart, such as 0.8 cm on center. The particular type of polyrod antenna, the number of polyrod antennas, and/or the spacing in the array can be selected according to various factors, such as based on parameters of the wireless signals and/or electromagnetic waves that are being utilized.

Figure 43A:
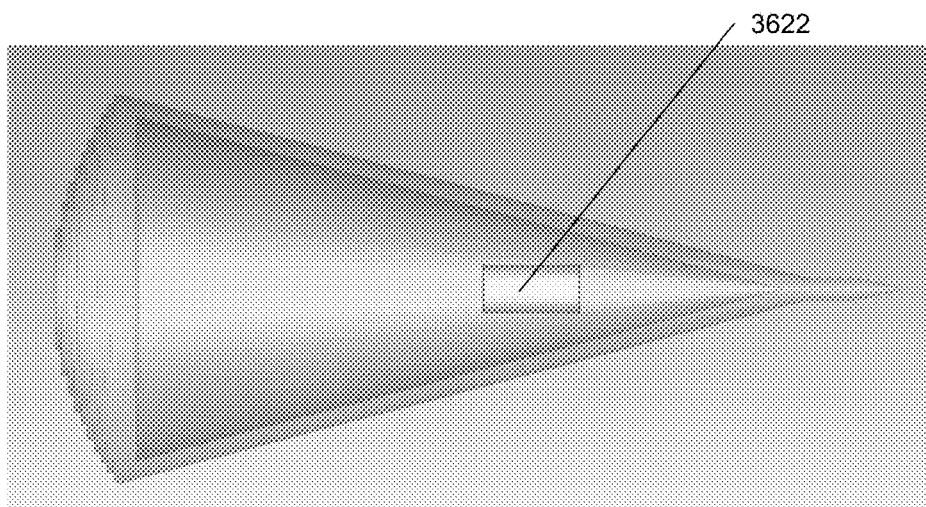
FIGS. 43A, and 43B are block diagrams illustrating an example, non-limiting embodiment of an antenna, and electric field characteristics of transmitted signals from the antenna in accordance with various aspects described herein.
Figure 43B:
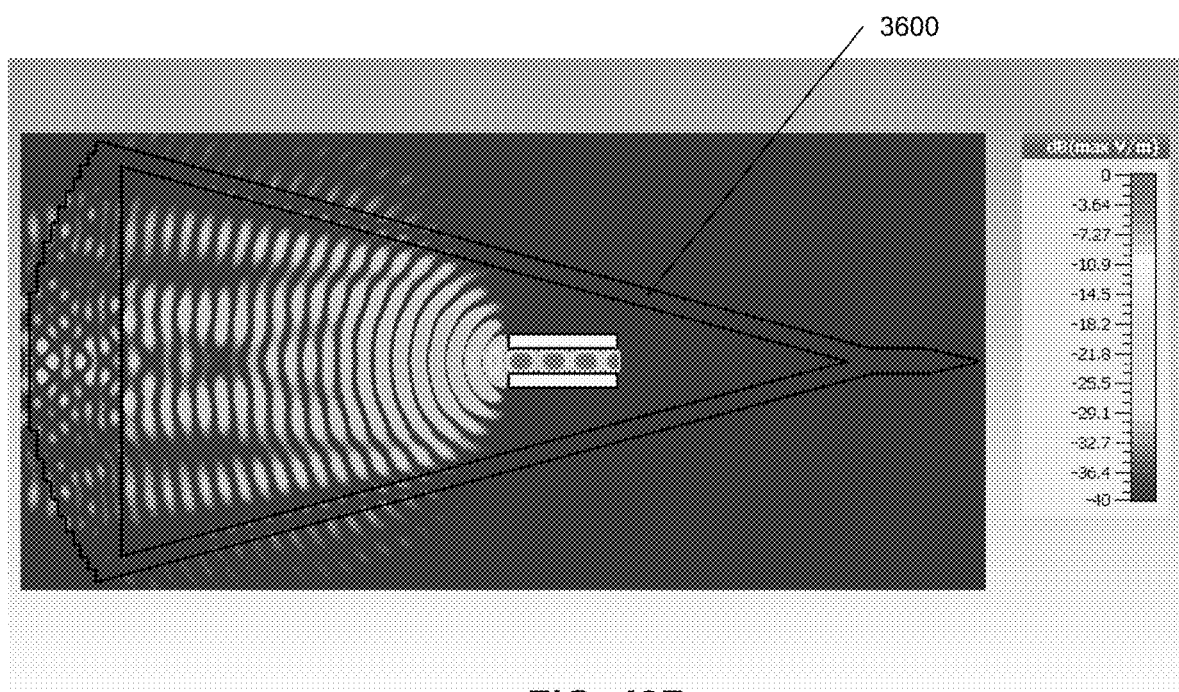

Referring now to FIG. 43A, a block diagram illustrating an example, non-limiting embodiment of a hollow horn antenna 3600 is shown. In one embodiment, the hollow horn antenna 3600 can be used in an array. As an example, hollow horn antenna 3600 can be made from Teflon® and/or can include a cylindrical V-band feed 3622 for generating a signal to be wirelessly transmitted. FIG. 43B illustrates an e-field distribution for the hollow horn antenna 3600. As shown, the electromagnetic waves are confined or substantially confined within the cylinder 3622.

Figure 44A:
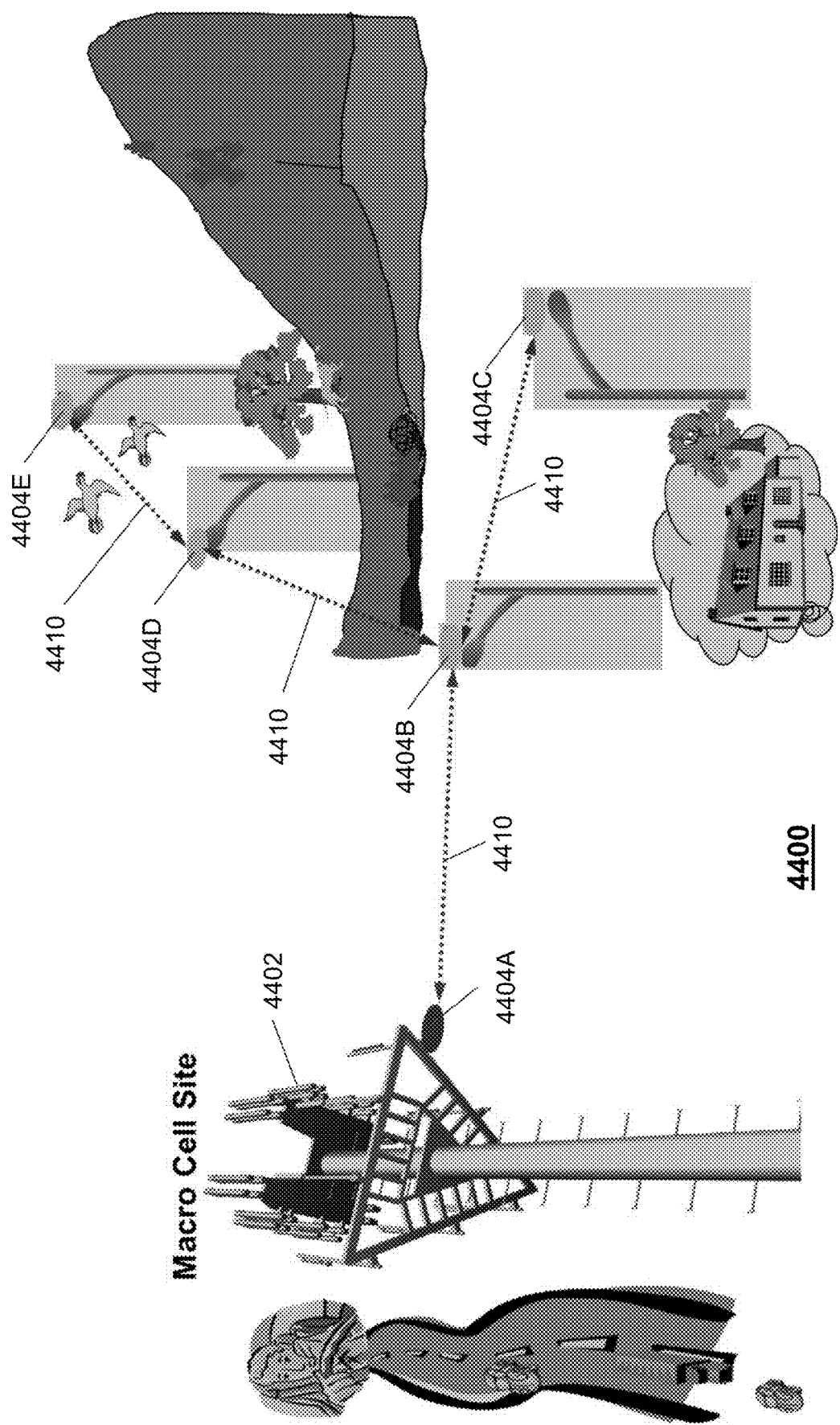
FIG. 44A is a block diagram illustrating an example, non-limiting embodiment of a communication system in accordance with various aspects described herein.

Turning now to FIG. 44A, a block diagram illustrating an example, non-limiting embodiment of a communication system 4400 in accordance with various aspects of the subject disclosure is shown. The communication system 4400 can include a macro base station 4402 such as a base station or access point having antennas that covers one or more sectors (e.g., 6 or more sectors). The macro base station 4402 can be communicatively coupled to a communication node 4404A that serves as a master or distribution node for other communication nodes 4404B-E distributed at differing geographic locations inside or beyond a coverage area of the macro base station 4402. The communication nodes 4404 operate as a distributed antenna system configured to handle communications traffic associated with client devices such as mobile devices (e.g., cell phones) and/or fixed/stationary devices (e.g., a communication device in a residence, or commercial establishment) that are wirelessly coupled to any of the communication nodes 4404. In particular, the wireless resources of the macro base station 4402 can be made available to mobile devices by allowing and/or redirecting certain mobile and/or stationary devices to utilize the wireless resources of a communication node 4404 in a communication range of the mobile or stationary devices.

The communication nodes 4404A-E can be communicatively coupled to each other over an interface 4410. In one embodiment, the interface 4410 can comprise a wired or tethered interface (e.g., fiber optic cable). In other embodiments, the interface 4410 can comprise a wireless RF interface forming a radio distributed antenna system. In various embodiments, the communication nodes 4404A-E can include one or more antennas, such as dielectric horn antennas or antenna arrays, poly rod antennas or antenna arrays or any of the other antennas described herein. The communication nodes 4404A-E can be configured to provide communication services to mobile and stationary devices according to instructions provided by the macro base station 4402. In other examples of operation however, the communication nodes 4404A-E operate merely as analog repeaters to spread the coverage of the macro base station 4402 throughout the entire range of the individual communication nodes 4404A-E.

The micro base stations (depicted as communication nodes 4404) can differ from the macro base station in several ways. For example, the communication range of the micro base stations can be smaller than the communication range of the macro base station. Consequently, the power consumed by the micro base stations can be less than the power consumed by the macro base station. The macro base station optionally directs the micro base stations as to which mobile and/or stationary devices they are to communicate with, and which carrier frequency, spectral segment(s) and/or timeslot schedule of such spectral segment(s) are to be used by the micro base stations when communicating with certain mobile or stationary devices. In these cases, control of the micro base stations by the macro base station can be performed in a master-slave configuration or other suitable control configurations. Whether operating independently or under the control of the macro base station 4402, the resources of the micro base stations can be simpler and less costly than the resources utilized by the macro base station 4402.

Figure 44B:
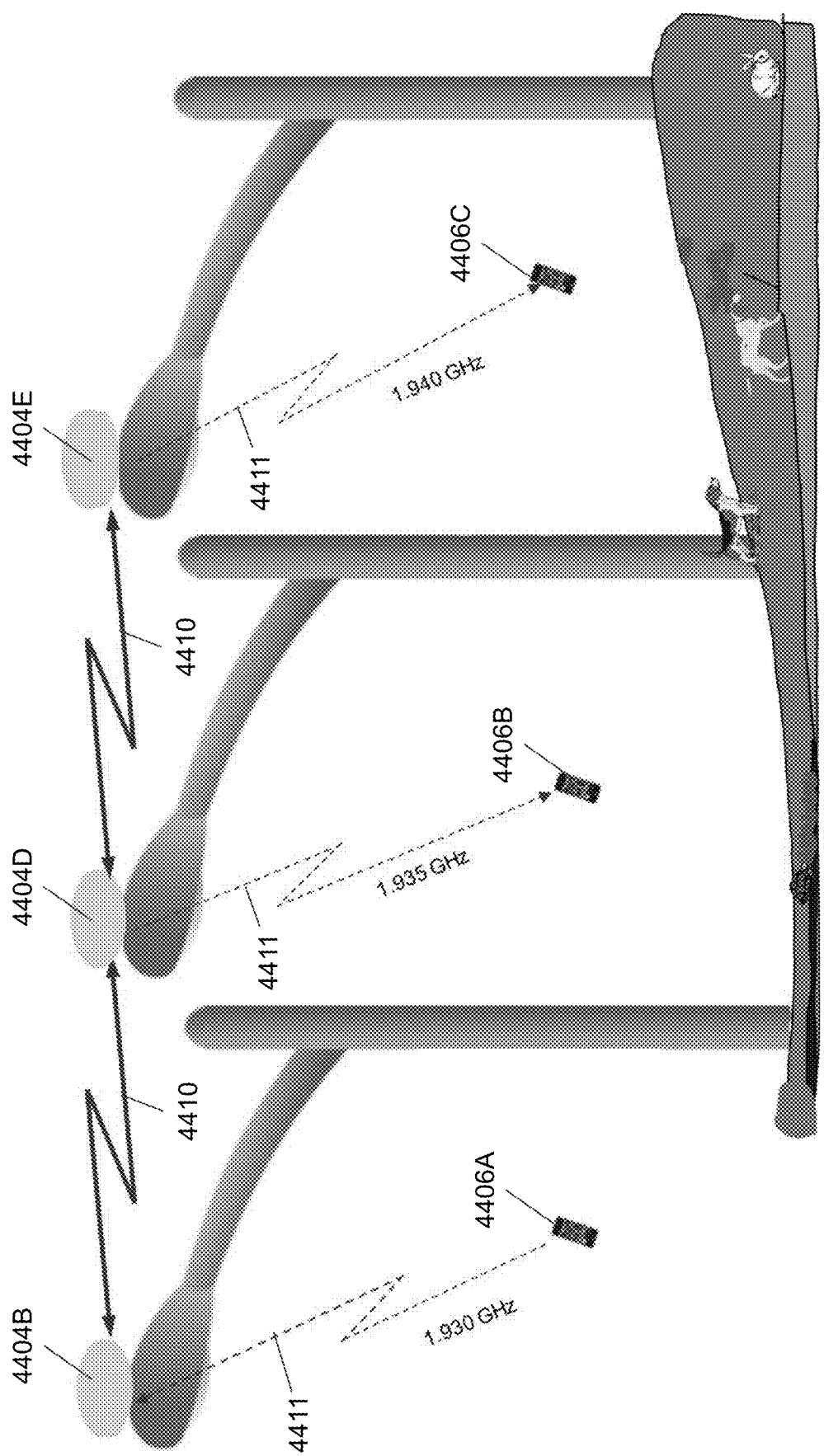
FIG. 44B is a block diagram illustrating an example, non-limiting embodiment of a portion of the communication system of FIG. 44A in accordance with various aspects described herein.

Turning now to FIG. 44B, a block diagram illustrating an example, non-limiting embodiment of the communication nodes 4404B-E of the communication system 4400 of FIG. 44A is shown. In this illustration, the communication nodes 4404B-E are placed on a utility fixture such as a light post. In other embodiments, some of the communication nodes 4404B-E can be placed on a building or a utility post or pole that is used for distributing power and/or communication lines. The communication nodes 4404B-E in these illustrations can be configured to communicate with each other over the interface 4410, which in this illustration is shown as a wireless interface. The communication nodes 4404B-E can also be configured to communicate with mobile or stationary devices 4406A-C over a wireless interface 4411 that conforms to one or more communication protocols (e.g., fourth generation (4G) wireless signals such as LTE signals or other 4G signals, fifth generation (5G) wireless signals, WiMAX, 802.11 signals, ultrawideband signals, etc.). The communication nodes 4404 can be configured to exchange signals over the interface 4410 at an operating frequency that is may be higher (e.g., 28 GHz, 38 GHz, 60 GHz, 80 GHz or higher) than the operating frequency used for communicating with the mobile or stationary devices (e.g., 1.9 GHz) over interface 4411. The high carrier frequency and a wider bandwidth can be used for communicating between the communication nodes 4404 enabling the communication nodes 4404 to provide communication services to multiple mobile or stationary devices via one or more differing frequency bands, (e.g. a 900 MHz band, 1.9 GHz band, a 2.4 GHz band, and/or a 5.8 GHz band, etc.) and/or one or more differing protocols. In other embodiments, particularly where the interface 4410 is implemented via a guided wave communications system on a wire, a wideband spectrum in a lower frequency range (e.g. in the range of 2-6 GHz, 4-10 GHz, etc.) can be employed.

Turning now to FIG. 44C, a block diagram illustrating an example, non-limiting embodiment of downlink and uplink communication techniques for enabling a base station to communicate with the communication nodes 4404 of FIG. 44A is shown. In the illustrations of FIG. 44C, downlink signals (i.e., signals directed from the macro base station 4402 to the communication nodes 4404) can be spectrally divided into control channels 4422, downlink spectral segments 4426 each including modulated signals which can be frequency converted to their original/native frequency band (e.g., cellular band, or other native frequency band) for enabling the communication nodes 4404 to communicate with one or more mobile or stationary devices 4426, and pilot signals 4424 which can be supplied with some or all of the spectral segments 4426 for mitigating distortion created between the communication nodes 4424. The pilot signals 4424 can be processed by tethered or wireless transceivers of downstream communication nodes 4404 to remove distortion from a receive signal (e.g., phase distortion). Each downlink spectral segment 4426 can be allotted a bandwidth 4425 sufficiently wide (e.g., 50 MHz) to include a corresponding pilot signal 4424 and one or more downlink modulated signals located in frequency channels (or frequency slots) in the spectral segment 4426. The modulated signals can represent cellular channels, WLAN channels or other modulated communication signals (e.g., 10-20 MHz), which can be used by the communication nodes 4404 for communicating with one or more mobile or stationary devices 4406.

Uplink modulated signals generated by mobile or stationary communication devices in their native/original frequency bands (e.g., cellular band, or other native frequency band) can be frequency converted and thereby located in frequency channels (or frequency slots) in the uplink spectral segment 4430. The uplink modulated signals can represent cellular channels, WLAN channels or other modulated communication signals. Each uplink spectral segment 4430 can be allotted a similar or same bandwidth 4425 to include a pilot signal 4428 which can be provided with some or each spectral segment 4430 to enable upstream communication nodes 4404 and/or the macro base station 4402 to remove distortion (e.g., phase error).

In the embodiment shown, the downlink and uplink spectral segments 4426 and 4430 each comprise a plurality of frequency channels (or frequency slots), which can be occupied with modulated signals that have been frequency converted from any number of native/original frequency bands (e.g. a 900 MHz band, 1.9 GHz band, a 2.4 GHz band, and/or a 5.8 GHz band, etc.). The modulated signals can be up-converted to adjacent frequency channels in downlink and uplink spectral segments 4426 and 4430. In this fashion, while some adjacent frequency channels in a downlink spectral segment 4426 can include modulated signals originally in a same native/original frequency band, other adjacent frequency channels in the downlink spectral segment 4426 can also include modulated signals originally in different native/original frequency bands, but frequency converted to be located in adjacent frequency channels of the downlink spectral segment 4426. For example, a first modulated signal in a 1.9 GHz band and a second modulated signal in the same frequency band (i.e., 1.9 GHz) can be frequency converted and thereby positioned in adjacent frequency channels of a downlink spectral segment 4426. In another illustration, a first modulated signal in a 1.9 GHz band and a second communication signal in a different frequency band (i.e., 2.4 GHz) can be frequency converted and thereby positioned in adjacent frequency channels of a downlink spectral segment 4426. Accordingly, frequency channels of a downlink spectral segment 4426 can be occupied with any combination of modulated signals of the same or differing signaling protocols and of a same or differing native/original frequency bands.

Similarly, while some adjacent frequency channels in an uplink spectral segment 4430 can include modulated signals originally in a same frequency band, adjacent frequency channels in the uplink spectral segment 4430 can also include modulated signals originally in different native/original frequency bands, but frequency converted to be located in adjacent frequency channels of an uplink segment 4430. For example, a first communication signal in a 2.4 GHz band and a second communication signal in the same frequency band (i.e., 2.4 GHz) can be frequency converted and thereby positioned in adjacent frequency channels of an uplink spectral segment 4430. In another illustration, a first communication signal in a 1.9 GHz band and a second communication signal in a different frequency band (i.e., 2.4 GHz) can be frequency converted and thereby positioned in adjacent frequency channels of the uplink spectral segment 4426. Accordingly, frequency channels of an uplink spectral segment 4430 can be occupied with any combination of modulated signals of a same or differing signaling protocols and of a same or differing native/original frequency bands. It should be noted that a downlink spectral segment 4426 and an uplink spectral segment 4430 can themselves be adjacent to one another and separated by only a guard band or otherwise separated by a larger frequency spacing, depending on the spectral allocation in place.

Figure 44D:
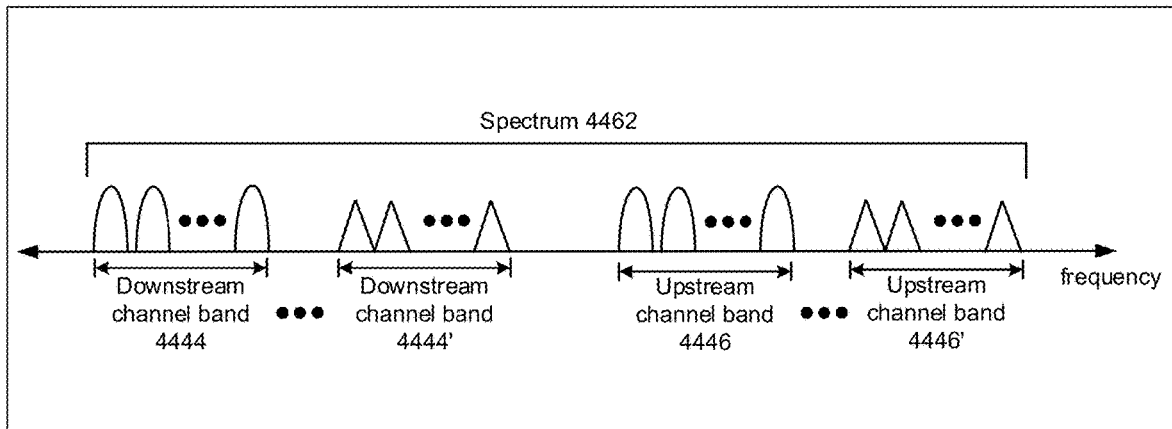
FIG. 44D is a graphical diagram illustrating an example, non-limiting embodiment of a frequency spectrum in accordance with various aspects described herein.

Turning now to FIG. 44D, a graphical diagram 4460 illustrating an example, non-limiting embodiment of a frequency spectrum is shown. In particular, a spectrum 4462 is shown for a distributed antenna system that conveys modulated signals occupying frequency channels of uplink or downlink spectral segments after they have been converted in frequency (e.g. via up-conversion or down-conversion) from one or more original/native spectral segments into the spectrum 4462.

As previously discussed two or more different communication protocols can be employed to communicate upstream and downstream data. When two or more differing protocols are employed, a first subset of the downlink frequency channels of a downlink spectral segment 4426 can be occupied by frequency converted modulated signals in accordance with a first standard protocol and a second subset of the downlink frequency channels of the same or a different downlink spectral segment 4430 can be occupied by frequency converted modulated signals in accordance with a second standard protocol that differs from the first standard protocol. Likewise a first subset of the uplink frequency channels of an uplink spectral segment 4430 can be received by the system for demodulation in accordance with the first standard protocol and a second subset of the uplink frequency channels of the same or a different uplink spectral segment 4430 can be received in accordance with a second standard protocol for demodulation in accordance with the second standard protocol that differs from the first standard protocol.

In the example shown, the downstream channel band 4444 includes a first plurality of downstream spectral segments represented by separate spectral shapes of a first type representing the use of a first communication protocol. The downstream channel band 4444' includes a second plurality of downstream spectral segments represented by separate spectral shapes of a second type representing the use of a second communication protocol. Likewise the upstream channel band 4446 includes a first plurality of upstream spectral segments represented by separate spectral shapes of the first type representing the use of the first communication protocol. The upstream channel band 4446' includes a second plurality of upstream spectral segments represented by separate spectral shapes of the second type representing the use of the second communication protocol. These separate spectral shapes are meant to be placeholders for the frequency allocation of each individual spectral segment along with associated reference signals, control channels and/or clock signals. While the individual channel bandwidth is shown as being roughly the same for channels of the first and second type, it should be noted that upstream and downstream channel bands 4444, 4444', 4446 and 4446' may be of differing bandwidths. Additionally, the spectral segments in these channel bands of the first and second type may be of differing bandwidths, depending on available spectrum and/or the communication standards employed.

Figure 44E:
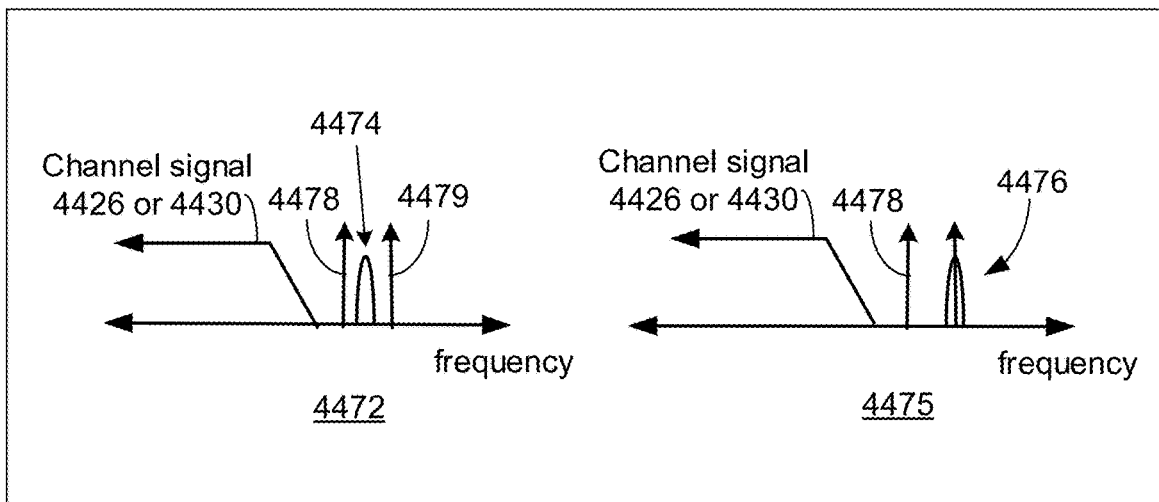
FIG. 44E is a graphical diagram illustrating an example, non-limiting embodiment of a frequency spectrum in accordance with various aspects described herein.

Turning now to FIG. 44E, a graphical diagram 4470 illustrating an example, non-limiting embodiment of a frequency spectrum is shown. In particular a portion of the spectrum 4462 of FIG. 44D is shown for a distributed antenna system that conveys modulated signals in the form of channel signals that have been converted in frequency (e.g. via up-conversion or down-conversion) from one or more original/native spectral segments.

The portion 4472 includes a portion of a downlink or uplink spectral segment 4426 and 4430 that is represented by a spectral shape and that represents a portion of the bandwidth set aside for a control channel, reference signal, and/or clock signal. The spectral shape 4474, for example, represents a control channel that is separate from reference signal 4479 and a clock signal 4478. It should be noted that the clock signal 4478 is shown with a spectral shape representing a sinusoidal signal that may require conditioning into the form of a more traditional clock signal. In other embodiments however, a traditional clock signal could be sent as a modulated carrier wave such by modulating the reference signal 4479 via amplitude modulation or other modulation technique that preserves the phase of the carrier for use as a phase reference. In other embodiments, the clock signal could be transmitted by modulating another carrier wave or as another signal. Further, it is noted that both the clock signal 4478 and the reference signal 4479 are shown as being outside the frequency band of the control channel 4474.

In another example, the portion 4475 includes a portion of a downlink or uplink spectral segment 4426 and 4430 that is represented by a portion of a spectral shape that represents a portion of the bandwidth set aside for a control channel, reference signal, and/or clock signal. The spectral shape 4476 represents a control channel having instructions that include digital data that modulates the reference signal, via amplitude modulation, amplitude shift keying or other modulation technique that preserves the phase of the carrier for use as a phase reference. The clock signal 4478 is shown as being outside the frequency band of the spectral shape 4476. The reference signal, being modulated by the control channel instructions, is in effect a subcarrier of the control channel and is in-band to the control channel. Again, the clock signal 4478 is shown with a spectral shape representing a sinusoidal signal, in other embodiments however, a traditional clock signal could be sent as a modulated carrier wave or other signal. In this case, the instructions of the control channel can be used to modulate the clock signal 4478 instead of the reference signal.

Consider the following example, where the control channel 4476 is carried via modulation of a reference signal in the form of a continuous wave (CW) from which the phase distortion in the receiver is corrected during frequency conversion of the downlink or uplink spectral segment 4426 and 4430 back to its original/native spectral segment. The control channel 4476 can be modulated with a robust modulation such as pulse amplitude modulation, binary phase shift keying, amplitude shift keying or other modulation scheme to carry instructions between network elements of the distributed antenna system such as network operations, administration and management traffic and other control data. In various embodiments, the control data can include without limitation:

Status information that indicates online status, offline status, and network performance parameters of each network element.

Network device information such as module names and addresses, hardware and software versions, device capabilities, etc.

Spectral information such as frequency conversion factors, channel spacing, guard bands, uplink/downlink allocations, uplink and downlink channel selections, etc.

Environmental measurements such as weather conditions, image data, power outage information, line of sight blockages, etc.

In a further example, the control channel data can be sent via ultra-wideband (UWB) signaling. The control channel data can be transmitted by generating radio energy at specific time intervals and occupying a larger bandwidth, via pulse-position or time modulation, by encoding the polarity or amplitude of the UWB pulses and/or by using orthogonal pulses. In particular, UWB pulses can be sent sporadically at relatively low pulse rates to support time or position modulation, but can also be sent at rates up to the inverse of the UWB pulse bandwidth. In this fashion, the control channel can be spread over an UWB spectrum with relatively low power, and without interfering with CW transmissions of the reference signal and/or clock signal that may occupy in-band portions of the UWB spectrum of the control channel.

In one or more embodiments, communication device 4510 can include an antenna array 4515 for transmitting wireless signals. In one or more embodiments, the antenna array 4515 can perform beam steering. For example, the antenna array 4515 can utilize a first subset of antennas of the antenna array to transmit first wireless signals 4525 directed (as shown by reference number 4527) via beam steering towards the communication device 4550. A second subset of antennas of the antenna array 4515 can transmit second wireless signals 4530 directed (as shown by reference number 4532) via the beam steering towards a transmission medium 4575 (e.g., a power line connected between the utility poles 4520, 4560). In one or more embodiments, the aforementioned beams can be simultaneously created by the same set of antennas in arrays 4510 and 4550. In one or more embodiments, the beam steering can enable the antenna array to communicate with more than one wireless receiver with or without directing wireless signals to a transmission medium. In one or more embodiments, the beam steering can enable the antenna array to direct the wireless signals to more than one transmission medium with or without communicating with a wireless receiver.

The first and second wireless signals 4525, 4530 can be associated with communication signals that are to be transmitted over the network. For instance, the first and second wireless signals 4525, 4530 can be the same signals. In another example, the first wireless signals 4525 can represent a first subset of the communication signals, while the second wireless signals 4530 represent a second subset of the communication signals. In one embodiment, the first and second wireless signals 4525, 4530 can be different and can be based on interleaving of a group of communication signals, such as video packets, and so forth. The communication signals can be various types of signals including information associated with subscriber services, network control, testing, and so forth.

In one or more embodiments, the second wireless signals 4530 induce electromagnetic waves 4540. For example, the electromagnetic waves 4540 are induced at a physical interface of the transmission medium 4575 and propagate (as shown by reference number 4542) without requiring an electrical return path. The electromagnetic waves 4540 are guided by the transmission medium 4575 towards the communication device 4550, which is positioned in proximity to the transmission medium. The electromagnetic waves 4540 can be representative of the second wireless signals 4530 which are associated with the communication signals.

In one or more embodiments, the communication device 4550 can include a receiver that is configured to receive the electromagnetic waves 4540 that are propagating along the transmission medium 4575. Various types of receivers can be used for receiving the electromagnetic waves 4540, such as devices shown in FIGS. 7, 8 and 9A. System 4500 enables the communication device 4510 to transmit information which is received by the communication device 4550 (e.g., another antenna array 4555) via the wireless communication path 4527 and via being guided by the transmission medium 4575.

In one or more embodiments, the antenna arrays 4515, 4555 can include polyrod antennas. For example, each of the polyrod antennas can include a core that is connected with a waveguide that is configured to confine an electromagnetic wave at least in part within the core in a particular region of the core. In one embodiment, each of the polyrod antennas can include a core having a first region, a second region, a third region, and a fourth region, where the core comprises an interface in the first region. One of the plurality of transmitters can generate a first electromagnetic wave that induces a second electromagnetic wave at the interface of the first region. The core can be connected with a waveguide that is configured to confine the second electromagnetic wave at least in part within the core in the first region, where the second region of the core is configured to reduce a radiation loss of the second electromagnetic wave as the second electromagnetic wave propagates into the second region. The third region of the core can be configured to reduce a propagation loss of the second electromagnetic wave as the second electromagnetic wave propagates into the third region. The fourth region of the core can be outside of the waveguide and can be tapered to facilitate transmitting one of the first or second wireless signals based on the second electromagnetic wave.

Figure 45:
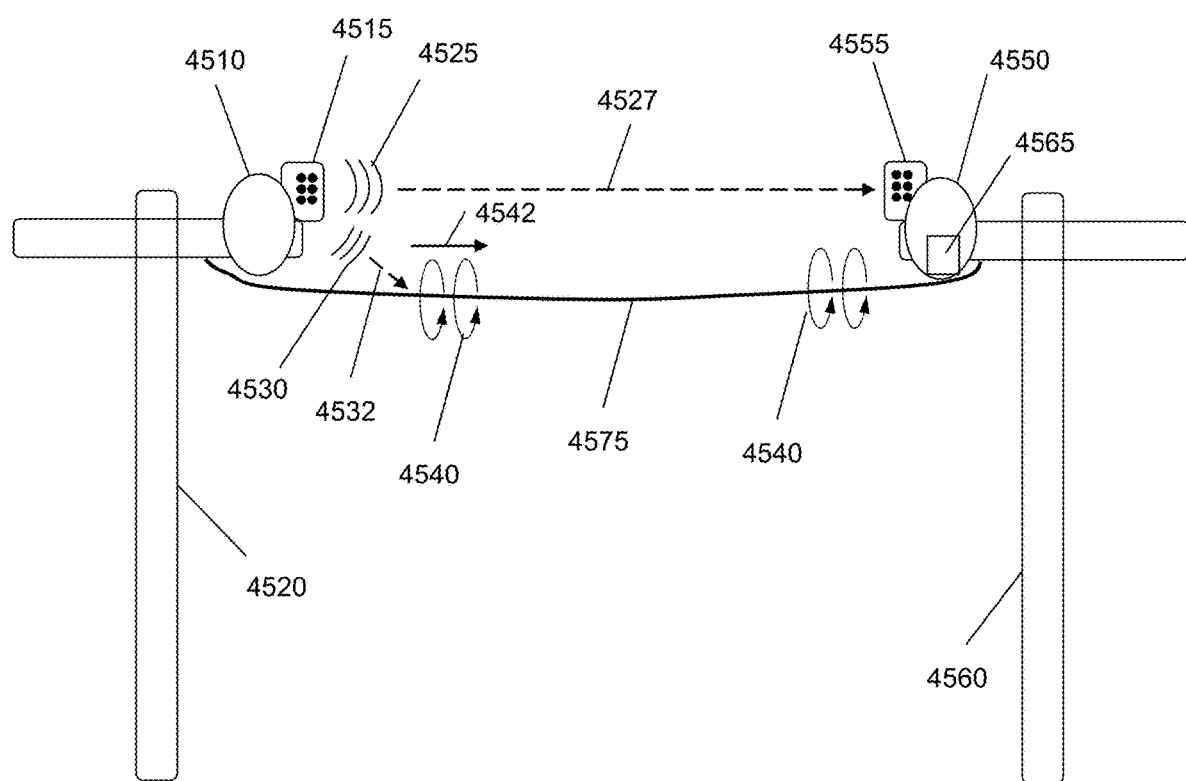
FIG. 45 is a block diagram illustrating an example, non-limiting embodiment of a communication system that utilizes beam steering in accordance with various aspects described herein.

In one or more embodiments, the communication device 4510 can provide a phase adjustment to the second wireless signals 4530 to accomplish beam steering towards the transmission medium 4575. FIG. 45 illustrates the antenna array 4555 and the receiver 4565 being co-located at communication device 4550, however, in another embodiment the antenna array 4555 and the receiver 4565 can be separate devices that may or may not be in proximity to each other. For example, the first wireless signals 4525 can be received by the antenna array 4555 of the communication device 4550 while the electromagnetic waves 4540 can be received by a receiver of a different communication device (not shown) that is in proximity to the transmission medium 4575.

Figure 46A:
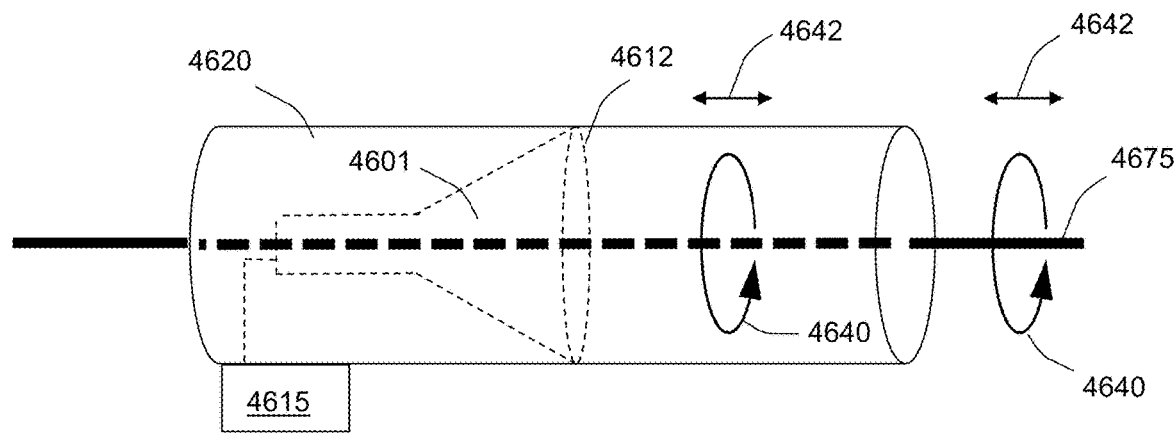
FIGS. 46A-E are graphical diagrams illustrating example, non-limiting embodiments of a communication device that absorbs radiation in accordance with various aspects described herein.

Referring to FIG. 46A, a block diagram illustrates an example, non-limiting embodiment of a communication device 4600 in accordance with various aspects described herein. Communication device 4600 can be one of a number of devices that facilitate communications in a network utilizing transmission media, such as power lines. Although, communication device 4600 can be utilized with various types of transmission media. As described herein, the communication device 4600 enables absorbing or otherwise mitigating undesired radiation (e.g., through use of an absorber 4620 that absorbs the undesired radiation) while facilitating communication through use of electromagnetic waves propagating along the transmission medium without requiring an electrical return path.

Communication device 4600 can include a launcher or coupling device 4601 (referred to herein as a launcher). The launcher 4601 is shown in FIG. 46A as a hollow horn structure having a conical structure, such as described with respect to FIGS. 18G, 18H, 23A, 23B, 23C and/or 25A. However, other shapes and configurations can be utilized for launcher 4601, which may or may not include conical features. A distal end 4612 of the launcher 4601 can have various shapes and configurations including circular or non-circular (e.g., elliptical). The launcher 4601 can be made from various materials or combinations of various materials, including metal.

In one embodiment, the distal end 4612 can be opposite to an end of the launcher 4601 which has, or is otherwise coupled with, transceiver circuitry 4615. The transceiver circuitry 4615 (e.g., a transceiver, transmitter, and/or receiver) can generate or otherwise facilitate generation of an electromagnetic wave 4640 via the launcher 4601 which propagates along a transmission medium 4675. The electromagnetic wave 4640 can propagate along the transmission medium 4675 without requiring an electrical return path, such as to be received by a receiver at another communication device coupled to the transmission medium. Propagation of the electromagnetic wave 4640 can be in either direction depending on whether the communication device 4600 is transmitting or receiving the electromagnetic wave as shown by arrows 4642. In one embodiment, the transceiver circuitry 4615 can include a processor that is configured to select parameter(s) associated with electromagnetic waves such as a wave mode (e.g., non-fundamental wave mode, fundamental wave mode, a hybrid wave mode, or combinations thereof as described earlier) and can include a transmitter to transmit instances of electromagnetic waves having a non-optical operating frequency (e.g., 60 GHz).

In one embodiment, the launcher 4601 can be coupled to the transceiver circuitry 4615 via a cable or feedline, such as described with respect to FIGS. 18A, 19A, 20A, 20B. In one embodiment, the launcher 4601 and/or the cable can be constructed of dielectric materials such as a polyethylene material, a polyurethane material or other suitable dielectric materials (e.g., a synthetic resin, other plastics, and so forth). In one embodiment, the launcher 4601 and/or the cable can be conductorless and/or can be substantially or entirely devoid of any conductive materials.

In one embodiment, the electromagnetic wave 4640 propagates longitudinally (e.g., along an axis of the launcher 4601) towards the distal end 4612 of the launcher. In one embodiment, far-field antenna gain patterns can be widened by decreasing the operating frequency of the electromagnetic wave from a nominal frequency. Similarly, the gain pattern can be narrowed by increasing the operating frequency of the electromagnetic wave from the nominal frequency. Accordingly, an outer extent of the electromagnetic wave 4640 (e.g., defined by the radius for a circular wave pattern) can be adjusted or otherwise controlled by configuring the communication device 4600 to increase or decrease the operating frequency of the electromagnetic wave. In one or more embodiments, the mode may not strictly have an 'outermost extent' but rather may extend indefinitely or near indefinitely. However, beyond a certain radius, which can be called the extent or outer extent, the field starts to decrease very rapidly, such that the total energy in that outer field is just a small fraction of the energy contained within that radius.

The launcher 4601 can also be used for receiving electromagnetic waves that are propagating along the transmission medium 4675. Electromagnetic waves 4640 received at the distal end 4612 of the launcher 4601 can propagate towards a receiver, such as in transceiver circuitry 4615. In this configuration, the communication device 4600 can perform bidirectional communications utilizing the launcher 4601. It is further noted that in some embodiments the cable or feedline can be configured to be collinear with the feed point to avoid any bend. In some embodiments, a collinear configuration can reduce an alteration in the propagation of the electromagnetic due to cable bends.

In one embodiment, the absorber 4620 can be configured to absorb radiation at or near the distal end 4612 of the launcher 4601. For example, the absorber 4620 can include absorbent material(s) that absorbs radiation and which is positioned in proximity to the distal end 4612 of the launcher 4601. For instance, the absorber 4620 can surround all or a portion (e.g., the distal end 4612) of the launcher 4601. In one embodiment, an inner surface of the absorbent material of the absorber 4620 can surround, and abut against, the distal end 4612 of the launcher 4601. The absorbent material of the absorber 4620 can be a single material or combinations of materials, including flexible foam such as polyurethane that includes carbon. Other material(s) can also be used that have material characteristics which allow for absorbing undesired radiation including particular elastomers, epoxy and/or plastics that are carbon-treated. The type of absorbent material and/or its physical characteristics (e.g., thickness, density, flexibility, and so forth) for the absorber 4620 can be selected based on a number of factors including the environment of the communication device 4600, the parameters of the electromagnetic wave 4640 (e.g., operating frequency), the size and/or shape of the launcher 4601, and so forth.

In one embodiment, the absorber 4620 can have a cylindrical shape defining a cavity (or opening such as a cylindrical cavity) and the launcher 4601 can be positioned entirely or partially in the cavity. In another embodiment, the absorber 4620 can have a cylindrical shape which is solid (in whole or in part) and the launcher 4601 can be embedded therein. Other shapes for the absorber 4620 can be utilized, including shapes that conform to the shape of the distal end 4612 of the launcher 4601, such as a circular cylindrical shape for the absorber where the distal end of the launcher is circular, an elliptical cylinder shape for the absorber where the distal end of the launcher is elliptical, and so forth. In one embodiment, the absorbent material of the absorber 4620 can define a cavity or can surround a solid region of non-absorbent material where the non-absorbent material is positioned along the path of propagation of the electromagnetic wave 4640 and/or where the non-absorbent material has a uniform diameter along a length of the absorber. The absorber 4620 can be a single contiguous device (such as a cylinder or ring) or can be multiple devices (such as a group of absorbers that are physically connected to a housing, where the group of absorbers may or may not abut against each other).

In one embodiment, where the absorber 4620 is solid or is closed at one or both ends (e.g., end cap(s)), non-absorbent material which does not absorb radiation or which does not interfere with the propagation of the electromagnetic wave can be used by the absorber. For example, the absorber 4620 can have a cylindrical shape with radiation absorbent material being an outer wall of the cylinder, where the radiation absorbent material circumscribes or surrounds the launcher 4601 and also circumscribes or surrounds the non-absorbent material. In this example, the absorber 4620 can provide a closed structure (e.g., the launcher 4601 is positioned entirely in the absorber 4620) which provides a housing and protection to the launcher (and/or other components of the communication device 4600), such as from the weather. The radiation absorbent material would absorb undesired radiation in proximity to the distal end 4612 of the launcher 4601 while the non-absorbent material would facilitate propagation of the electromagnetic wave 4640, such as along the transmission medium 4675.

Figure 46B:
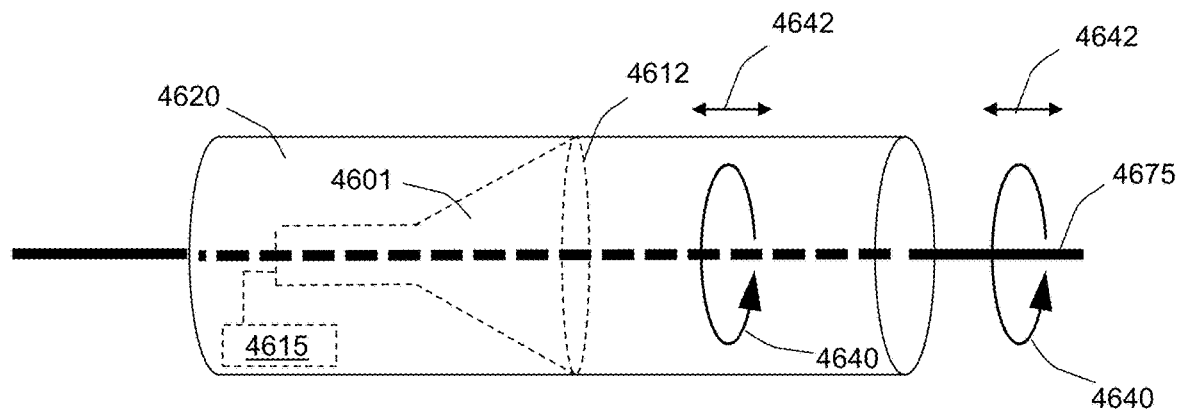

In one embodiment, the transceiver circuitry 4615 (e.g., transmitter, receiver, and/or transceiver) can be positioned outside of the absorber 4620. For example, the transceiver circuitry 4615 can be in a housing that is connected with the outside of the absorber 4620 or that is supported by another structure (e.g., a utility structure) and is coupled with the launcher 4601, such as through a cable. In another embodiment of communication device 4600' as shown in FIG. 46B, the transceiver circuitry 4615 can be positioned inside of, or otherwise surrounded in whole or in part by, the absorber 4620. As explained herein, the absorber 4620 can have an open cavity or can be a closed housing (e.g., utilizing non-absorbent material where the electromagnetic wave is intended to propagate).

In one embodiment, the transmission medium 4675 can be positioned so as to pass through the absorber 4620. For example, the absorber 4620 can have a cylindrical shape which defines an open cavity or which is solid, and the transmission medium 4675 can be positioned through the cavity or solid. In one embodiment, the transmission medium 4675 can pass entirely through opposing ends of the absorber 4620 (as shown in FIG. 46A). In another embodiment, the transmission medium 4675 can pass through only one of the opposing ends of the absorber 4620 (e.g., an end of the transmission medium being positioned in the absorber).

In one embodiment, the launcher 4601, the absorber 4620 and/or the transmission medium 4675 can be concentrically aligned as illustrated in FIGS. 46A and 46B. In another embodiment, the launcher 4601, the absorber 4620 and/or the transmission medium 4675 are not concentrically aligned.

Figure 46C:
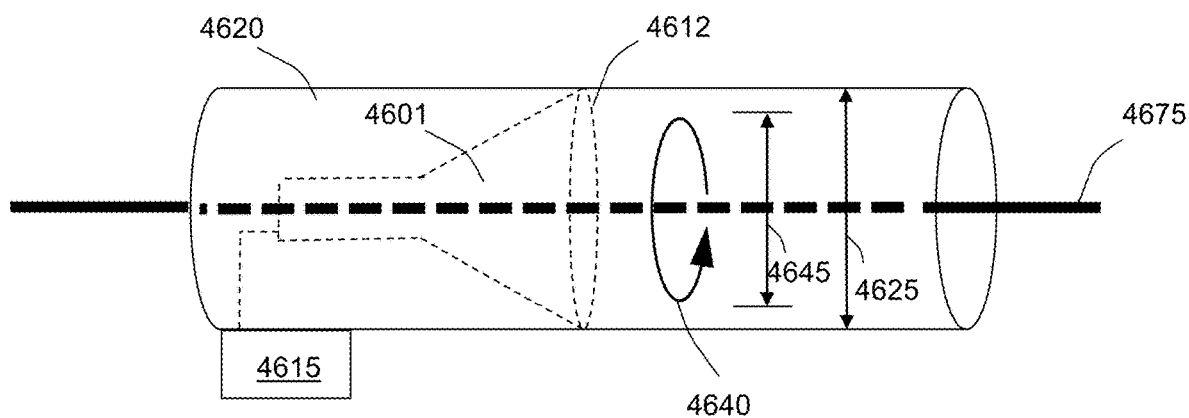

As described herein, parameters of the electromagnetic wave 4640 (e.g., the operating frequency) can be adjusted enabling control over the outer extent 4645 (e.g., the size) of the electromagnetic wave 4640 as illustrated in FIG. 46C. In this example, the outer extent 4645 of the electromagnetic wave 4640 can be controlled to be smaller than a diameter 4625 of the cavity (or solid region of non-absorbent material) which is defined by the absorbent material of the absorber 4620 so that the absorber absorbs undesired radiation at the distal end 4612 of the launcher 4601 while facilitating propagation of the electromagnetic wave 4640 along the transmission medium 4675.

Figure 46D:
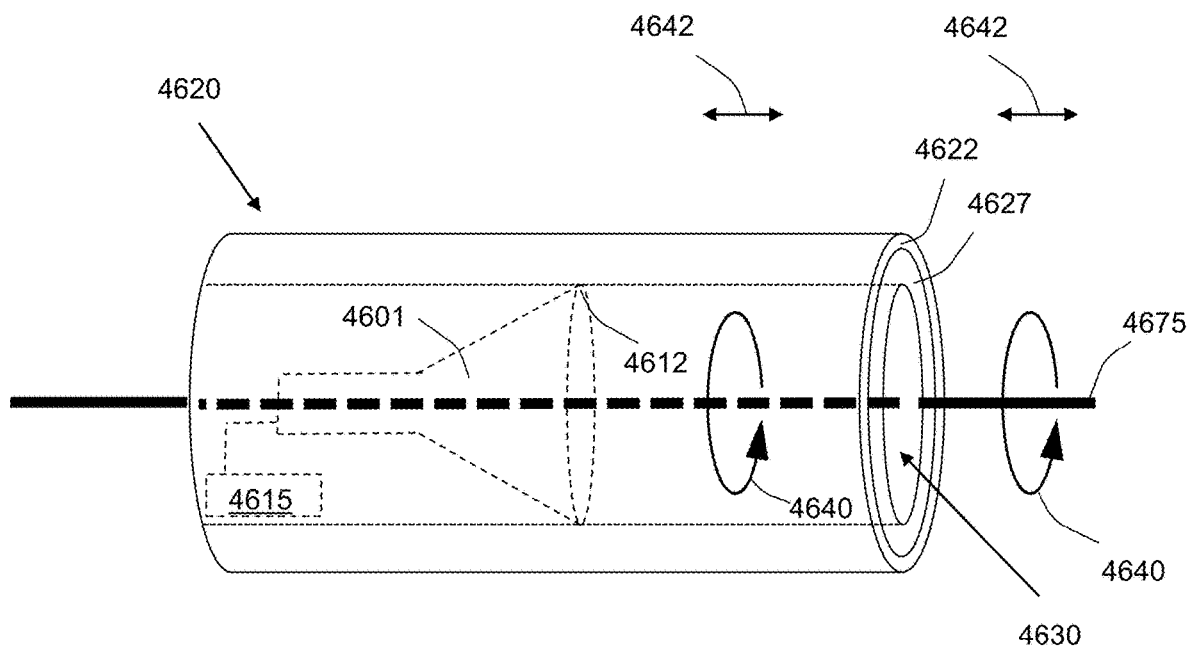

In one embodiment of the communication device 4600" as shown in FIG. 46D, the absorber 4620 can include a rigid housing 4622 where radiation absorbent material 4627 is physically connected to and supported by the rigid housing. The rigid housing 4622 can be made from various materials, including plastic. In one embodiment, the rigid housing 4622 can have a cylindrical shape with the radiation absorbent material 4627 physically connected to an inner surface of the rigid body. In this example, the radiation absorbent material 4627 extends along an entirety of the inner surface of the rigid housing 4622 and circumscribes or surrounds the launcher 4601. However, other configurations can be utilized such as the radiation absorbent material 4627 being a ring(s) that is positioned only along a portion the inner surface of the rigid housing 4622 and circumscribes or surrounds the distal end 4612 of the launcher 4601. In one embodiment, the radiation absorbent material 4627 can define an open cavity 4630. In another embodiment, the radiation absorbent material 4627 can surround non-absorbent material that facilitates propagation of the electromagnetic wave 4640. In these examples, the absorber 4620 can provide either open or closed structures which provide a housing and protection to the launcher 4601 (and/or other components of the communication device 4600), such as from the weather. The radiation absorbent material 4627 would absorb undesired radiation in proximity to the distal end 4612 of the launcher 4601 while the non-absorbent material (or open cavity) would facilitate propagation of the electromagnetic wave 4640, such as along the transmission medium 4675.

Figure 46E:
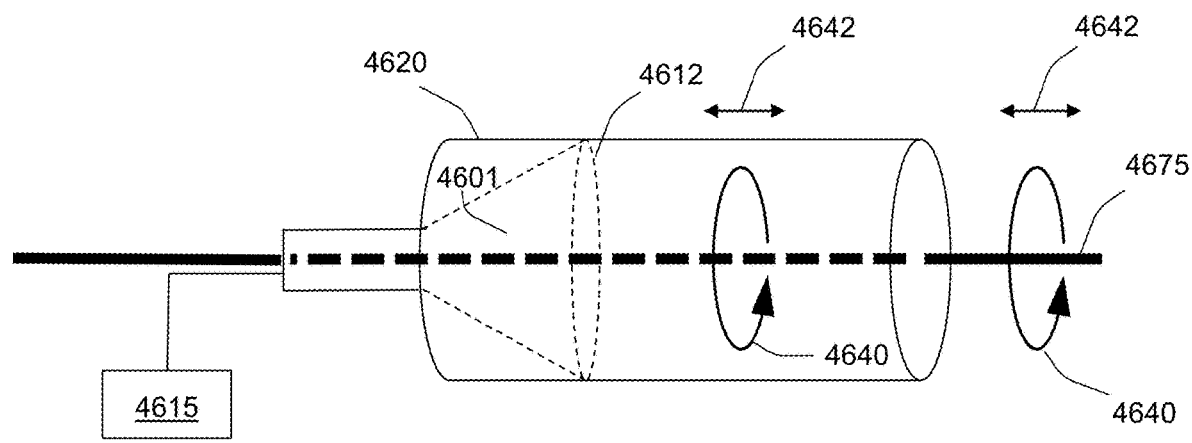

In one embodiment of the communication device 4600''' as shown in FIG. 46E, the absorber 4620 can surround only a portion of the launcher 4601 (allowing another portion of the launcher to be exposed or otherwise accessible from outside of the absorber) so that radiation absorbent material of the absorber is in proximity to the distal end 4612 of the launcher. For example, the absorber 4620 can have a cylindrical shape with the distal end 4612 inside of the cylinder and an opposing end of the launcher 4601 extending outside of the cylinder.

The absorber 4620 can be utilized with other configurations of communication devices. For example, the absorber 4620 can be utilized with a dielectric antenna that transmits wireless signals. In this example, the absorber 4620 can surround the distal end of the dielectric antenna so as to absorb undesired radiation while allowing wireless signals to be transmitted by or received by the dielectric antenna.

In one embodiment, multiple launchers 4601 (e.g. two) can be positioned in a single absorber 4620 facing in opposing directions such that the distal ends 4612 are facing towards the ends of the single absorber. In this example, the two launchers 4601 can share a transceiver circuitry 4615 or can have separate circuitry. The multiple launchers 4601 can facilitate bidirectional transmitting and receiving of electromagnetic waves that propagate along the transmission medium 4675 without requiring an electrical return path.

Figure 47:
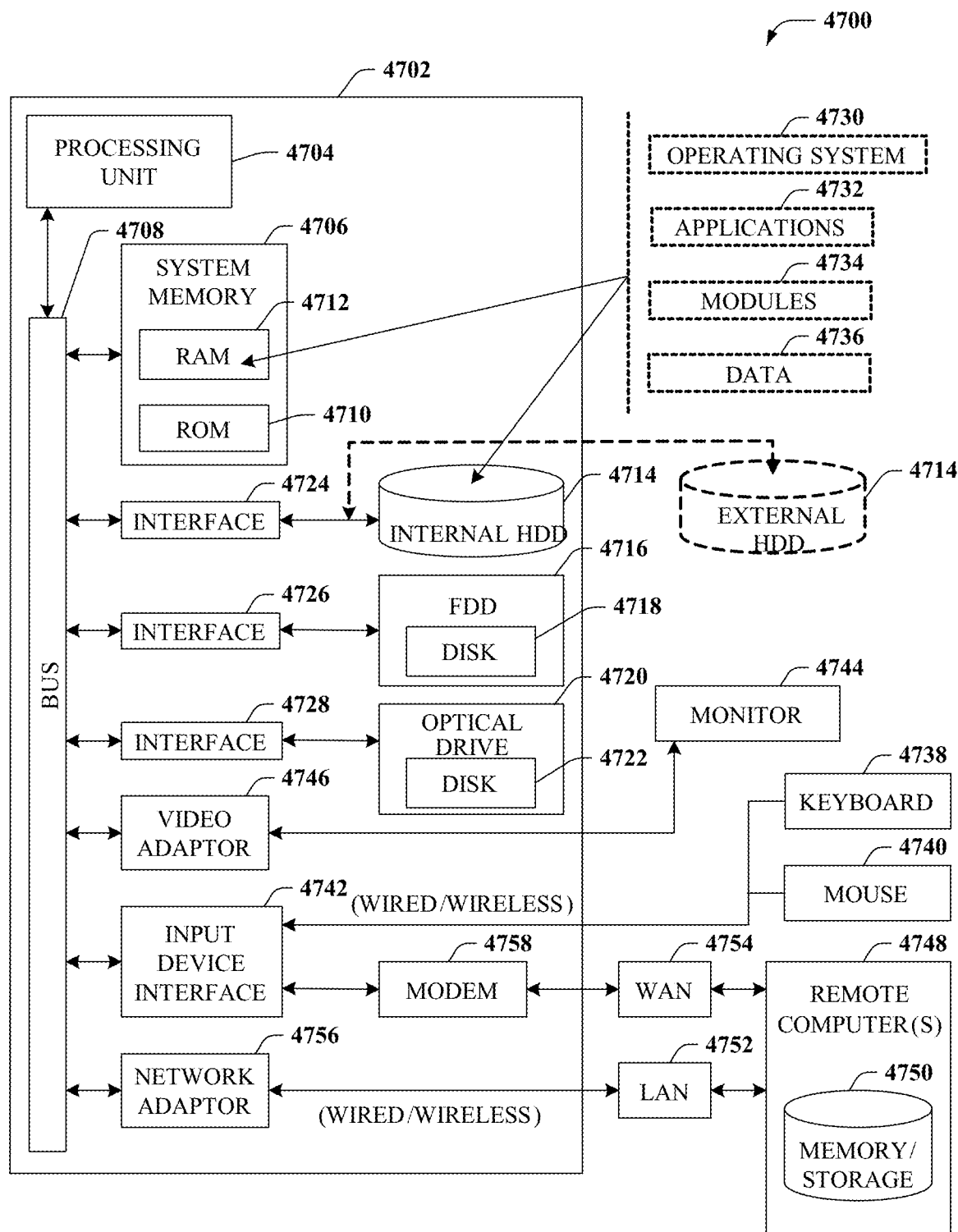
FIG. 47 is a block diagram of an example, non-limiting embodiment of a computing environment in accordance with various aspects described herein.

Referring now to FIG. 47, there is illustrated a block diagram of a computing environment in accordance with various aspects described herein. In order to provide additional context for various embodiments of the embodiments described herein, FIG. 47 and the following discussion are intended to provide a brief, general description of a suitable computing environment 4700 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes processor as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 47, the example environment 4700 for transmitting and receiving signals via or forming at least part of a base station (e.g., base station devices 1504, macrocell site 1502, or base stations 1614) or central office (e.g., central office 1501 or 1611). At least a portion of the example environment 4700 can also be used for transmission devices 101 or 102. The example environment can comprise a computer 4702, the computer 4702 comprising a processing unit 4704, a system memory 4706 and a system bus 4708. The system bus 4708 couple's system components including, but not limited to, the system memory 4706 to the processing unit 4704. The processing unit 4704 can be any of various commercially available processors. Dual microprocessors and other multiprocessor architectures can also be employed as the processing unit 4704.

The system bus 4708 can be any of several types of bus structure that can further interconnect to a memory bus (with or without a memory controller), a peripheral bus, and a local bus using any of a variety of commercially available bus architectures. The system memory 4706 comprises ROM 4710 and RAM 4712. A basic input/output system (BIOS) can be stored in a non-volatile memory such as ROM, erasable programmable read only memory (EPROM), EEPROM, which BIOS contains the basic routines that help to transfer information between elements within the computer 4702, such as during startup. The RAM 4712 can also comprise a high-speed RAM such as static RAM for caching data.

The computer 4702 further comprises an internal hard disk drive (HDD) 4714 (e.g., EIDE, SATA), which internal hard disk drive 4714 can also be configured for external use in a suitable chassis (not shown), a magnetic floppy disk drive (FDD) 4716, (e.g., to read from or write to a removable diskette 4718) and an optical disk drive 4720, (e.g., reading a CD-ROM disk 4722 or, to read from or write to other high capacity optical media such as the DVD). The hard disk drive 4714, magnetic disk drive 4716 and optical disk drive 4720 can be connected to the system bus 4708 by a hard disk drive interface 4724, a magnetic disk drive interface 4726 and an optical drive interface 4728, respectively. The interface 4724 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 4702, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 4712, comprising an operating system 4730, one or more application programs 4732, other program modules 4734 and program data 4736. All or portions of the operating system, applications, modules, and/or data can also be cached in the RAM 4712. The systems and methods described herein can be implemented utilizing various commercially available operating systems or combinations of operating systems. Examples of application programs 4732 that can be implemented and otherwise executed by processing unit 4704 include the diversity selection determining performed by transmission device 101 or 102.

A user can enter commands and information into the computer 4702 through one or more wired/wireless input devices, e.g., a keyboard 4738 and a pointing device, such as a mouse 4740. Other input devices (not shown) can comprise a microphone, an infrared (IR) remote control, a joystick, a game pad, a stylus pen, touch screen or the like. These and other input devices are often connected to the processing unit 4704 through an input device interface 4742 that can be coupled to the system bus 4708, but can be connected by other interfaces, such as a parallel port, an IEEE 1394 serial port, a game port, a universal serial bus (USB) port, an IR interface, etc.

A monitor 4744 or other type of display device can be also connected to the system bus 4708 via an interface, such as a video adapter 4746. It will also be appreciated that in alternative embodiments, a monitor 4744 can also be any display device (e.g., another computer having a display, a smart phone, a tablet computer, etc.) for receiving display information associated with computer 4702 via any communication means, including via the Internet and cloud-based networks. In addition to the monitor 4744, a computer typically comprises other peripheral output devices (not shown), such as speakers, printers, etc.

The computer 4702 can operate in a networked environment using logical connections via wired and/or wireless communications to one or more remote computers, such as a remote computer(s) 4748. The remote computer(s) 4748 can be a workstation, a server computer, a router, a personal computer, portable computer, microprocessor-based entertainment appliance, a peer device or other common network node, and typically comprises many or all of the elements described relative to the computer 4702, although, for purposes of brevity, only a memory/storage device 4750 is illustrated. The logical connections depicted comprise wired/wireless connectivity to a local area network (LAN) 4752 and/or larger networks, e.g., a wide area network (WAN) 4754. Such LAN and WAN networking environments are commonplace in offices and companies, and facilitate enterprise-wide computer networks, such as intranets, all of which can connect to a global communications network, e.g., the Internet.

When used in a LAN networking environment, the computer 4702 can be connected to the local network 4752 through a wired and/or wireless communication network interface or adapter 4756. The adapter 4756 can facilitate wired or wireless communication to the LAN 4752, which can also comprise a wireless AP disposed thereon for communicating with the wireless adapter 4756.

When used in a WAN networking environment, the computer 4702 can comprise a modem 4758 or can be connected to a communications server on the WAN 4754 or has other means for establishing communications over the WAN 4754, such as by way of the Internet. The modem 4758, which can be internal or external and a wired or wireless device, can be connected to the system bus 4708 via the input device interface 4742. In a networked environment, program modules depicted relative to the computer 4702 or portions thereof, can be stored in the remote memory/storage device 4750. It will be appreciated that the network connections shown are example and other means of establishing a communications link between the computers can be used.

The computer 4702 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and Bluetooth® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 48:
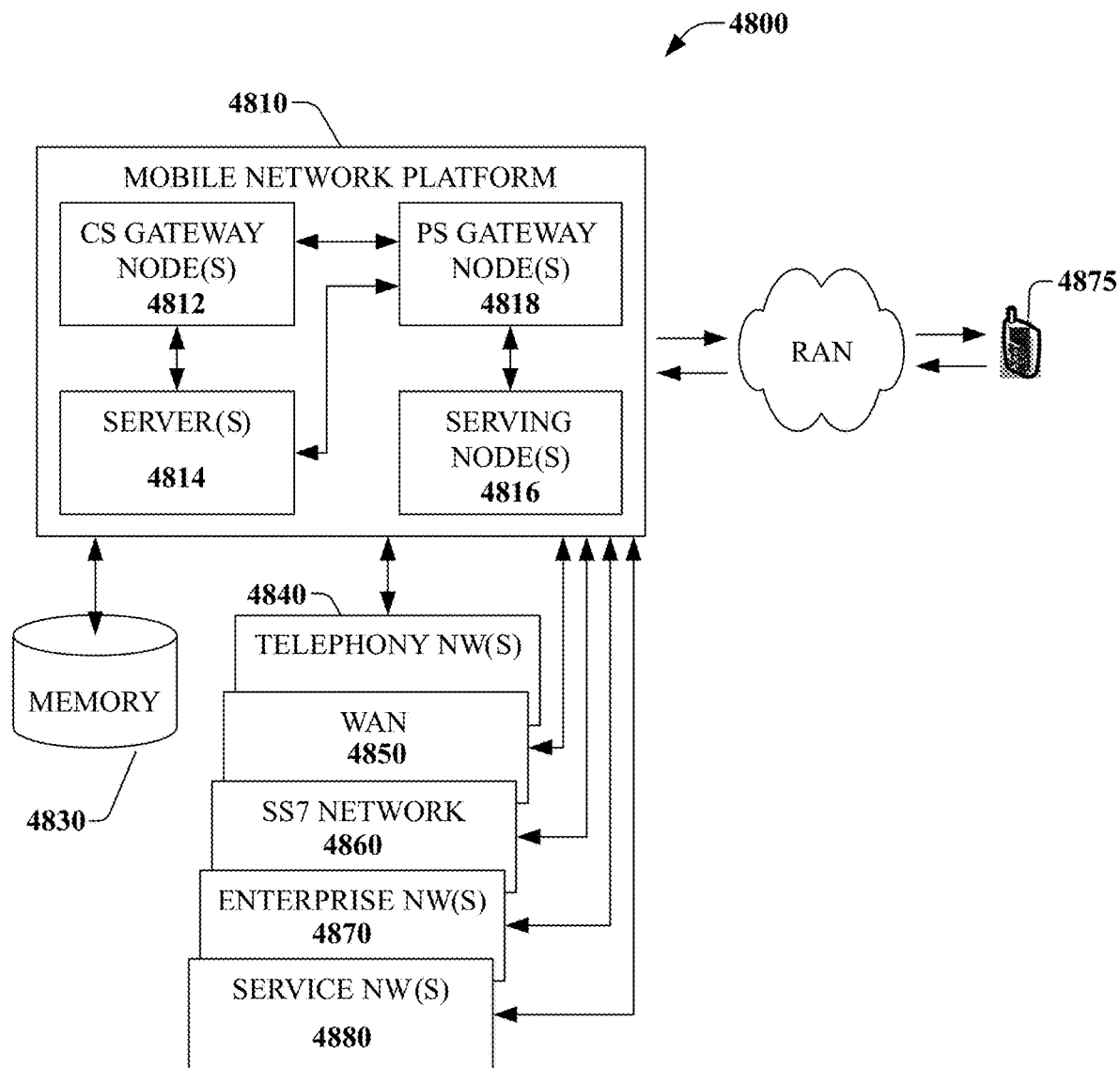
FIG. 48 is a block diagram of an example, non-limiting embodiment of a mobile network platform in accordance with various aspects described herein.

FIG. 48 presents an example embodiment 4800 of a mobile network platform 4810 that can implement and exploit one or more aspects of the disclosed subject matter described herein. In one or more embodiments, the mobile network platform 4810 can generate and receive signals transmitted and received by base stations (e.g., base station devices 1504, macrocell site 1502, or base stations 1614), central office (e.g., central office 1501 or 1611), or transmission device 101 or 102 associated with the disclosed subject matter. Generally, wireless network platform 4810 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 4810 can be included in telecommunications carrier networks, and can be considered carrier-side components as discussed elsewhere herein. Mobile network platform 4810 comprises CS gateway node(s) 4822 which can interface CS traffic received from legacy networks like telephony network(s) 4840 (e.g., public switched telephone network (PSTN), or public land mobile network (PLMN)) or a signaling system #7 (SS7) network 4870. Circuit switched gateway node(s) 4822 can authorize and authenticate traffic (e.g., voice) arising from such networks. Additionally, CS gateway node(s) 4822 can access mobility, or roaming, data generated through SS7 network 4870; for instance, mobility data stored in a visited location register (VLR), which can reside in memory 4830. Moreover, CS gateway node(s) 4822 interfaces CS-based traffic and signaling and PS gateway node(s) 4818. As an example, in a 3GPP UMTS network, CS gateway node(s) 4822 can be realized at least in part in gateway GPRS support node(s) (GGSN). It should be appreciated that functionality and specific operation of CS gateway node(s) 4822, PS gateway node(s) 4818, and serving node(s) 4816, is provided and dictated by radio technology(ies) utilized by mobile network platform 4810 for telecommunication.

In addition to receiving and processing CS-switched traffic and signaling, PS gateway node(s) 4818 can authorize and authenticate PS-based data sessions with served mobile devices. Data sessions can comprise traffic, or content(s), exchanged with networks external to the wireless network platform 4810, like wide area network(s) (WANs) 4850, enterprise network(s) 4870, and service network(s) 4880, which can be embodied in local area network(s) (LANs), can also be interfaced with mobile network platform 4810 through PS gateway node(s) 4818. It is to be noted that WANs 4850 and enterprise network(s) 4860 can embody, at least in part, a service network(s) like IP multimedia subsystem (IMS). Based on radio technology layer(s) available in technology resource(s) 4817, packet-switched gateway node(s) 4818 can generate packet data protocol contexts when a data session is established; other data structures that facilitate routing of packetized data also can be generated. To that end, in an aspect, PS gateway node(s) 4818 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 4800, wireless network platform 4810 also comprises serving node(s) 4816 that, based upon available radio technology layer(s) within technology resource(s) 4817, convey the various packetized flows of data streams received through PS gateway node(s) 4818. It is to be noted that for technology resource(s) 4817 that rely primarily on CS communication, server node(s) can deliver traffic without reliance on PS gateway node(s) 4818; for example, server node(s) can embody at least in part a mobile switching center. As an example, in a 3GPP UMTS network, serving node(s) 4816 can be embodied in serving GPRS support node(s) (SGSN).

For radio technologies that exploit packetized communication, server(s) 4814 in wireless network platform 4810 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by wireless network platform 4810. Data streams (e.g., content(s) that are part of a voice call or data session) can be conveyed to PS gateway node(s) 4818 for authorization/authentication and initiation of a data session, and to serving node(s) 4816 for communication thereafter. In addition to application server, server(s) 4814 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 4810 to ensure network's operation and data integrity in addition to authorization and authentication procedures that CS gateway node(s) 4822 and PS gateway node(s) 4818 can enact. Moreover, provisioning server(s) can provision services from external network(s) like networks operated by a disparate service provider; for instance, WAN 4850 or Global Positioning System (GPS) network(s) (not shown). Provisioning server(s) can also provision coverage through networks associated to wireless network platform 4810 (e.g., deployed and operated by the same service provider), such as the distributed antennas networks shown in FIG. 1 that enhance wireless service coverage by providing more network coverage. Repeater devices such as those shown in FIGS. 7, 8, and 9 also improve network coverage in order to enhance subscriber service experience by way of UE 4875.

It is to be noted that server(s) 4814 can comprise one or more processors configured to confer at least in part the functionality of macro network platform 4810. To that end, the one or more processor can execute code instructions stored in memory 4830, for example. It is should be appreciated that server(s) 4814 can comprise a content manager 4815, which operates in substantially the same manner as described hereinbefore.

In example embodiment 4800, memory 4830 can store information related to operation of wireless network platform 4810. Other operational information can comprise provisioning information of mobile devices served through wireless platform network 4810, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 4830 can also store information from at least one of telephony network(s) 4840, WAN 4850, enterprise network(s) 4870, or SS7 network 4860. In an aspect, memory 4830 can be, for example, accessed as part of a data store component or as a remotely connected memory store.

In order to provide a context for the various aspects of the disclosed subject matter, FIG. 48, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 49:
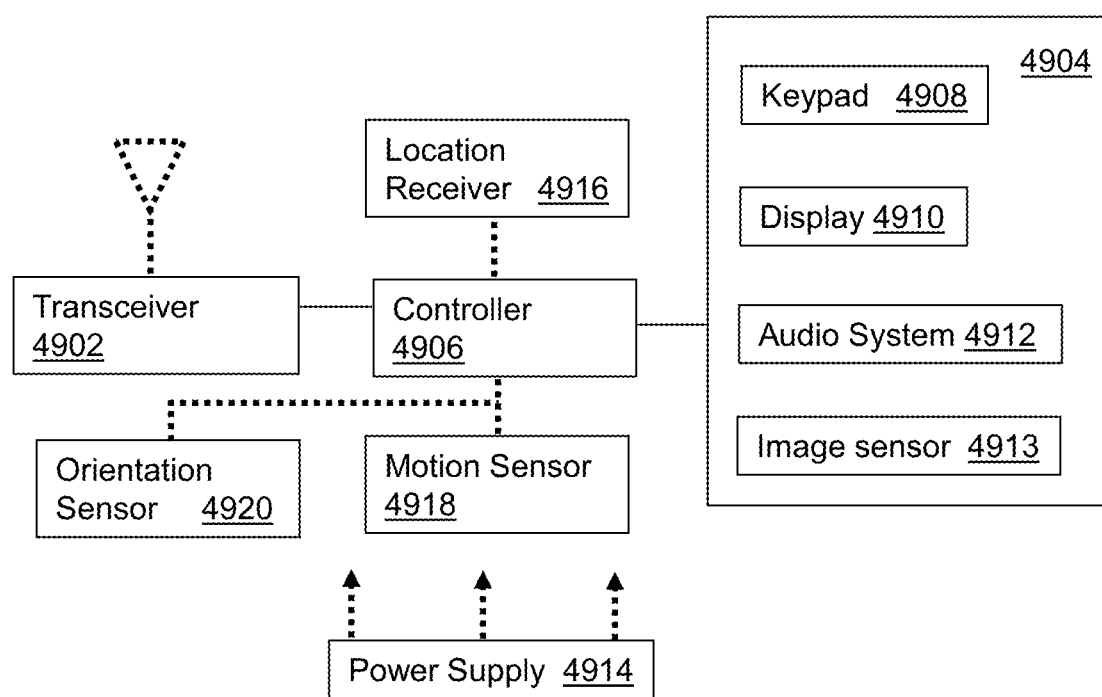
FIG. 49 is a block diagram of an example, non-limiting embodiment of a communication device in accordance with various aspects described herein.

FIG. 49 depicts an illustrative embodiment of a communication device 4900. The communication device 4900 can serve as an illustrative embodiment of devices such as mobile devices and in-building devices referred to by the subject disclosure (e.g., in FIGS. 15, 16A and 16B).

The communication device 4900 can comprise a wireline and/or wireless transceiver 4902 (herein transceiver 4902), a user interface (UI) 4904, a power supply 4914, a location receiver 4916, a motion sensor 4918, an orientation sensor 4920, and a controller 4906 for managing operations thereof. The transceiver 4902 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-IX, UMTS/HSDPA, GSM/GPRS, TDMA/EDGE, EV/DO, WiMAX, SDR, LTE, as well as other next generation wireless communication technologies as they arise. The transceiver 4902 can also be adapted to support circuit-switched wireline access technologies (such as PSTN), packet-switched wireline access technologies (such as TCP/IP, VoIP, etc.), and combinations thereof.

The UI 4904 can include a depressible or touch-sensitive keypad 4908 with a navigation mechanism such as a roller ball, a joystick, a mouse, or a navigation disk for manipulating operations of the communication device 4900. The keypad 4908 can be an integral part of a housing assembly of the communication device 4900 or an independent device operably coupled thereto by a tethered wireline interface (such as a USB cable) or a wireless interface supporting for example Bluetooth®. The keypad 4908 can represent a numeric keypad commonly used by phones, and/or a QWERTY keypad with alphanumeric keys. The UI 4904 can further include a display 4910 such as monochrome or color LCD (Liquid Crystal Display), OLED (Organic Light Emitting Diode) or other suitable display technology for conveying images to an end user of the communication device 4900. In an embodiment where the display 4910 is touch-sensitive, a portion or all of the keypad 4908 can be presented by way of the display 4910 with navigation features.

The display 4910 can use touch screen technology to also serve as a user interface for detecting user input. As a touch screen display, the communication device 4900 can be adapted to present a user interface having graphical user interface (GUI) elements that can be selected by a user with a touch of a finger. The touch screen display 4910 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 4910 can be an integral part of the housing assembly of the communication device 4900 or an independent device communicatively coupled thereto by a tethered wireline interface (such as a cable) or a wireless interface.

The UI 4904 can also include an audio system 4912 that utilizes audio technology for conveying low volume audio (such as audio heard in proximity of a human ear) and high volume audio (such as speakerphone for hands free operation). The audio system 4912 can further include a microphone for receiving audible signals of an end user. The audio system 4912 can also be used for voice recognition applications. The UI 4904 can further include an image sensor 4913 such as a charged coupled device (CCD) camera for capturing still or moving images.

The power supply 4914 can utilize common power management technologies such as replaceable and rechargeable batteries, supply regulation technologies, and/or charging system technologies for supplying energy to the components of the communication device 4900 to facilitate long-range or short-range portable communications. Alternatively, or in combination, the charging system can utilize external power sources such as DC power supplied over a physical interface such as a USB port or other suitable tethering technologies.

The location receiver 4916 can utilize location technology such as a global positioning system (GPS) receiver capable of assisted GPS for identifying a location of the communication device 4900 based on signals generated by a constellation of GPS satellites, which can be used for facilitating location services such as navigation. The motion sensor 4918 can utilize motion sensing technology such as an accelerometer, a gyroscope, or other suitable motion sensing technology to detect motion of the communication device 4900 in three-dimensional space. The orientation sensor 4920 can utilize orientation sensing technology such as a magnetometer to detect the orientation of the communication device 4900 (north, south, west, and east, as well as combined orientations in degrees, minutes, or other suitable orientation metrics).

The communication device 4900 can use the transceiver 4902 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 4906 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 4900.

Other components not shown in FIG. 49 can be used in one or more embodiments of the subject disclosure. For instance, the communication device 4900 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used in optional training controller 230 evaluate and select candidate frequencies, modulation schemes, MIMO modes, and/or guided wave modes in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, $x=(x1, x2, x3, x4, \ldots, xn)$, to a confidence that the input belongs to a class, that is, $f(x)=confidence$ (class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A communication device, comprising:
    an absorber comprising radiation absorbent material;
    a receiver having an aperture and surrounded by the radiation absorbent material, wherein the receiver receives at the aperture a first electromagnetic wave that propagates along a transmission medium without requiring an electrical return path, and wherein the receiver obtains a first communication signal from the first electromagnetic wave; and
    a launcher collocated with the receiver and surrounded by the radiation absorbent material, wherein the launcher induces a second electromagnetic wave that conveys a second communication signal, and wherein the radiation absorbent material absorbs radiation associated with the second electromagnetic wave in proximity to the launcher.

2. The communication device of claim 1, wherein the absorber has a cylindrical shape defining a cavity therethrough, and wherein the launcher is positioned in the cavity.

3. The communication device of claim 2, wherein the transmission medium passes through the cavity.

4. The communication device of claim 2, wherein the receiver is positioned in the cavity.

5. The communication device of claim 2, wherein the cavity has an inner radius, and wherein the launcher induces the second electromagnetic wave such that a distance from the transmission medium to an outer extent of the second electromagnetic wave is less than the inner radius of the cavity.

6. The communication device of claim 1, wherein a portion of the launcher is positioned outside of the absorber.

7. The communication device of claim 1, wherein the launcher, the absorber and the transmission medium are concentrically aligned.

8. The communication device of claim 1, wherein the radiation absorbent material of the absorber circumscribes second material that is not radiation absorbent.

9. The communication device of claim 8, wherein the second material has a cylindrical shape.

10. The communication device of claim 1, wherein the launcher is configured as a hollow horn, and wherein the transmission medium passes through the hollow horn.

11. The communication device of claim 1, wherein the absorber circumscribes the launcher.

12. The communication device of claim 1, wherein the absorber comprises a rigid body, and wherein the radiation absorbent material is connected to and surrounded by the rigid body.

13. The communication device of claim 1, comprising transceiver circuitry and a cable, wherein the cable has a dielectric core coupled to the launcher, and wherein the transceiver circuitry and the launcher are coupled via the cable.

14. A communication device, comprising:
    an absorber comprising radiation absorbent material;
    a receiver having an aperture and surrounded by the radiation absorbent material, wherein the receiver receives at the aperture a first electromagnetic wave that propagates along a transmission medium without requiring an electrical return path; and
    a launcher collocated with the receiver and surrounded by the radiation absorbent material, wherein the launcher induces a second electromagnetic wave, and wherein the radiation absorbent material absorbs radiation associated with the second electromagnetic wave in proximity to the launcher.

15. The communication device of claim 14, further comprising:
    a coupling device positioned in and surrounded by the absorber.

16. The communication device of claim 15, wherein the coupling device has a distal end, and wherein the radiation absorbent material absorbs radiation in proximity to the distal end of the coupling device.

17. The communication device of claim 15, wherein the absorber has a cylindrical shape defining a cavity therethrough, wherein the coupling device has a hollow horn shape and is positioned in the cavity, and wherein the transmission medium passes through the cavity.

18. The communication device of claim 14, wherein the absorber comprises a rigid body having a cylindrical shape, and wherein the radiation absorbent material is connected to and surrounded by the rigid body.

19. A method comprising:
    generating, by a launcher of a communication device, a first electromagnetic wave that propagates along a transmission medium without requiring an electrical return path;
    absorbing, by an absorber of the communication device, radiation associated with the first electromagnetic wave in proximity to the launcher; and
    receiving, by a receiver of the communication device, a second electromagnetic wave that propagates along the transmission medium without requiring the electrical return path.

20. The method of claim 19, wherein the first electromagnetic wave conveys a first communication signal, the method further comprising:
    obtaining, by the receiver, a second communication signal from the second electromagnetic wave; and
    selecting, by the communication device, parameters for the first electromagnetic wave such that a distance from the transmission medium to an outer extent of the first electromagnetic wave is less than an inner radius of a cavity defined by the absorber.

* * * * *